(12) United States Patent
Imai et al.

(10) Patent No.: US 11,037,943 B2
(45) Date of Patent: *Jun. 15, 2021

(54) THREE-DIMENSIONAL MEMORY DEVICE HAVING ON-PITCH DRAIN SELECT GATE ELECTRODES AND METHOD OF MAKING THE SAME

(71) Applicant: SANDISK TECHNOLOGIES LLC, Addison, TX (US)

(72) Inventors: Muneyuki Imai, Yokkaichi (JP); James Kai, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/406,283

(22) Filed: May 8, 2019

(65) Prior Publication Data
US 2019/0267391 A1 Aug. 29, 2019

Related U.S. Application Data

(63) Continuation-in-part of application No. 15/818,146, filed on Nov. 20, 2017, now Pat. No. 10,403,639.
(Continued)

(51) Int. Cl.
*H01L 27/11556* (2017.01)
*H01L 27/11582* (2017.01)
(Continued)

(52) U.S. Cl.
CPC .... *H01L 27/11556* (2013.01); *G11C 16/0408* (2013.01); *G11C 16/0466* (2013.01);
(Continued)

(58) Field of Classification Search
CPC ......... H01L 21/8221; H01L 21/823418; H01L 27/11556; H01L 21/11582;
(Continued)

(56) References Cited

U.S. PATENT DOCUMENTS 5,915,167 A    6/1999  Leedy
9,331,094 B2   1/2016  Pachamuthu et al.
(Continued)

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Vincent Wall
(74) *Attorney, Agent, or Firm* — The Marbury Law Group PLLC

(57) ABSTRACT

An array of memory stack structures extends through an alternating stack of insulating layers and electrically conductive layers. The drain-select-level assemblies may be provided by forming drain-select-level openings through a drain-select-level sacrificial material layer, and by forming a combination of a cylindrical electrode portion and a first gate dielectric mayin each first drain-select-level opening while forming a second gate dielectric directly on a sidewall of each second drain-select-level opening in a second subset of the drain-select-level openings. A strip electrode portion is formed by replacing the drain-select-level sacrificial material layer with a conductive material. Structures filling the second subset of the drain-select-level openings may be used as dummy structures at a periphery of an array. The dummy structures are free of gate electrodes and thus prevents a leakage current therethrough.

3 Claims, 132 Drawing Sheets

Related U.S. Application Data

(60) Provisional application No. 62/533,993, filed on Jul. 18, 2017.

(51) Int. Cl.
    *G11C 16/04* (2006.01)
    *H01L 29/06* (2006.01)
    *H01L 21/28* (2006.01)

(52) U.S. Cl.
    CPC .... *H01L 27/11582* (2013.01); *H01L 29/0649* (2013.01); *H01L 29/40117* (2019.08)

(58) Field of Classification Search
    CPC ........... H01L 21/11548; H01L 21/1157; H01L 21/11519; H01L 21/11565; G11C 5/025
    See application file for complete search history.

(56) References Cited

U.S. PATENT DOCUMENTS

| | | | |
|---|---|---|---|
| 9,368,509 B2 | 6/2016 | Pang et al. | |
| 9,478,561 B2* | 10/2016 | Kim | H01L 27/11575 |
| 9,515,085 B2 | 12/2016 | Rabkin et al. | |
| 9,721,963 B1 | 1/2017 | Rabkin et al. | |
| 9,679,907 B1* | 6/2017 | Kaneko | H01L 21/31111 |
| 9,922,987 B1* | 3/2018 | Mizutani | H01L 27/11582 |
| 9,972,640 B1* | 5/2018 | Kai | H01L 21/31116 |
| 9,972,641 B1* | 5/2018 | Zhang | H01L 23/5226 |
| 10,083,982 B2* | 9/2018 | Shigemura | H01L 21/76843 |
| 10,192,878 B1* | 1/2019 | Tsutsumi | H01L 27/1157 |
| 10,224,104 B2* | 3/2019 | Chowdhury | H01L 27/11582 |
| 10,236,300 B2* | 3/2019 | Zhang | H01L 27/11582 |
| 10,256,247 B1* | 4/2019 | Kanakamedala | H01L 23/535 |
| 10,290,650 B1* | 5/2019 | Iwai | H01L 29/7926 |
| 10,297,610 B2* | 5/2019 | Kai | H01L 27/11519 |
| 10,381,229 B2* | 8/2019 | Yada | G11C 16/26 |
| 10,381,364 B2* | 8/2019 | Zhou | H01L 27/11519 |
| 2008/0067583 A1 | 3/2008 | Kidoh et al. | |
| 2009/0230458 A1 | 9/2009 | Ishiduki et al. | |
| 2009/0242967 A1 | 10/2009 | Katsumata et al. | |
| 2010/0176440 A1 | 7/2010 | Omura | |
| 2011/0013454 A1 | 1/2011 | Hishida et al. | |
| 2011/0059595 A1 | 3/2011 | Jung | |
| 2012/0069660 A1 | 3/2012 | Iwai et al. | |
| 2013/0099306 A1 | 4/2013 | Choi et al. | |
| 2015/0060992 A1 | 3/2015 | Taekyung et al. | |
| 2016/0204117 A1* | 7/2016 | Liu | H01L 27/11551 257/324 |
| 2016/0204122 A1 | 7/2016 | Shoji et al. | |
| 2017/0125433 A1 | 5/2017 | Ogawa et al. | |
| 2017/0148808 A1 | 5/2017 | Nishikawa et al. | |
| 2017/0148809 A1 | 5/2017 | Nishikawa et al. | |
| 2017/0148810 A1 | 5/2017 | Kai et al. | |
| 2017/0148811 A1 | 5/2017 | Zhang et al. | |
| 2017/0179144 A1 | 6/2017 | Han | |
| 2017/0236896 A1 | 8/2017 | Lu et al. | |
| 2019/0027488 A1 | 1/2019 | Kai et al. | |
| 2019/0027489 A1 | 1/2019 | Orimoto et al. | |
| 2019/0252405 A1* | 8/2019 | Tsutsumi | H01L 27/1157 |
| 2020/0006358 A1* | 1/2020 | Nishikawa | H01L 21/76897 |
| 2020/0051995 A1* | 2/2020 | Tanaka | H01L 27/11582 |
| 2020/0058673 A1* | 2/2020 | Nishikawa | H01L 21/76829 |

OTHER PUBLICATIONS

USPTO Non-Final Office Action for U.S. Appl. No. 15/181,061 dated Sep. 10, 2018, 28 pages.
Invitation to Pay Additional Fees and, Where Applicable, Protest Fee and Communication Relating to the Results of the Partial International Search from the International Searching Authority for International Patent Application No. PCT/US2018/033196, dated Sep. 10, 2018, 22 pages.
International Search Report and Written Opinion of the International Searching Authority for International Patent Application No. PCT/US2018/033196, dated Nov. 6, 2018, 29 pages.
U.S. Appl. No. 15/078,555, filed Mar. 23, 2016, SanDisk Technologies LLC.
U.S. Appl. No. 15/286,063, filed Oct. 5, 2016, SanDisk Technologies LLC.
U.S. Appl. No. 15/332,429, filed Oct. 24, 2016, SanDisk Technologies LLC.
U.S. Appl. No. 15/337,235, filed Oct. 28, 2016, SanDisk Technologies LLC.
U.S. Appl. No. 15/354,067, filed Nov. 17, 2016, SanDisk Technologies LLC.
U.S. Appl. No. 15/354,795, filed Nov. 17, 2016, SanDisk Technologies LLC.
U.S. Appl. No. 15/468,732, filed Mar. 24, 2017, SanDisk Technologies LLC.
U.S. Appl. No. 15/496,359, filed Apr. 25, 2017, SanDisk Technologies LLC.
U.S. Appl. No. 15/628,495, filed Jun. 20, 2017, SanDisk Technologies LLC.
U.S. Appl. No. 15/685,254, filed Aug. 24, 2017, SanDisk Technologies LLC.
U.S. Appl. No. 15/704,286, filed Sep. 14, 2017, SanDisk Technologies LLC.
U.S. Appl. No. 15/784,549, filed Oct. 16, 2017, SanDisk Technologies LLC.
Notification Concerning Transmittal of International Preliminary Report on Patentability and Written Opinion of the International Search Authority for International Patent Application No. PCT/US2018/033196, dated Jan. 30, 2020, 19 pages.

* cited by examiner

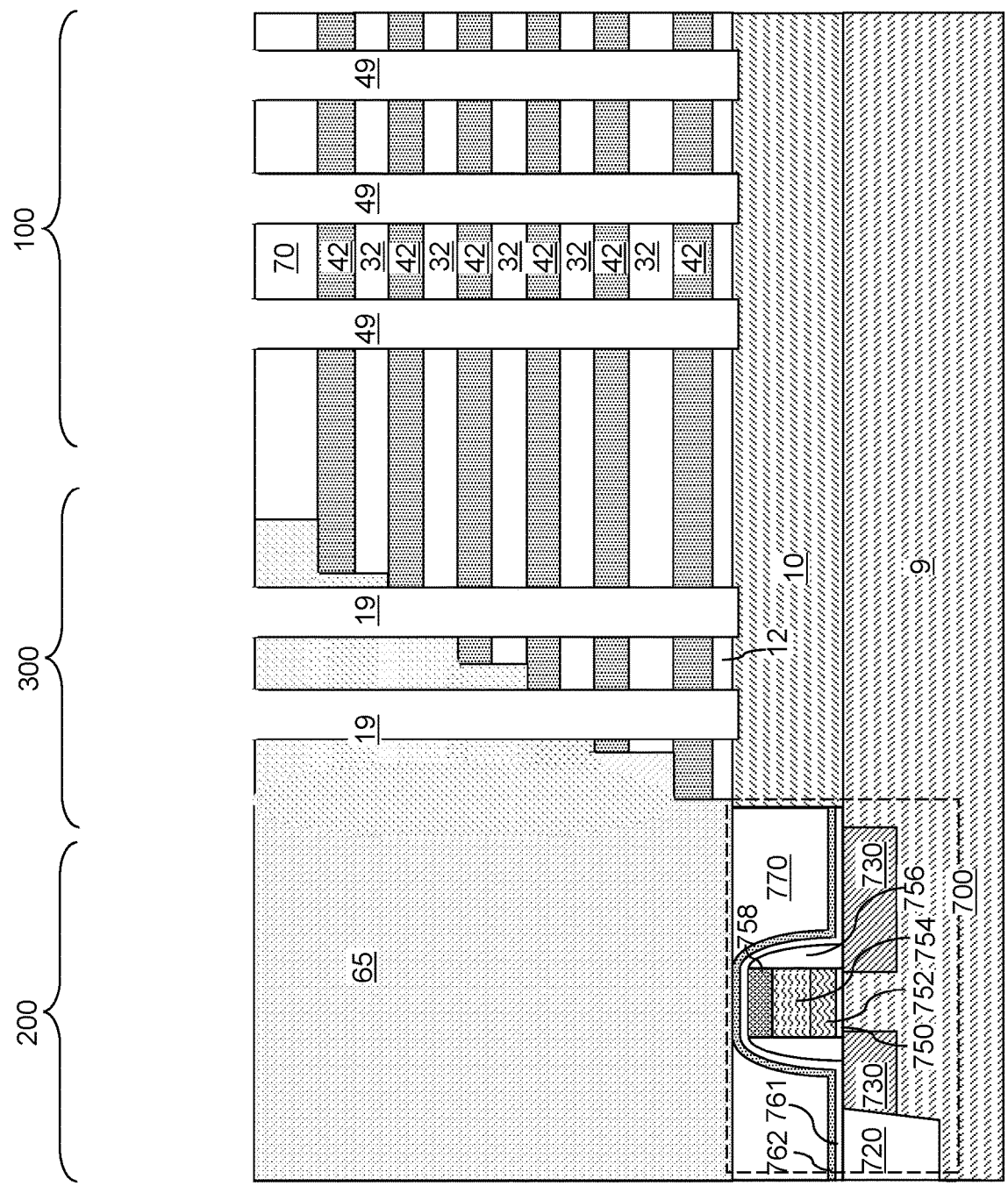

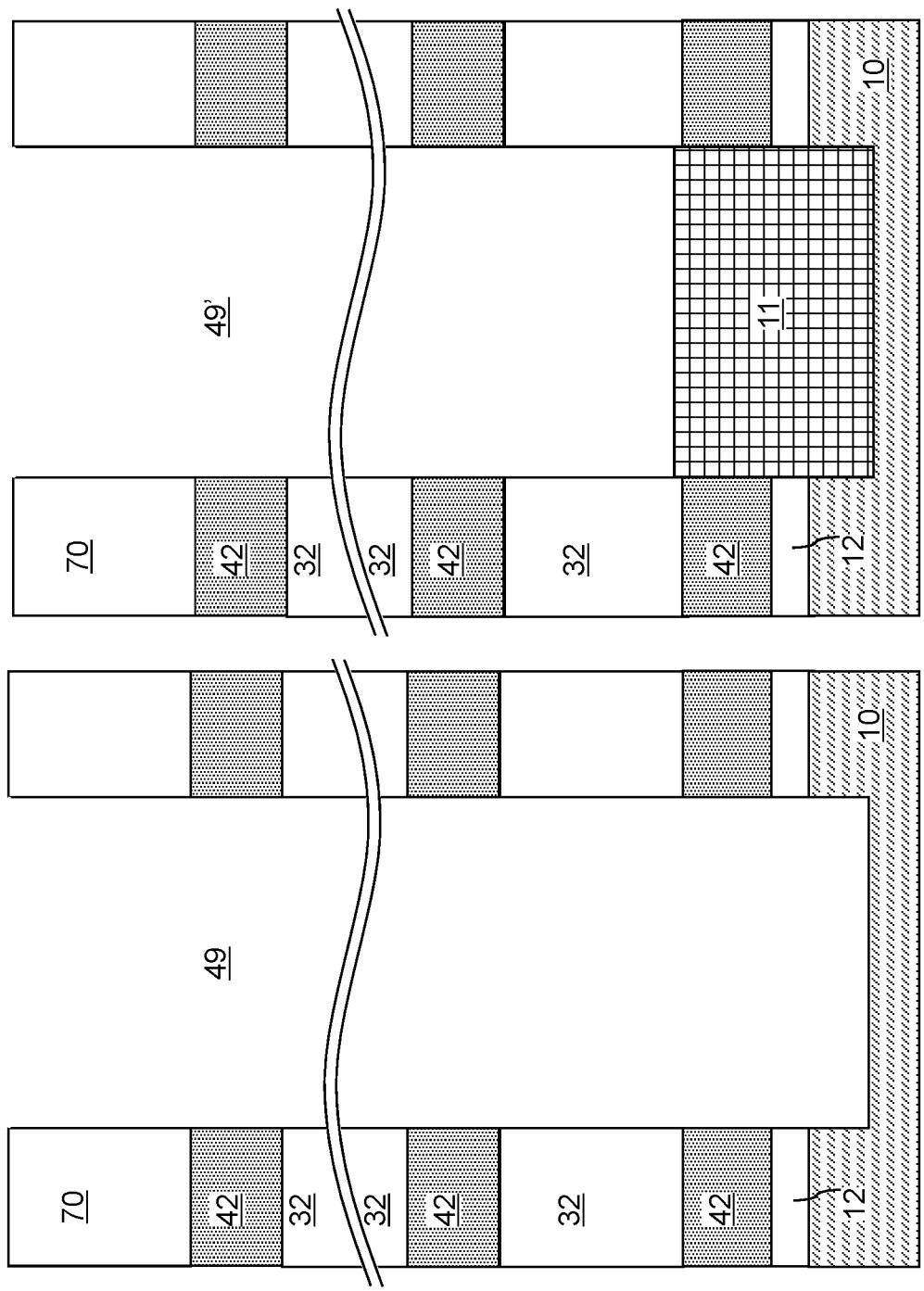

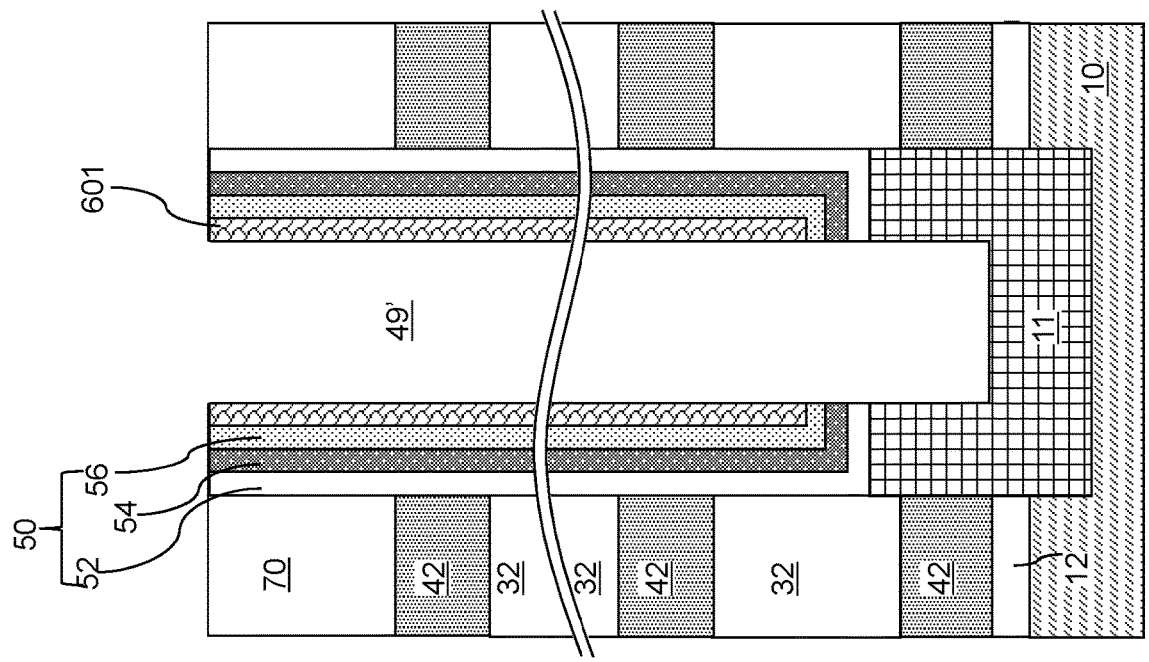
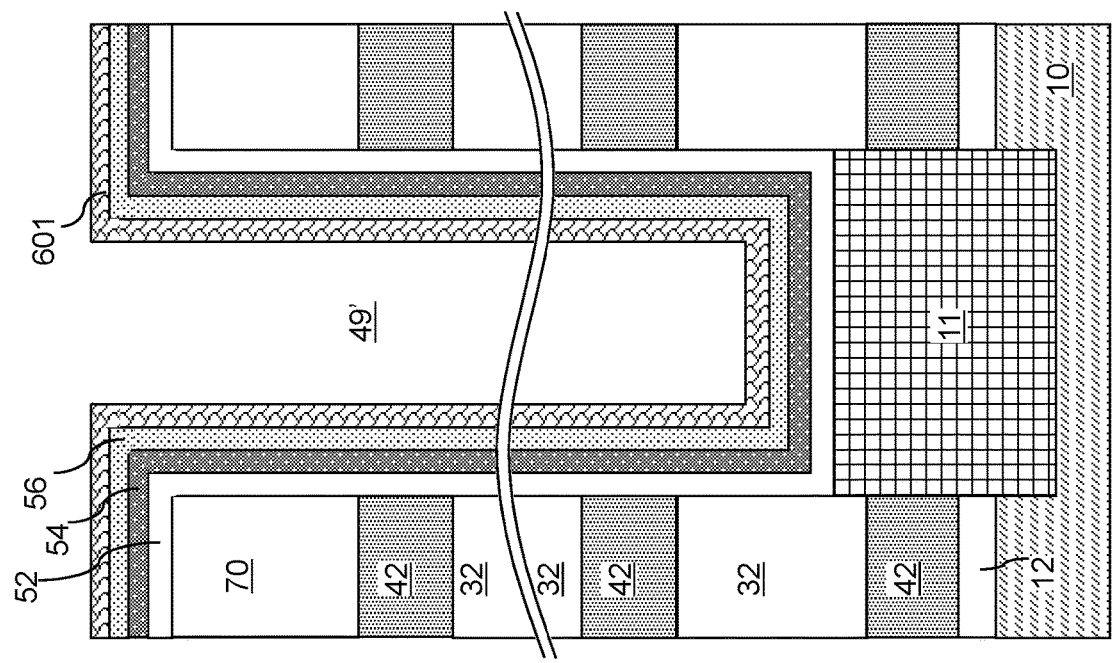
FIG. 5C
FIG. 5D

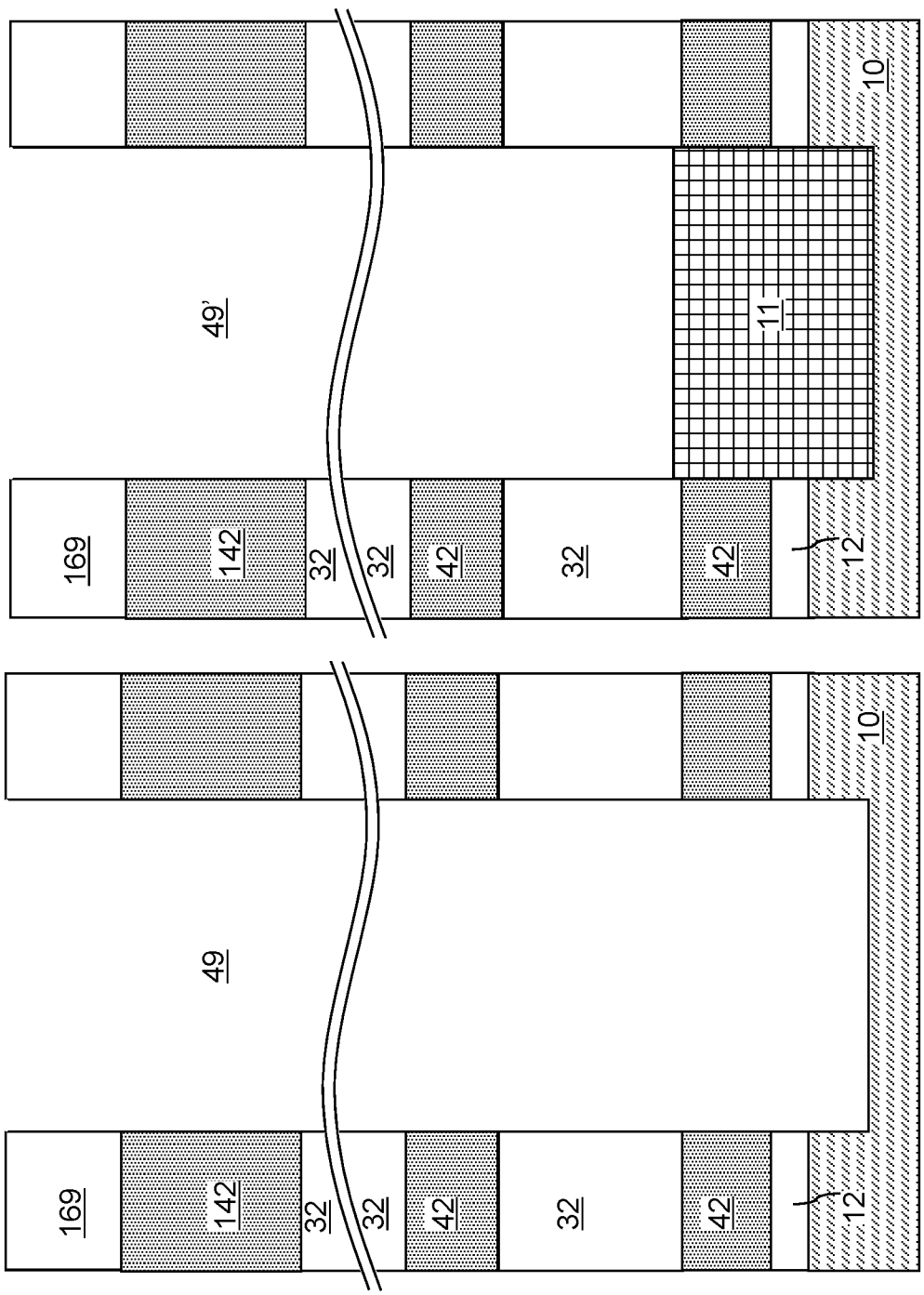

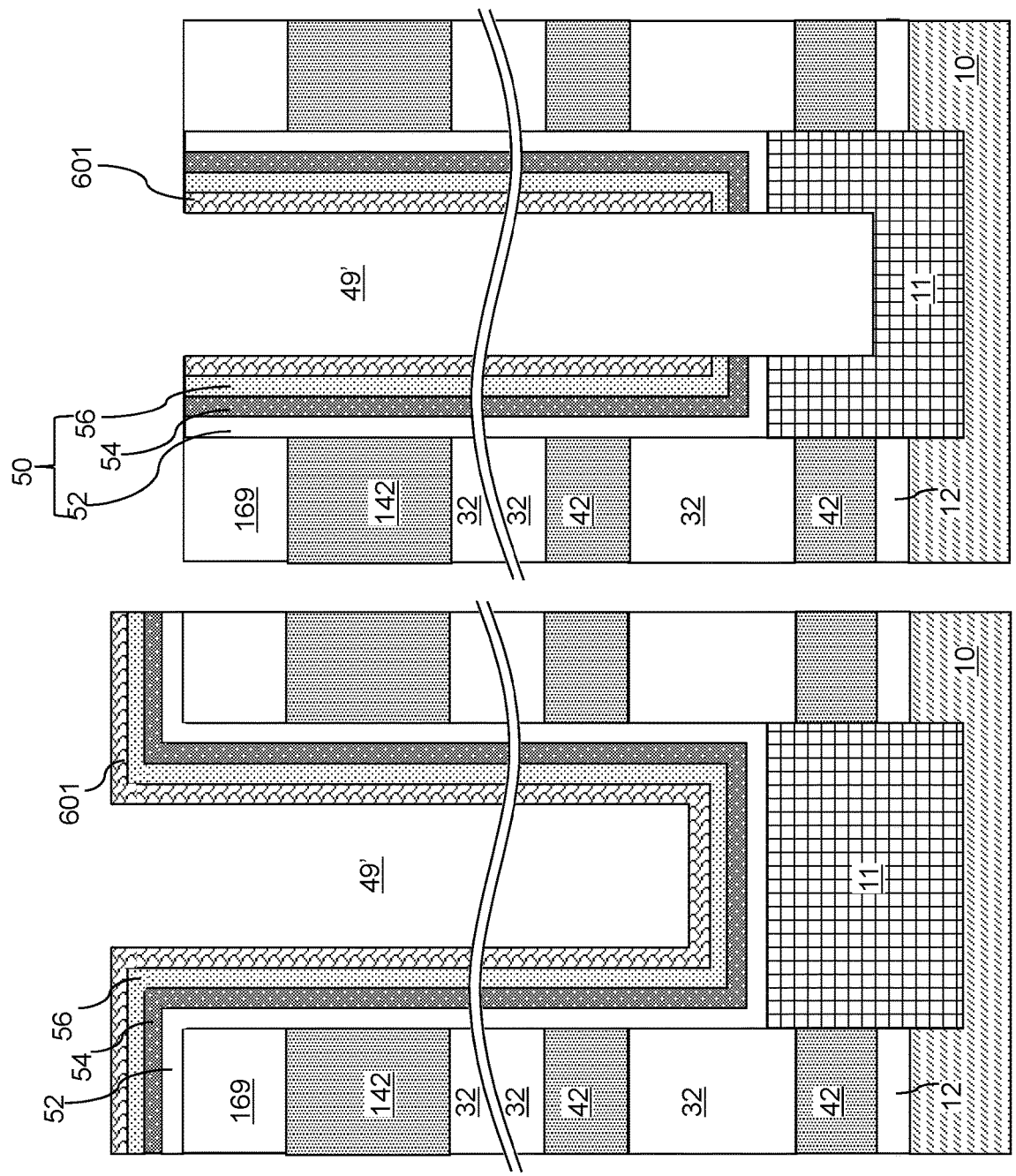

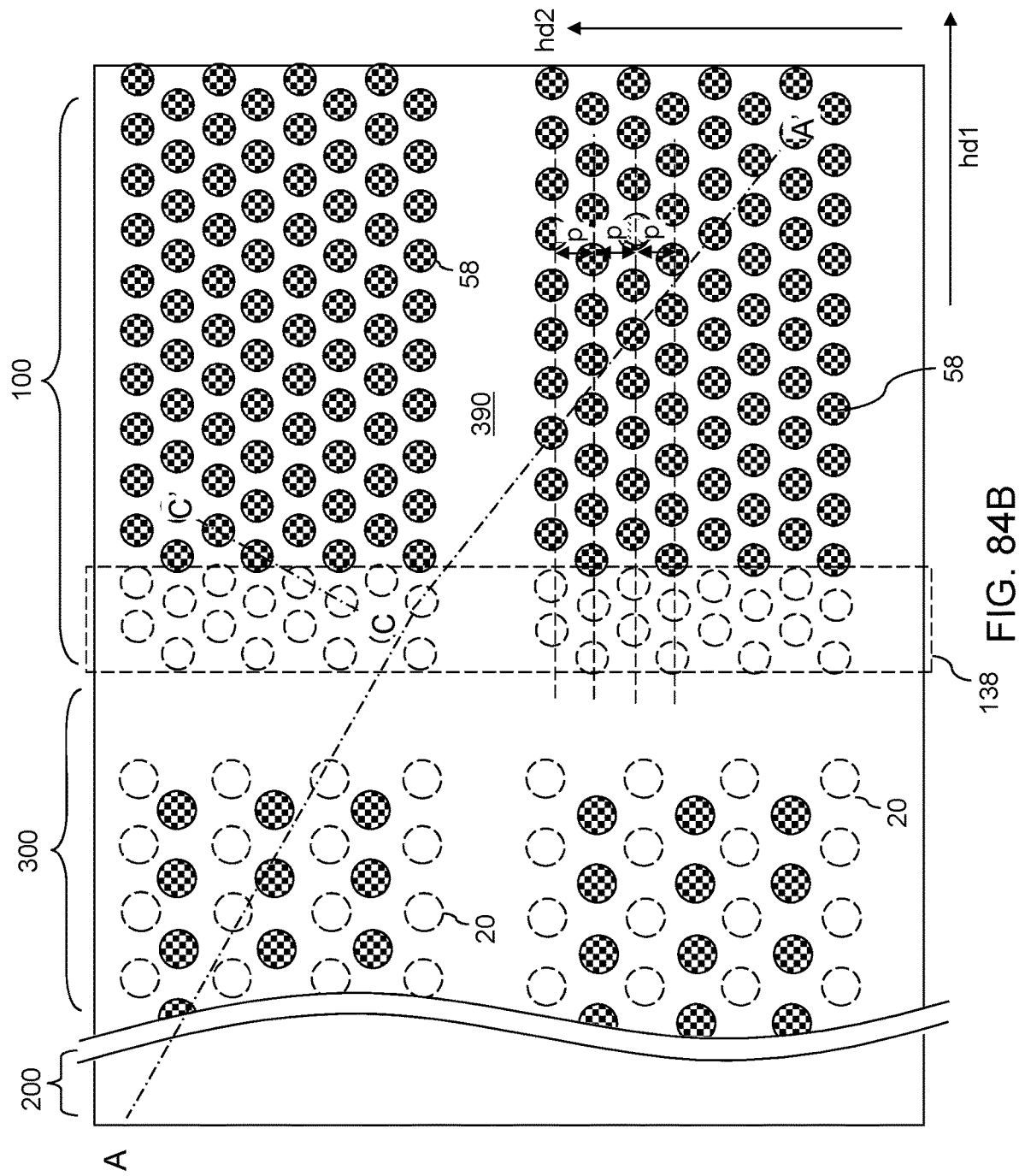

THREE-DIMENSIONAL MEMORY DEVICE HAVING ON-PITCH DRAIN SELECT GATE ELECTRODES AND METHOD OF MAKING THE SAME

RELATED APPLICATIONS

This application is a continuation-in-part application of U.S. application Ser. No. 15/818,146, filed on Nov. 20, 2017, and which claims benefit of priority of U.S. Provisional Patent Application Ser. No. 62/533,993 filed on Jul. 18, 2017, the entire contents of all of which are incorporated herein by reference in their entirety.

FIELD

The present disclosure relates generally to the field of semiconductor devices, and particular to a three-dimensional memory device including on-pitch select gate electrodes having a same periodicity as memory stack structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: an alternating stack of insulating layers and electrically conductive layers located over a substrate; an array of memory stack structures extending through the alternating stack and arranged as rows that extend along a first horizontal direction and are spaced apart along a second horizontal direction, wherein each of the memory stack structures comprises a memory film and a memory-level channel portion contacting an inner sidewall of the memory film; an array of drain-select-level assemblies overlying the alternating stack and having a same periodicity as the array of memory stack structures along the first horizontal direction and the second horizontal direction, wherein each of the drain-select-level assemblies comprises a drain-select-level channel portion contacting a respective memory-level channel portion and a drain region contacting an upper end of the drain-select-level channel portion; a strip electrode portion laterally surrounding respective rows of drain-select-level assemblies; and a drain-select-level isolation strip comprising at least one dielectric material and contacting the strip electrode portion and sidewalls of a row of drain-select-level assemblies.

According to another embodiment of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming an array of memory stack structures extending through the alternating stack and arranged as rows that extend along a first horizontal direction and are spaced apart along a second horizontal direction, wherein each of the memory stack structures comprises a memory film and a memory-level channel portion contacting an inner sidewall of the memory film; forming an insulating spacer layer and a drain-select-level sacrificial material layer over the alternating stack and the array of memory stack structures; forming drain-select-level openings through the drain-select-level sacrificial material layer and the insulating spacer layer over the array of memory stack structures; forming a combination of a cylindrical electrode portion and a first gate dielectric in each first drain-select-level opening in a first subset of the drain-select-level openings while forming a second gate dielectric directly on a sidewall of each second drain-select-level opening in a second subset of the drain-select-level openings; and forming a first drain-select-level channel portion in each first drain-select-level opening while forming a second drain-select-level channel portion in each second drain-select-level opening, wherein first drain-select-level assemblies are formed in the first drain-select-level openings and second drain-select-level assemblies are formed in the second drain-select-level openings.

According to an embodiment of the present disclosure, a three-dimensional memory device is provided, which comprises: an alternating stack of insulating layers and electrically conductive layers located over a substrate; an array of memory stack structures extending through the alternating stack and arranged as rows that extend along a first horizontal direction and are spaced along a second horizontal direction, wherein each of the memory stack structures comprises a memory film and a memory-level channel portion contacting an inner sidewall of the memory film; an array of drain-select-level assemblies overlying the alternating stack and having a same periodicity as the array of memory stack structures along the first horizontal direction and the second horizontal direction, wherein each of the drain-select-level assemblies comprises a drain-select-level channel portion contacting a respective memory-level channel portion; drain select gate electrodes laterally surrounding respective rows of drain-select-level assemblies; and a drain-select-level isolation strip comprising at least one dielectric material and located between a neighboring pair of drain select gate electrodes.

According to another embodiment of the present disclosure, a method of forming a three-dimensional memory device is provided, which includes the steps of: forming an alternating stack of insulating layers and spacer material layers over a substrate, wherein the spacer material layers are formed as, or are subsequently replaced with, electrically conductive layers; forming an array of memory stack structures extending through the alternating stack and arranged as rows that extend along a first horizontal direction and are spaced along a second horizontal direction, wherein each of the memory stack structures comprises a memory film and a memory-level channel portion contacting an inner sidewall of the memory film; forming an array of drain-select-level assemblies having a same periodicity as the array of memory stack structures along the first horizontal direction and the second horizontal direction over the alternating stack, wherein each of the drain-select-level assemblies comprises a drain-select-level channel portion contacting a respective memory-level channel portion; forming drain select gate electrodes laterally surrounding respective rows of drain-select-level assemblies; and forming a drain-select-level isolation strip comprising at least one dielectric material and located between a neighboring pair of drain select gate electrodes.

According to yet another embodiment of the present disclosure, a three-dimensional memory device is provided, which comprises: an alternating stack of insulating layers and electrically conductive layers located over a substrate;

an array of memory stack structures extending through the alternating stack and arranged as rows that extend along a first horizontal direction with a first pitch and are spaced along a second horizontal direction with a second pitch for each pair of neighboring rows, wherein each of the memory stack structures comprises a vertical semiconductor channel, a memory film and a gate dielectric that overlies a top surface of the memory film; drain select gate electrodes laterally surrounding respective rows of the gate dielectrics; and a drain-select-level isolation strip comprising a dielectric material located between a neighboring pair of the drain select gate electrodes. One of the drain select gate electrodes comprises a strip electrode portion including a pair of lengthwise sidewalls that generally extend along the first horizontal direction, and a plurality of cylindrical electrode portions that laterally surround a respective one of the gate dielectrics.

According to still another embodiment of the present disclosure, a method of forming a three-dimensional memory device comprises the steps of: forming an alternating stack of insulating layers and spacer material layers over a substrate, wherein the spacer material layers are formed as, or are subsequently replaced with, electrically conductive layers; forming at least one sacrificial matrix layer over the alternating stack; forming an array of memory stack structures extending through the at least one sacrificial matrix layer and the alternating stack and arranged as rows that extend along a first horizontal direction with a first pitch and are spaced along a second horizontal direction with a second pitch for each pair of neighboring rows, wherein each of the memory stack structures comprises a vertical semiconductor channel and a memory film; physically exposing upper portions of the memory stack structures by removing the at least one sacrificial matrix layer selective to the alternating stack; forming drain select gate electrodes around upper portions of the vertical semiconductor channels; and forming a drain-select-level isolation strip comprising a dielectric material, wherein the drain-select-level isolation strip is formed between a neighboring pair of the drain select gate electrodes.

BRIEF DESCRIPTION OF THE DRAWINGS

FIG. 4A is a schematic vertical cross-sectional view of the first exemplary structure after formation of memory openings and support openings according to the first embodiment of the present disclosure.

FIGS. 5A-5F are sequential schematic vertical cross-sectional views of a memory opening during formation of a memory stack structure according to the first embodiment of the present disclosure.

FIGS. 35A-35G are sequential schematic vertical cross-sectional views of a memory opening during formation of a memory stack structure according to the second embodiment of the present disclosure.

FIG. 79B is a top-down view of the third exemplary structure of FIG. 79A. The hinged vertical plane A-A' is the plane of the vertical cross-sectional view of FIG. 79A.

FIG. 80 is a vertical cross-sectional view of the third exemplary structure after formation of backside recesses according to the third embodiment of the present disclosure.

FIG. 81 is a vertical cross-sectional view of the third exemplary structure after formation of electrically conductive layers, source regions, insulating spacers, and backside contact via structures according to the third embodiment of the present disclosure.

FIG. 82 is a vertical cross-sectional view of the third exemplary structure after formation of drain-select-level cavities according to the third embodiment of the present disclosure.

FIG. 83 is a vertical cross-sectional view of the third exemplary structure after formation of strip electrode portions according to the third embodiment of the present disclosure.

FIG. 84A is a vertical cross-sectional view of the third exemplary structure after formation of drain contact via structures, word line contact via structures, and peripheral contact via structures according to the third embodiment of the present disclosure.

FIG. 84B is a top-down view of the third exemplary structure of FIG. 84A. The hinged vertical plane A-A' is the plane of the vertical cross-sectional view of FIG. 84A.

FIG. 84C is a vertical cross-sectional view along the vertical plane C-C' of FIG. 84B.

DETAILED DESCRIPTION

Figure 1:
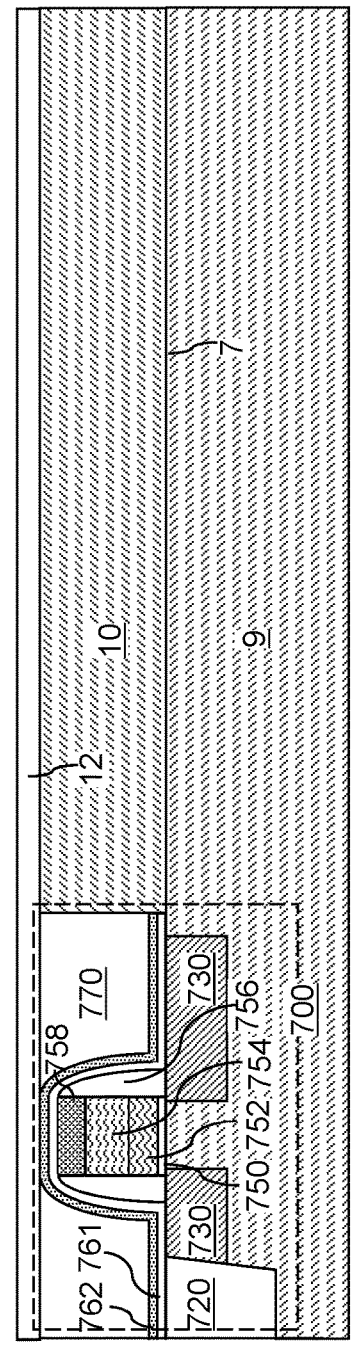
FIG. 1 is a schematic vertical cross-sectional view of a first exemplary structure after formation of at least one peripheral device, a semiconductor material layer, and a gate dielectric layer according to a first embodiment of the present disclosure.

An on-pitch array offers the benefit of a higher device density in a three-dimensional memory device through efficient use of device areas. Pattern distortion problems at the edge of a two-dimensional array may be alleviated by using peripheral dummy structures that are not electrically wired. However, peripheral dummy structures may increase the leakage current because the pattern distortion occurs with higher frequency in the peripheral dummy structures. Embodiments of the present disclosure reduce or eliminate leakage currents caused by peripheral dummy structures. The embodiments of the present disclosure are directed to three-dimensional memory device including on-pitch select gate electrodes having the same periodicity as memory stack structures and methods of manufacturing the same, the various embodiments of which are described below. The embodiments of the disclosure may be used to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition.

As used herein, a first element located "on" a second element may be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated using the various embodiments described herein.

Referring to FIG. 1, a first exemplary structure according to a first embodiment of the present disclosure is illustrated, which may be used, for example, to fabricate a device structure containing vertical NAND memory devices. The first exemplary structure includes a substrate, which may be a semiconductor substrate (9, 10). The substrate may include a substrate semiconductor layer 9. The substrate semiconductor layer 9 may be a semiconductor wafer or a semiconductor material layer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the substrate semiconductor layer 9. The major surface 7 may be a semiconductor surface. In one embodiment, the major surface 7 may be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry may be formed on a portion of the substrate semiconductor layer 9. The at least one semiconductor device 700 may include, for example, field effect transistors. For example, at least one shallow trench isolation structure 720 may be formed by etching portions of the substrate semiconductor layer 9 and depositing a dielectric material therein. A gate dielectric layer, at least one gate conductor layer, and a gate cap dielectric layer may be formed over the substrate semiconductor layer 9, and may be subsequently patterned to form at least one gate structure (750, 752, 754, 758), each of which may include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 may be formed around the at least one gate structure (750, 752, 754, 758) by depositing and anisotropically etching a dielectric liner. Active regions 730 may be formed in upper portions of the substrate semiconductor layer 9, for example, by introducing electrical dopants using the at least one gate structure (750, 752, 754, 758) as masking structures. Additional masks may be used as needed. The active regions 730 may include source regions and drain regions of field effect transistors. A first dielectric liner 761 and a second dielectric liner 762 may be optionally formed. Each of the first and second dielectric liners (761, 762) may comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 may be a silicon oxide layer, and the second dielectric liner 762 may be a silicon nitride layer. The least one semiconductor device for the peripheral circuitry may contain a driver circuit for memory devices to be subsequently formed, which may include at least one NAND device.

A dielectric material such as silicon oxide may be deposited over the at least one semiconductor device, and may be subsequently planarized to form a planarization dielectric layer 770. In one embodiment, the planarized top surface of the planarization dielectric layer 770 may be coplanar with a top surface of the dielectric liners (761, 762). Subsequently, the planarization dielectric layer 770 and the dielectric liners (761, 762) may be removed from an area to physically expose a top surface of the substrate semiconductor layer 9. As used herein, a surface is "physically exposed" if the surface is in physical contact with vacuum, or a gas phase material (such as air).

An optional semiconductor material layer 10 may be formed on the top surface of the substrate semiconductor layer 9 by deposition of a single crystalline semiconductor material, for example, by selective epitaxy. The deposited semiconductor material may be the same as, or may be different from, the semiconductor material of the substrate semiconductor layer 9. The deposited semiconductor material may be any material that may be used for the semiconductor substrate layer 9 as described above. The single crystalline semiconductor material of the semiconductor material layer 10 may be in epitaxial alignment with the single crystalline structure of the substrate semiconductor layer 9. Portions of the deposited semiconductor material located above the top surface of the planarization dielectric layer 770 may be removed, for example, by chemical mechanical planarization (CMP). In this case, the semiconductor material layer 10 may have a top surface that is coplanar with the top surface of the planarization dielectric layer 770. The semiconductor material layer 10 may be doped with electrical dopants of a first conductivity type, which may be p-type or n-type, The region (i.e., area) of the at least one semiconductor device 700 is herein referred to as a peripheral device region 200. The device region in which a memory array may be subsequently formed is herein referred to as a memory array region 100. A contact region 300 for subsequently forming stepped terraces of electrically conductive layers may be provided between the memory array region 100 and the peripheral device region 200. Optionally, a base insulating layer 12 may be formed above the semiconductor material layer 10 and the planarization dielectric layer 770. The base insulating layer 12 may be, for example, silicon oxide layer. The thickness of the base insulating layer 12 may be in a range from 3 nm to 30 nm, although lesser and greater thicknesses may also be used.

Figure 2:
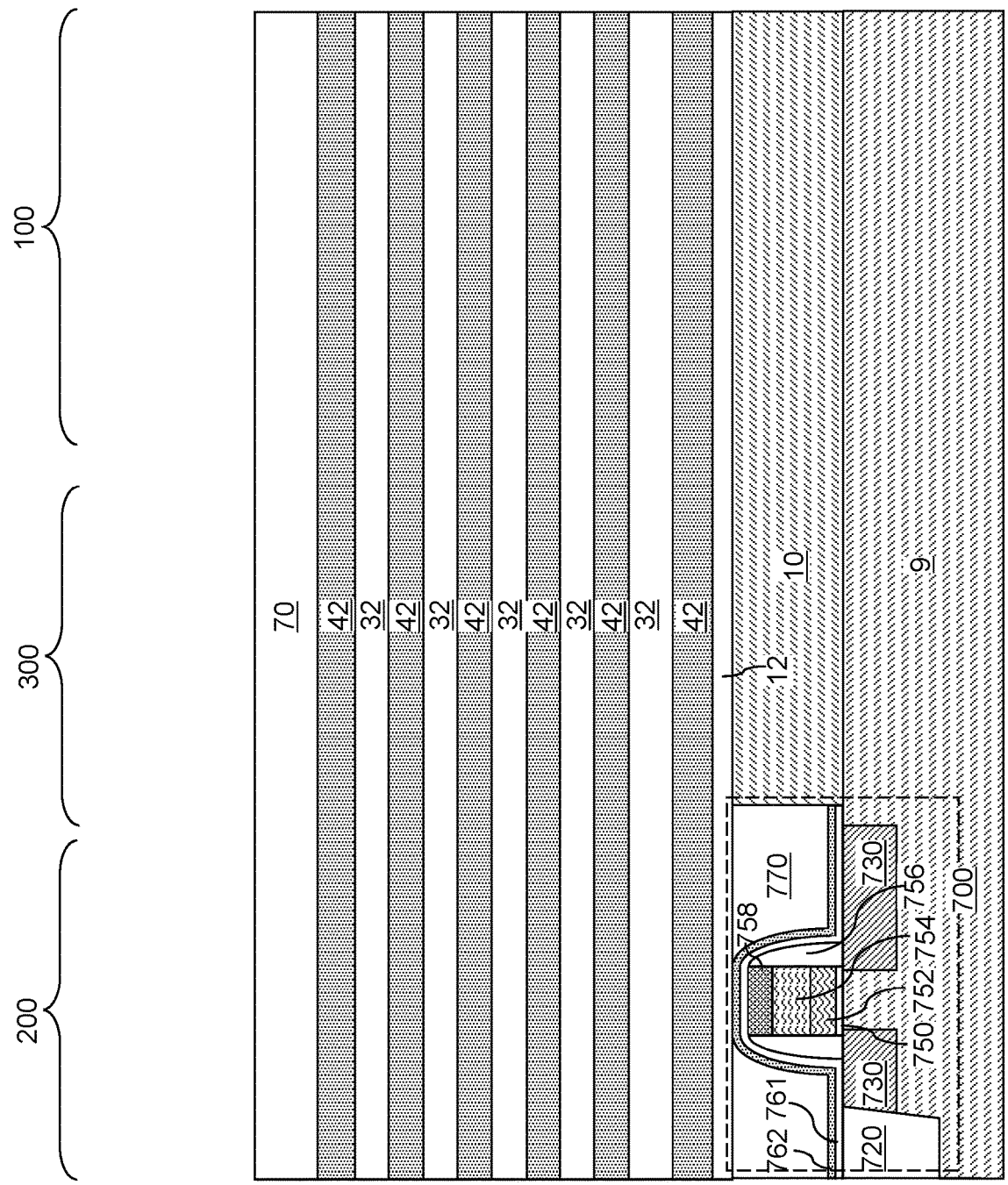
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which may be insulating layers 32) and second material layers (which may be sacrificial material layer 42) may be formed over the top surface of the substrate, which may be, for example, on the top surface of the base insulating layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer may include a first material, and each second material layer may include a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be used for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 may be a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is used for the insulating layers 32, tetraethyl orthosilicate (TEOS) may be used as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be used for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be used. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

While the present disclosure is described using an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 may include a dielectric material that is different from the material of the sacrificial material layers 42. In one embodiment, the insulating cap layer 70 may include a dielectric material that may be used for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Figure 3:
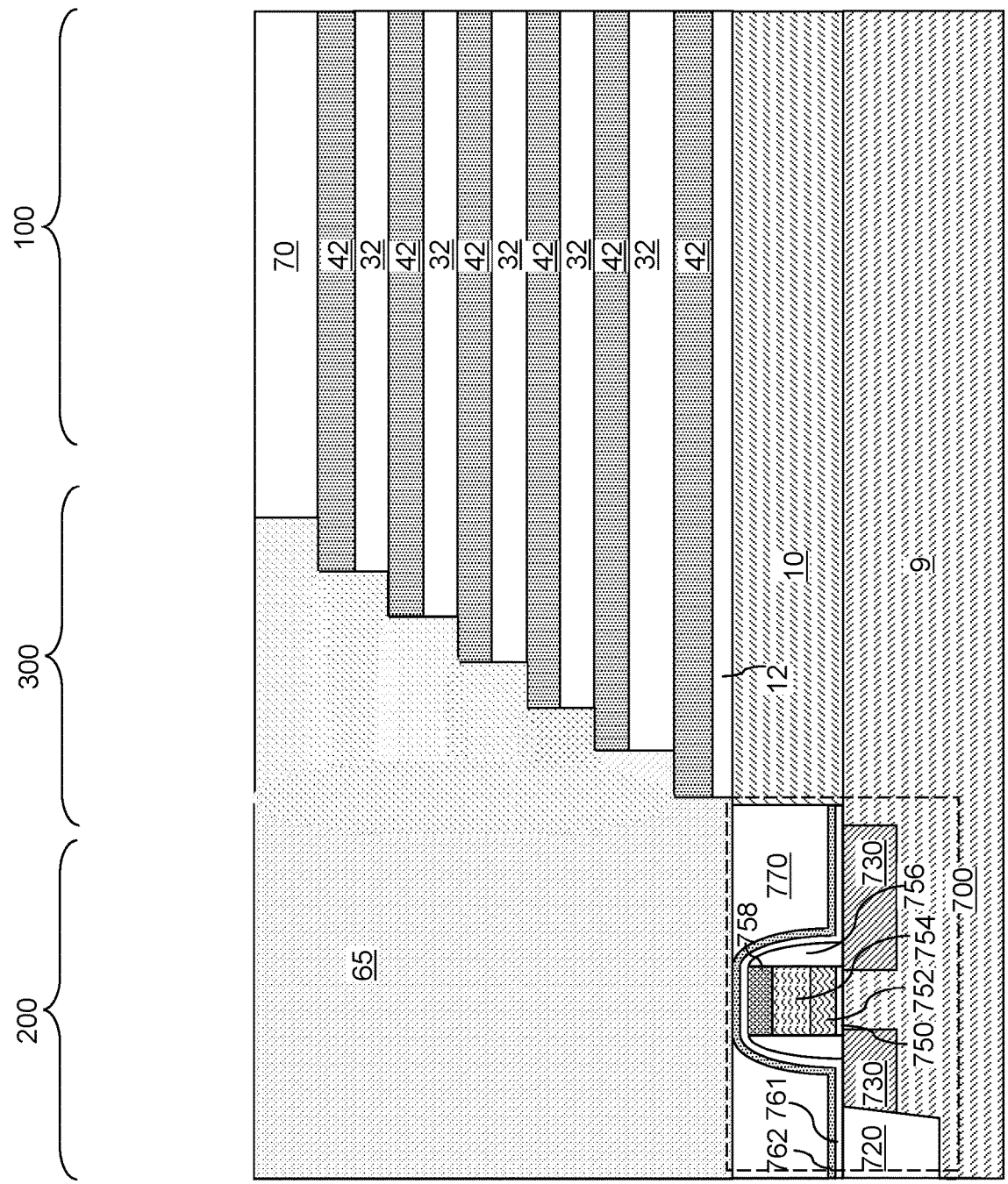
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity may be formed within the contact region 300 which is located between the memory array region 100 and the peripheral device region 200 containing the at least one semiconductor device for the peripheral circuitry. The stepped cavity may have various stepped surfaces such that the horizontal cross-sectional shape of the stepped cavity changes in steps as a function of the vertical distance from the top surface of the substrate (9, 10). In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) may have stepped surfaces after formation of the stepped cavity. As used herein, "stepped surfaces" refer to a set of surfaces that include at least two horizontal surfaces and at least two vertical surfaces such that each horizontal surface may be adjoined to a first vertical surface that extends upward from a first edge of the horizontal surface, and may be adjoined to a second vertical surface that extends downward from a second edge of the horizontal surface. A "stepped cavity" refers to a cavity having stepped surfaces.

A terrace region may be formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity may constitute the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is used for the retro-stepped dielectric material portion 65, the silicon oxide of the retro-stepped dielectric material portion 65 may, or may not, be doped with dopants such as B, P, and/or F.

Optionally, drain-select-level isolation strips (not expressly illustrated) may be formed through the insulating cap layer 70 and a subset of the sacrificial material layers 42 located at drain select levels. The drain-select-level isolation strips are isolation structures formed at the drain side select gate electrode level(s). The drain-select-level isolation strips may be formed, for example, by forming drain select level isolation trenches and filling the drain select level isolation trenches with a dielectric material such as silicon oxide. Excess portions of the dielectric material may be removed from above the top surface of the insulating cap layer 70.

Figure 4B:
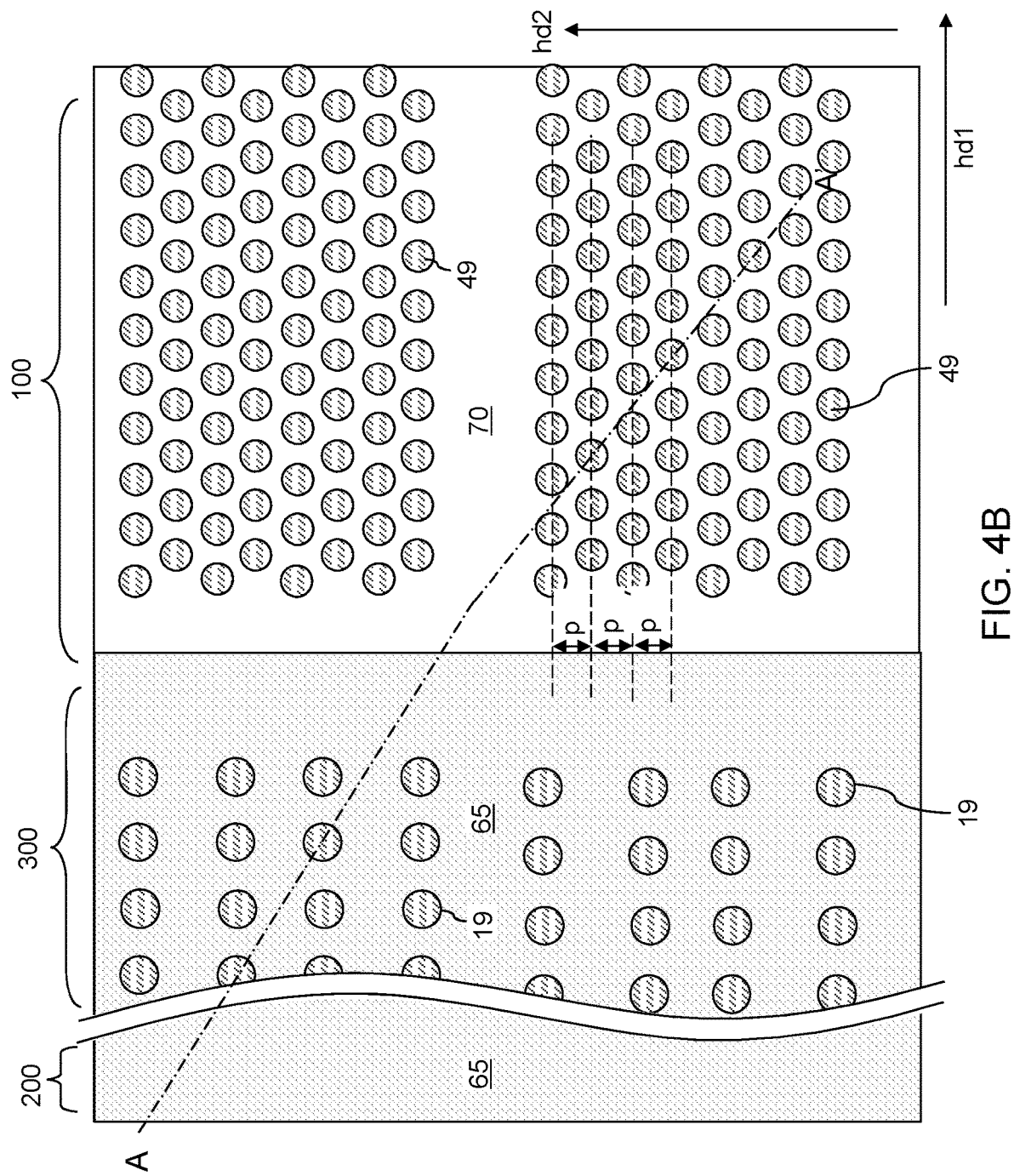
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer may be formed over the insulating cap layer 70 and the retro-stepped dielectric material portion 65, and may be lithographically patterned to form openings therein. The openings may include a first set of openings formed over the memory array region 100 and a second set of openings formed over the contact region 300. The pattern in the lithographic material stack may be transferred through the insulating cap layer 70 or the retro-stepped dielectric material portion 65, and through the alternating stack (32, 42) by at least one anisotropic etch that uses the patterned lithographic material stack as an etch mask. Portions of the alternating stack (32, 42) underlying the openings in the patterned lithographic material stack may be etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 may be formed through the insulating cap layer 70 and the entirety of the alternating stack (32, 42) in the memory array region 100. The support openings 19 may be formed through the retro-stepped dielectric material portion 65 and the portion of the alternating stack (32, 42) that underlie the stepped surfaces in the contact region 300.

The memory openings 49 may extend through the entirety of the alternating stack (32, 42). The support openings 19 may extend through a subset of layers within the alternating stack (32, 42). The chemistry of the anisotropic etch process used to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may be formed through the base insulating layer 12 so that the memory openings 49 and the support openings 19 may extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the recessed top surfaces of the semiconductor material layer 10 by a recess depth. The recess depth may be, for example, in a range from 1 nm to 50 nm, although lesser and greater recess depths may also be used. The overetch is optional, and may be omitted. If the overetch is not performed, the bottom surfaces of the memory openings 49 and the support openings 19 may be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100. A two-dimensional array of support openings 19 may be formed in the contact region 300. The substrate semiconductor layer 9 and the semiconductor material layer 10 collectively constitutes a substrate (9, 10), which may be a semiconductor substrate. Alternatively, the semiconductor material layer 10 may be omitted, and the memory openings 49 and the support openings 19 may be extend to a top surface of the substrate semiconductor layer 9.

FIG. 4B is a top-down view of the first exemplary structure of FIG. 4A. The vertical plane A-A' is the plane of the cross-section for FIG. 4A. In one embodiment shown in FIG. 4B, the memory openings 49 can be formed as a two-dimensional periodic array including rows that extend along a first horizontal direction hd1 (e.g., word line direction) and having a uniform inter-row pitch p along a second horizontal direction hd2 (e.g., bit line direction), which can be perpendicular to the first horizontal direction hd1. In one embodiment, a plurality of two-dimensional periodic arrays can be formed such that each two-dimensional periodic array is formed as a cluster that is laterally spaced from a neighboring two-dimensional periodic array along the second horizontal direction hd2.

Multiple two-dimensional arrays may be formed as clusters of memory openings 49 having multiple rows of memory openings 49. Each row of memory openings 49 may have a one-dimensional periodic array having a first pitch along the first horizontal direction hd1. The rows of memory openings within each cluster may be arranged along the second horizontal direction hd2 with a second pitch, which may be the inter-row pitch p. Thus, each two-dimensional periodic array may include respective rows that extend along the first horizontal direction hd1 and having a uniform inter-row pitch p along the second horizontal direction hd2. The number of rows of memory openings 49 within each two-dimensional array of memory openings 49 may be in a range from 8 to 64, such as from 12 to 32, although lesser and greater numbers may also be used.

FIGS. 5A-5F illustrate structural changes in a memory opening 49, which is one of the memory openings 49 in the first exemplary structure of FIGS. 4A and 4B, during formation of a memory stack structure. The same structural change occurs simultaneously in each of the other memory openings 49 and the support openings 19.

Referring to FIG. 5A, a memory opening 49 in the first exemplary device structure of FIGS. 4A and 4B is illustrated. The memory opening 49 may extend through the insulating cap layer 70, the alternating stack (32, 42), the base insulating layer 12, and optionally into an upper portion of the semiconductor material layer 10. At this processing step, each support opening 19 may extend through the retro-stepped dielectric material portion 65, a subset of layers in the alternating stack (32, 42), the base insulating layer 12, and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 5B, an optional pedestal channel portion (e.g., an epitaxial pedestal) 11 may be formed at the bottom portion of each memory opening 49 and each support openings 19, for example, by selective epitaxy. Each pedestal channel portion 11 may comprises a single crystalline semiconductor material in epitaxial alignment with the single crystalline semiconductor material of the semiconductor material layer 10. In one embodiment, the pedestal channel portion 11 may be doped with electrical dopants of the same conductivity type as the semiconductor material layer 10. In one embodiment, the top surface of each pedestal channel portion 11 may be formed above a horizontal plane including the top surface of a sacrificial material layer 42. In an embodiment, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the substrate (9, 10) and a drain region to be subsequently formed in an upper portion of the memory opening 49. A cavity 49' may be present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor material layer 10 that the pedestal channel portion contacts. If a semiconductor material layer 10 is not present, the pedestal channel portion 11 may be formed directly on the substrate semiconductor layer 9, which may have a doping of the first conductivity type.

Referring to FIG. 5C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively, or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be used. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer. As used herein, a first surface and a second surface are "vertically coincident" if the second surface overlies or underlies the first surface and if there exists a vertical plane including the first surface and the second surface.

In another embodiment, the sacrificial material layers 42 may be laterally recessed with respect to the sidewalls of the insulating layers 32, and a combination of a deposition process and an anisotropic etch process may be used to form the charge storage layer 54 as a plurality of memory material portions that are vertically spaced apart. While the present disclosure is described using an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if used, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively, or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be used.

The tunneling dielectric layer 56 may include a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The optional first semiconductor channel layer 601 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be used. A cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 may be sequentially anisotropically etched using at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' may be removed to form openings in remaining portions thereof. Each of the first semiconductor channel layer 601, the tunneling dielectric layer 56, the charge storage layer 54, and the blocking dielectric layer 52 may be etched by anisotropic etch process.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not used) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' may be vertically recessed so that the recessed semiconductor surface underneath the cavity 49' is vertically offset from the topmost surface of the pedestal channel portion 11 (or of the semiconductor substrate layer 10 in case pedestal channel portions 11 are not used) by a recess distance. A tunneling dielectric layer 56 may be located over the charge storage layer 54. A set of a blocking dielectric layer 52, a charge storage layer 54, and a tunneling dielectric layer 56 in a memory opening 49 may constitute a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Figure 5F:
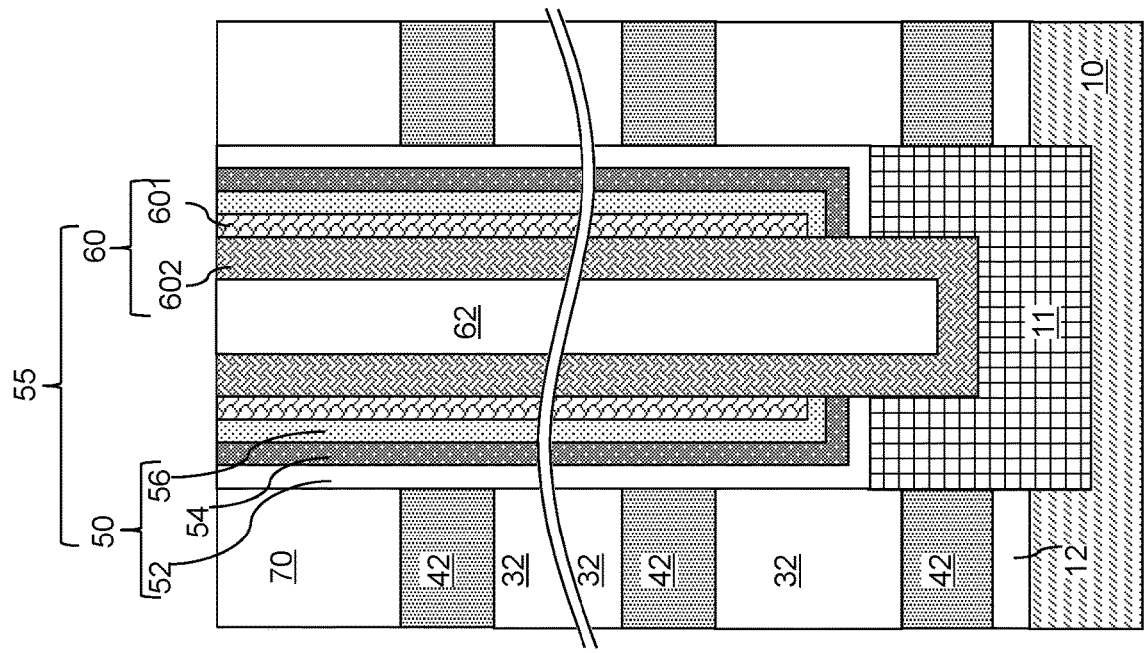
Figure 5E:
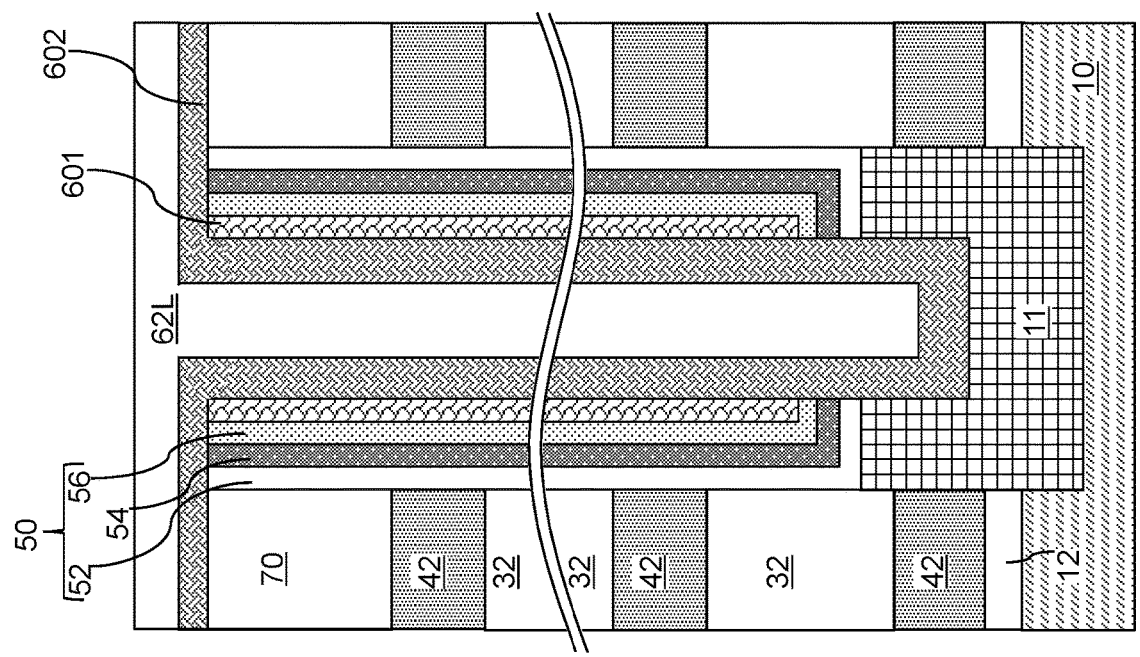

Referring to FIG. 5E, a second semiconductor channel layer 602 may be deposited directly on the semiconductor surface of the pedestal channel portion 11 (or the semiconductor material layer 10 if pedestal channel portions 11 are omitted), and directly on the first semiconductor channel layer 601. The second semiconductor channel layer 602 may include a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 may include amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be used. The second semiconductor channel layer 602 may partially or fully fill the cavity in each memory opening 49.

The materials of the first semiconductor channel layer 601 and the second semiconductor channel layer 602 are collectively referred to as a semiconductor channel material. In other words, the semiconductor channel material may be a set of all semiconductor material in the first semiconductor channel layer 601 and the second semiconductor channel layer 602.

In embodiments in which the memory openings 49 and the support openings 19 are not completely filled with the second semiconductor channel layer 602, a dielectric core material layer 62L including a dielectric material may be deposited in unfilled volumes of the memory openings 49 and support openings 19. The dielectric core material layer 62L may include silicon oxide.

Referring to FIG. 5F, portions of the dielectric core material layer 62L and the second semiconductor channel layer 602 located above the top surface of the insulating cap layer 70 may be removed by a planarization process, which may use a recess etch or chemical mechanical planarization (CMP). Each remaining portion of the second semiconductor channel layer 602 may be located entirety within a memory opening 49 or entirely within a support opening 19. Each remaining portion of the dielectric core material layer 62L may be located entirely within a memory opening 49 or entirely within a support opening 19, and is herein referred to as a dielectric core 62.

Each adjoining pair of a first semiconductor channel layer 601 and a second semiconductor channel layer 602 can collectively form a memory level channel portion 60 through which electrical current can flow when a vertical NAND device including the memory level channel portion 60 is turned on. A tunneling dielectric layer 56 is surrounded by a charge storage layer 54, and laterally surrounds a portion of the memory level channel portion 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. Each combination of a memory film 50 and a memory level channel portion 60 (which is a portion of a vertical semiconductor channel) within a memory opening 49 constitutes a memory stack structure 55. As used herein, a macroscopic retention time refers to a retention time suitable for operation of a memory device as a permanent memory device such as a retention time in excess of 24 hours.

Figure 6A:
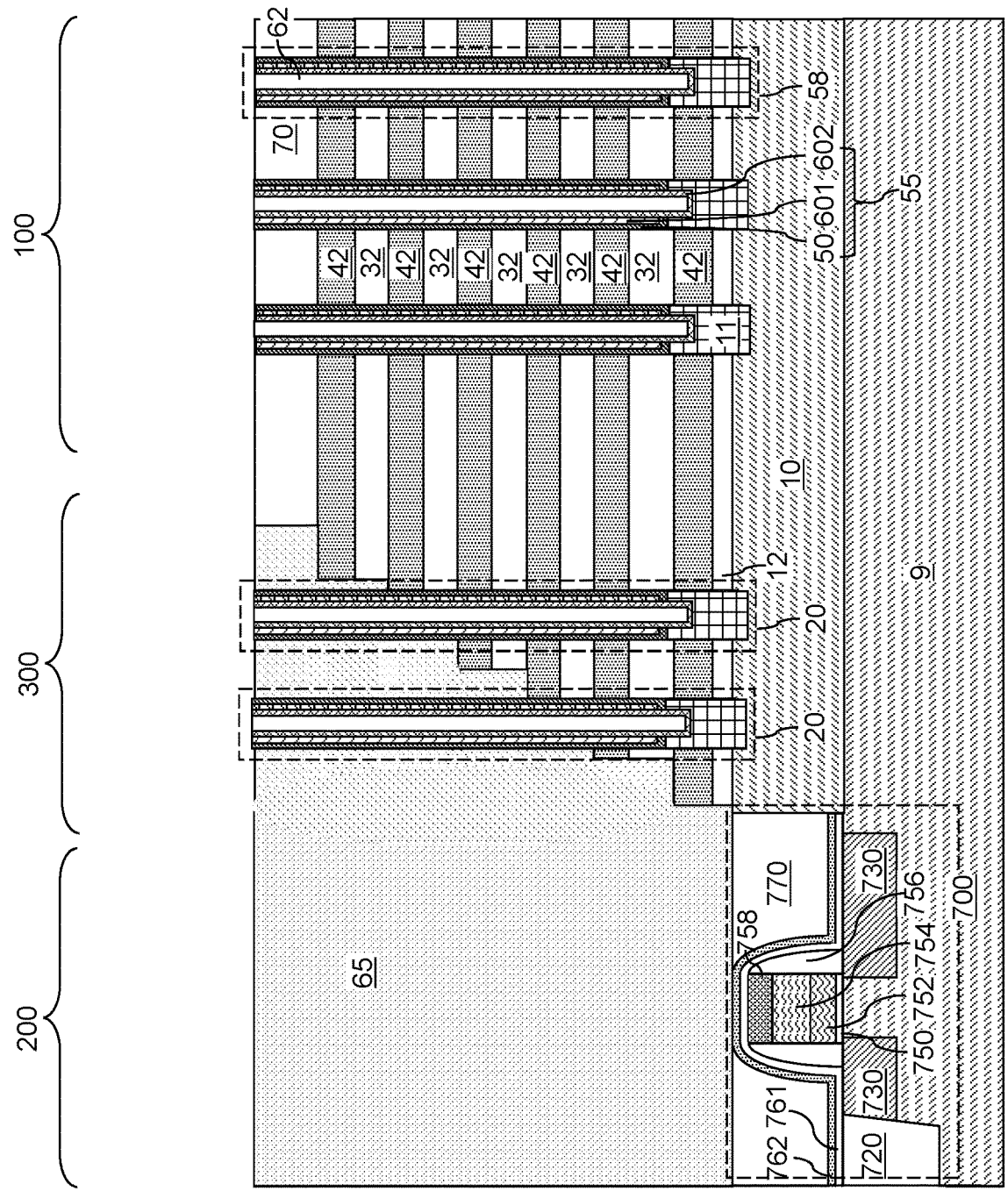
FIG. 6A is a schematic vertical cross-sectional view of the first exemplary structure after formation of the memory stack structures according to the first embodiment of the present disclosure.
Figure 6B:
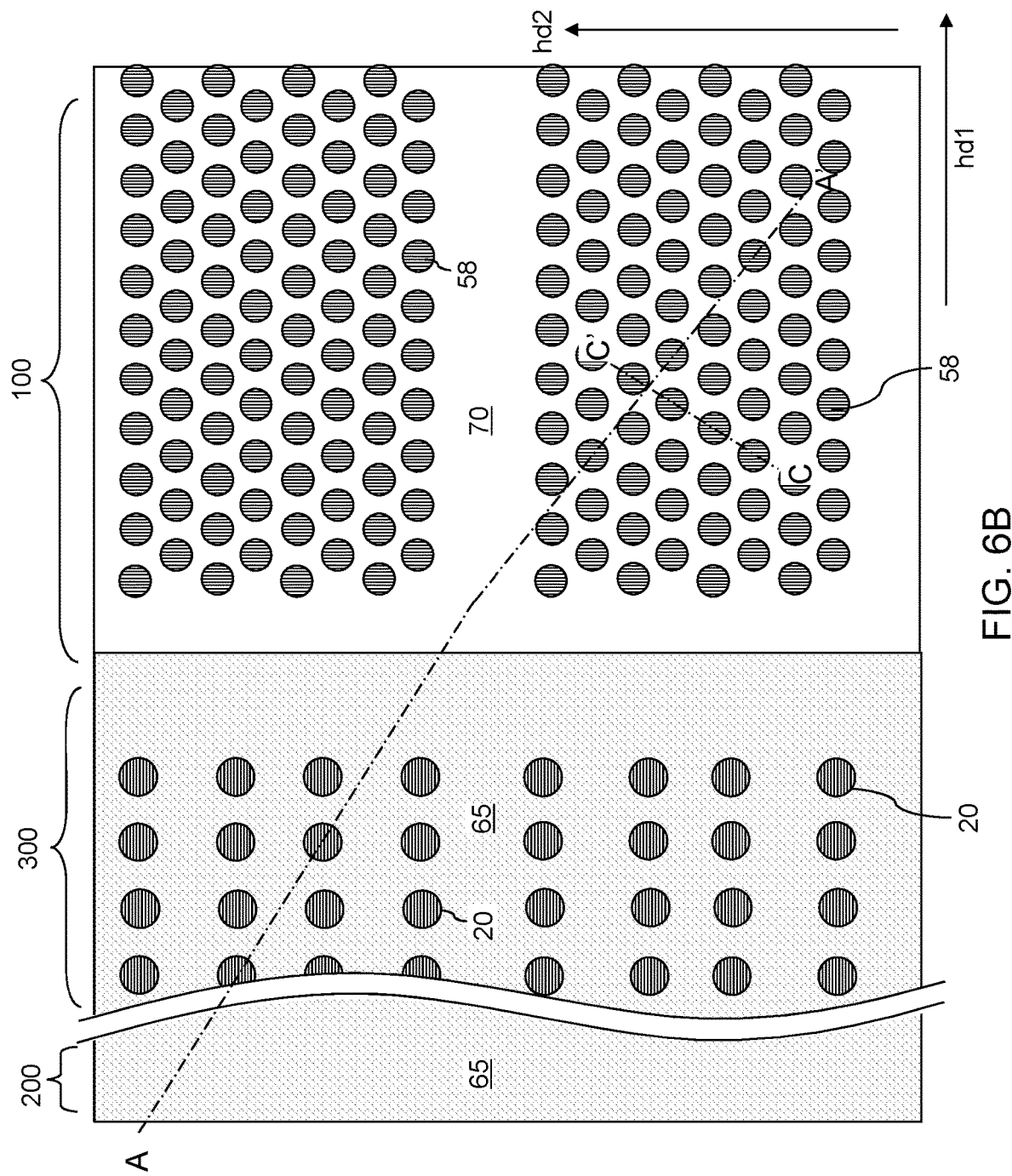
FIG. 6B is a top-down view of the first exemplary structure of FIG. 6A. The vertical plane A-A' is the plane of the cross-section for FIG. 6A.
Figure 6C:
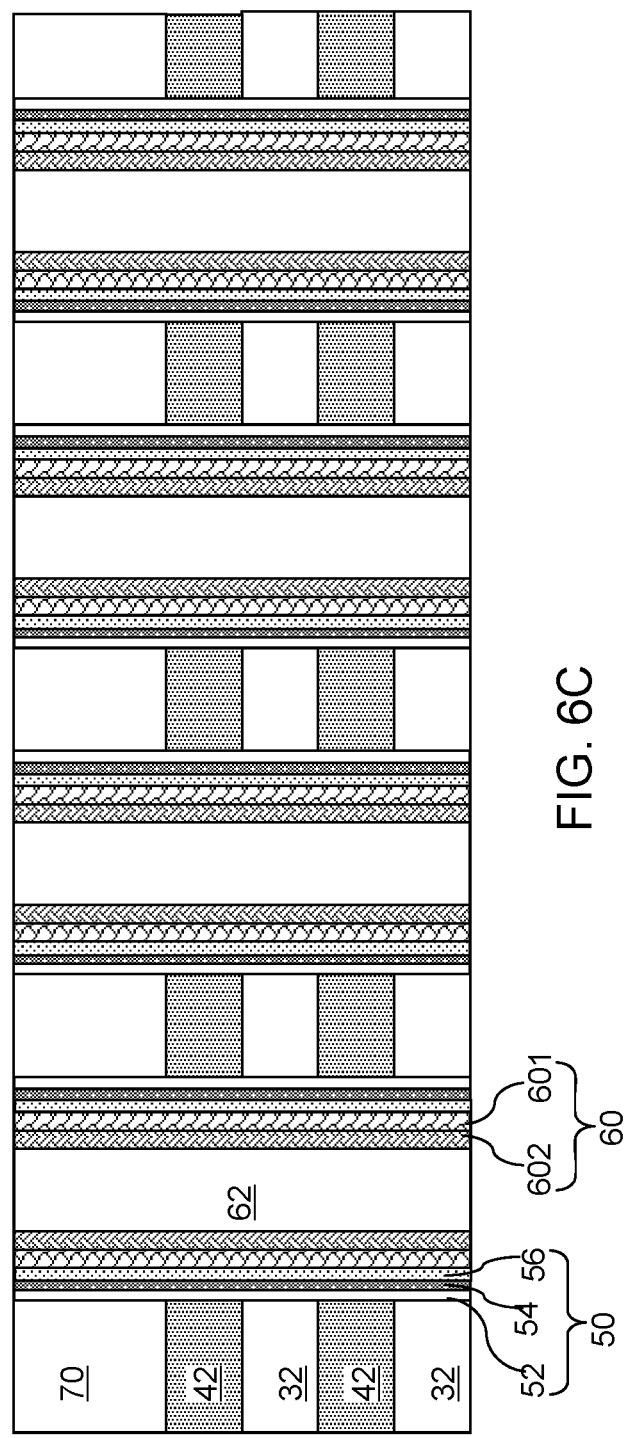
FIG. 6C is a vertical cross-sectional view of the first exemplary structure along the vertical plane C-C' of FIG. 6B.

Referring to FIGS. 6A-6C, the first exemplary structure is illustrated after the processing steps of FIG. 5F. FIG. 6A is a schematic vertical cross-sectional view of the first exemplary structure after formation of the memory stack structures according to the first embodiment of the present disclosure. FIG. 6B is a top-down view of the first exemplary structure of FIG. 6A. The vertical plane A-A' is the plane of the cross-section for FIG. 6A. FIG. 6C is a vertical cross-sectional view of the first exemplary structure along the vertical plane C-C' of FIG. 6B. Each combination of a memory film 50 and a memory level channel portion 60 (which is a portion of a vertical semiconductor channel) within a memory opening 49 constitutes a memory stack structure 55. The memory stack structure 55 is a combination of a memory level channel portion 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, and an optional dielectric core 62 located in a memory opening 49 is herein referred to as a memory opening fill structure 58. Each combination of a pedestal channel portion 11 (if present), a memory film 50, a memory level channel portion 60, and an optional dielectric core 62 within each support opening 19 fills the respective support openings 19, and constitutes a support pillar structure 20 (i.e., a dummy structure which is not electrically connected to a bit line).

An instance of a memory opening fill structure 58 may be formed within each memory opening 49 of the structure of FIGS. 4A and 4B. An instance of the support pillar structure 20 may be formed within each support opening 19 of the structure of FIGS. 4A and 4B. Each exemplary memory stack structure 55 includes a memory-level channel portion 60, which may comprise multiple semiconductor channel layers (601, 602), and a memory film 50. The memory film 50 may comprise a tunneling dielectric layer 56 laterally surrounding the memory-level channel portion 60 and a vertical stack of charge storage regions laterally surrounding the tunneling dielectric layer 56 (comprising a memory material layer 54) and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the memory-level channel portion 60.

Figure 7A:
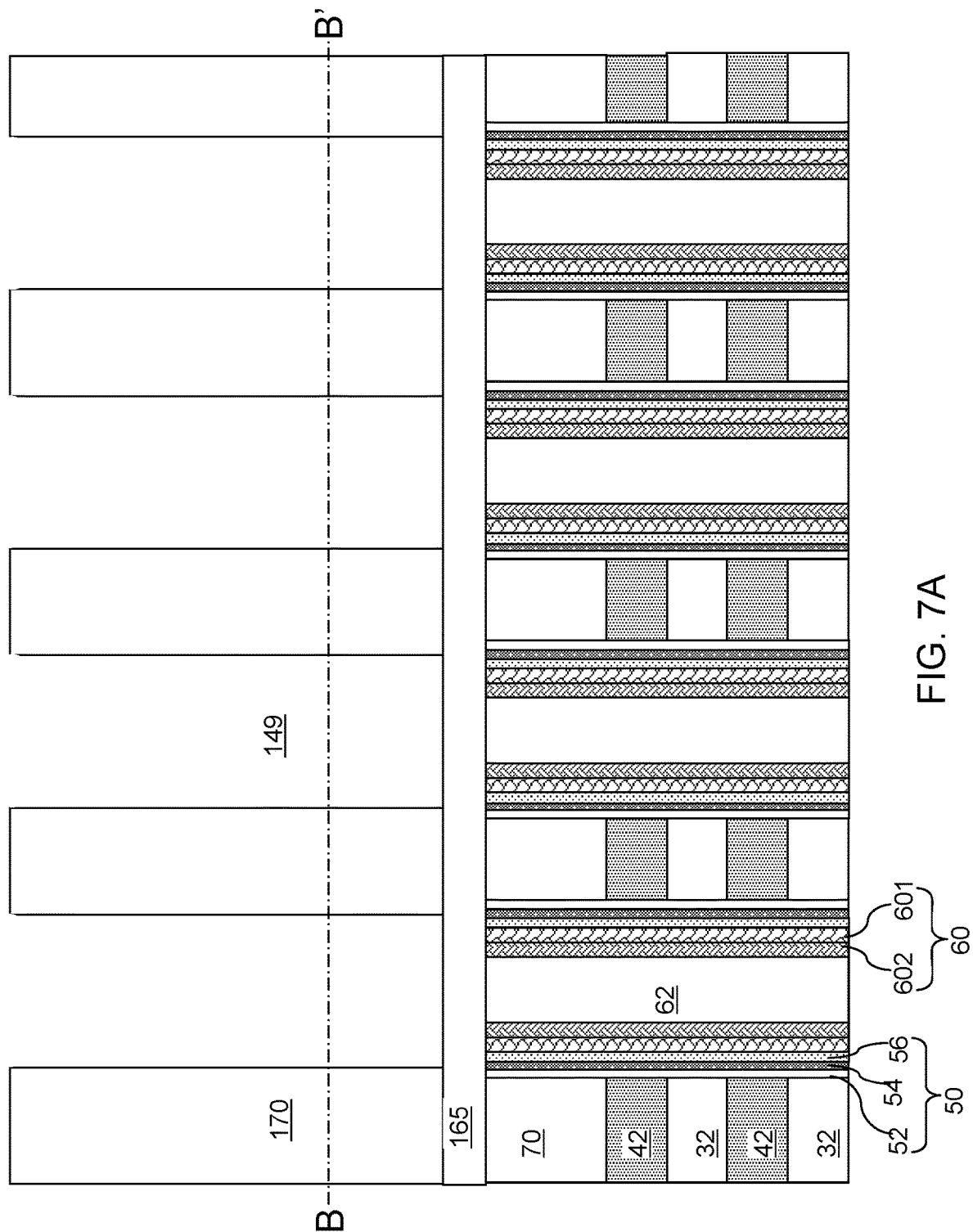
FIG. 7A is a vertical cross-sectional view of the first exemplary structure after formation of an insulating spacer layer, a first dielectric template layer, and an array of cylindrical openings according to the first embodiment of the present disclosure.
Figure 7B:
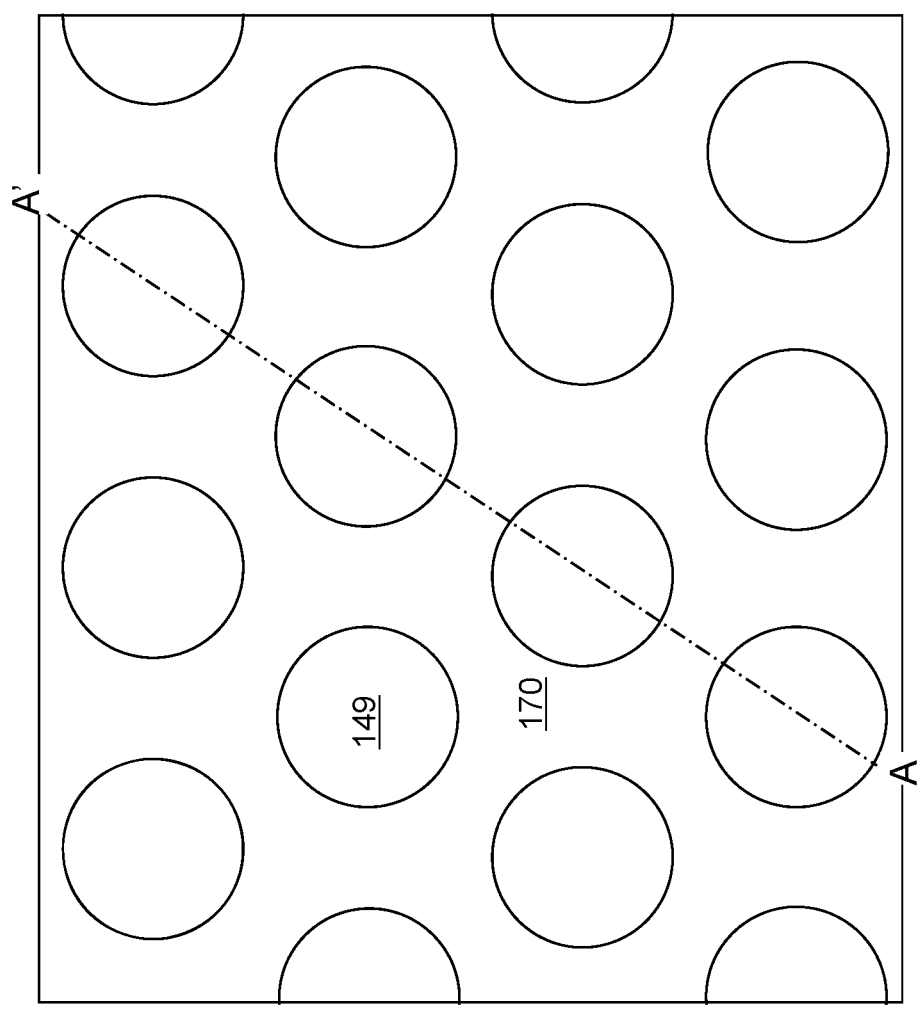
FIG. 7B is a top-down view of the first exemplary structure of FIG. 7A. The vertical plane A-A' is the plane of the cross-section for FIG. 7A.

FIG. 7A is a vertical cross-sectional view of the first exemplary structure after formation of an insulating spacer layer, a first dielectric template layer, and an array of cylindrical openings according to the first embodiment of the present disclosure. FIG. 7B is a top-down view of the first exemplary structure of FIG. 7A. The vertical plane A-A' is the plane of the cross-section for FIG. 7A. Referring to FIGS. 7A and 7B, an insulating spacer layer 165 can be optionally formed. The insulating spacer layer 165 can include a dielectric material such as silicon oxide, a dielectric metal oxide, or silicon oxynitride, and can have a thickness in a range from 5 nm to 100 nm, although lesser and greater thicknesses can also be employed.

A first dielectric template layer 170 may be formed over the insulating spacer layer 165. The first dielectric template layer 170 may include doped silicate glass or undoped silicate glass (e.g., silicon oxide). The thickness of the first dielectric template layer 170 may be in a range from 150 nm to 600 nm, although lesser and greater thicknesses may also be used.

Arrays of cylindrical openings 149 may be formed through the first dielectric template layer. The array of cylindrical openings 149 may have the same periodicity as the memory openings 49 and the support openings 19. In one embodiment, a photoresist layer (not shown) may be applied over the first dielectric template layer 170, and the same lithographic mask that forms the pattern for the memory openings 49 and the support openings 19 may be used to pattern the photoresist layer. The pattern in the photoresist layer may be subsequently transferred through the first dielectric template layer 170 to form the arrays of cylindrical openings 149.

In one embodiment, each of the cylindrical openings 149 may be aligned to an underlying one of the memory opening fill structures 58 and the support opening fill structures 20. Thus, a vertical axis passing through the geometrical center of each cylindrical opening 149 may coincide with, or may be laterally offset by less than the overlay tolerance of the lithographic alignment process used during patterning of the photoresist later from a vertical axis passing through the geometrical center of the underlying one of the memory opening fill structures 58 and the support opening fill structures 20. Generally, the same lithographic mask used to pattern the memory openings 49 and the support openings 19 may be used to form the array of cylindrical openings 149. Thus, each array of cylindrical openings 149 overlying an array of the memory stack structures 58 may have the same periodicity as the array of memory stack structures 58 along the first horizontal direction hd1 and the second horizontal direction hd2.

The lateral dimensions of the cylindrical openings 149 may be the same as, may be greater than, or may be less than, the lateral dimensions of the memory openings 49 or the support openings 19 depending on the exposure conditions during lithographic patterning of the photoresist layer. The cylindrical openings 149 may have any two-dimensional closed shape that generally matches the horizontal cross-sectional shape of the underlying memory opening 49 or the underlying support opening 19.

Figure 8A:
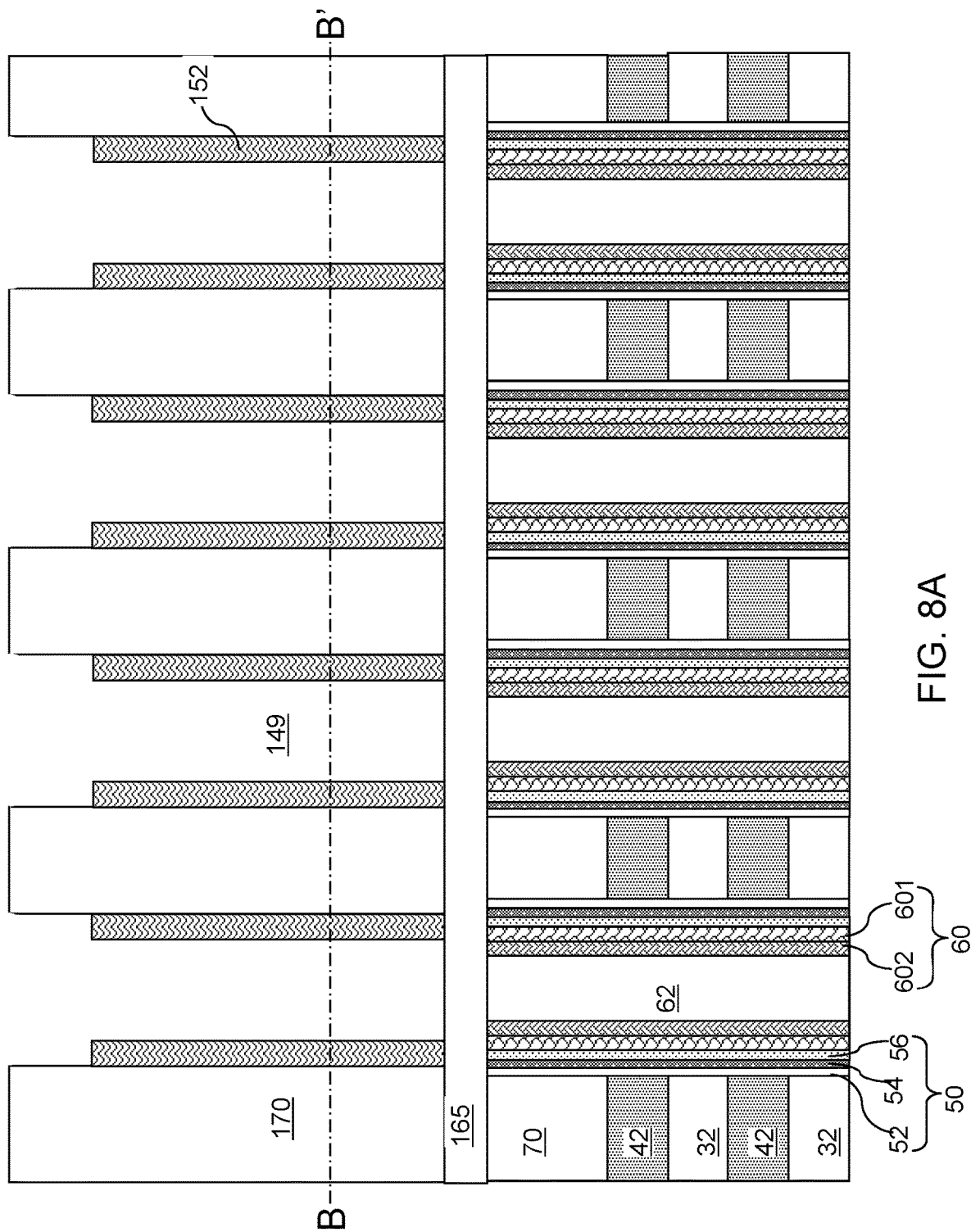
FIG. 8A is a vertical cross-sectional view of the first exemplary structure after formation of cylindrical electrode portions according to the first embodiment of the present disclosure.
Figure 8B:
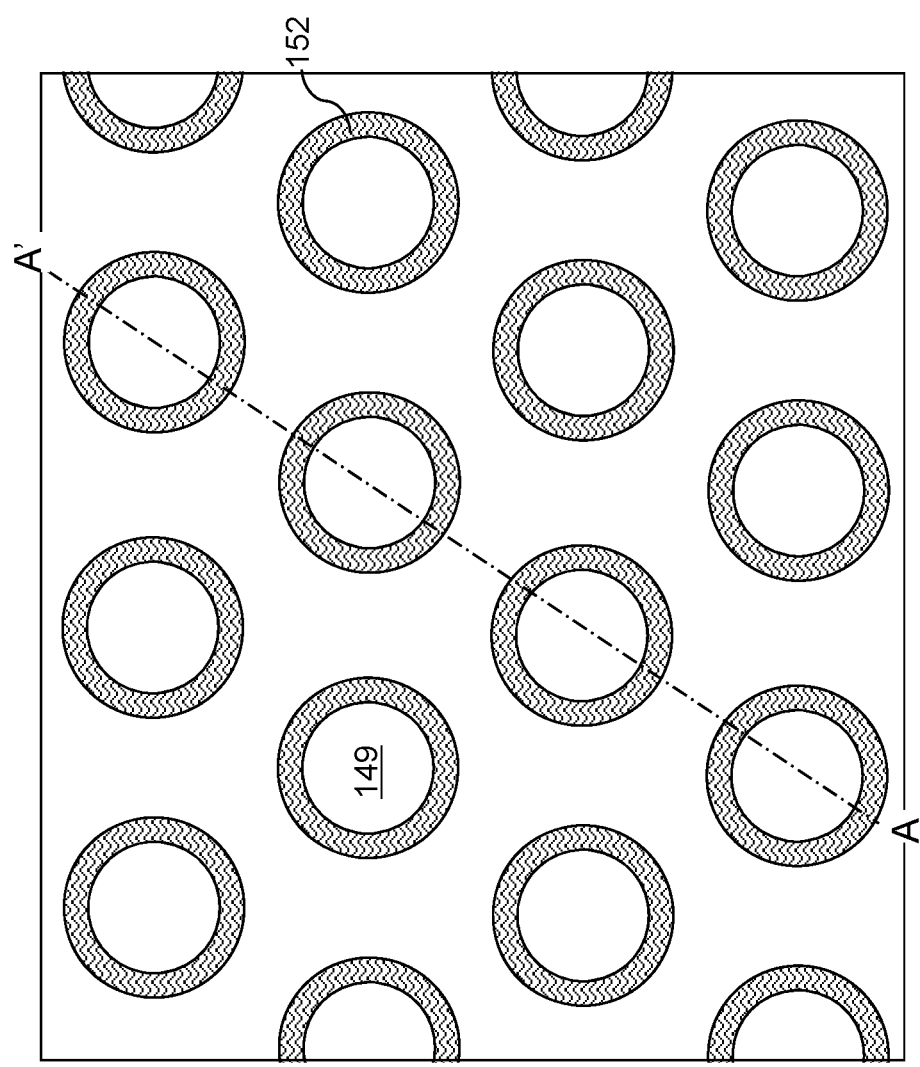
FIG. 8B is a top-down view of the first exemplary structure of FIG. 8A. The vertical plane A-A' is the plane of the cross-section for FIG. 8A.

FIG. 8A is a vertical cross-sectional view of the first exemplary structure after formation of cylindrical electrode portions according to the first embodiment of the present disclosure. FIG. 8B is a top-down view of the first exemplary structure of FIG. 8A. The vertical plane A-A' is the plane of the cross-section for FIG. 8A. Referring to FIGS. 8A and 8B, a conductive material is conformally deposited in the cylindrical cavities 149, and is subsequently anisotropically etched to form cylindrical electrode portions 152. Each of the cylindrical electrode portions 149 can have a cylindrical configuration with a uniform thickness, which can be in a range from 3 nm to 50 nm, although lesser and greater thicknesses can also be employed. The conductive material can include a metallic material or a doped semiconductor material. For example, the conductive material can include a metallic nitride (such as TiN) or doped polysilicon. The top surfaces of the cylindrical electrode portions 152 can be vertically recessed below the horizontal plane including the top surface of the first dielectric template layer 170.

Figure 9A:
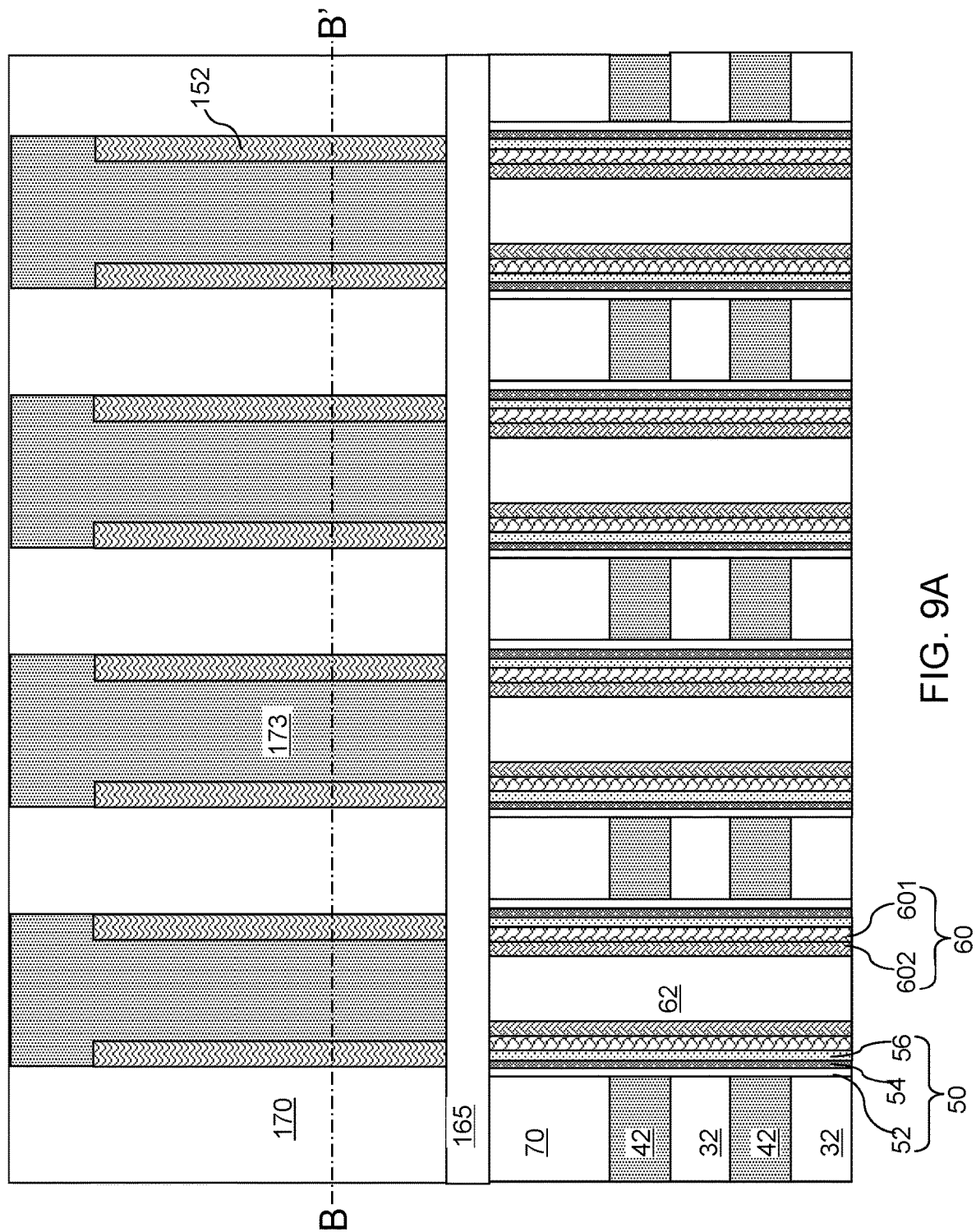
FIG. 9A is a vertical cross-sectional view of the first exemplary structure after formation of sacrificial pedestals according to the first embodiment of the present disclosure.
Figure 9B:
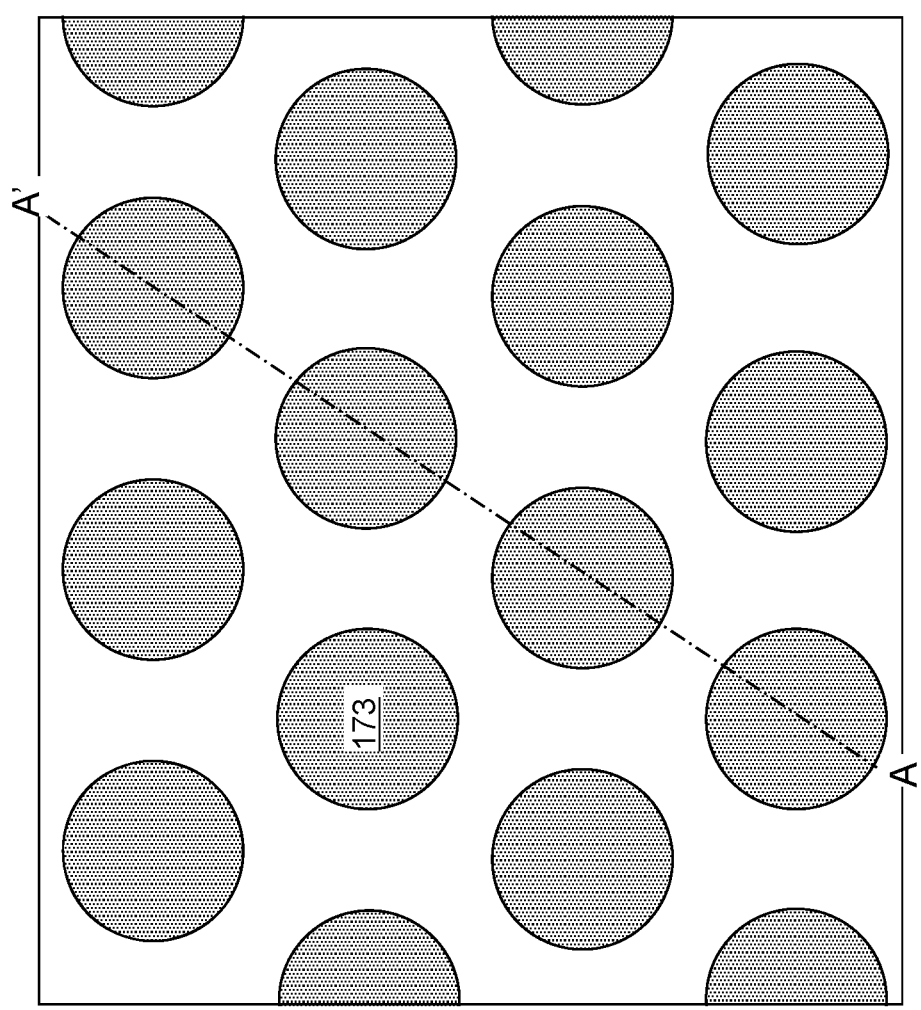
FIG. 9B is a top-down view of the first exemplary structure of FIG. 9A. The vertical plane A-A' is the plane of the cross-section for FIG. 9A.

FIG. 9A is a vertical cross-sectional view of the first exemplary structure after formation of sacrificial pedestals according to the first embodiment of the present disclosure. FIG. 9B is a top-down view of the first exemplary structure of FIG. 9A. The vertical plane A-A' is the plane of the cross-section for FIG. 9A. Referring to FIGS. 9A and 9B, a sacrificial fill material is deposited in remaining volumes of the cylindrical cavities 149. The sacrificial fill material includes a material that can be removed selective to the materials of the insulating spacer layer 165, the first dielectric template layer 170, and the cylindrical electrode portions 152. For example, the sacrificial fill material can include silicon nitride, a semiconductor material (in case the cylindrical electrode portions 152 include a different semiconductor material or a metallic material), amorphous or polycrystalline carbon, or a silicon-containing polymer material. Excess portions of the sacrificial fill material can be removed from above the horizontal plane including the top surface of the first dielectric template layer 170 by a planarization process. Chemical mechanical planarization and/or a recess etch can be employed for the planarization process.

Each remaining portion of the sacrificial fill material in the cylindrical openings 149 may have a structure of a pedestal, and is herein referred to as a sacrificial pedestal 173. Each sacrificial pedestal 173 may be a lower portion formed within a cylindrical electrode portion 152 and having a first uniform horizontal cross-sectional shape, and an upper portion overlying the lower portion and having a second uniform horizontal cross-sectional shape. The second uniform horizontal cross-sectional shape may be laterally offset outward from (i.e., be wider than) the first uniform horizontal cross-sectional shape by the thickness of the cylindrical electrode portion 152. The sacrificial pedestals 173 may be formed within unfilled volumes of the array of cylindrical openings 149 after formation of the cylindrical electrode portions 152. The combination of the first dielectric template layer 170 and the cylindrical electrode portions 152 may function as the matrix for forming the sacrificial pedestals 173.

Figure 10:
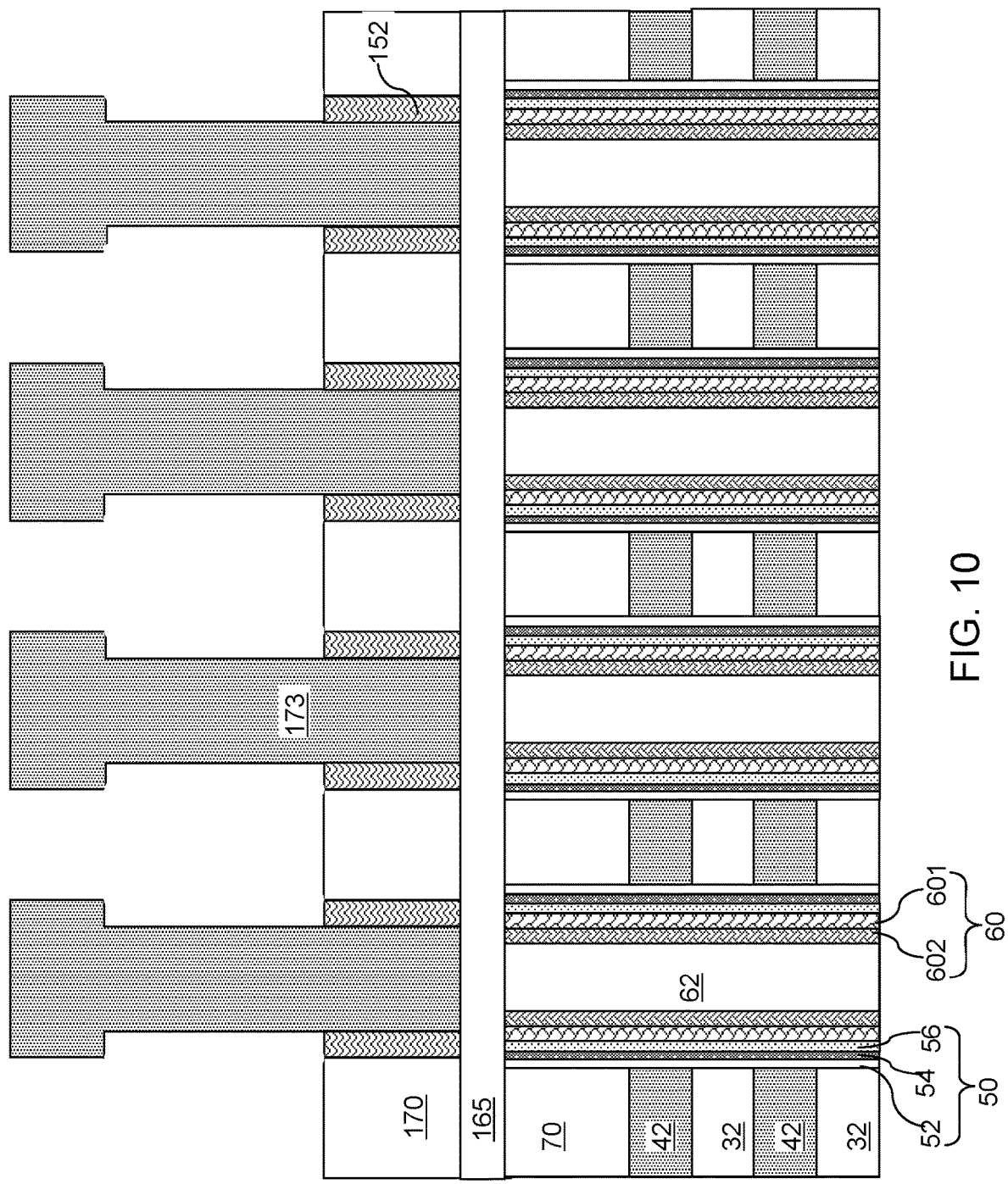
FIG. 10 is a vertical cross-sectional view of the first exemplary structure after recessing the first dielectric template layer according to the first embodiment of the present disclosure.

Referring to FIG. 10, the first dielectric template layer 170 may be vertically recessed selective to the material of the sacrificial pedestals 173 such that the height of the remaining portion of the first dielectric template layer 170 is about the gate length of the vertical field effect transistors (e.g., the gate length of the drain side select gate transistors) to be subsequently formed at the level of the of the first dielectric template layer 170. For example, the height of the first dielectric template layer 170 after vertically recessing the first dielectric template layer 170 may be in a range from 30 nm to 300 nm, although lesser and greater heights may also be used. The vertical recessing of the first dielectric template layer 170 may be performed by an isotropic etch process or an anisotropic etch process that is selective to the material of the sacrificial pedestals 173. In an illustrative example, if the first dielectric template layer 170 includes silicon oxide and if the sacrificial pedestals 173 include silicon nitride, the first dielectric template layer 170 may be vertically recessed by a wet etch process using hydrofluoric acid.

Subsequently, the cylindrical electrode portions 152 may optionally be trimmed from above the horizontal plane including the recessed top surface of the first dielectric template layer 170, for example, by an isotropic etch process that etches the material of the cylindrical electrode portions 152. The isotropic etch process may be selective to the materials of the sacrificial pedestals 173 and the first dielectric template layer 170. A plurality of cylindrical electrode portions 152 may be formed over the alternating stack (32, 42) and within the first dielectric template layer 170.

Figure 11:
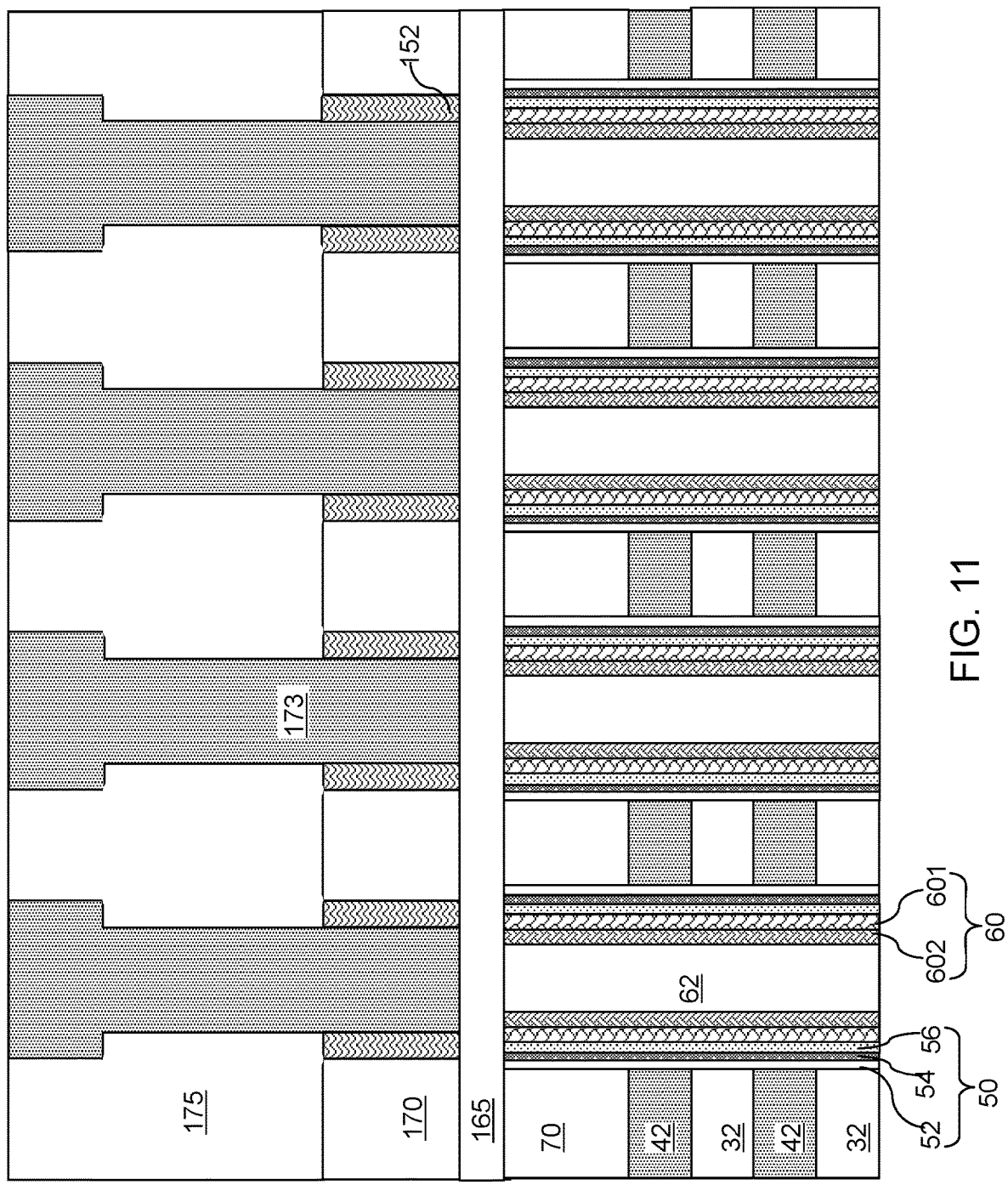
FIG. 11 is a vertical cross-sectional view of the first exemplary structure after formation of a second dielectric template layer according to the first embodiment of the present disclosure.

Referring to FIG. 11, a second dielectric template layer 175 may be formed by depositing a dielectric material around the sacrificial pedestals 173. Excess portions of the dielectric material may be removed from above the horizontal plane including the top surfaces of the sacrificial pedestals 173 by a planarization process such as chemical mechanical planarization. The second dielectric template layer 175 includes a dielectric material that is different from the material of the sacrificial pedestals 173. For example, the second dielectric template layer 175 may include doped silicate glass or undoped silicate glass (e.g., silicon oxide). The dielectric material of the second dielectric template layer 175 may be the same as, or may be different from, the dielectric material of the first dielectric template layer 170. The top surface of the second dielectric template layer 175 may be within the same horizontal plane as the top surfaces of the sacrificial pedestals 173.

Figure 12A:
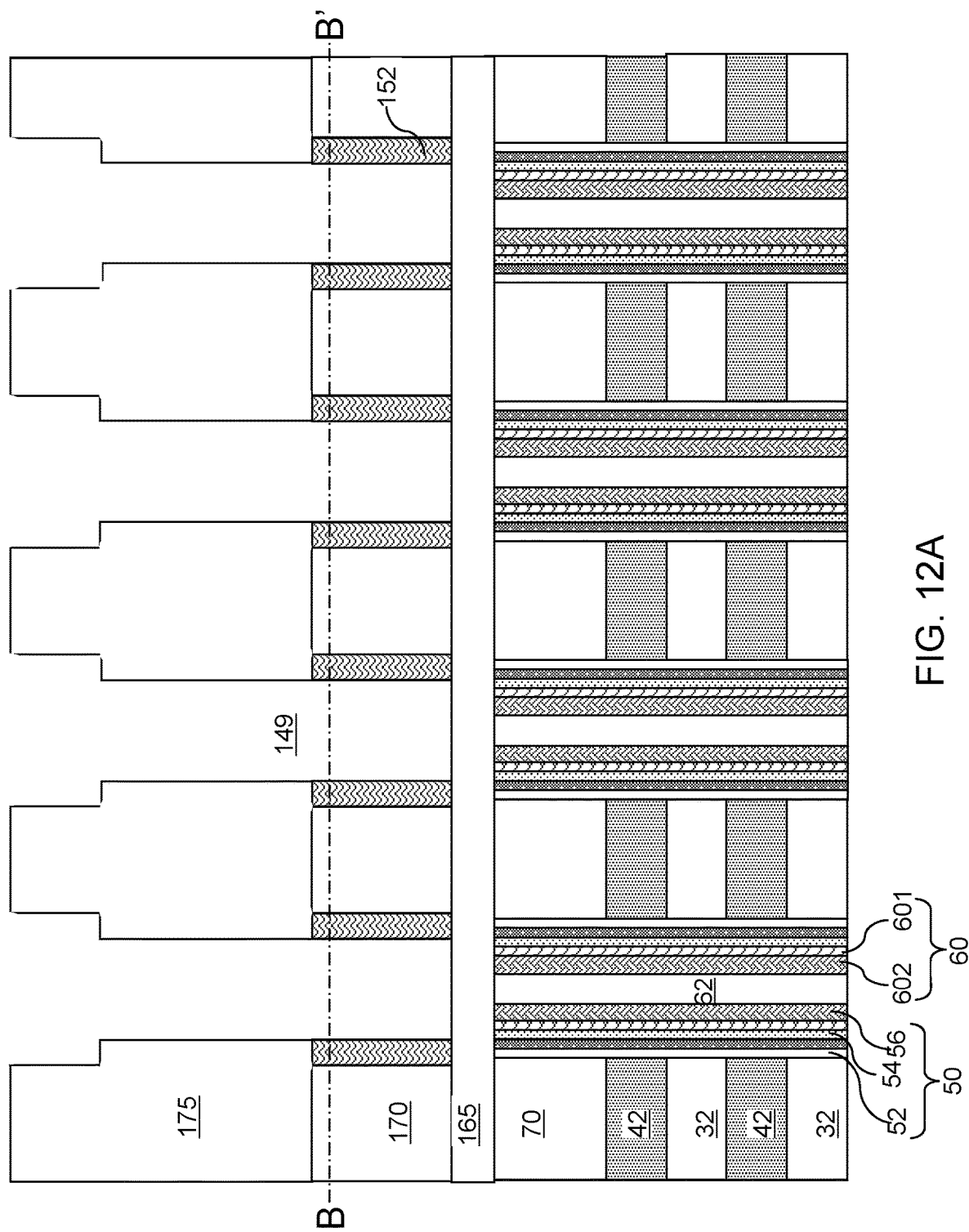
FIG. 12A is a vertical cross-sectional view of the first exemplary structure after removal of sacrificial pedestals according to the first embodiment of the present disclosure.
Figure 12B:
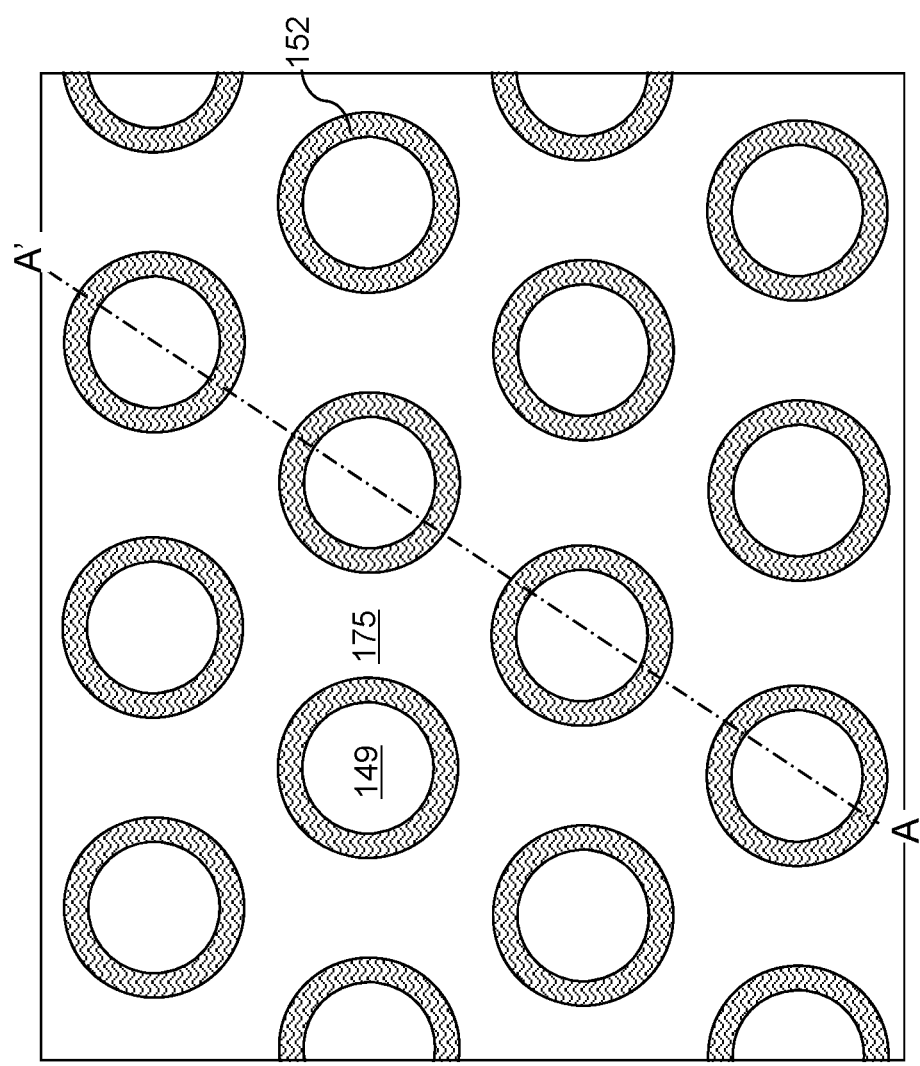
FIG. 12B is a top-down view of the first exemplary structure of FIG. 12A. The vertical plane A-A' is the plane of the cross-section for FIG. 12A.

FIG. 12A is a vertical cross-sectional view of the first exemplary structure after removal of sacrificial pedestals according to the first embodiment of the present disclosure. FIG. 12B is a top-down view of the first exemplary structure of FIG. 12A. The vertical plane A-A' is the plane of the cross-section for FIG. 12A. Referring to FIGS. 12A and 12B, the sacrificial pedestals 173 can be removed selective to the second dielectric template layer 175, the cylindrical electrode portions 152, and the insulating spacer layer 165 by an etch process. In an illustrative example, if the sacrificial pedestals 173 include silicon nitride, a wet etch employing hot phosphoric acid can be employed to remove the sacrificial pedestals 173 selective to the second dielectric template layer 175, the cylindrical electrode portions 152, and the insulating spacer layer 165. Cylindrical cavities 149 are present within the cylindrical electrode portions 152 after removal of the sacrificial pedestals 173. Inner sidewalls of the plurality of cylindrical electrode portions 152 are physically exposed to the cylindrical cavities 149.

Figure 13:
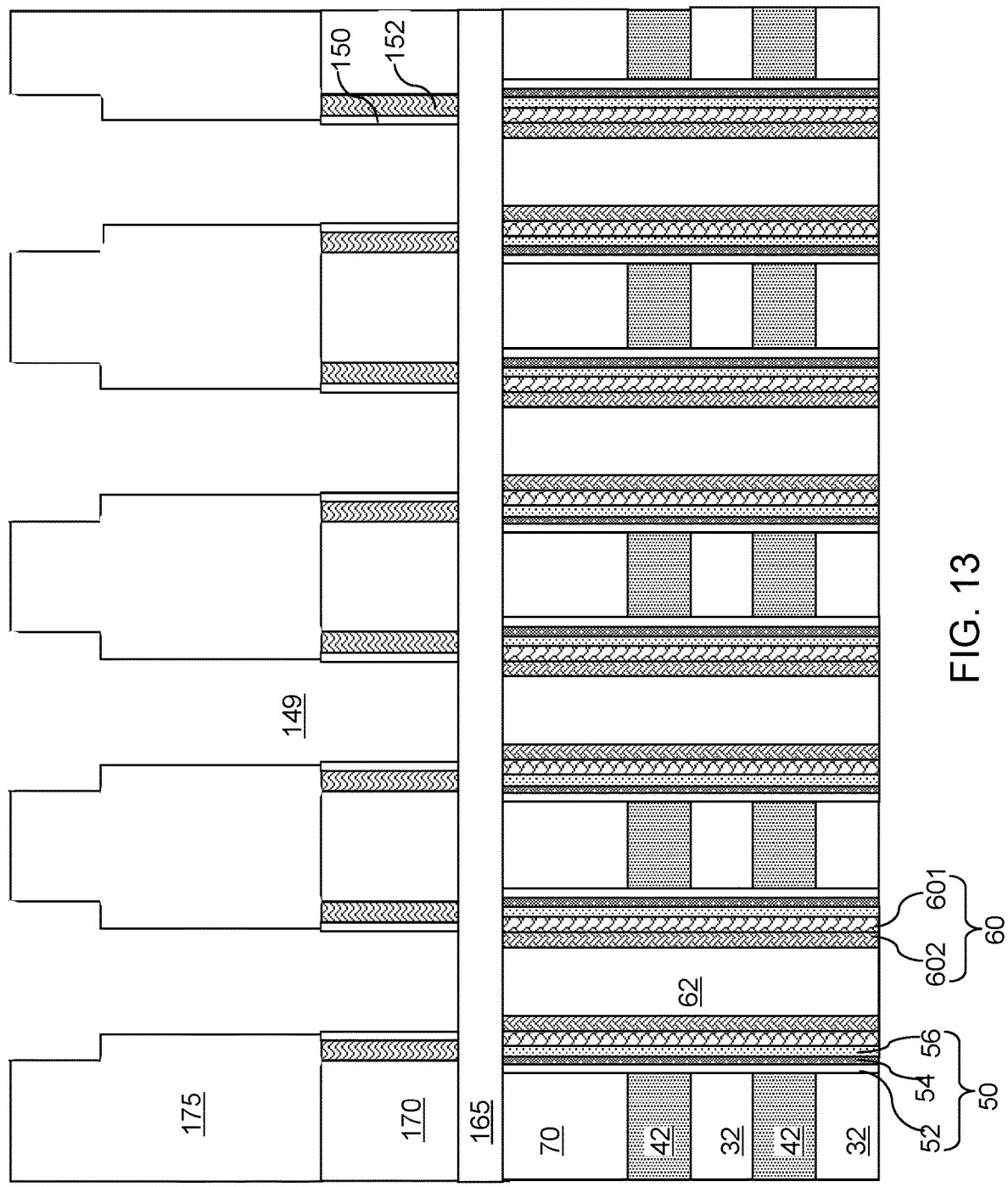
FIG. 13 is a vertical cross-sectional view of the first exemplary structure after formation of gate dielectrics according to the first embodiment of the present disclosure.

Referring to FIG. 13, a plurality of gate dielectrics 150 may be formed on the inner sidewalls of the plurality of cylindrical electrode portions 152. The plurality of gate dielectrics 150 may be formed by deposition of a conformal gate dielectric layer such as a silicon oxide layer and/or a dielectric metal oxide layer. In embodiments in which the cylindrical electrode portions 152 include a semiconductor material, conversion (such as oxidation and/or nitridation) of surface portions of the cylindrical electrode portions 152 from the inner sidewalls of the cylindrical electrode portions 152 may be used in lieu of, or in addition to, deposition of the conformal gate dielectric layer. While the present disclosure is illustrated only for an embodiment in which surface portions of the cylindrical electrode portions 152 are converted into gate dielectrics 150, alternative methods of forming gate dielectrics may be are expressly contemplated herein.

Figure 14A:
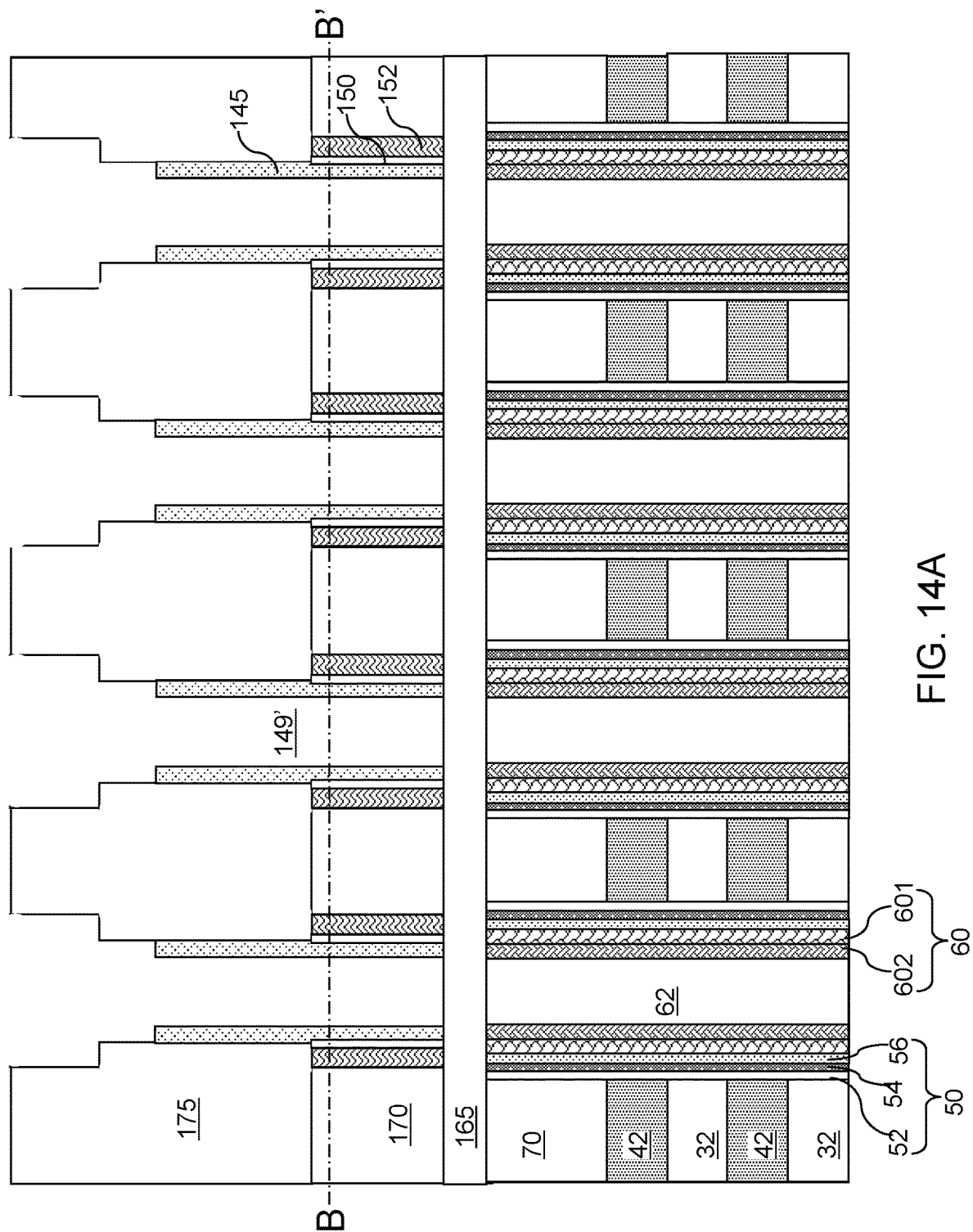
FIG. 14A is a vertical cross-sectional view of the first exemplary structure after formation of a cover spacer layer according to the first embodiment of the present disclosure.
Figure 14B:
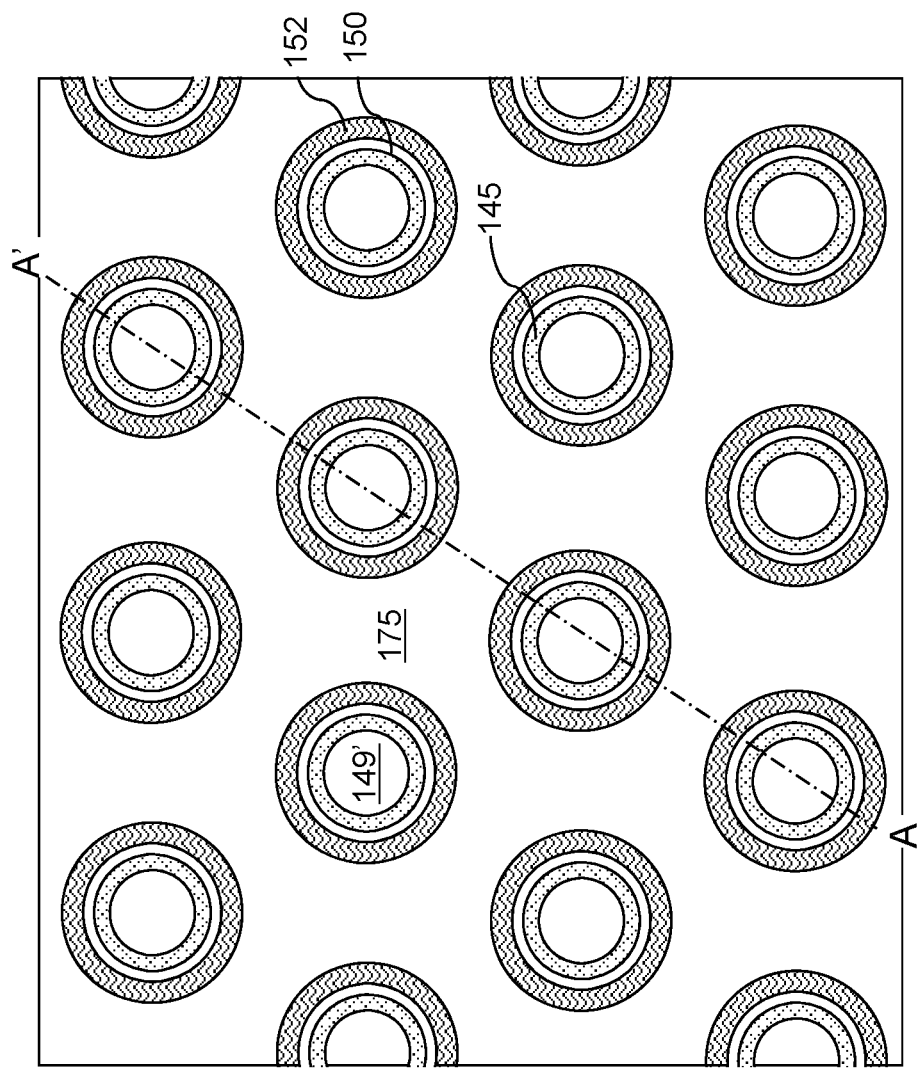
FIG. 14B is a top-down view of the first exemplary structure of FIG. 14A. The vertical plane A-A' is the plane of the cross-section for FIG. 14A.

FIG. 14A is a vertical cross-sectional view of the first exemplary structure after formation of a cover spacer layer according to the first embodiment of the present disclosure. FIG. 14B is a top-down view of the first exemplary structure of FIG. 14A. The vertical plane A-A' is the plane of the cross-section for FIG. 14A. Referring to FIGS. 14A and 14B, a cover spacer layer 145 can be optionally formed on the plurality of cylindrical gate dielectrics 150 by conformally depositing a sacrificial material layer and removing horizontal portions of the sacrificial material layer employing an anisotropic etch process. The sacrificial material is selected among materials that can protect the cylindrical gate dielectrics 150 during a subsequent anisotropic etch process that forms openings through the insulating cap layer 160 to physically expose surfaces of the memory level channel portions 60. For example, the sacrificial material can include amorphous silicon, polysilicon, or amorphous or polycrystalline carbon. The top of the cover spacer layers 145 can extend to a horizontal plane of the top surface of the second dielectric template layer 175, or the top of the cover spacer layers 145 can be recessed below the horizontal plane of the top surface of the second dielectric template layer 175, as shown in FIG. 14.

Figure 15:
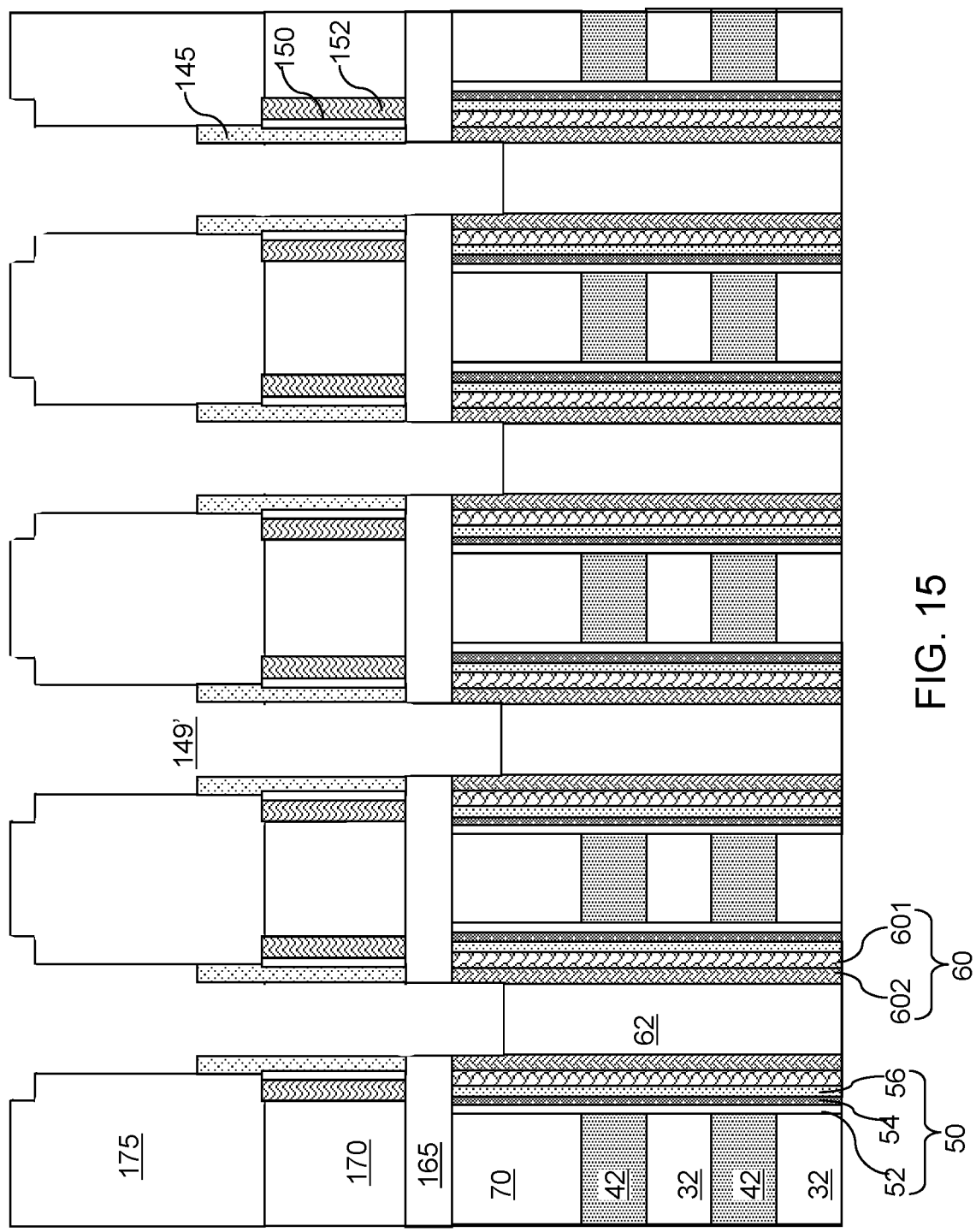
FIG. 15 is a vertical cross-sectional view of the first exemplary structure after anisotropically etching through the insulating spacer layer and physically exposing surfaces of the memory-level channel portions according to the first embodiment of the present disclosure.

Referring to FIG. 15, an anisotropic etch may be performed to form openings through the insulating spacer layer 165 within each area enclosed by the cover spacer layers 145. The anisotropic etch may continue to recess top surfaces of the dielectric cores 62. Inner sidewalls of the memory-level channel portions 60 may be physically exposed to the cylindrical cavities 149', which are vacant volumes surrounded by the second dielectric template layer 175, remaining portions of the cover spacer layers 145, the remaining portion of the insulating cap layer 70, and physically exposed surfaces of the memory-level channel portions 60. If desired, the width of the cavity through the insulating spacer layer 165 may be expanded by a selective isotropic etch of the insulating spacer layer 165 to expose the top surface of the memory-level channel portions 60.

Figure 16:
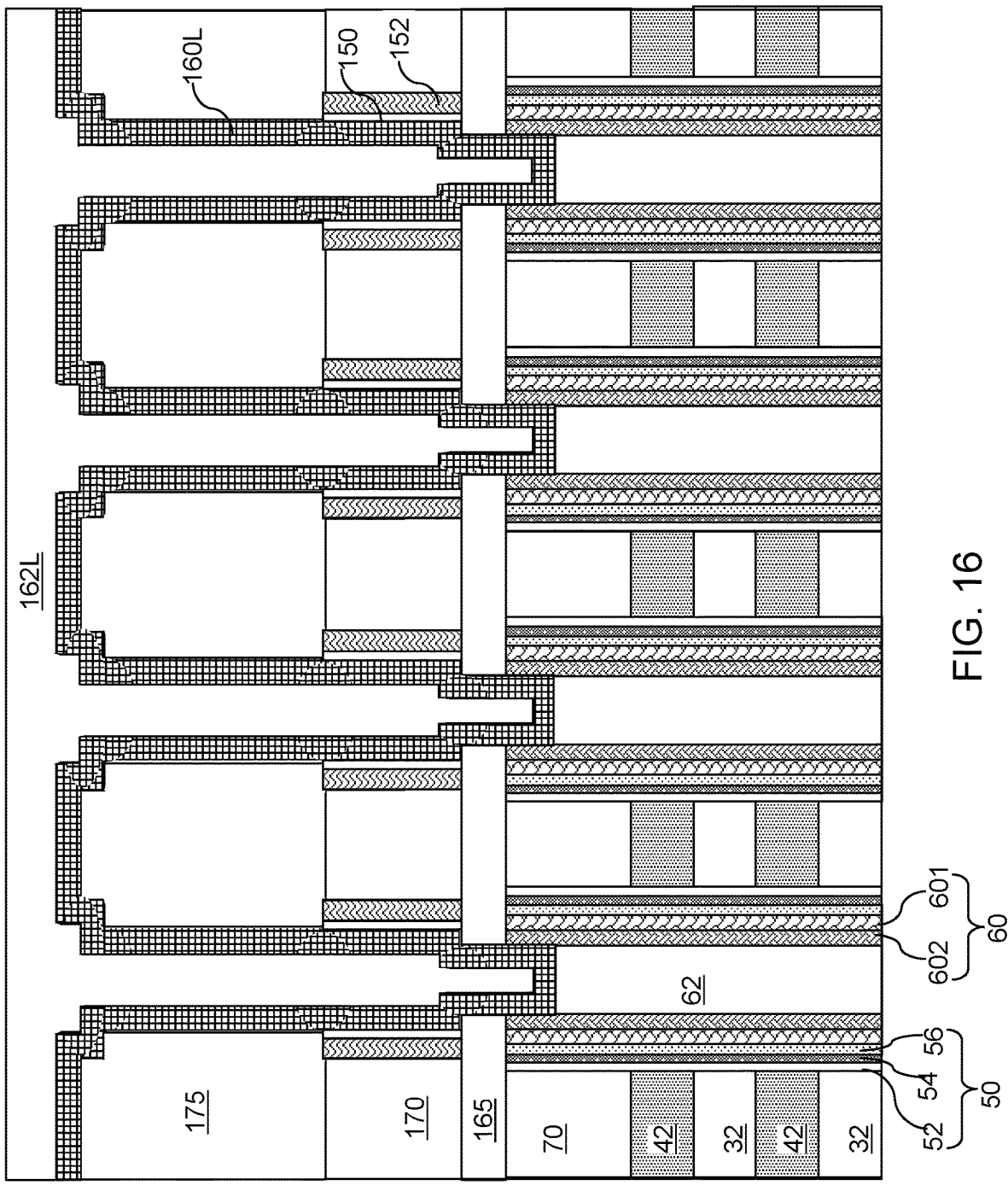
FIG. 16 is a vertical cross-sectional view of the first exemplary structure after formation of a drain-select-level channel layer and a drain-select-level dielectric core material layer according to the first embodiment of the present disclosure.

Referring to FIG. 16, remaining portions of the cover spacer layers 145 may be removed selective to the gate dielectrics 150, for example, by an isotropic etch process. For example, if the cover spacer layers 145 include amorphous silicon or polysilicon, a wet etch using a KOH solution may be used to remove the cover spacer layers 145 selective to the gate dielectrics 150. Inner sidewalls of the gate dielectrics 150 and inner sidewalls of upper regions of the memory-level channel portions 60 may be physically exposed. The top portions of the memory-level channel portions 60 extending above the dielectric cores 62 may also be partially or entirely etched during this etching step.

A semiconductor material layer may be conformally deposited at the periphery of each of the cylindrical cavities 149' to form a drain-select-level channel layer 160L. The memory-level channel portions 60 and the drain-select-level channel layer 160L may have a doping of the first conductivity type, which is the conductivity type of the semiconductor material layer 10. The dopant concentration of the memory-level channel portions 60 and the drain-select-level channel layer 160L may be in a range from $1.0 \times 10^{15}/cm^3$ to $1.0 \times 10^{18}/cm^3$, although lesser and greater dopant concentrations may also be used. Alternatively, the drain-select-level channel layer 160L may be undoped, i.e., intrinsic that does not have any intentional doping and have a dopant concentration that does not exceed $1.0 \times 10^{15}/cm^3$.

The drain-select-level channel layer 160L may include a polycrystalline semiconductor material (such as polysilicon), or may include an amorphous semiconductor material that may be converted into a polycrystalline semiconductor material by an anneal at an elevated temperature (such as amorphous silicon). The thickness of the drain-select-level channel layer 160L may be in a range from 2 nm to 50 nm, such as from 4 nm to 25 nm, although lesser and greeter thicknesses may also be used. The drain-select-level channel layer 160L may be deposited, for example, by chemical vapor deposition. Subsequently, a drain-select-level dielectric core material layer 162L may be deposited in unfilled volumes of the cylindrical cavities 149'. The drain-select-level dielectric core material layer 162L includes a dielectric material such as silicon oxide.

Figure 17:
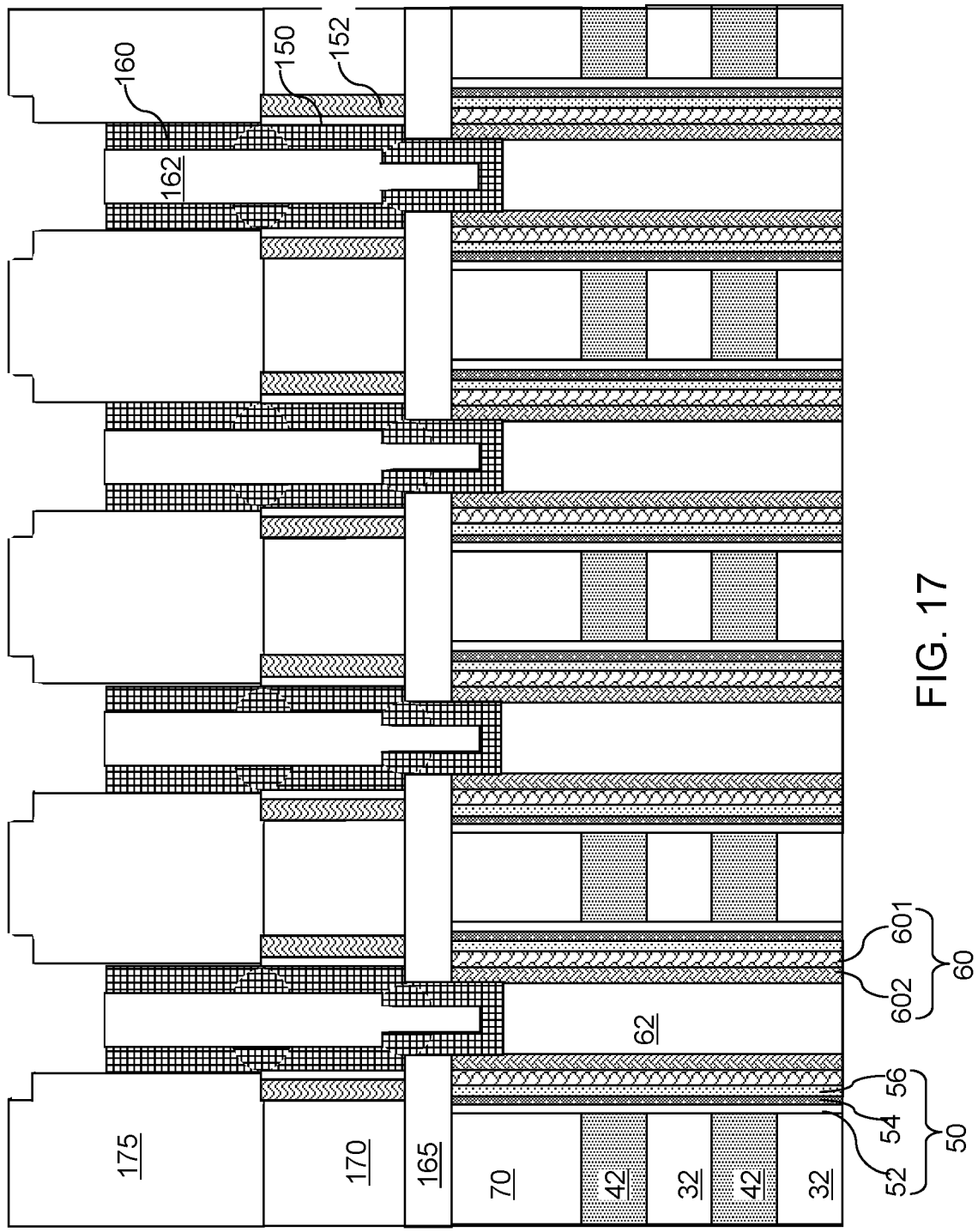
FIG. 17 is a vertical cross-sectional view of the first exemplary structure after formation of a drain-select-level channel portions and drain-select-level dielectric cores according to the first embodiment of the present disclosure.

Referring to FIG. 17, the drain-select-level dielectric core material layer 162L and the drain-select-level channel layer 160L may be recessed by at least one etch process, which may include an anisotropic etch process and/or an isotropic etch process. The drain-select-level dielectric core material layer 162L and the drain-select-level channel layer 160L may be recessed to a height below stepped surfaces of the second dielectric template layer 175 at which the horizontal cross-sectional area of the cylindrical cavities 149' change. Each remaining portion of the drain-select-level channel layer 160L constitutes a drain-select-level channel portion 160. Each remaining portion of the drain-select-level dielectric core material layer 162L may constitute a drain-select-level dielectric core 162 that is laterally surrounded by a respective drain-select-level channel portion 160. In one embodiment, each drain-select-level channel portion 160 may be formed directly on exposed top surface and/or sidewall of a respective one of the memory-level channel portions 60.

Figure 18:
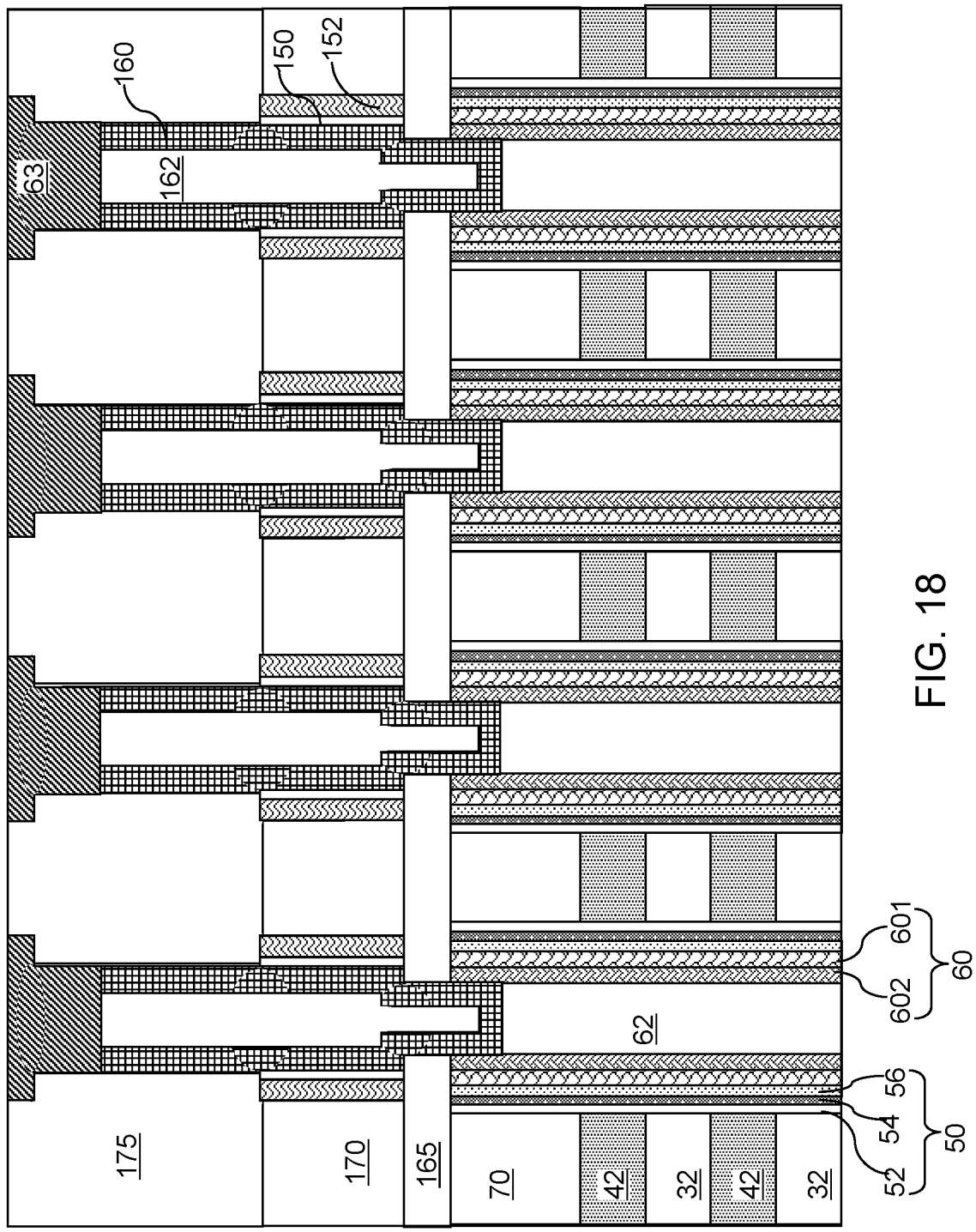
FIG. 18 is a vertical cross-sectional view of the first exemplary structure after formation of drain regions according to the first embodiment of the present disclosure.

Referring to FIG. 18, a doped semiconductor material having a doping of a second conductivity type is deposited in the recesses above the drain-select-level dielectric cores 162 and the drain-select-level channel portions 160. The second conductivity type is the opposite of the first conductivity type. For example, if the first conductivity type is p-type, the second conductivity type is n-type, and vice versa. Excess portions of the doped semiconductor material may be removed from above the horizontal plane including the top surface of the second dielectric template layer 175 by a planarization process, which may use as recess etch and/or chemical mechanical planarization. Each remaining portion of the doped semiconductor material may constitute a drain region 63.

Figure 19:
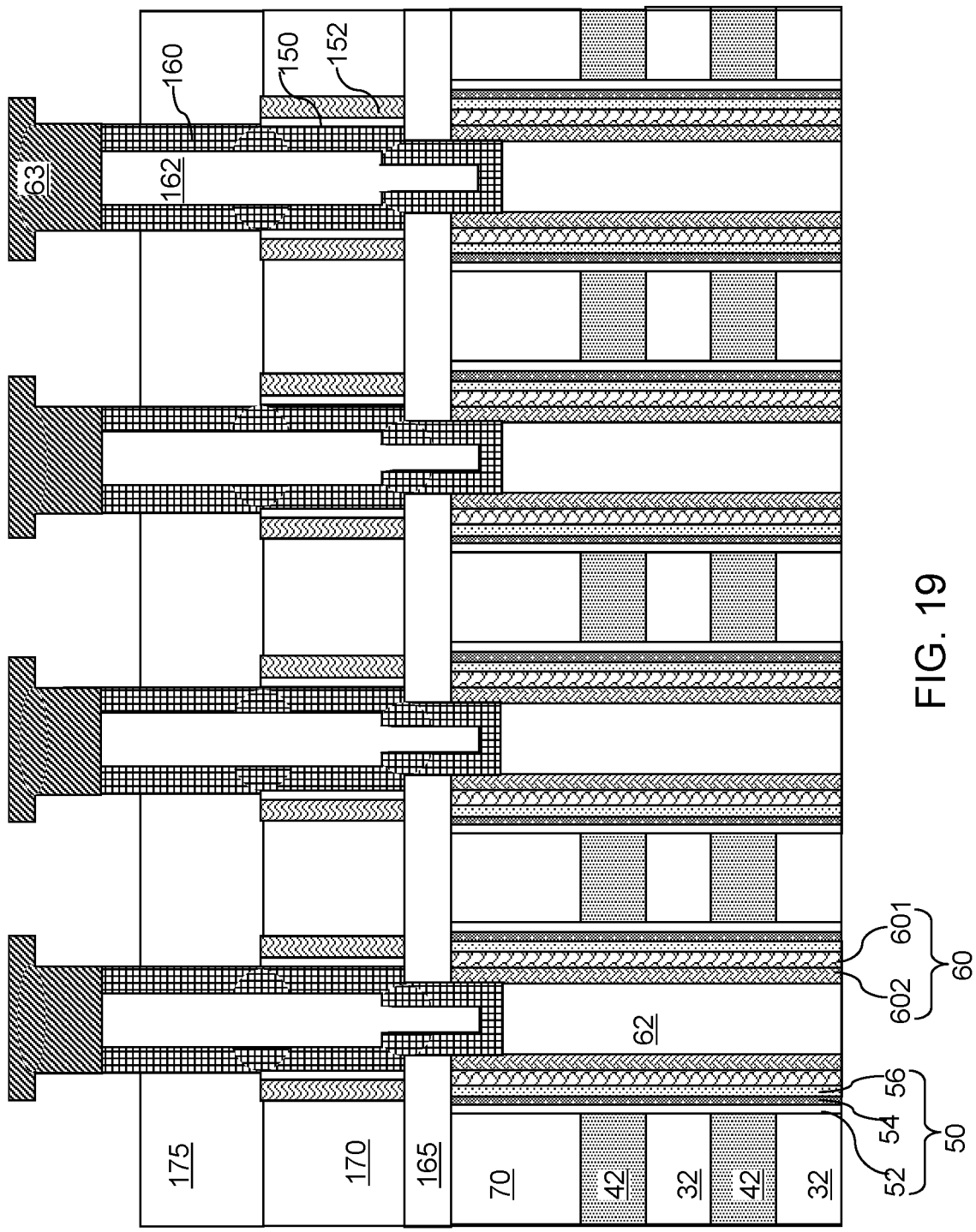
FIG. 19 is a vertical cross-sectional view of the first exemplary structure after vertically recessing the second dielectric template layer according to the first embodiment of the present disclosure.

Referring to FIG. 19, the second dielectric template layer 175 may be vertically recessed by a recess etch process that removes the material of the second dielectric template layer 175 selective to the semiconductor materials of the drain regions 63 and the drain-select-level channel portions 160. For example, if the second dielectric template layer 175 includes silicon oxide, a wet etch using hydrofluoric acid may be used to recess the second dielectric template layer 175. The recessed top surface of the second dielectric template layer 175 may be below a horizontal plane including the interfaces between the drain regions 63 and the drain-select-level channel portions 160.

Figure 20:
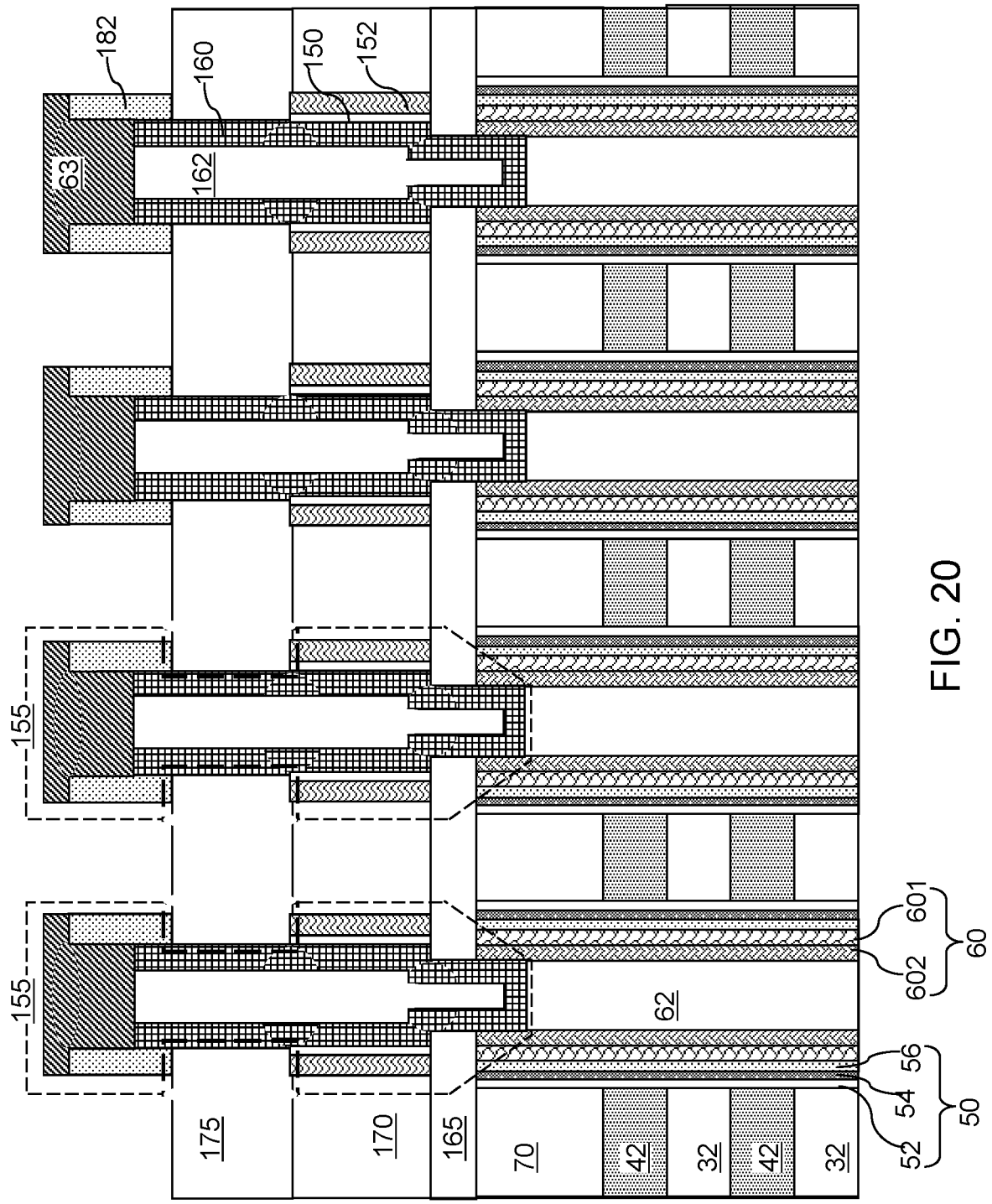
FIG. 20 is a vertical cross-sectional view of the first exemplary structure after formation of cylindrical dielectric spacers according to the first embodiment of the present disclosure.

Referring to FIG. 20, a thin dielectric material layer may be conformally deposited and anisotropically etched to form cylindrical dielectric spacers 182. The thin dielectric material layer includes a dielectric material such as silicon nitride, silicon oxide, or a dielectric metal oxide. The thickness of the thin dielectric material layer may be on the order of, and/or the same as, the lateral thickness of the cylindrical electrode portions 152. The anisotropic etch process may be selective to the materials of the drain regions 63 and the second dielectric template layer 175. In one embodiment, the outer sidewalls of the cylindrical dielectric spacers 182 may be vertically coincident with sidewalls of the drain regions 63.

Each continuous material portion formed after formation of the insulating spacer layer 165 other than the first and second dielectric template layers (170, 175) is herein referred to as a drain-select-level assembly 155. Thus, each combination of adjacent drain-select-level dielectric core 162, drain-select-level channel portion 160, gate dielectric 150, cylindrical electrode portion 152, drain region 63, and cylindrical dielectric spacer 182 constitutes a drain-select-level assembly 155. The drain-select-level assemblies 155 may be formed as an array having the same periodicity as the array of memory stack structures 55 (or the array of the memory opening fill structures 58) along the first horizontal direction hd1 and the second horizontal direction hd2 over the alternating stack (32, 42). In an alternative embodiment, if the sacrificial material layers 42 are replaced with electrically conductive layers 46 prior to forming the drain-select-level structures 155, then the alternating stack includes insulating layers 32 and electrically conductive layers 46. Each of the drain-select-level assemblies 155 comprises a drain-select-level channel portion 160 contacting a respective memory-level channel portion 60. Each pair of adjacent drain-select-level channel portion 160 and memory-level channel portion 60 constitutes a vertical semiconductor channel (60, 160).

Figure 21:
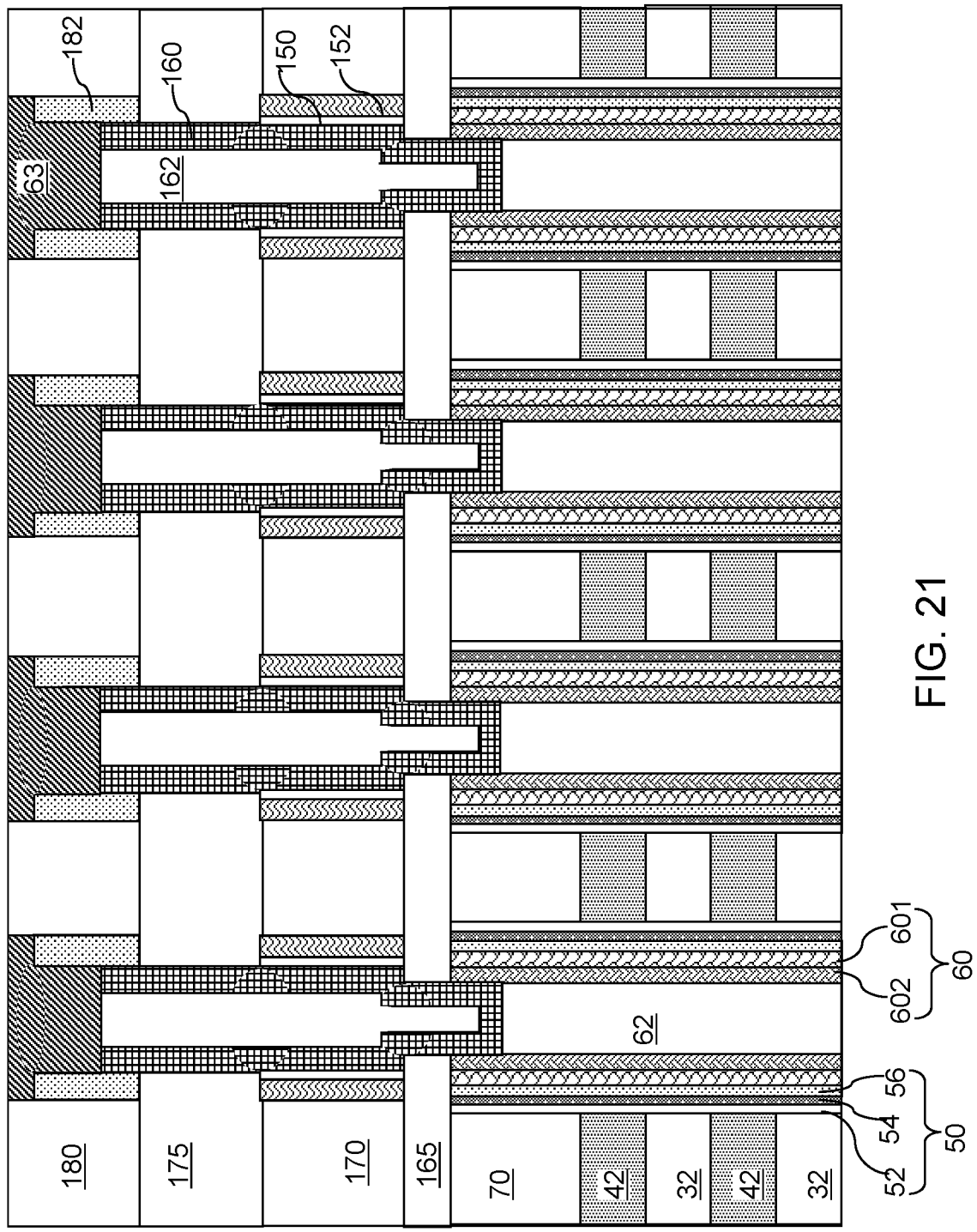
FIG. 21 is a vertical cross-sectional view of the first exemplary structure after formation of a third dielectric template layer according to the first embodiment of the present disclosure.

Referring to FIG. 21, a dielectric material may be deposited over the second dielectric template layer 175 and around the cylindrical dielectric spacers 182. Portions of the deposited dielectric material located above the horizontal plane including the top surfaces of the drain regions 63 may be removed by a planarization process such as a recess etch or chemical mechanical planarization. Remaining portions of the deposited dielectric material constitute a third dielectric template layer 180, which laterally surrounds each of the cylindrical dielectric spacers 182 and overlies the second dielectric template layer 175. The third dielectric template layer 180 includes a dielectric material such as doped silicate glass or undoped silicate glass (e.g., silicon oxide). The dielectric material of the third dielectric template layer 180 may be the same as, or may be different from, the dielectric material of the second dielectric template layer 175.

Figure 22A:
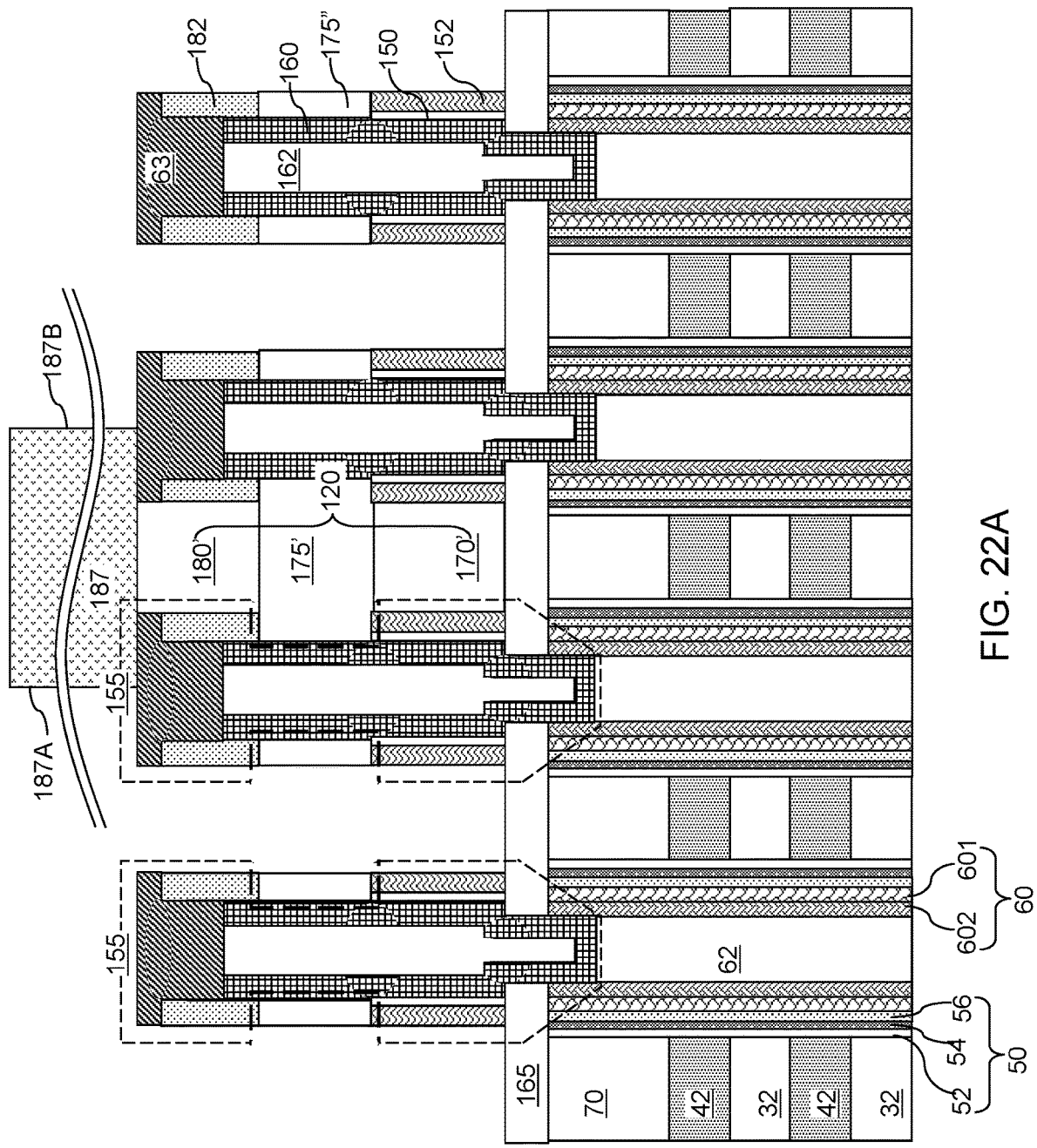
FIG. 22A is a vertical cross-sectional view of the first exemplary structure after anisotropically etching the first, second, and third dielectric template layer using a combination of a patterned photoresist layer and the drain regions as an etch mask according to the first embodiment of the present disclosure.
Figure 22B:
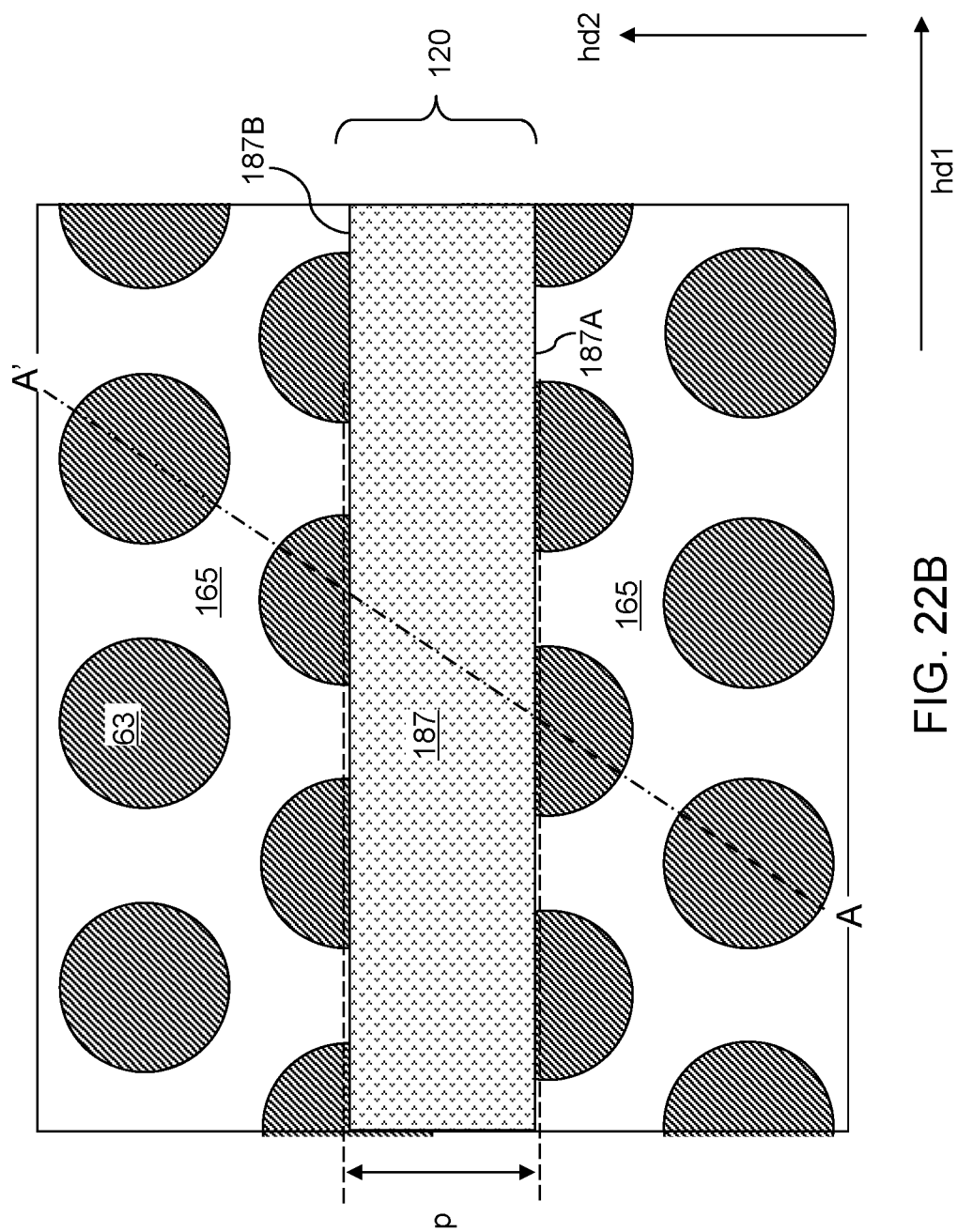
FIG. 22B is a top-down view of the first exemplary structure of FIG. 22A. The vertical plane A-A' is the plane of the cross-section for FIG. 22A.

FIG. 22A is a vertical cross-sectional view of the first exemplary structure after anisotropically etching the first, second, and third dielectric template layer employing a combination of a patterned photoresist layer and the drain regions as an etch mask according to the first embodiment of the present disclosure. FIG. 22B is a top-down view of the first exemplary structure of FIG. 22A. The vertical plane A-A' is the plane of the cross-section for FIG. 22A. Referring to FIGS. 22A and 22B, a photoresist layer 187 can be applied over the first exemplary structure, and can be lithographically patterned to form line patterns in areas in which electrical isolation between neighboring pairs of drain select gate electrodes is to be provided. In one embodiment, the patterned portions of the photoresist layer 187 can have a pair of lengthwise sidewalls that extend along the lengthwise direction of a pair of rows of memory opening fill structures 58. A first lengthwise sidewall 187A of each patterned portion of the photoresist layer 187 can overlie a first row of memory opening fill structures 58 within two rows of memory opening fill structures 58 that are neighboring row pairs, and a second lengthwise sidewall 187B of each patterned portion of the photoresist layer 187 can overlie a second row of memory opening fill structures 58 within the two rows of memory opening fill structures 58. The width of each patterned portion of the photoresist layer 187, as measured along a direction perpendicular to the direction of the lengthwise sidewalls, can be in a range from 0.5 times the inter-row pitch p to 1.5 times the inter-row pitch p, and may be in a range from 0.7 times the inter-row pitch p to 1.3 times the inter-row pitch p.

An anisotropic etch process that etches the materials of the first, second, and third dielectric template layers (170, 175, 180) selective to the material of the drain regions 63 may be performed. For example, if the first, second, and third dielectric template layers (170, 175, 180) include doped or undoped silicate glass (e.g., silicon oxide) materials, an anisotropic etch process that etches silicon oxide selective to silicon may be used. The photoresist layer 187 and the drain regions 63 protect underlying masked portions of the first, second, and third dielectric template layers (170, 175, 180) during the anisotropic etch process. As such, the combination of the photoresist layer 187 and the drain regions 63 functions as an etch mask for anisotropically etching the first, second, and third dielectric template layers (170, 175, 180). The insulating spacer layer 165 may be used as an etch stop layer for the anisotropic etch process.

Each set of remaining portions of the first, second, and third dielectric template layers (170, 175, 180) constitutes a drain-select-level isolation strip 120. Each drain-select-level isolation strip 120 may laterally extend along the first horizontal direction hd1. Each drain-select-level isolation strip 120 may include a lower dielectric strip portion 170', a perforated dielectric strip portion 175', and an upper dielectric strip portion 180'. The lower dielectric strip portion 170' is a remaining portion of the first dielectric template layer 170, the perforated dielectric strip portion 175' may be a remaining portion of the second dielectric template layer 175, and the upper dielectric strip portion 180' may be a remaining portion of the third dielectric template layer 180. Each drain-select-level isolation strip 120 includes at least one dielectric material, and may include two or three different dielectric materials depending on the compositions of the lower dielectric strip portion 170', the perforated dielectric strip portion 175', and the upper dielectric strip portion 180' therein.

Each remaining portion of the second dielectric template layer 175 that is not incorporated into the drain-select-level isolation strips 120 constitutes a tubular dielectric spacer 175'', which has a configuration of a tube that encircles a respective one of the drain-select-level assemblies 155. The tubular dielectric spacers 175" may have the same material composition as, and the same height as, the perforated dielectric strip portions 175'.

Figure 23A:
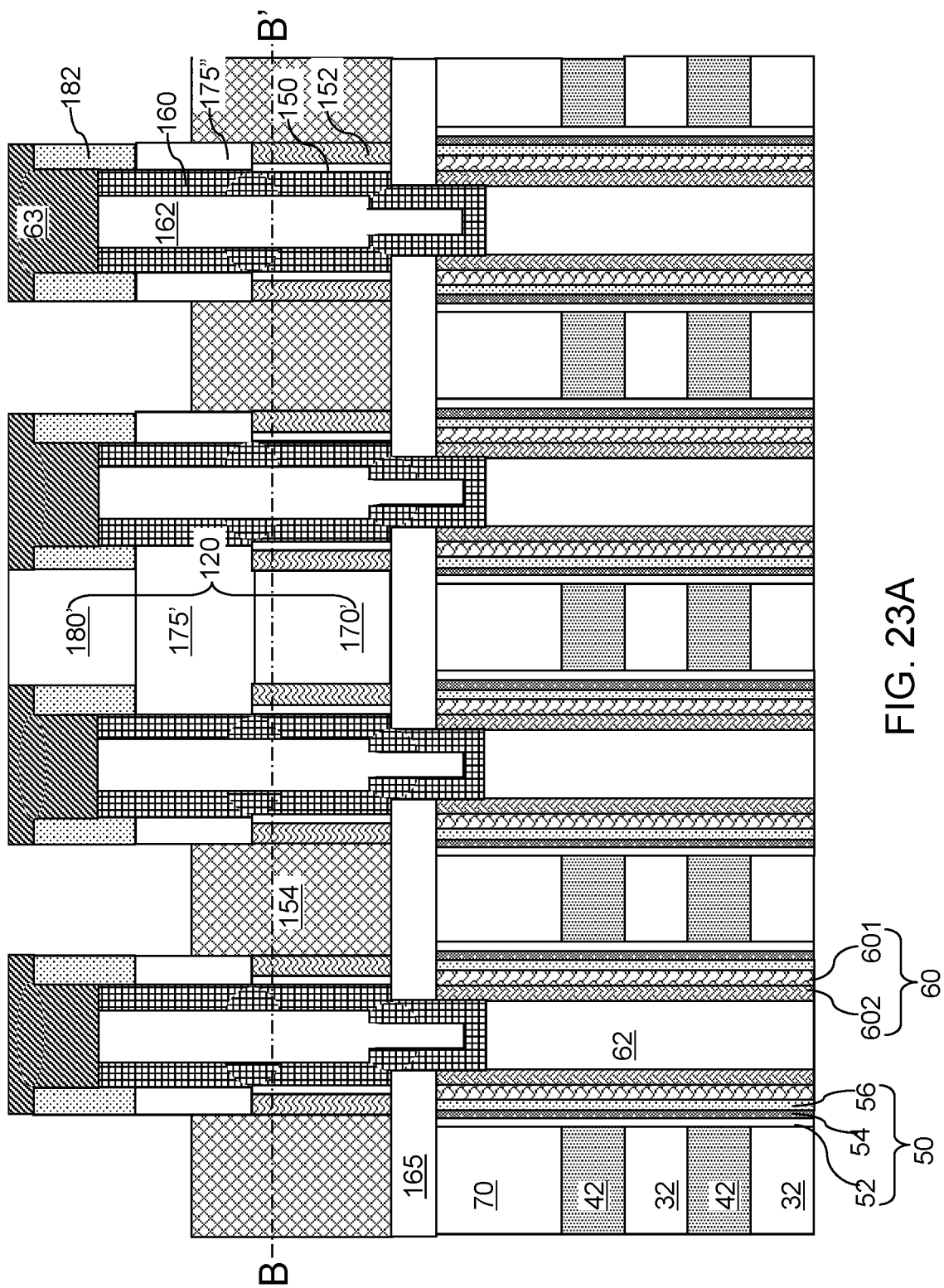
FIG. 23A is a vertical cross-sectional view of the first exemplary structure after formation of strip electrode portions according to the first embodiment of the present disclosure.
Figure 23B:
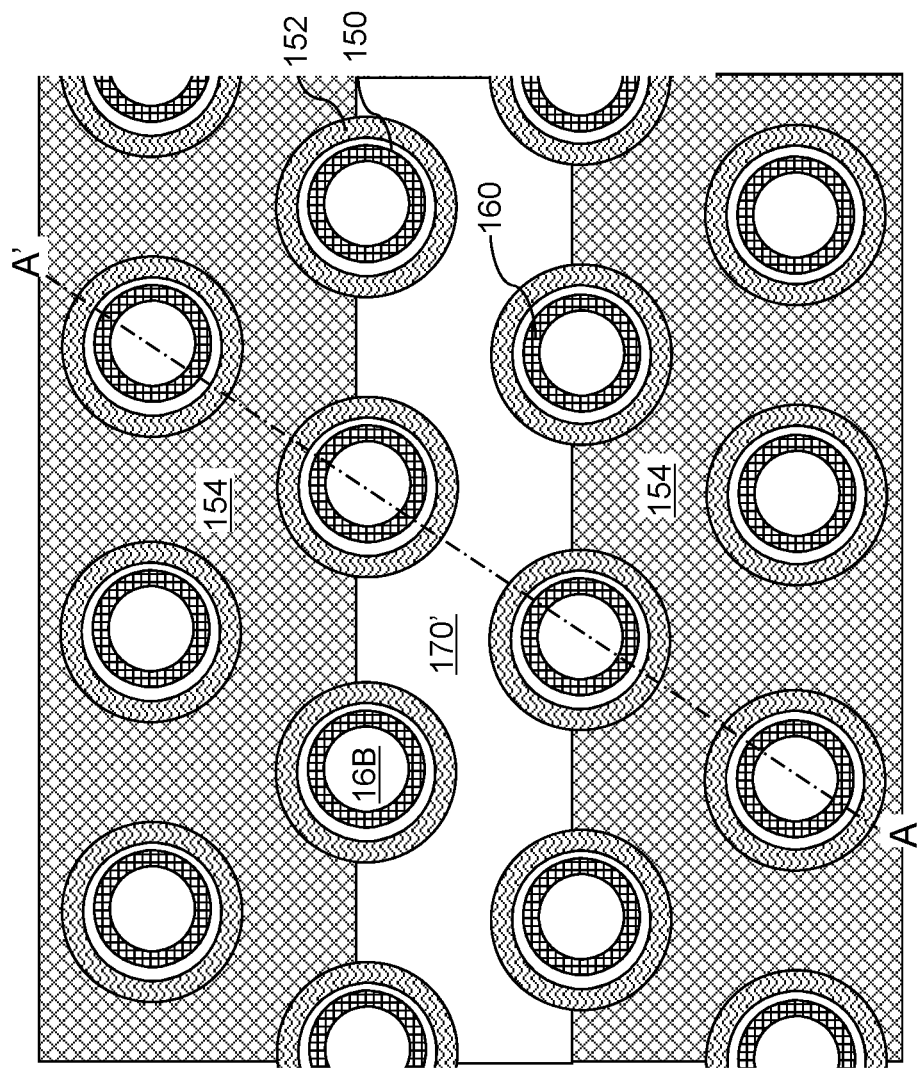
FIG. 23B is a horizontal cross-sectional view along the plane B-B' of the first exemplary structure of FIG. 23A. The vertical plane A-A' is the plane of the cross-section for FIG. 23A.

FIG. 23A is a vertical cross-sectional view of the first exemplary structure after formation of strip electrode portions according to the first embodiment of the present disclosure. FIG. 23B is a horizontal cross-sectional view along the plane B-B' of the first exemplary structure of FIG. 23A. The vertical plane A-A' is the plane of the cross-section for FIG. 23A. Referring to FIGS. 23A and 23B, at least one conductive material is deposited in the cavities overlying the insulating spacer layer 165 and on each of the cylindrical electrode portions 152. The at least one conductive material can include an elemental metal (such as tungsten, aluminum, copper, or cobalt), an intermetallic alloy, a conductive metal nitride material (such as TiN, TaN, or WN), or a heavily doped semiconductor material. The at least one conductive material can fill the entire volume of the cavities between the top surface of the insulating spacer layer 165 and the horizontal plane including the top surfaces of the drain regions 63.

Portions of the deposited at least one conductive material may be removed from above the horizontal plane including the top surfaces of the drain regions 63 by a recess etch. Further, the recess etch may continue to recess the top surface of remaining portions of the deposited at least one conductive material below the topmost surfaces of the cylindrical dielectric spacers 182. In one embodiment, the recessed top surface of the at least one conductive material may contact outer sidewalls of the tubular dielectric spacers 175". Each remaining portion of the at least one conductive material constitutes a strip electrode portion 154, which laterally encircles and directly contacts each cylindrical electrode portion 152 located between a neighboring pair of drain-select-level isolation strips 120, and directly contacts only one side of each cylindrical electrode portion 152 contacting any of the neighboring pair of drain-select-level isolation strips 120.

Each strip electrode portion 154 may include a pair of lengthwise sidewalls that generally extend along the first horizontal direction hd1. Each lengthwise sidewall of a strip electrode portion 154 includes a laterally alternating sequence of planar sidewall segments and concave sidewall segments, which may be a laterally alternating sequence of vertical planar sidewall segments and vertical concave sidewall segments. Each set of adjacent strip electrode portion 154 and plurality of cylindrical electrode portions 152 (which laterally surround a respective one of the memory-level channel portions 160) constitutes a drain select gate electrode (152, 154). Each neighboring pair of drain select gate electrodes (152, 154) is laterally spaced from each other by a respective drain-select-level isolation strip 120.

Each strip electrode portion 154 may be formed on a respective subset of the plurality of cylindrical electrode portions 152 that is arranged in rows that extend along a first horizontal direction hd1. Each drain select gate electrode (152, 154) laterally surrounds, and encircles, respective rows of drain-select-level assemblies 155, and contacts only one side of two rows of drain-select-level assemblies 155, which are two outmost rows of drain-select-level assemblies 155 contacting a respective drain-select-level isolation strip 120.

Figure 24A:
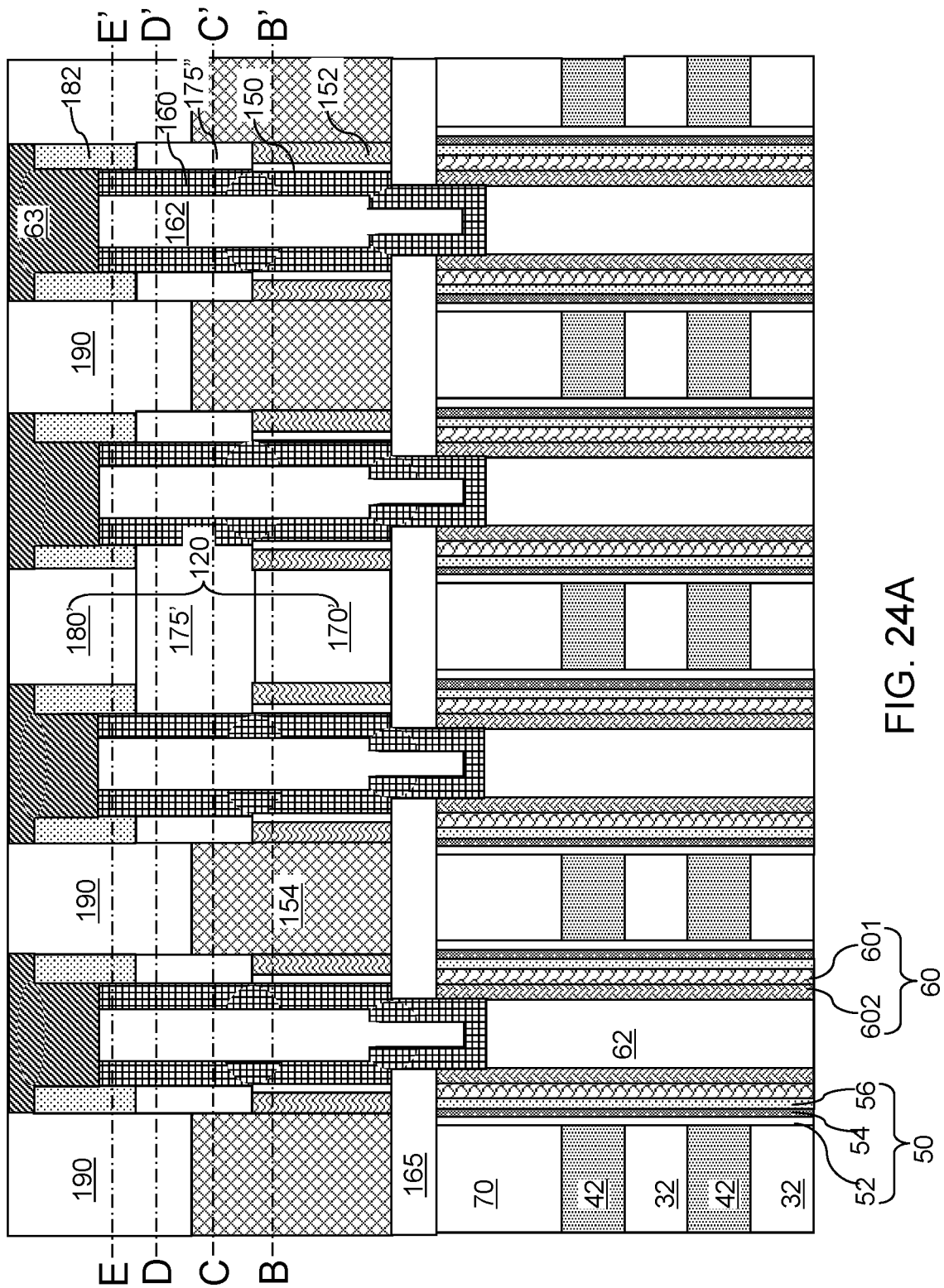
FIG. 24A is a vertical cross-sectional view of the first exemplary structure after formation of a dielectric fill material layer according to the first embodiment of the present disclosure.
Figure 24B:
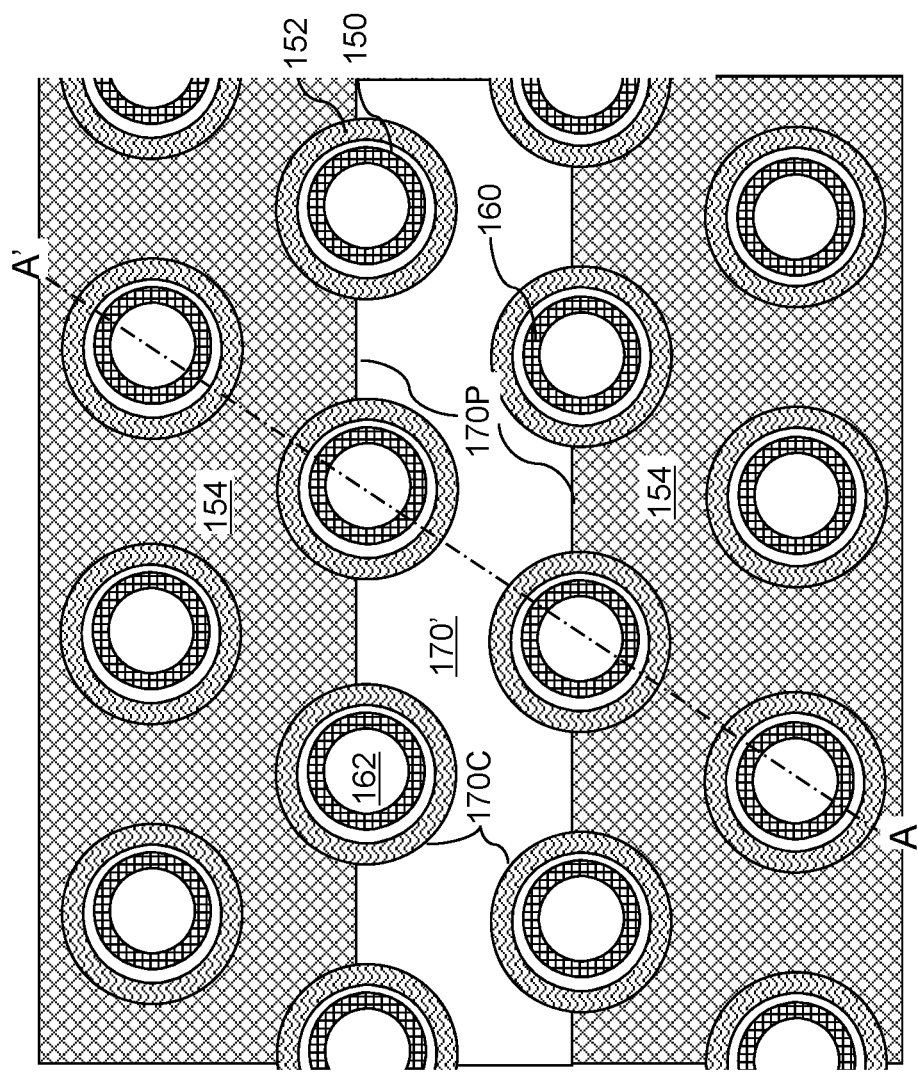
FIG. 24B is a horizontal cross-sectional view along the plane B-B' of the first exemplary structure of FIG. 24A. The vertical plane A-A' is the plane of the cross-section for FIG. 24A.
Figure 24C:
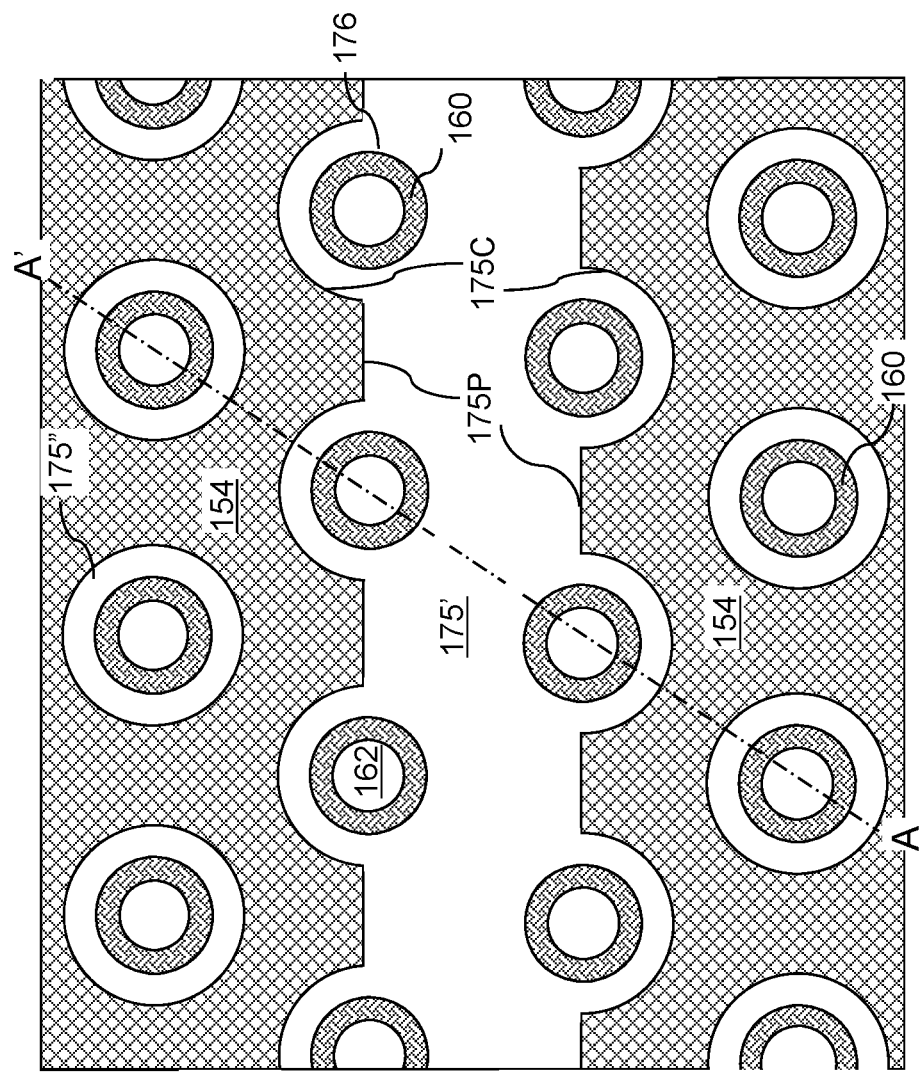
FIG. 24C is a horizontal cross-sectional view along the plane C-C' of the first exemplary structure of FIG. 24A.
Figure 24D:
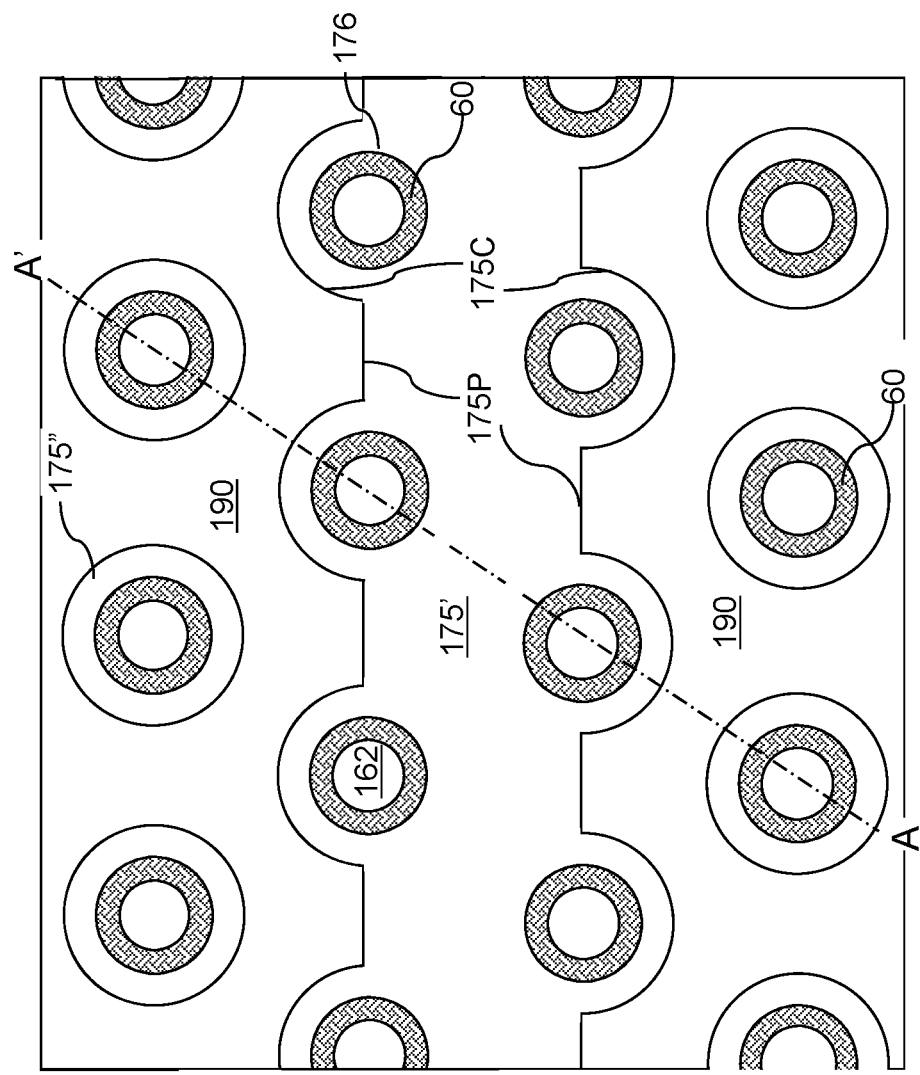
FIG. 24D is a horizontal cross-sectional view along the plane D-D' of the first exemplary structure of FIG. 24A.
Figure 24E:
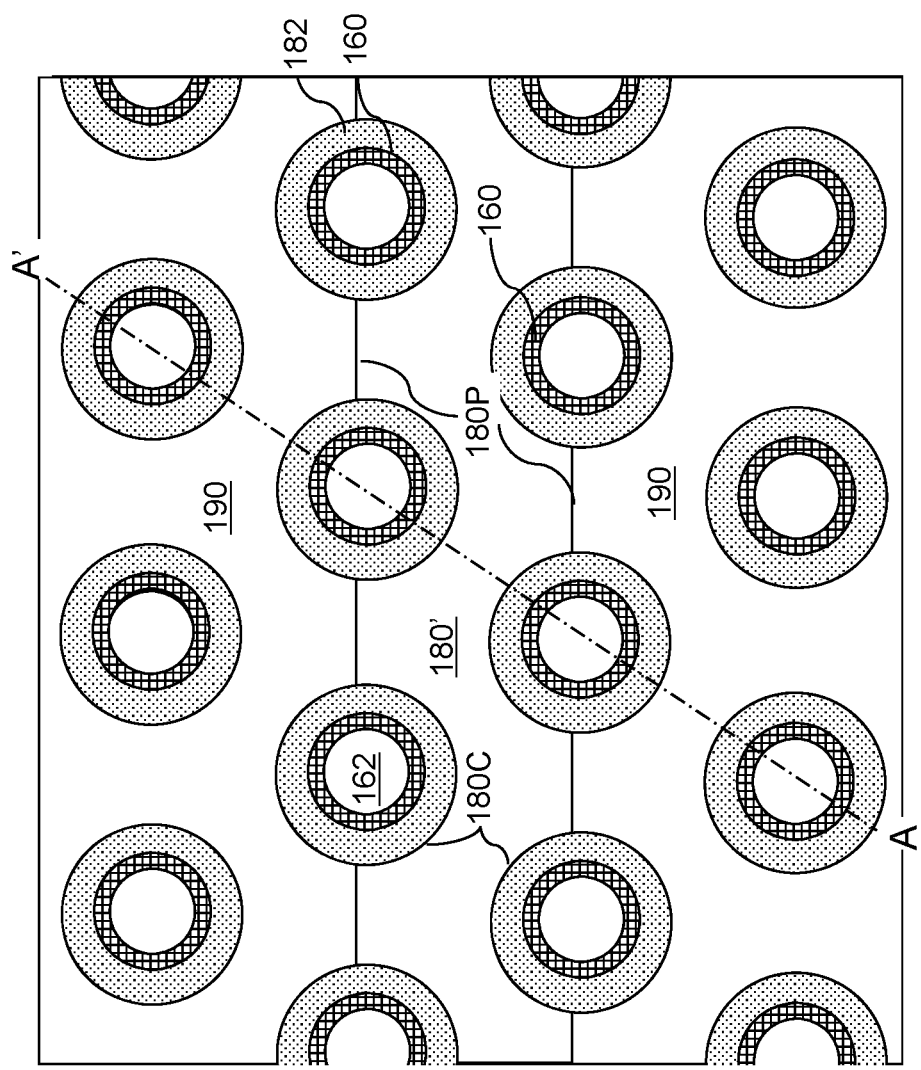
FIG. 24E is a horizontal cross-sectional view along the plane E-E' of the first exemplary structure of FIG. 24A.

FIG. 24A is a vertical cross-sectional view of the first exemplary structure after formation of a dielectric fill material layer according to the first embodiment of the present disclosure. FIG. 24B is a horizontal cross-sectional view along the plane B-B' of the first exemplary structure of FIG. 24A. The vertical plane A-A' is the plane of the cross-section for FIG. 24A. FIG. 24C is a horizontal cross-sectional view along the plane C-C' of the first exemplary structure of FIG. 24A. FIG. 24D is a horizontal cross-sectional view along the plane D-D' of the first exemplary structure of FIG. 24A. FIG. 24E is a horizontal cross-sectional view along the plane E-E' of the first exemplary structure of FIG. 24A. Referring to FIGS. 24A-24E, 25A, and 25B, a dielectric fill material layer 190 is formed on the top surface of the strip electrode portions 154 to fill the gaps among the drain regions 63. The dielectric fill material layer 190 can include a planarizable dielectric material such as silicon oxide. The dielectric fill material layer 190 can be planarized to remove to provide a top surface that is coplanar with the top surfaces of the drain regions 63. For example, chemical mechanical planarization or a recess etch can be employed. The top surfaces of the drain select level isolation strips 120 and the dielectric fill material layer 190 can be within a same horizontal plane as the top surfaces of the drain regions 63.

As shown in FIG. 24B, the lower dielectric strip portion 170' underlies the perforated dielectric strip portion 175' and contacts sidewalls of a subset of the cylindrical electrode portions 152. In one embodiment, the lower dielectric strip portion 170' may include two lengthwise sidewalls, and each of the two lengthwise sidewalls of the lower dielectric strip portion 170' may include a respective alternating sequence of planar sidewall segments 170P and concave sidewall segments 170C. In one embodiment, each of the two lengthwise sidewalls of the lower dielectric strip portion 170' may include a respective alternating sequence of vertical planar sidewall segments and vertical concave sidewall segments. In one embodiment, each cylindrical electrode portion 152 that laterally surrounds a memory-level channel portion 160 within the subset of the drain-select-level assemblies 155 (i.e., within a neighboring pair of rows of drain-select-level assemblies 155) contacts a respective concave sidewall segment of the lower dielectric strip portion 170'.

As shown in FIGS. 24C and 24D, the perforated dielectric strip portion 175' includes two rows of perforations 176 arranged along the first horizontal direction hd1. The two rows of perforations may be cylindrical openings through the perforated dielectric strip portion 175'. Each of the cylindrical openings laterally surrounds a respective one of a subset of the drain-select-level assemblies 155 that is arranged in two rows that extend along the first horizontal direction hd1. The drain-select-level isolation strip 120 may directly contact each of the memory-level channel portions 160 that extend through the cylindrical openings in the drain-select-level isolation strip 120.

In one embodiment, the perforated dielectric strip portion 175' includes two lengthwise sidewalls that generally extend along the first horizontal direction hd1. Each of the two lengthwise sidewalls of the perforated dielectric strip portion 175' includes a respective alternating sequence of planar sidewall segments 175P and convex sidewall segments 175C. As used herein, a "planar sidewall segment" refers to a segment of a sidewall that is entirely contained within a two-dimensional Euclidean plane. As used herein, a "convex sidewall segment" refers to a segment of a sidewall that is entirely contained within a convex surface. As used herein, a "concave sidewall segment" refers to a segment of a sidewall that is entirely contained within a concave surface. As used herein, a structure "generally extends" along a specific direction if the most prominent extension direction is the specific direction. Portions of such a structure may locally extend along directions that are different from the specific direction provided that the overall direction, and the most prominent extension direction, is the specific direction.

In one embodiment, each of the two lengthwise sidewalls of the perforated dielectric strip portion 175' may include a respective alternating sequence of vertical planar sidewall segments 175P and vertical convex sidewall segments 175C. As used herein, a "vertical planar sidewall segment" refers to a planar sidewall segment that extends straight along a vertical direction. As used herein, a "vertical convex sidewall segment" refers to a convex sidewall segment that extends straight along a vertical direction. As used herein, a "vertical concave sidewall segment" refers to a concave sidewall segment that extends straight along a vertical direction. In one embodiment, the planar sidewall segments 175P of the perforated dielectric strip portion 175' may be vertically coincident with the planar sidewall segments 170P of the lower dielectric strip portion 170'.

As shown in FIG. 24E, the upper dielectric strip portion 180' overlies the perforated dielectric strip portion 175', and includes a pair of lengthwise sidewalls that generally extend along the first horizontal direction hd1. Each of the pair of lengthwise sidewalls of the upper dielectric strip portion 180' may include a respective alternating sequence of planar sidewall segments 180P and concave sidewall segments 180C. In one embodiment, the planar sidewall segments of the perforated dielectric strip portion 175' may be vertically coincident with the planar sidewall segments of the upper dielectric strip portion 180'. In one embodiment, each of the two lengthwise sidewalls of the upper dielectric strip portion 180' may include a respective alternating sequence of vertical planar sidewall segments 180P and vertical concave sidewall segments 180C.

Figure 25A:
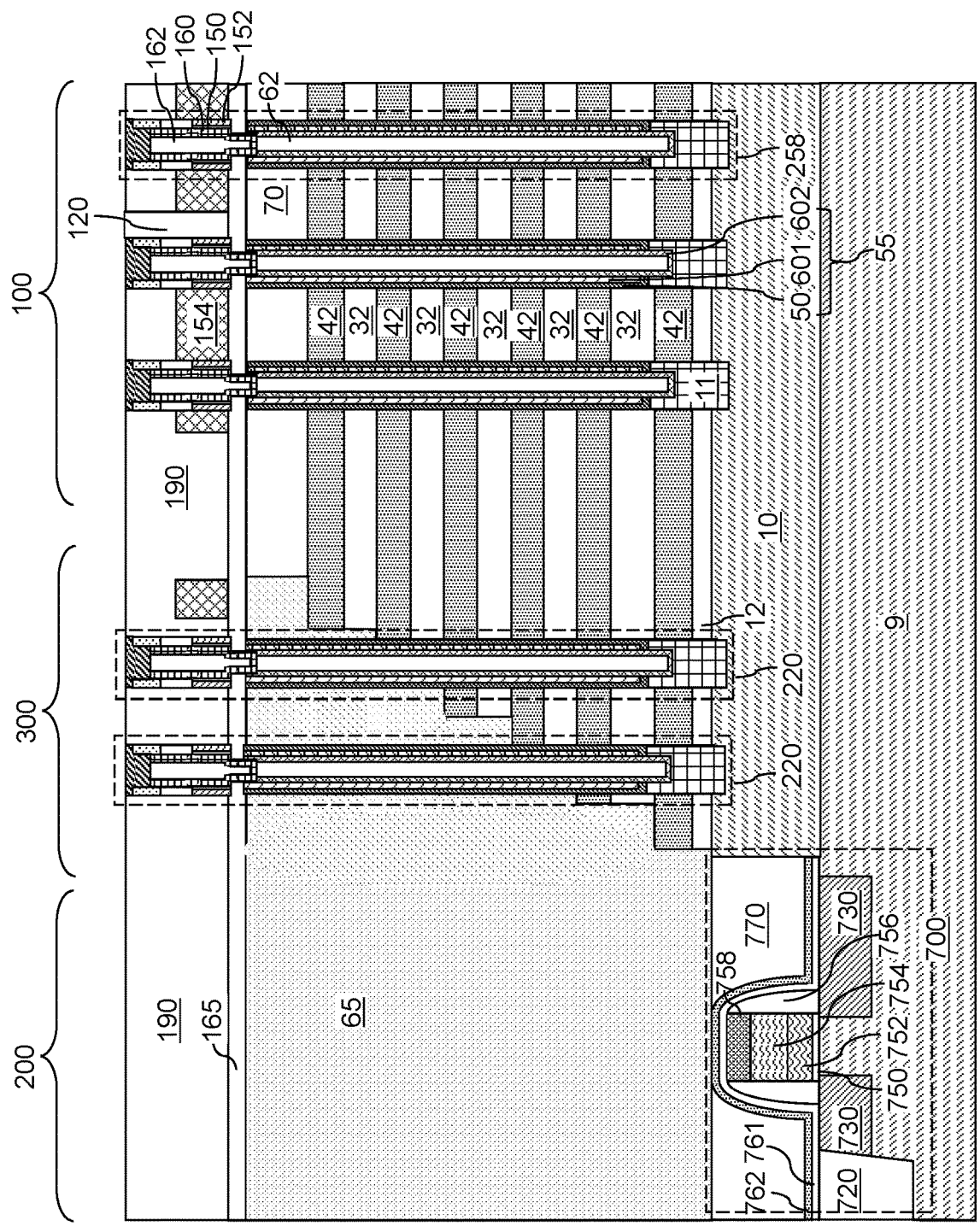
FIG. 25A is another vertical cross-sectional view of the first exemplary structure at the processing steps of FIGS. 24A-24E.
Figure 25B:
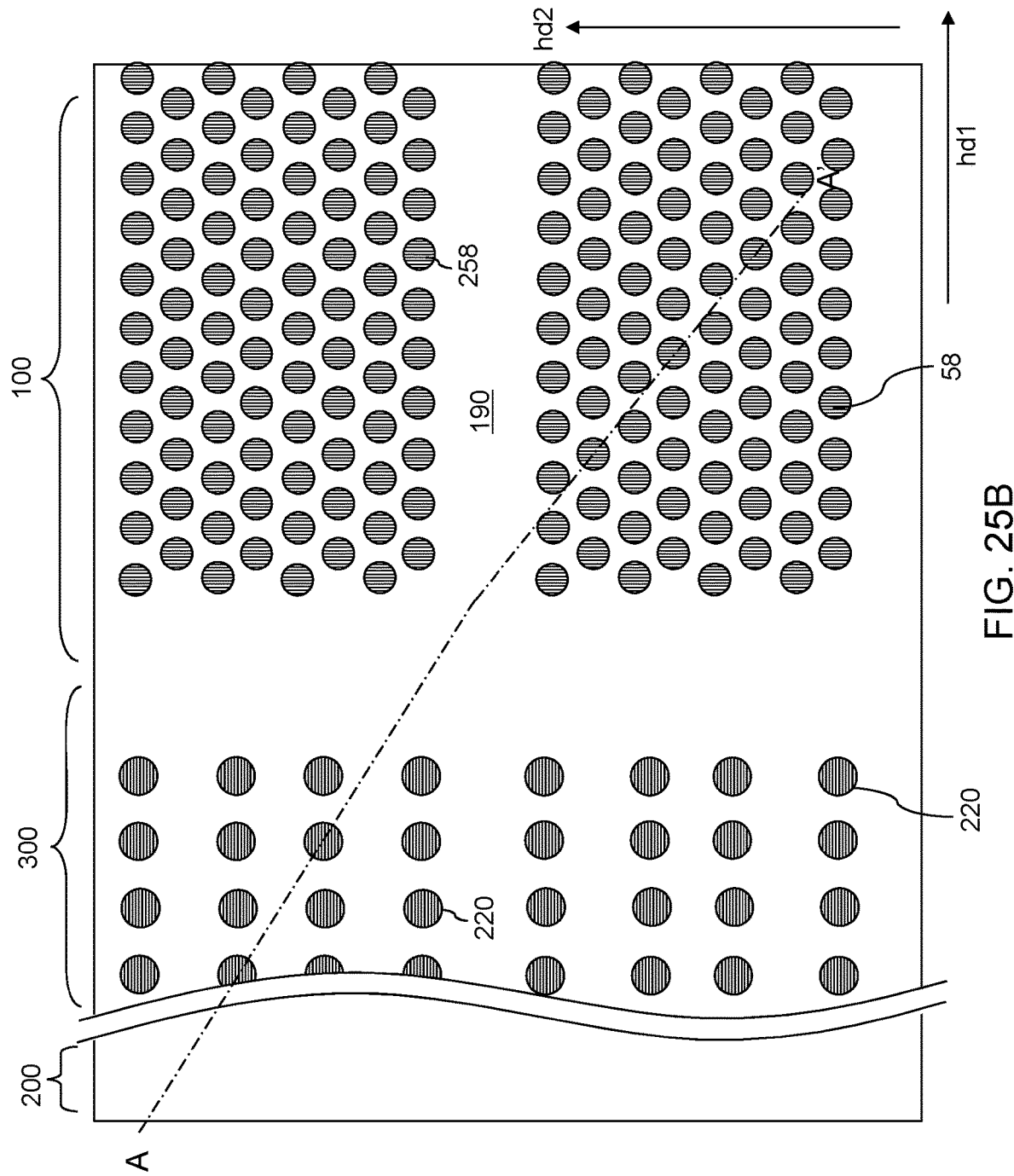
FIG. 25B is a top-down view of the first exemplary structure of FIG. 25A. The vertical plane A-A' is the plane of the cross-section of FIG. 25A.

FIG. 25A is another vertical cross-sectional view of the first exemplary structure at the processing steps of FIGS. 24A-24E. FIG. 25B is a top-down view of the first exemplary structure of FIG. 25A. The vertical plane A-A' is the plane of the cross-section of FIG. 25A. As shown in FIGS. 25A and 25B, the combination of a respective drain select level assembly 155 and the respective underlying memory opening fill structure 58 comprises a portion of a vertical NAND string 220. The combination of a respective drain select level assembly 155 and the respective underlying support pillar structure 20 comprises a support structure 258.

In one embodiment shown in FIGS. 26A to 31B and described below, the sacrificial material layers 42 may be replaced with electrically conductive layers 46 (e.g., word lines/control gate electrodes and source side select gate electrodes) after formation of the drain-select-level assembly 155 and the portions of a vertical NAND strings 220. In an alternative embodiment, the below described steps of replacing the sacrificial material layers 42 with the electrically conductive layers 46 may be performed prior to forming the drain-select-level structures 155 and the and the portions of a vertical NAND strings 220.

Figure 26A:
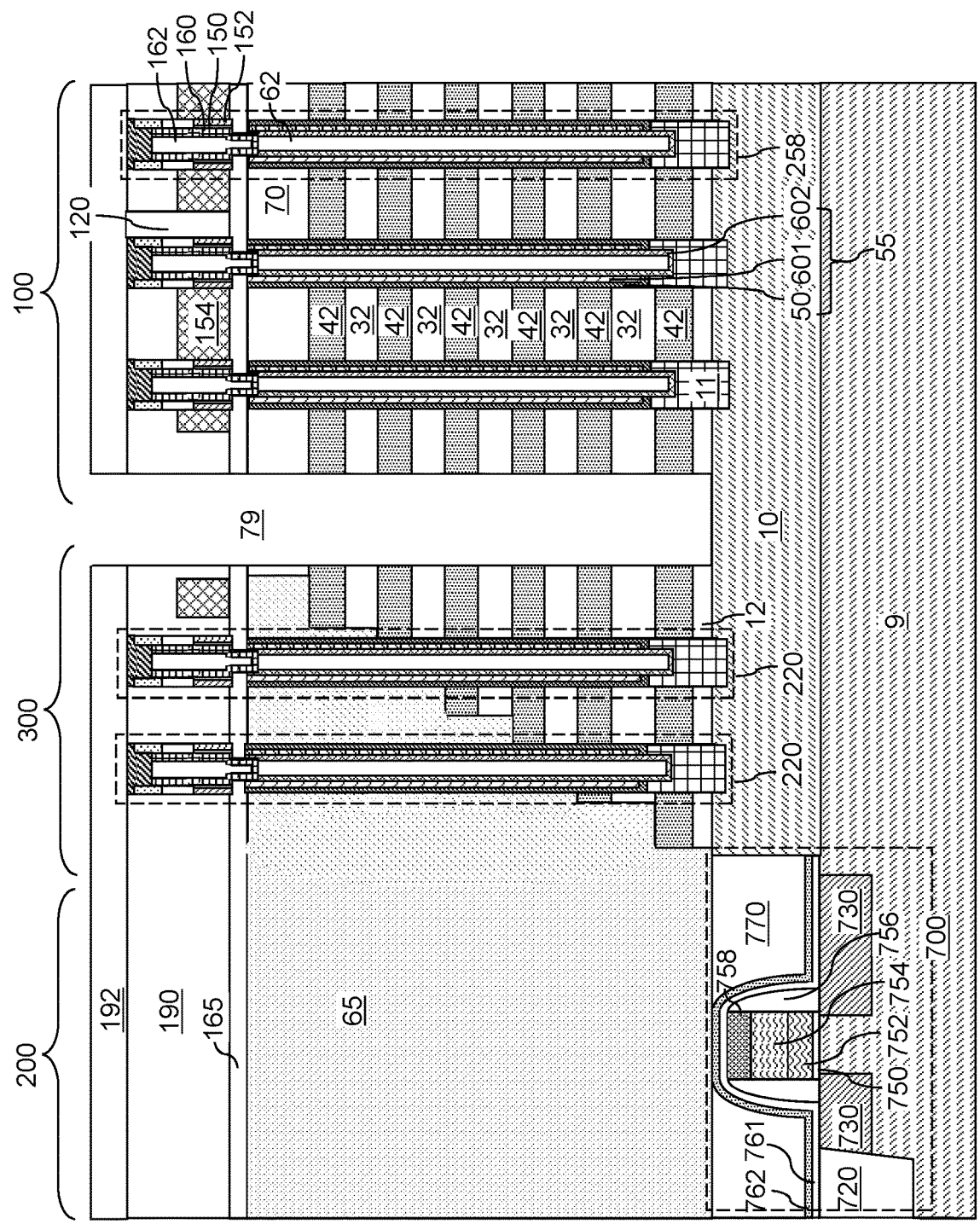
FIG. 26A is a vertical cross-sectional view of the first exemplary structure after formation of a contact level dielectric layer and backside trenches according to the first embodiment of the present disclosure.
Figure 26B:
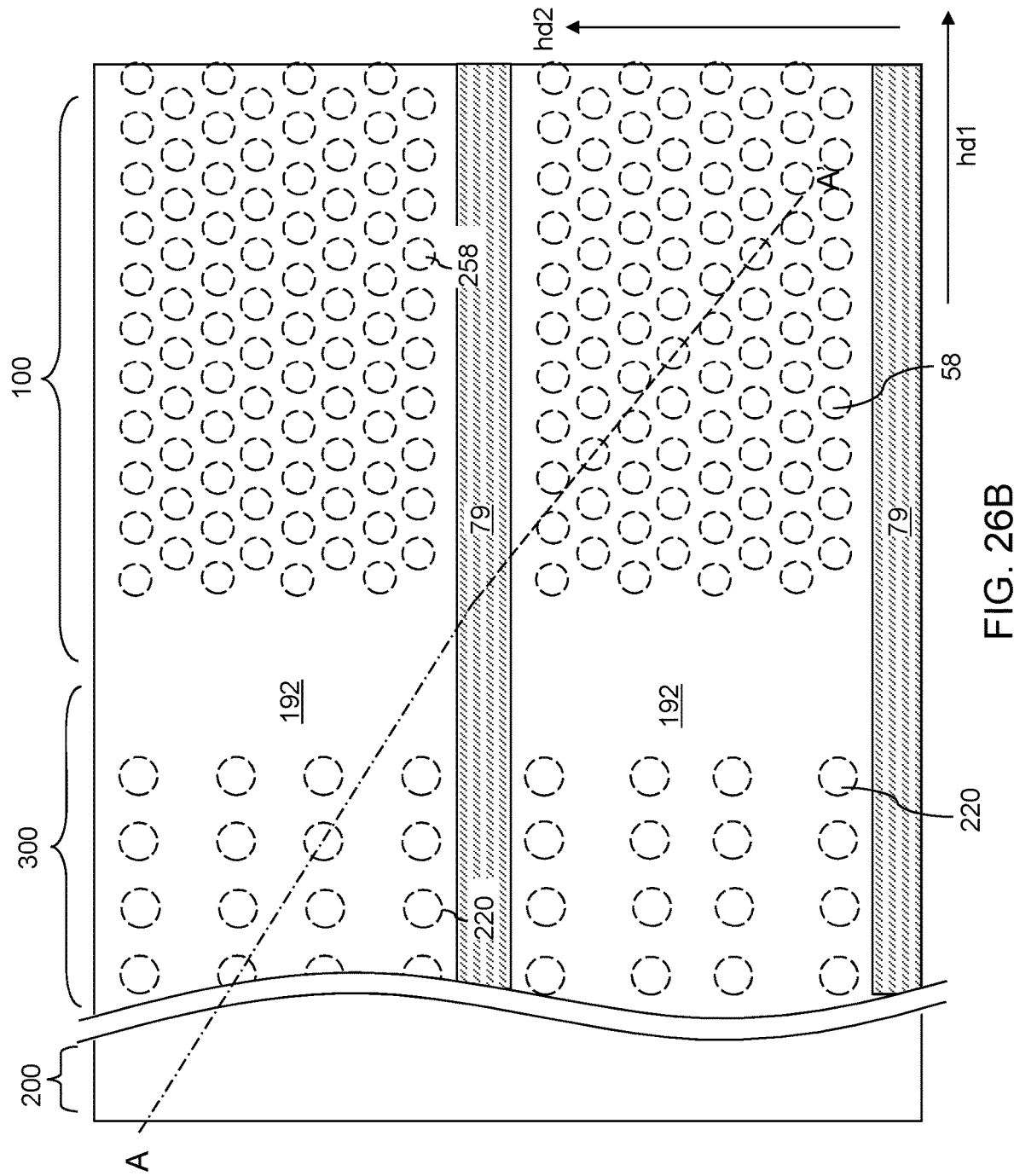
FIG. 26B is a top-down view of the first exemplary structure of FIG. 26A. The vertical plane A-A' is the plane of the cross-section of FIG. 26A.

FIG. 26A is a vertical cross-sectional view of the first exemplary structure after formation of a contact level dielectric layer and backside trenches according to the first embodiment of the present disclosure. FIG. 26B is a top-down view of the first exemplary structure of FIG. 26A. The vertical plane A-A' is the plane of the cross-section of FIG. 26A. Referring to FIGS. 26A and 26B, a contact level dielectric layer 192 can be formed over the dielectric fill material layer 190. The contact level dielectric layer 192 includes a dielectric material such as silicon oxide, and can have a thickness in a range from 50 nm to 800 nm, although lesser and greater thicknesses can also be employed. A photoresist layer (not shown) can be applied over the contact level dielectric layer 192, and is lithographically patterned to form openings in areas between arrays of memory stack structures 55. The pattern in the photoresist layer can be transferred through the contact level dielectric layer 192, the dielectric fill material layer 190, the insulating spacer layer 165, the alternating stack (32, 42), and/or the retro-stepped dielectric material portion 65 employing an anisotropic etch to form backside trenches 79. The backside trenches 79 vertically extend at least to the top surface of the substrate (9, 10), and laterally extend through the memory array region 100 and the contact region 300. In one embodiment, the backside trenches 79 can be employed as source contact openings in which source contact via structures can be subsequently formed. In one embodiment, the backside trenches 79 can laterally extend along the first horizontal direction hd1, i.e., along the word line direction of the rows of the drain select level assemblies 155. The photoresist layer can be removed, for example, by ashing.

Figure 27:
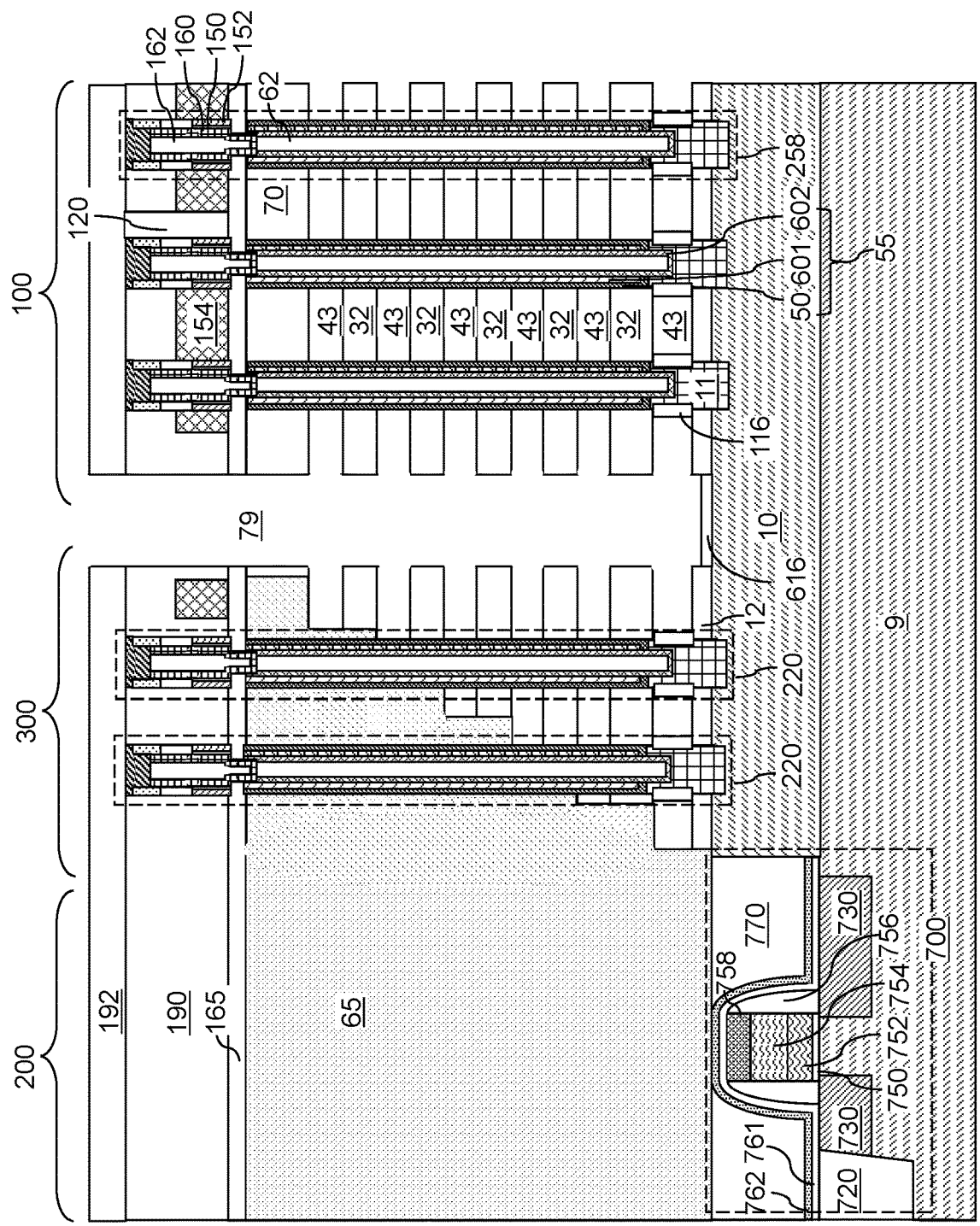
FIG. 27 is a vertical cross-sectional view of the first exemplary structure after formation of backside recesses by removal of the sacrificial material layers with respect to the insulating layers according to the first embodiment of the present disclosure.

Referring to FIG. 27, an etchant that selectively etches the second material of the sacrificial material layers 42 with respect to the first material of the insulating layers 32 may be introduced into the backside trenches 79, for example, using an etch process. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32, the dielectric fill material layer 190, the insulating spacer layer 165, and the retro-stepped dielectric material portion 65 may be selected from silicon oxide and dielectric metal oxides. In another embodiment, the sacrificial material layers 42 may include a semiconductor material such as polysilicon, and the materials of the insulating layers 32 and the retro-stepped dielectric material portion 65 may be selected from silicon oxide, silicon nitride, and dielectric metal oxides. In this case, the depth of the backside trenches 79 may be modified so that the bottommost surface of the backside trenches 79 is located within the base insulating layer 12, i.e., to avoid physical exposure of the top surface of the semiconductor material layer 10.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 may provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 may be formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 may include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 may include a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Figure 28:
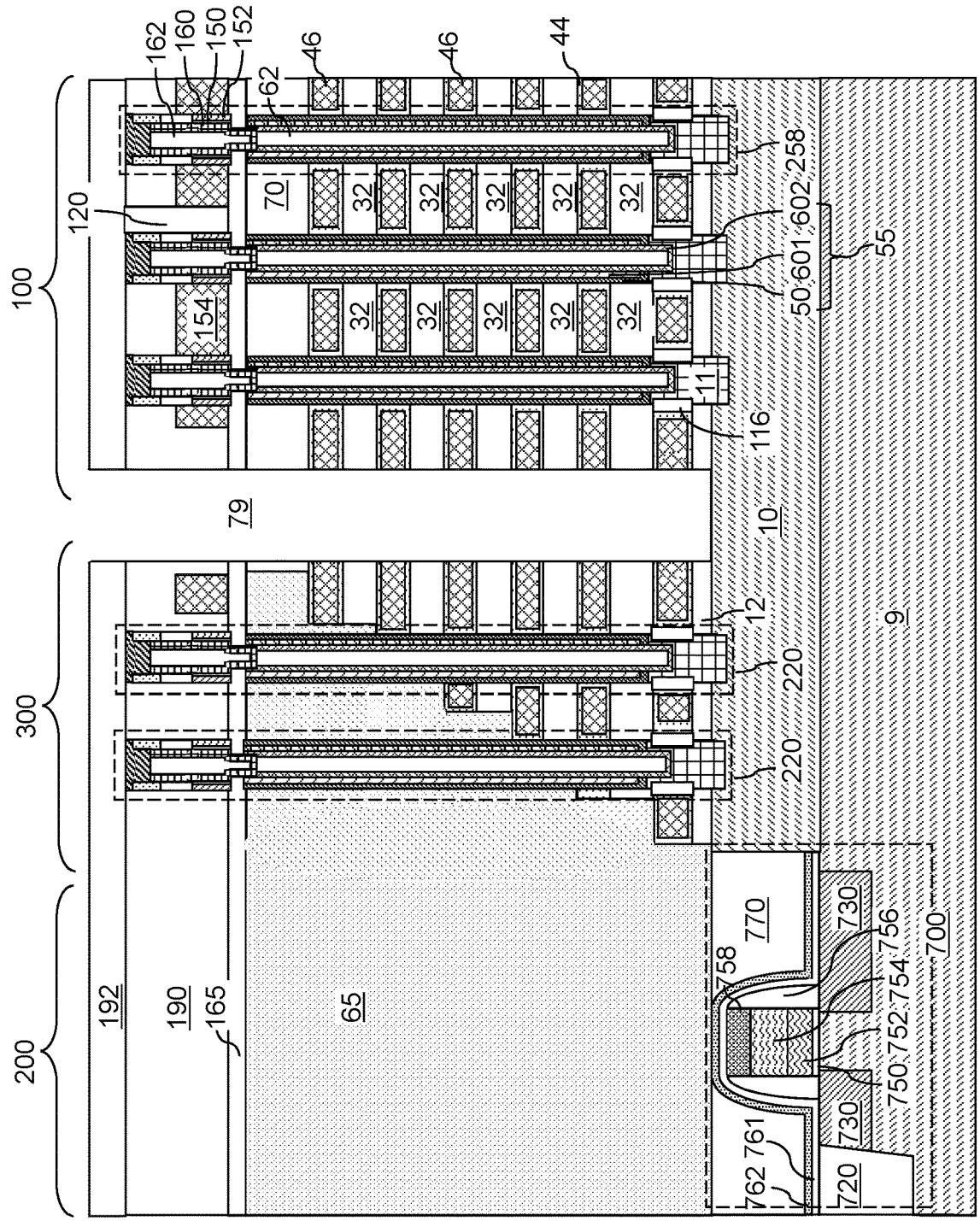
FIG. 28 is a vertical cross-sectional view of the first exemplary structure after formation of optional backside blocking dielectric layers and electrically conductive layers and after removal of excess conductive material from within the backside trenches according to the first embodiment of the present disclosure.

Referring to FIG. 28, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer may include a silicon oxide layer. The backside blocking dielectric layer may be deposited by a conformal deposition method such as chemical vapor deposition or atomic layer deposition. The thickness of the backside blocking dielectric layer may be in a range from 1 nm to 10 nm, although lesser and greater thicknesses may also be used. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

At least one conductive material may be deposited in the backside recesses 43, peripheral portions of the backside trenches 79, and over the contact level dielectric layer 192 by conformal deposition. Each continuous portion of the at least one conductive material deposited in a backside recess 43 constitutes an electrically conductive layer 46. The conductive material deposited outside of the backside recesses 43 collectively constitute a continuous metallic material layer (not shown), which is a continuous layer of the conductive material that is deposited over the contact level dielectric layer 192 and at peripheral portions of the backside trenches 79.

In an illustrative example, a metallic barrier layer (not explicitly shown) may be deposited in the backside recesses. The metallic barrier layer includes an electrically conductive metallic material that may function as a diffusion barrier layer and/or adhesion promotion layer for a metallic fill material to be subsequently deposited. The metallic barrier layer may include a conductive metallic nitride material such as TiN, TaN, WN, or a stack thereof, or may include a conductive metallic carbide material such as TiC, TaC, WC, or a stack thereof. In one embodiment, the metallic barrier layer may be deposited by a conformal deposition process such as chemical vapor deposition (CVD) or atomic layer deposition (ALD). The thickness of the metallic barrier layer may be in a range from 2 nm to 8 nm, such as from 3 nm to 6 nm, although lesser and greater thicknesses may also be used. In one embodiment, the metallic barrier layer may consist essentially of a conductive metal nitride such as TiN.

A metal fill material may be deposited in the plurality of backside recesses 43, on the sidewalls of the at least one backside contact trench 79, and over the top surface of the contact level dielectric layer 192 to form a metallic fill material layer. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer may consist essentially of at least one elemental metal. The at least one elemental metal of the metallic fill material layer may be selected, for example, from tungsten, cobalt, ruthenium, titanium, and tantalum. In one embodiment, the metallic fill material layer may consist essentially of a single elemental metal. In one embodiment, the metallic fill material layer may be deposited using a fluorine-containing precursor gas such as $WF_6$. In one embodiment, the metallic fill material layer may be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 may be formed in the plurality of backside recesses 43. The continuous metallic material layer may be formed on the sidewalls of each backside contact trench 79 and over the contact level dielectric layer 192. Each electrically conductive layer 46 includes a portion of the metallic barrier layer and a portion of the metallic fill material layer that are located between a vertically neighboring pair of dielectric material layers, which may be a pair of insulating layers 32, a bottommost insulating layer and a base insulating layer 12, or a topmost insulating layer and the insulating cap layer 70. The continuous metallic material layer includes a continuous portion of the metallic barrier layer and a continuous portion of the metallic fill material layer that are located in the backside trenches 79 or above the contact level dielectric layer 192.

Each sacrificial material layer 42 may be replaced with an electrically conductive layer 46. A backside cavity is present in the portion of each backside contact trench 79 that is not filled with the backside blocking dielectric layer and the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside contact trench 79 and from above the contact level dielectric layer 192, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 may be replaced with the electrically conductive layers 46.

Each drain select gate electrode (152, 154) functions as a drain side select gate electrode (SGD) of the vertical NAND string. One or several of the bottommost electrically conductive layers functions as a source side select gate electrode (SGS) of the vertical NAND string. Each electrically conductive layer 46 located between the drain side and the source side select gate electrodes may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer may be selective to the material of the backside blocking dielectric layer 44. In this case, a horizontal portion of the backside blocking dielectric layer 44 may be present at the bottom of each backside contact trench 79. The base insulating layer 12 may be vertically spaced from the backside contact trench 79 by the horizontal portion of the backside blocking dielectric layer 44.

In another embodiment, the removal of the continuous electrically conductive material layer may not be selective to the material of the backside blocking dielectric layer 44 or, the backside blocking dielectric layer 44 may not be used. In this case, a top surface and/or sidewall surface, of the base insulating layer 12 may be physically exposed at the bottom of the backside contact trench 79 depending on whether the base insulating layer 12 is not removed or partially removed during removal of the continuous electrically conductive material layer.

Figure 29:
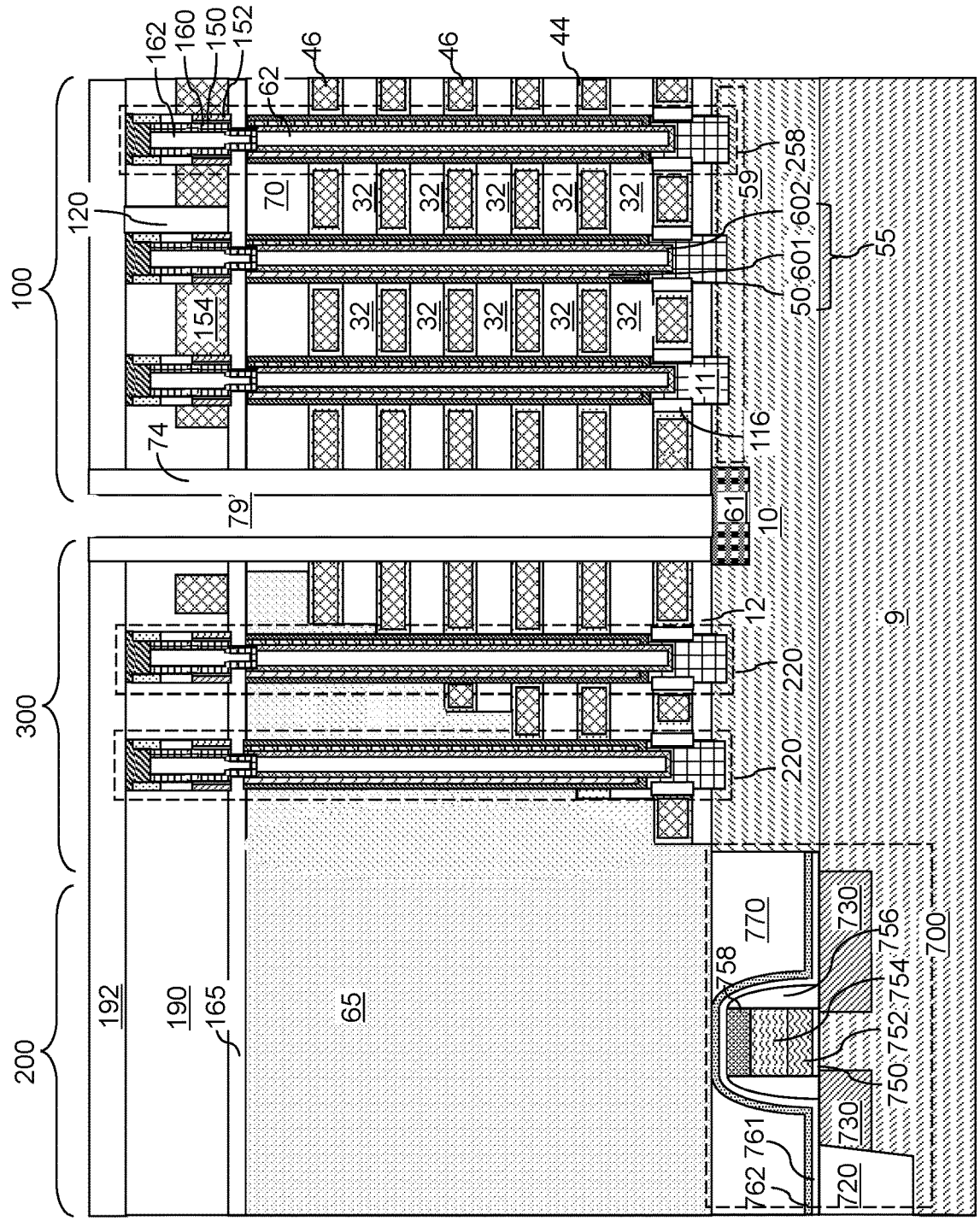
FIG. 29 is a vertical cross-sectional view of the first exemplary structure after formation of a source region underneath each backside trench according to the first embodiment of the present disclosure.

Referring to FIG. 29, an insulating material layer may be formed in the at least one backside contact trench 79 and over the contact level dielectric layer 192 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the contact level dielectric layer 192 and at the bottom of each backside contact trench 79. Each remaining portion of the insulating material layer constitutes an insulating spacer 74. A backside cavity 79' is present within a volume surrounded by each insulating spacer 74.

The anisotropic etch process may continue with, or without, a change in the etch chemistry to remove portions of the optional backside blocking dielectric layer 44 and the planar dielectric portion 616 that underlies the opening through the insulating spacer 74. A top surface of the semiconductor material layer 10 may be physically exposed at the bottom of each backside contact trench 79.

A source region 61 may be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74. Each source region 61 may have a doping of a second conductivity type, which is the opposite of the first conductivity type. For example, if the first conductivity type is p-type, the second conductivity type is n-type, and vice versa.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels (60, 160) through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 is formed in an upper portion of the semiconductor substrate (9, 10).

Figure 30:
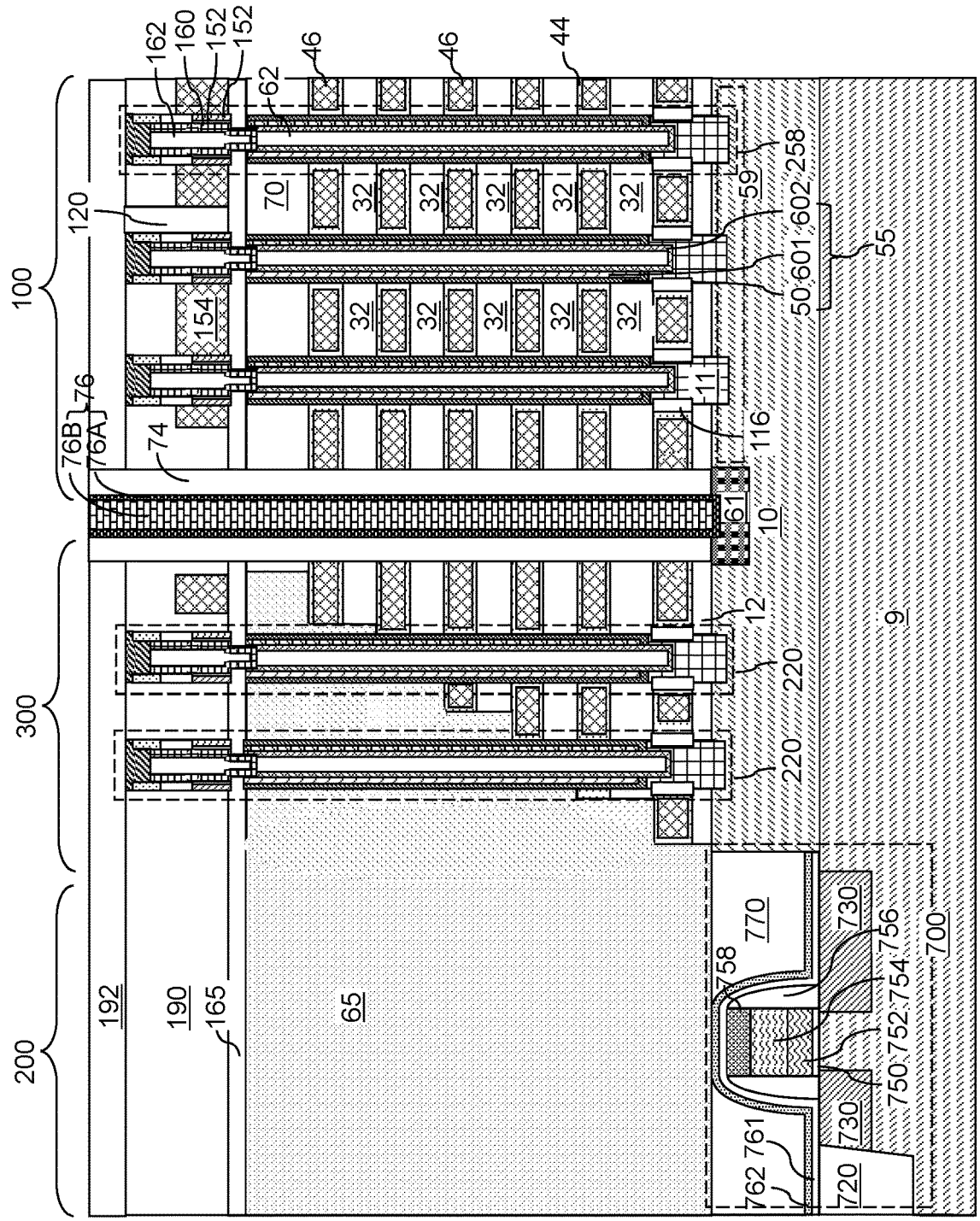
FIG. 30 is a vertical cross-sectional view of the first exemplary structure after formation of an insulating spacer and a backside contact structure within each backside trench according to the first embodiment of the present disclosure.

Referring to FIG. 30, a contact via structure 76 may be formed within each cavity 79'. Each contact via structure 76 may fill a respective cavity 79'. The contact via structures 76 may be formed by depositing at least one conductive material in the remaining unfilled volume (i.e., the backside cavity 79') of the backside contact trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 192 overlying the alternating stack (32, 46) as a stopping layer. If chemical mechanical planarization (CMP) process is used, the contact level dielectric layer 192 may be used as a CMP stopping layer. Each remaining continuous portion of the at least one conductive material in the backside contact trenches 79 constitutes a backside contact via structure 76. The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 31A:
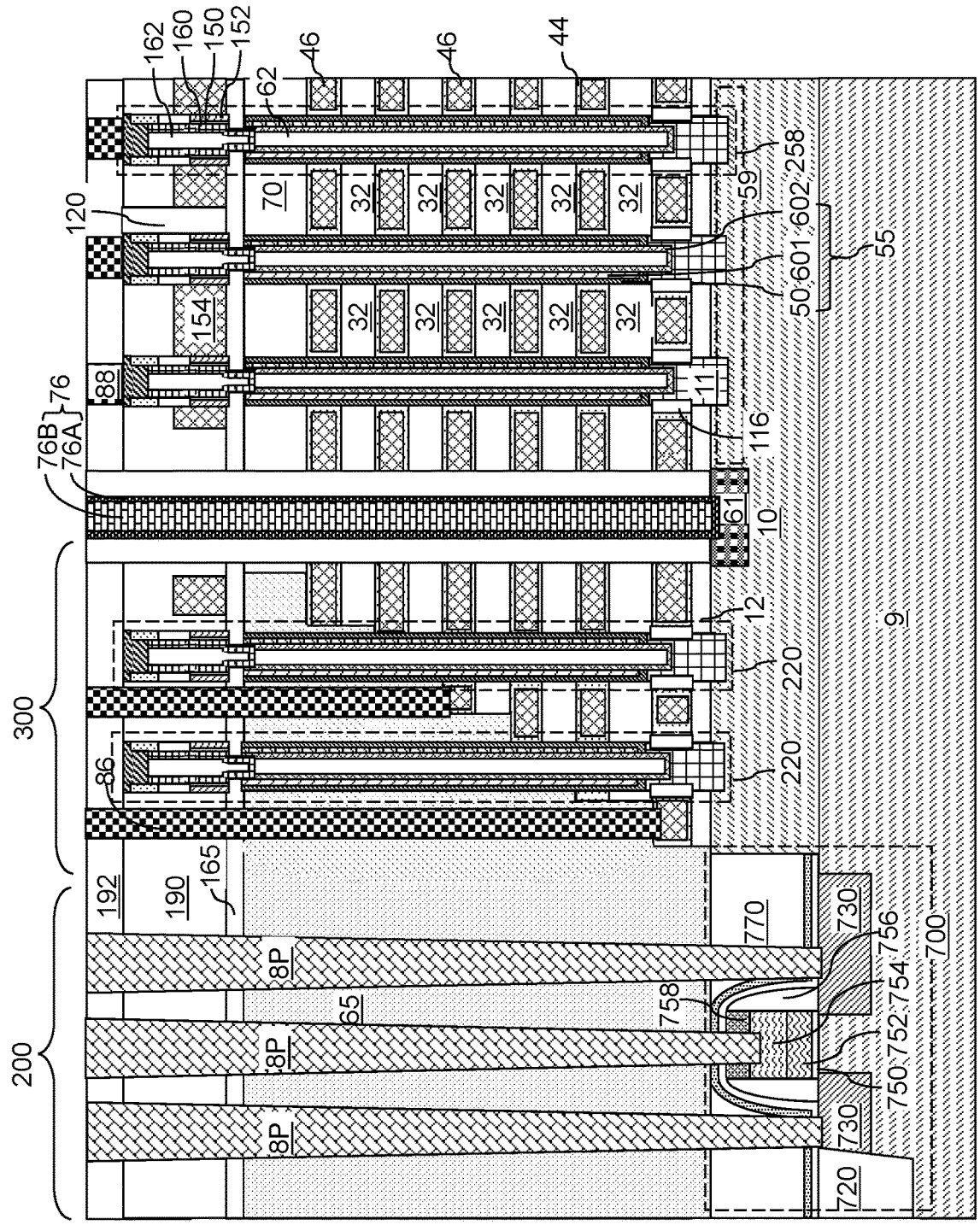
FIG. 31A is a vertical cross-sectional view of the first exemplary structure after formation of additional contact via structures according to the first embodiment of the present disclosure.
Figure 31B:
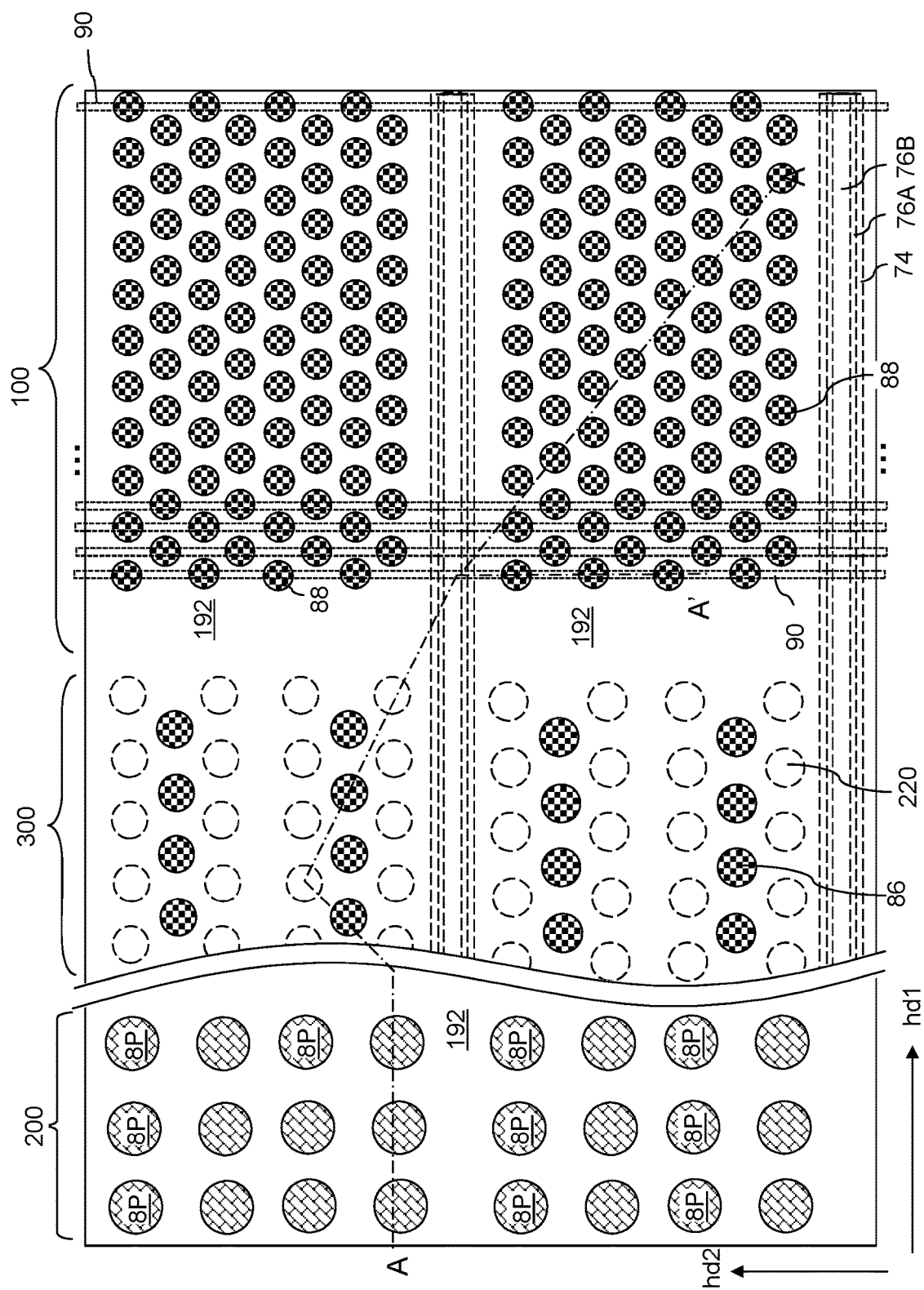
FIG. 31B is a top-down view of the exemplary structure of FIG. 31A. The vertical plane A-A' is the plane of the schematic vertical cross-sectional view of FIG. 31A.

FIG. 31A is a schematic vertical cross-sectional view of the first exemplary structure after formation of additional contact via structures according to the first embodiment of the present disclosure. FIG. 31B is a top-down view of the exemplary structure of FIG. 31A. The vertical plane A-A' is the plane of the schematic vertical cross-sectional view of FIG. 31A. Referring to FIGS. 31A and 31B, additional contact via structures (88, 86, 8P) can be formed through the contact level dielectric layer 192, the dielectric fill material layer 190, and optionally through the retro-stepped dielectric material portion 65. For example, drain contact via structures 88 can be formed through the contact level dielectric material layer 192 on each drain region 63. Word line contact via structures 86 can be formed on the electrically conductive layers 46 through the contact level dielectric layer 192, the dielectric fill material layer 190, the insulating spacer layer 165, and through the retro-stepped dielectric material portion 65. Peripheral device contact via structures 8P can be formed through the contact level dielectric layer 192, the dielectric fill material layer 190, the insulating spacer layer 165, and through the retro-stepped dielectric material portion 65 directly on respective nodes of the peripheral devices. Additional metal interconnect structures (not shown) can be subsequently formed as needed. For example, bit lines 90 (shown schematically in FIG. 31B) which extend in the second horizontal direction hd2 can be formed to provide electrical contact with the drain contact via structures 88.

Referring collectively to all drawings related to the first embodiment, the first exemplary structure may include a three-dimensional memory device. The three-dimensional memory device may include: an alternating stack of insulating layers 32 and electrically conductive layers 46 located over a substrate (9, 10); an array of memory stack structures 55 extending through the alternating stack (32, 46) and arranged as rows that extend along a first horizontal direction hd1 and are spaced along a second horizontal direction hd2, wherein each of the memory stack structures 55 comprises a memory film 50 and a memory-level channel portion 60 contacting an inner sidewall of the memory film 50; an array of drain-select-level assemblies 155 overlying the alternating stack and having a same periodicity as the array of memory stack structures 55 along the first horizontal direction hd1 and the second horizontal direction hd2, wherein each of the drain-select-level assemblies 155 comprises a drain-select-level channel portion 160 contacting a respective memory-level channel portion 60; drain select gate electrodes (152, 154) laterally surrounding respective rows of drain-select-level assemblies 155; and a drain-select-level isolation strip 120 comprising at least one dielectric material and located between a neighboring pair of drain select gate electrodes (152, 154).

Each of the drain select gate electrodes (152, 154) may include a strip electrode portion 154 including a pair of lengthwise sidewalls that generally extend along the first horizontal direction hd1; and a plurality of cylindrical electrode portions 152 that laterally surround a respective one of the drain-select-level channel portions 160. An array of gate dielectrics 150 may be located between a respective one of the cylindrical electrode portions 152 and a respective one of the drain-select-level channel portions 160.

In one embodiment, the drain select gate electrodes (152, 154) may be formed on a top surface of the insulating spacer layer 165, through which the drain-select-level channel portions 160 extend. In one embodiment, the insulating spacer layer 165 may contact a topmost surface of each of the memory films 50. Each of the drain-select-level channel portions 160 may vertically extend through a respective opening in the insulating spacer layer 165. In one embodiment, the insulating spacer layer 165 contacts a bottom surface of each of the drain select gate electrodes (152, 154). An array of drain regions 63 may contact an upper end of a respective one of the drain-select-level channel portions 160.

Figure 32:
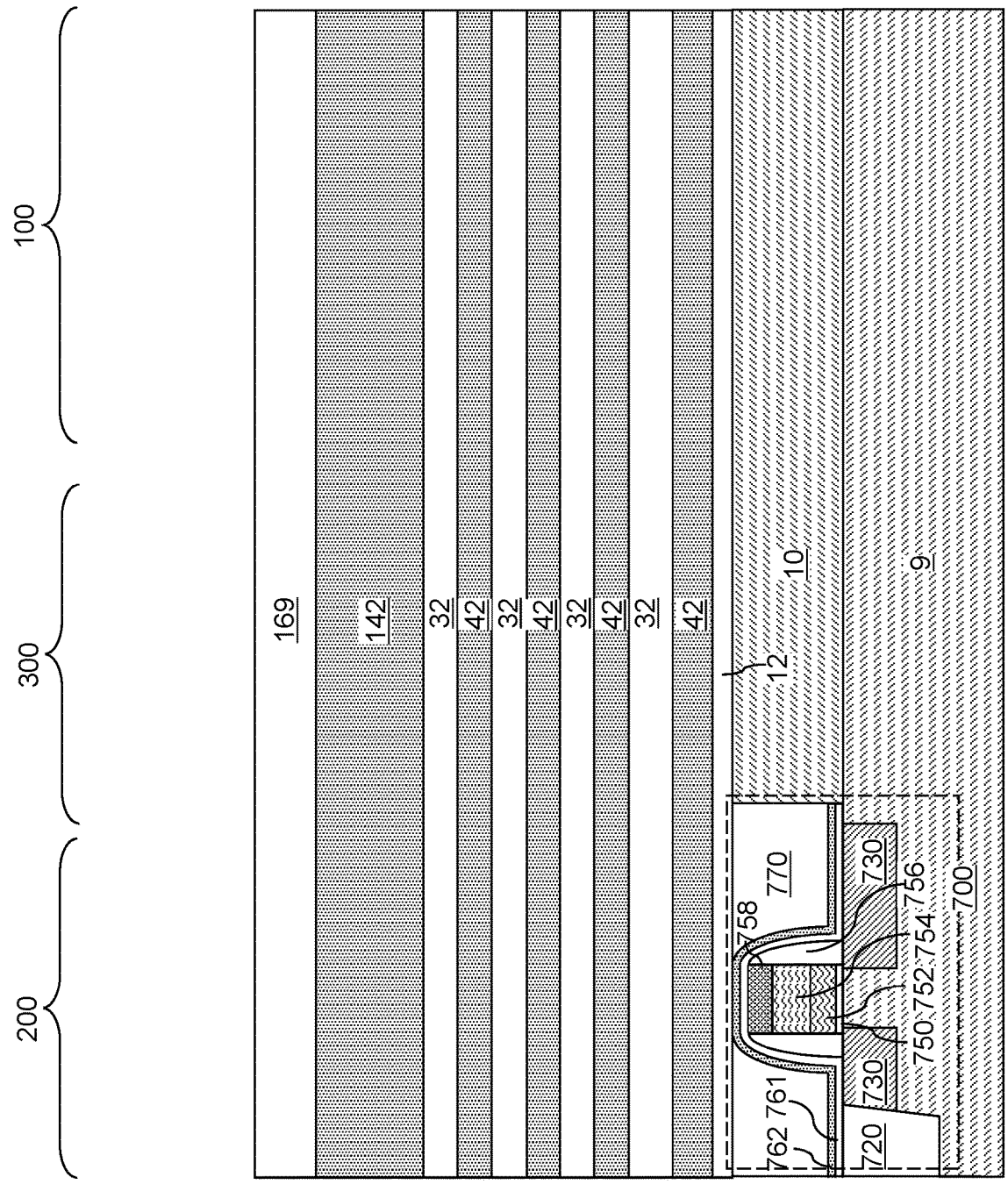
FIG. 32 is a vertical cross-sectional view of a second exemplary structure after formation of an alternating stack of insulating layers and sacrificial material layers, a first sacrificial matrix layer, and a second sacrificial matrix layer according to the second embodiment of the present disclosure.

Referring to FIG. 32, a second exemplary structure according to the second embodiment of the present disclosure is illustrated, which may be derived from the first exemplary structure illustrated in FIG. 2 by forming a layer stack including at least one sacrificial matrix layer (142, 169) in lieu of the insulating cap layer 70. In one embodiment. the at least one sacrificial matrix layer (142, 169) may include a first sacrificial matrix layer 142 and a second sacrificial matrix layer 169 that may be formed over the first sacrificial matrix layer 142. Each of the first and second sacrificial matrix layers (142, 169) may include a material that may be removed selective to the material of an underlying layer. In an illustrative example, the first sacrificial matrix layer 142 may include the same material as the sacrificial material layers 42, and the second sacrificial matrix layer 169 may include the same material as the insulating layers 32. In one embodiment, the first sacrificial matrix layer 142 may include silicon nitride, and the second sacrificial matrix layer 169 may include silicon oxide. In one embodiment, the first sacrificial matrix layer 142 may have a thickness that is in a range from twice the average thickness of the sacrificial material layers 42 to 6 times the average thickness of the sacrificial material layers 42, and the second sacrificial matrix layer 169 may have a thickness that is in a range from the average thickness of the insulating layers 32 to three times the average thickness of the insulating layers 32.

Figure 33:
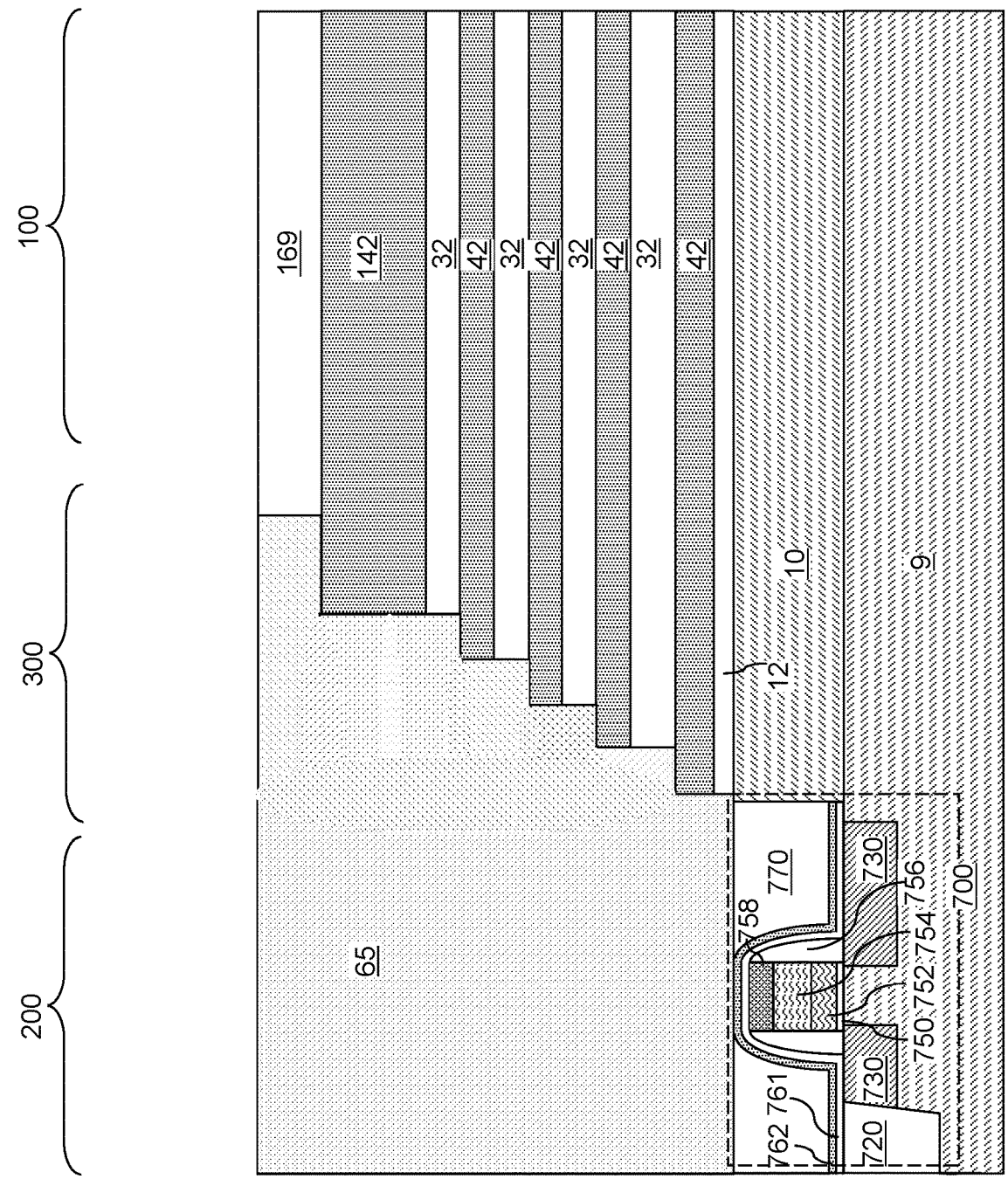
FIG. 33 is a vertical cross-sectional view of the second exemplary structure after formation of stepped terraces and a retro-stepped dielectric material portion according to the second embodiment of the present disclosure.

Referring to FIG. 33, the processing steps as described above with reference to FIG. 3 may be performed to form a terrace region and a stepped cavity, and to form a retro-stepped dielectric material portion 65. The second sacrificial matrix layer 169 may be patterned in the same manner as the insulating cap layer 70 of the first embodiment, and the first sacrificial matrix layer 142 may be patterned in the same manner as a topmost one of the sacrificial material layers 42 of the first embodiment.

Figure 34A:
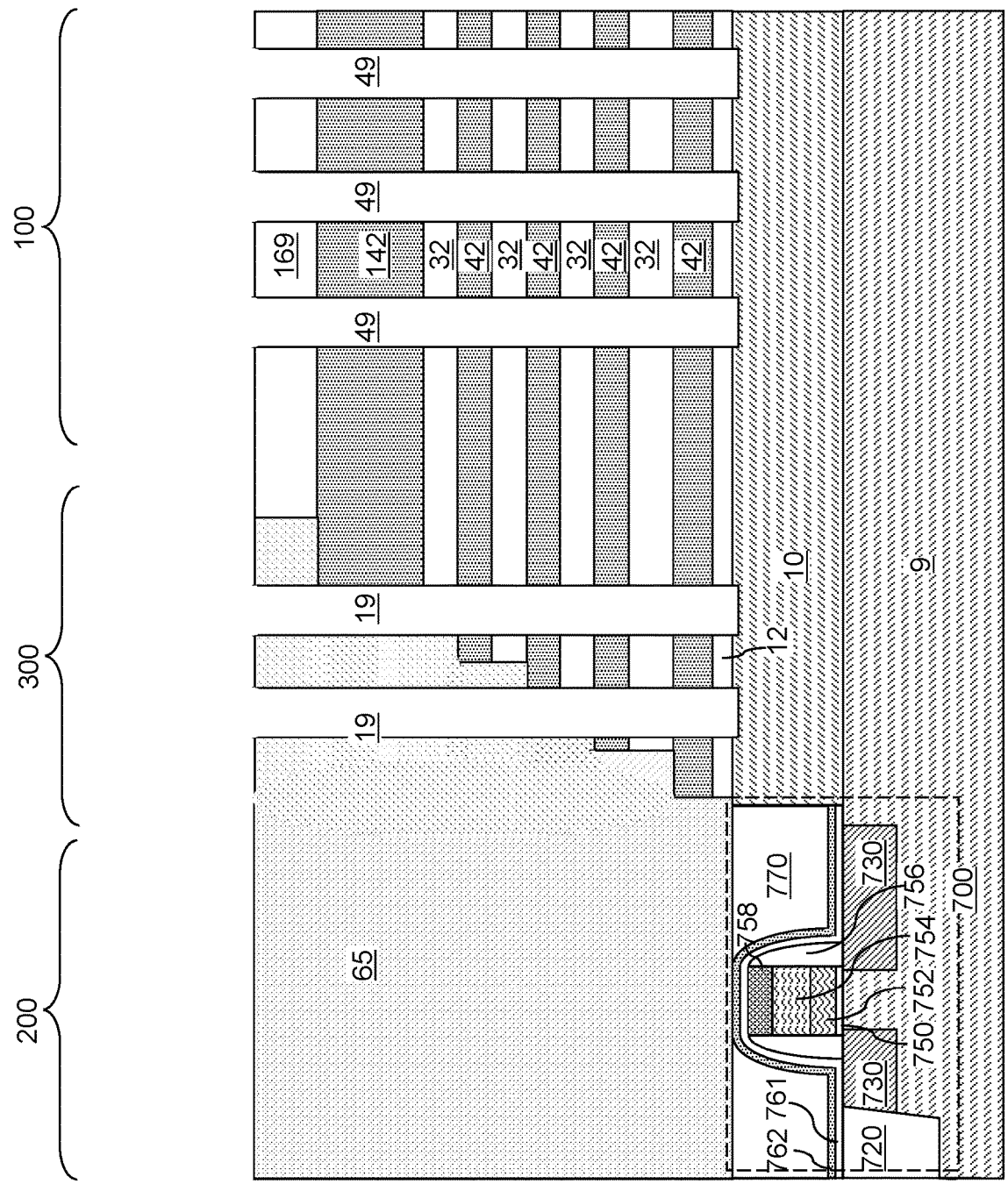
FIG. 34A is a vertical cross-sectional view of the second exemplary structure after formation of memory openings and support openings according to the second embodiment of the present disclosure.
Figure 34B:
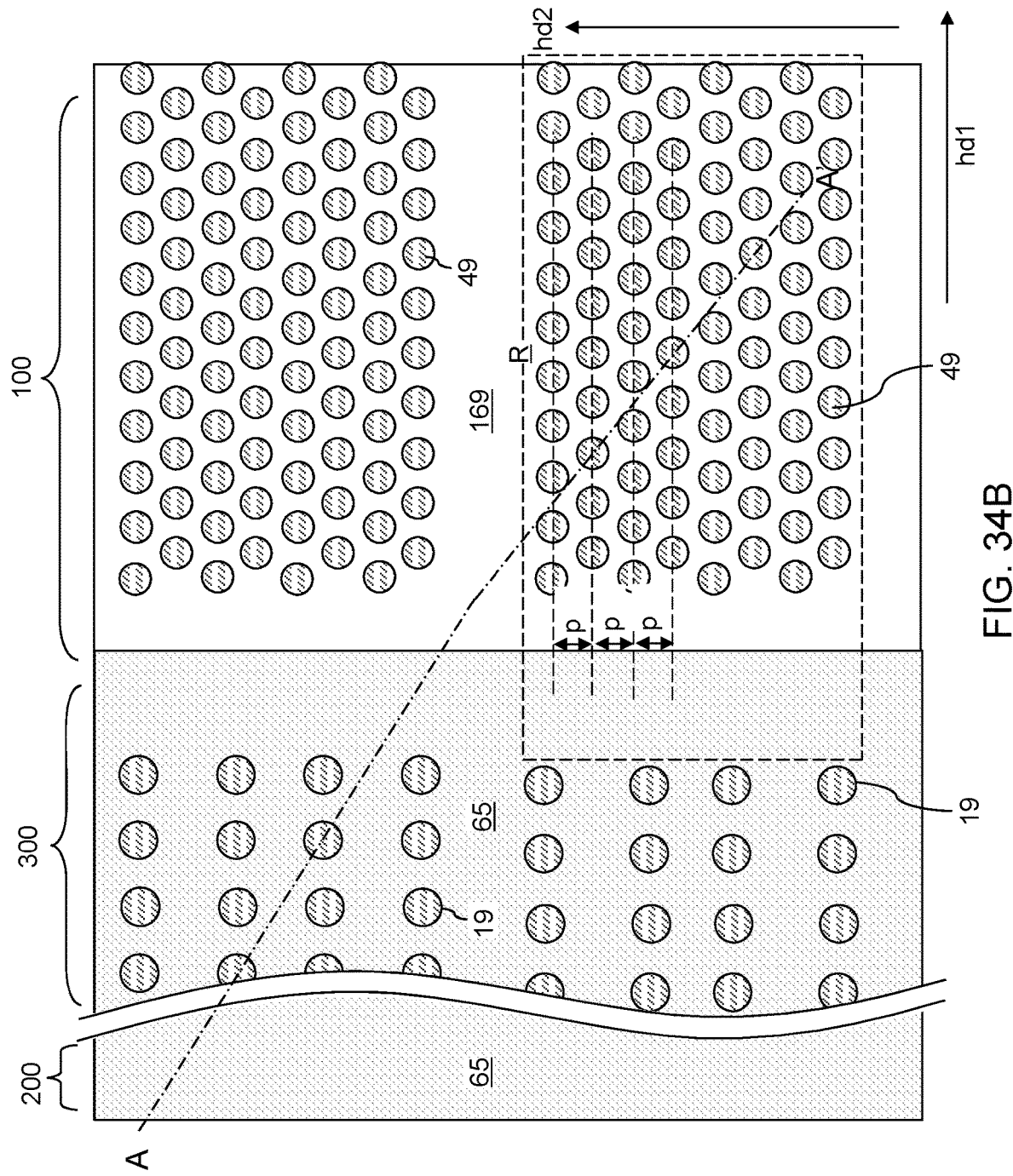
FIG. 34B is a top-down view of the second exemplary structure of FIG. 34A. The vertical plane A-A' is the plane of the cross-section for FIG. 34A.

FIG. 34A is a schematic vertical cross-sectional view of the second exemplary structure after formation of memory openings and support openings according to the second embodiment of the present disclosure. FIG. 34B is a top-down view of the second exemplary structure of FIG. 34A. The vertical plane A-A' is the plane of the cross-section for FIG. 34A. Referring to FIGS. 34A and 34B, the processing steps of FIGS. 4A and 4B can be performed to form memory openings 49 and support openings 19. The memory openings 49 can have the same pattern as in the first embodiment, and as such, can form two-dimensional arrays having a uniform inter-row pitch p along the second horizontal direction hd2. The region R in FIG. 34B corresponds to a region in which a two-dimensional array of memory openings 49 is provided. The two-dimensional array of memory openings 49 can be a two-dimensional periodic array of memory openings 49.

FIGS. 35A-35G illustrate structural changes in a memory opening 49, which is one of the memory openings 49 in the second exemplary structure of FIGS. 34A and 34B, during formation of a memory stack structure. The same structural change occurs simultaneously in each of the other memory openings 49 and the support openings 19.

Referring to FIG. 35A, a memory opening 49 in the second exemplary device structure of FIGS. 34A and 34B is illustrated. The memory opening 49 extends through the second sacrificial matrix layer 169, the first sacrificial matrix layer 142, the alternating stack (32, 42), the base insulating layer 12, and optionally into an upper portion of the semiconductor material layer 10. At this processing step, each support opening 19 may extend through the retro-stepped dielectric material portion 65, a subset of layers in the alternating stack (32, 42), the base insulating layer 12, and optionally through the upper portion of the semiconductor material layer 10. The recess depth of the bottom surface of each memory opening with respect to the top surface of the semiconductor material layer 10 may be in a range from 0 nm to 30 nm, although greater recess depths may also be used. Optionally, the sacrificial material layers 42 may be laterally recessed partially to form lateral recesses (not shown), for example, by an isotropic etch.

Referring to FIG. 35B, an optional pedestal channel portion (e.g., an epitaxial pedestal) 11 may be formed at the bottom portion of each memory opening 49 and each support openings 19, for example, by selective epitaxy. The pedestal channel portion 11 of the second embodiment may be structurally and compositionally identical to the pedestal channel portion 11 of the first embodiment, and may be formed using a same selective deposition process.

Referring to FIG. 35C, a stack of layers including a blocking dielectric layer 52, a charge storage layer 54, a tunneling dielectric layer 56, and an optional first semiconductor channel layer 601 may be sequentially deposited in the memory openings 49. Each of the blocking dielectric layer 52, the charge storage layer 54, the tunneling dielectric layer 56, and the optional first semiconductor channel layer 601 may have the same composition and/or the same thickness as in the first embodiment, and may be formed in the same manner as in the first embodiment.

Referring to FIG. 35D, the optional first semiconductor channel layer 601, the tunneling dielectric layer 56, the charge storage layer 54, the blocking dielectric layer 52 are sequentially anisotropically etched using at least one anisotropic etch process in the same manner as in the first embodiment. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls. A cavity 49' may be present inside each memory opening 49 and inside each support opening 19.

Figure 35E:
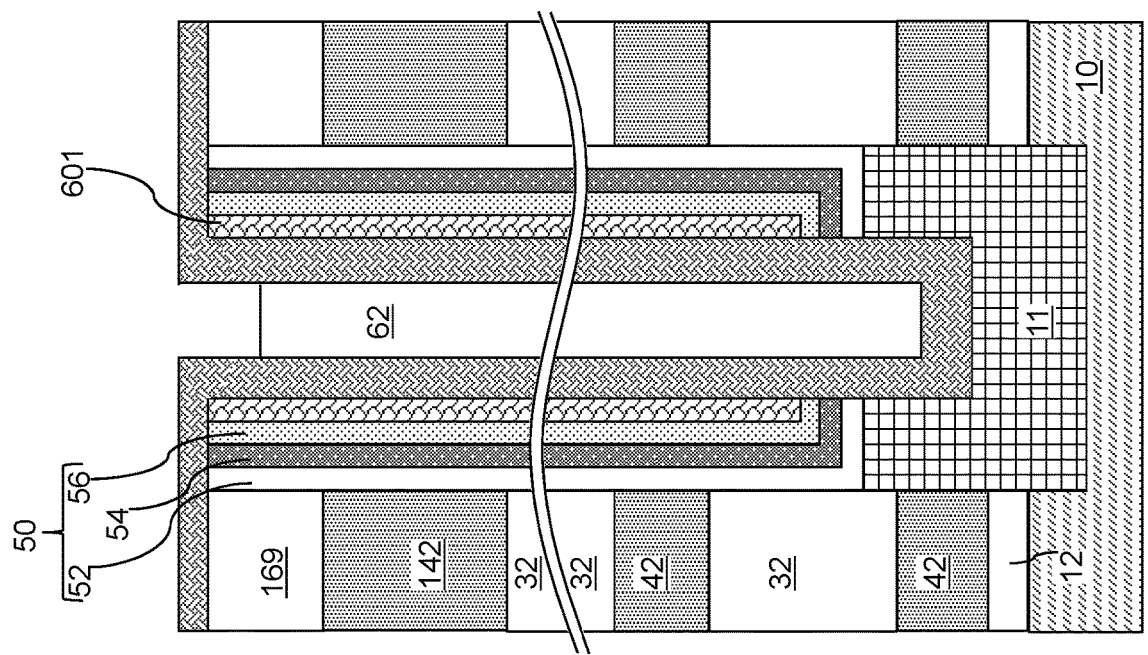

Referring to FIG. 35E, a second semiconductor channel layer 602 may be deposited directly on the semiconductor surface of the pedestal channel portion 11 (or the semiconductor substrate layer 10 if pedestal channel portions 11 are omitted), and directly on the first semiconductor channel layer 601. The second semiconductor channel layer 602 may have the same composition and/or the same structure as the second semiconductor channel layer 602 of the first embodiment. In case the memory openings 49 and the support openings 19 are not completely filled with the second semiconductor channel layer 602, a dielectric core material layer 62L including a dielectric material may be deposited in unfilled volumes of the memory openings 49 and support openings 19. The dielectric core material layer 62L may include silicon oxide.

Figure 35F:
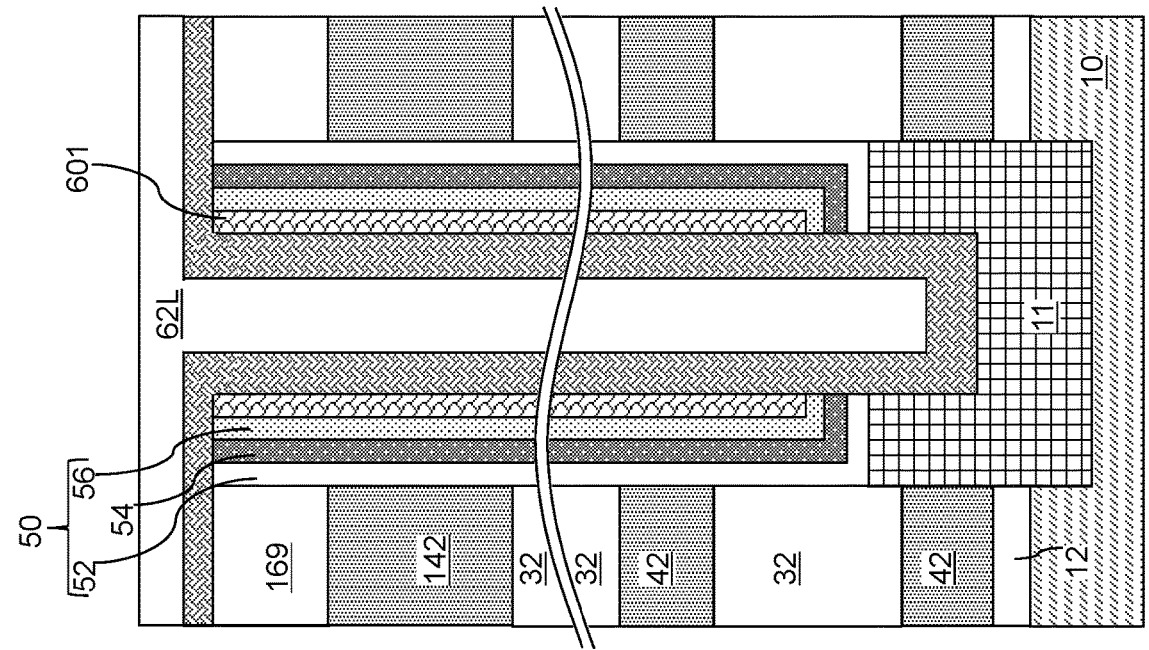

Referring to FIG. 35F, the dielectric core material layer 62L may be vertically recessed to remove horizontal portions of the dielectric core material layer 62L from above the top surface of the second semiconductor channel layer 602. Subsequently, the dielectric core material layer 62L may be further recessed selective to the second semiconductor channel layer 602 such that recessed top surfaces of remaining portions of the dielectric core material layer 62L is located below the horizontal plane including the top surface of the second sacrificial matrix layer 169. Each remaining portion of the dielectric core material layer 62L constitutes a dielectric core 62, which may be a dielectric pillar structure located entirely within a respective one of the memory openings 49 and the support openings 19.

Figure 35G:
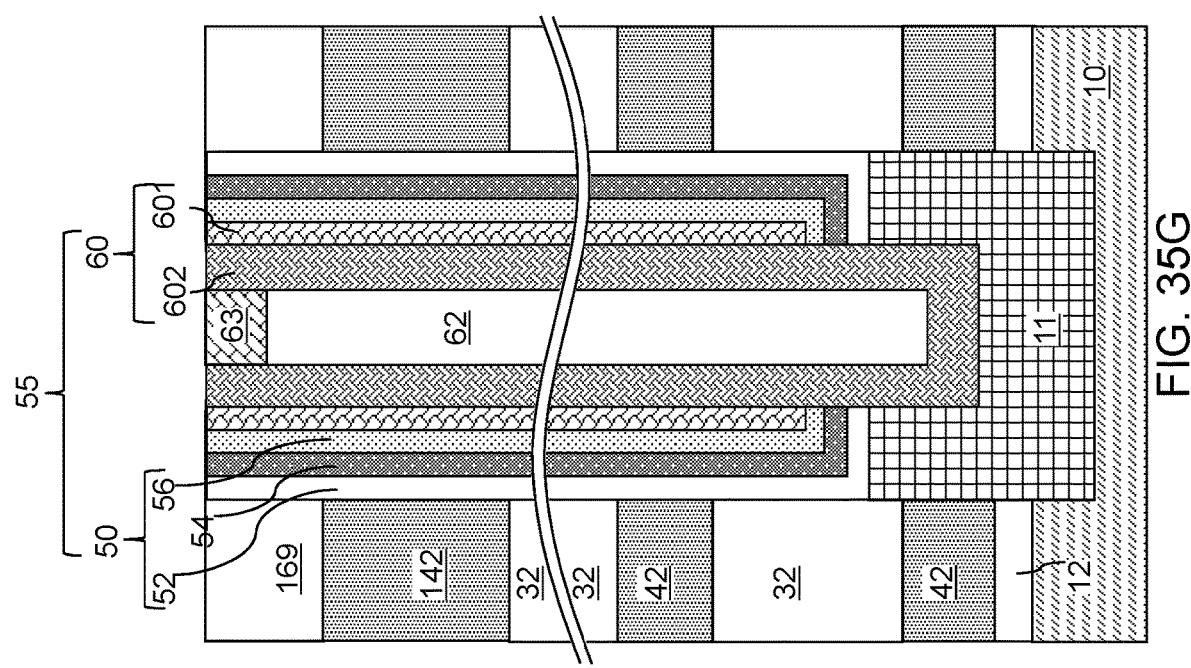

Referring to FIG. 35G, a doped semiconductor material having a doping of the second conductivity type (which is the opposite of the first conductivity type) may be deposited in the cavities overlying the dielectric cores 62. Portions of the deposited doped semiconductor material and the second semiconductor channel layer 602 located above the horizontal plane including the top surface of the second sacrificial matrix layer 169 may be removed by a planarization process. The planarization process may use a recess etch or chemical mechanical planarization. Each remaining portion of the doped semiconductor material overlying a respective dielectric core 62 constitutes a drain region 63.

Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 36A:
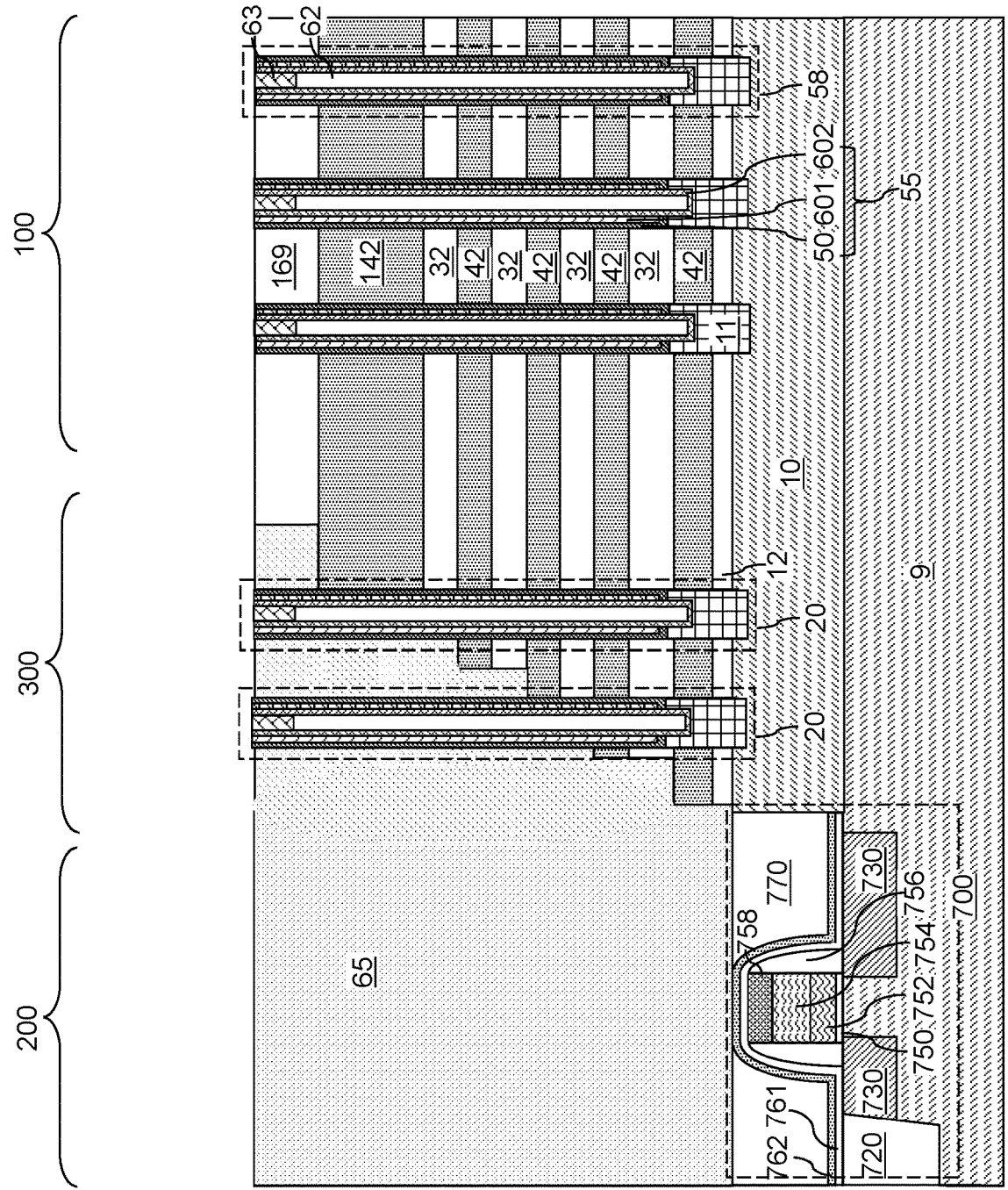
FIG. 36A is a vertical cross-sectional view of the second exemplary structure after formation of the memory stack structures according to the second embodiment of the present disclosure.
Figure 36B:
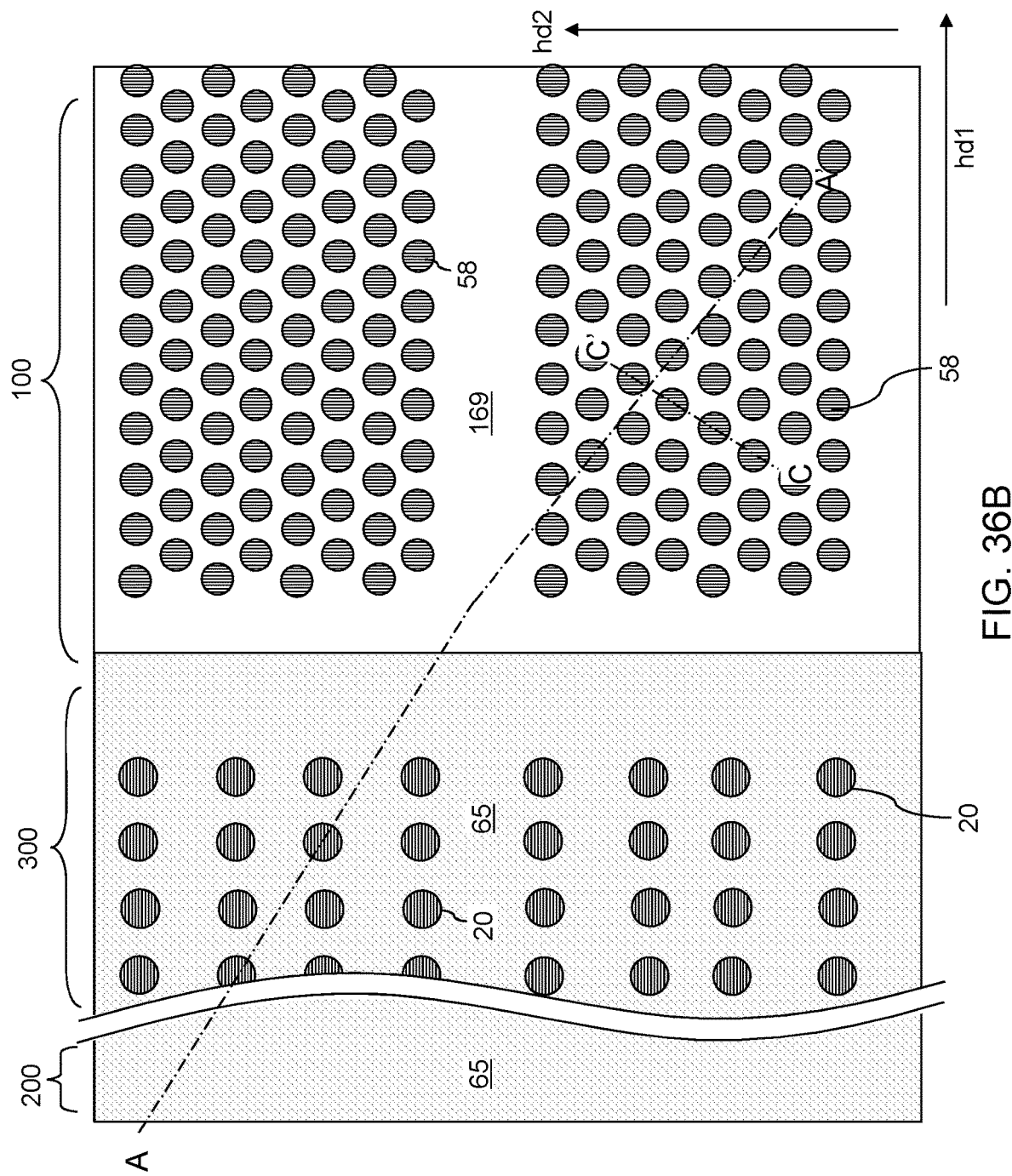
FIG. 36B is a top-down view of the second exemplary structure of FIG. 36A. The vertical plane A-A' is the plane of the cross-section for FIG. 36A.
Figure 36C:
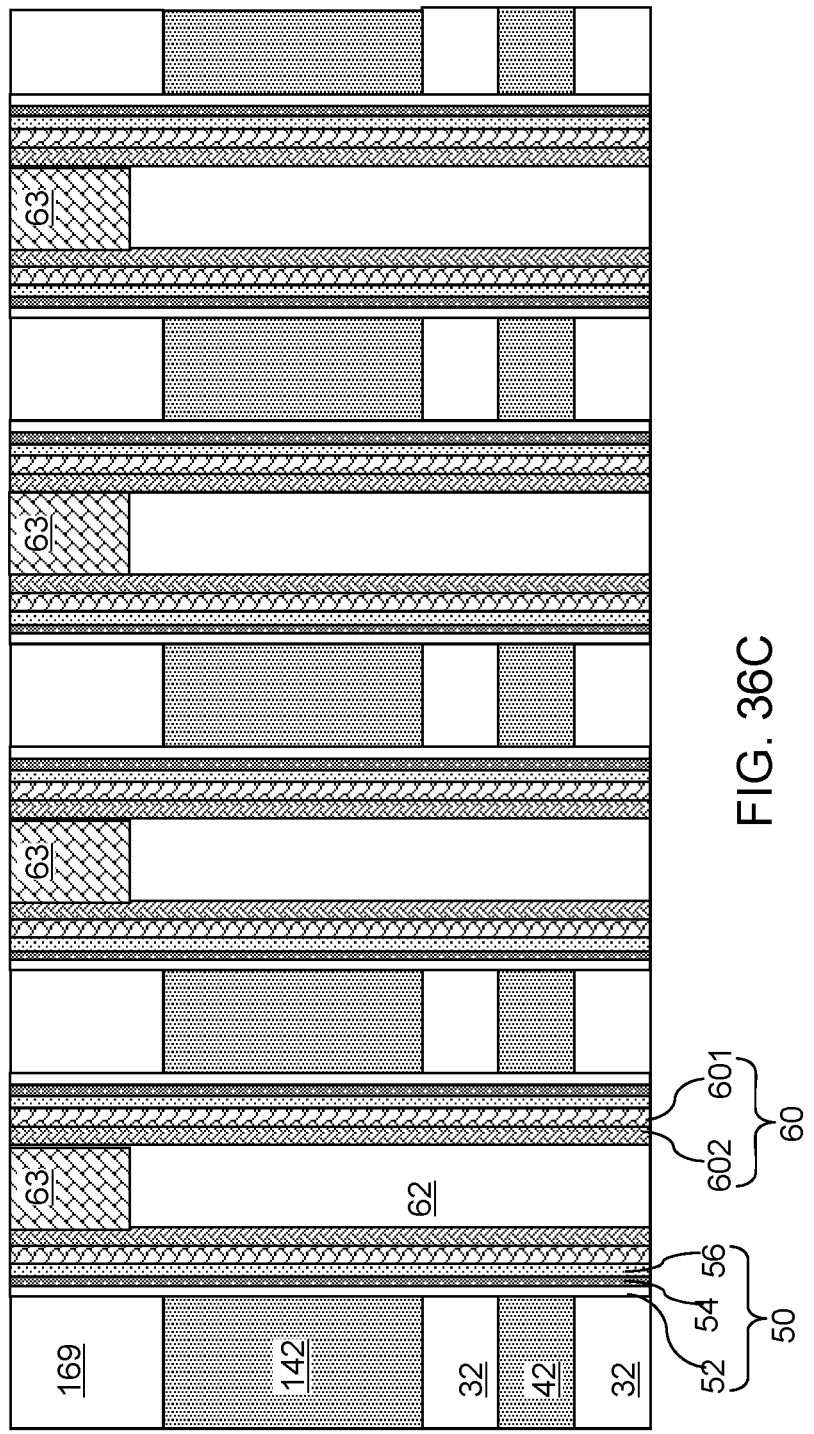
FIG. 36C is a vertical cross-sectional view of the second exemplary structure along the vertical plane C-C' of FIG. 36B.

FIG. 36A is a schematic vertical cross-sectional view of the second exemplary structure after formation of the memory stack structures according to the second embodiment of the present disclosure. FIG. 36B is a top-down view of the second exemplary structure of FIG. 36A. The vertical plane A-A' is the plane of the cross-section for FIG. 36A. FIG. 36C is a vertical cross-sectional view of the second exemplary structure along the vertical plane C-C' of FIG. 36B. Referring to FIGS. 36A-36C, the second exemplary structure is illustrated after the processing steps of FIG. 35G. Each combination of a memory film 50 and a vertical semiconductor channel 60 (which is a portion of a vertical semiconductor channel) within a memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11, a memory stack structure 55, an optional dielectric core 62, and a drain region 63 located in a memory opening 49 is herein referred to as a memory opening fill structure 58. Each combination of a pedestal channel portion 11, a memory film 50, a vertical semiconductor channel 60, an optional dielectric core 62, and a drain region 63 within each support opening 19 fills the respective support openings 19, and constitutes a support pillar structure 20 (i.e., a dummy structure which is not electrically connected to a bit line). Each drain region 63 within a support pillar structure 20 is a dummy structure, which is electrically inactive, and is not directly contacted by any conductive structure from above.

An instance of a memory opening fill structure 58 may be formed within each memory opening 49 of the structure of FIGS. 34A and 34B. An instance of the support pillar structure 20 may be formed within each support opening 19 of the structure of FIGS. 34A and 34B. Each exemplary memory stack structure 55 may include a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (comprising a memory material layer 54) and an optional blocking dielectric layer 52. While the present disclosure is described using the illustrated configuration for the memory stack structure, the methods of the present disclosure may be applied to alternative memory stack structures including different layer stacks or structures for the memory film 50 and/or for the vertical semiconductor channel 60.

An array of memory stack structures 55 may extend through the at least one sacrificial matrix layer (142, 169) and the alternating stack (32, 42), and is arranged as rows that extend along the first horizontal direction hd1 with a first pitch and are spaced along a second horizontal direction hd2 with a second pitch for each pair of neighboring rows. The at least one sacrificial matrix layer (169, 142) may be subsequently removed selective to the memory opening fill structures 58 and the support opening fill structures 20.

Figure 37:
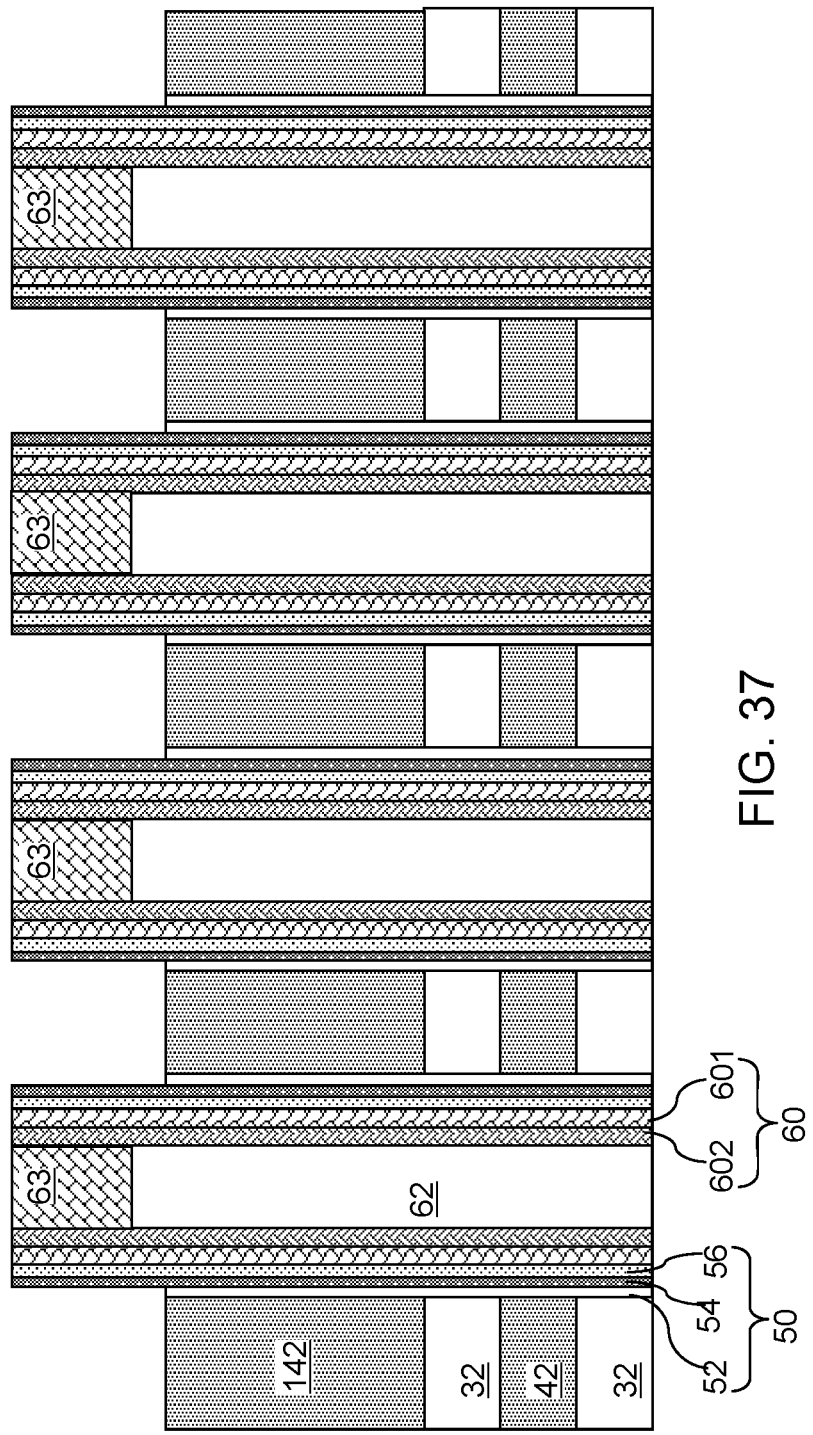
FIG. 37 is a vertical cross-sectional view of the second exemplary structure after removal of the second sacrificial matrix layer according to the second embodiment of the present disclosure.

Referring to FIG. 37, the second sacrificial matrix layer 169 may be removed selective to the semiconductor materials of the memory opening fill structures 58 and the support opening fill structures 20. In one embodiment, the removal of the second sacrificial matrix layer 169 may be selective to the first sacrificial matrix layer 142. In one embodiment, the second sacrificial matrix layer 169 may include silicon oxide, and the first sacrificial matrix layer 142 may include silicon nitride. In this case, the second sacrificial matrix layer 169 may be removed selective to the first sacrificial matrix layer 142 by a wet etch process using hydrofluoric acid. Physically exposed portions of the blocking dielectric layer 52 may be collaterally etched. For example, if the blocking dielectric layer 52 and the second sacrificial matrix layer 169 include silicon oxide, the physically exposed upper ends of the blocking dielectric layers 52 may be collaterally etched during removal of the second sacrificial matrix layer 169.

Figure 38:
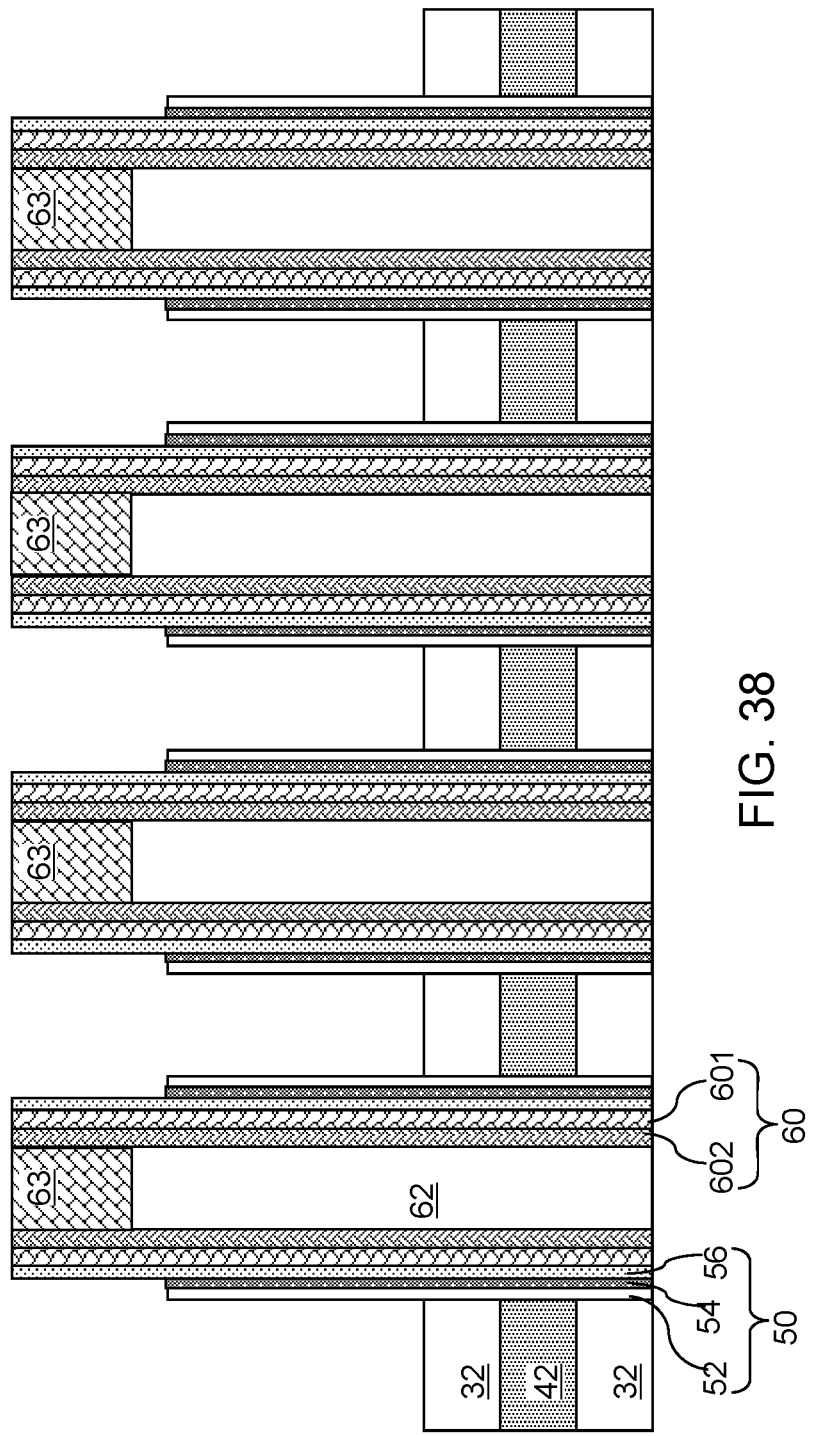
FIG. 38 is a vertical cross-sectional view of the second exemplary structure after removal of the first sacrificial matrix layer according to the second embodiment of the present disclosure.

Referring to FIG. 38, the first sacrificial matrix layer 142 may be removed selective to the semiconductor materials of the memory opening fill structures 58 and the support opening fill structures 20 and selective to the insulating material of the insulating layers 32. For example, if the first sacrificial matrix layer 142 includes silicon nitride, a wet etch using hot phosphoric acid may be used to remove the first sacrificial matrix layer 142. Physically exposed portions of the memory films 50 may be collaterally etched. For example, if the charge storage layers 54 include silicon nitride, upper end portions of the charge storage layers 54 may be collaterally etched during removal of the first sacrificial matrix layer 142. Generally, the etch processes that remove the second and first sacrificial matrix layers (169, 142) may physically expose upper portions of the memory stack structures 55, and may partially etch upper end portions of the memory films 50 collaterally.

Figure 39:
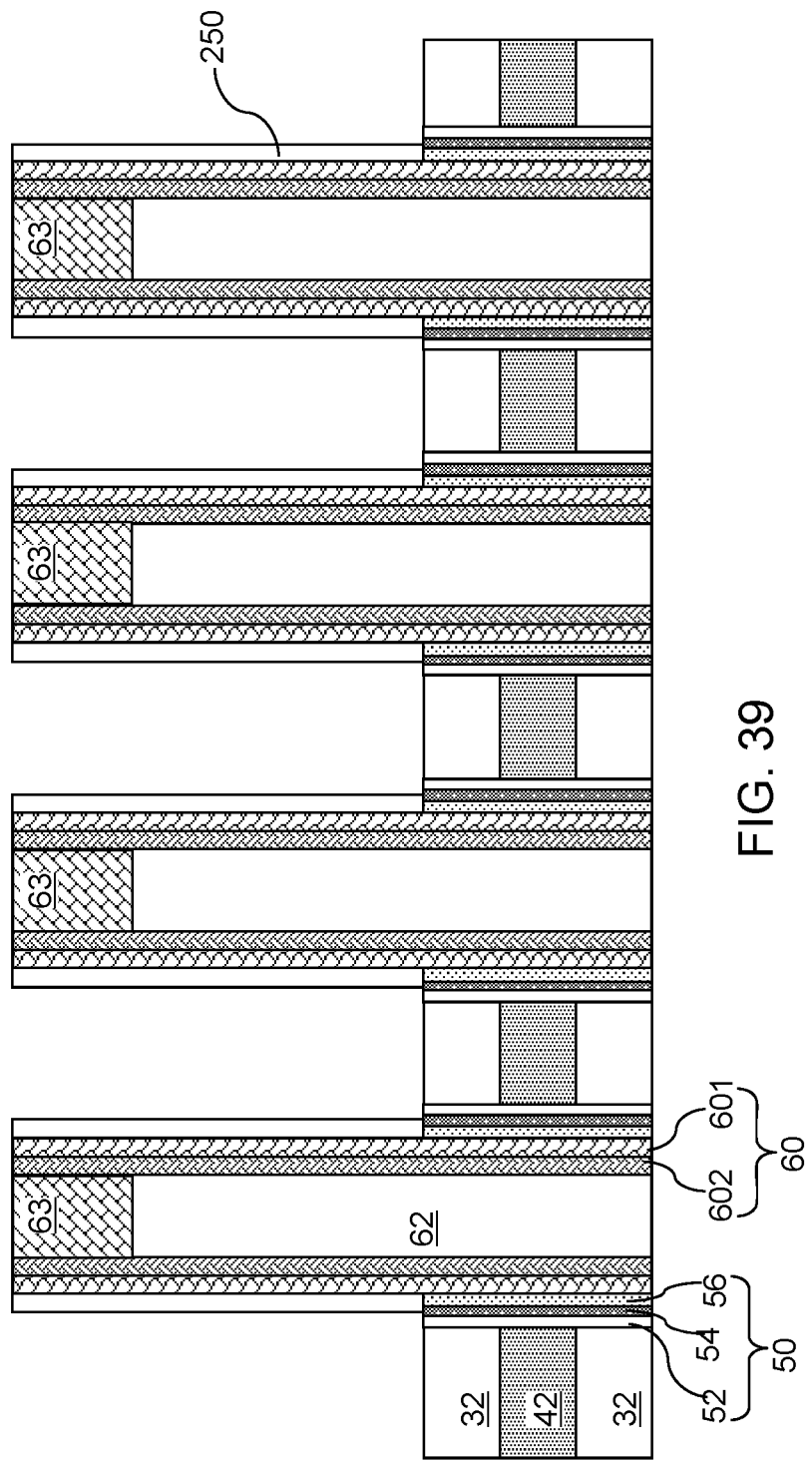
FIG. 39 is a vertical cross-sectional view of the second exemplary structure after formation of gate dielectrics according to the second embodiment of the present disclosure.

Referring to FIG. 39, gate dielectrics 250 may be formed on the outer sidewalls of portions of the vertical semiconductor channels 60 that protrude above the horizontal surface including the topmost surface of the alternating stack (32, 42). In one embodiment, remaining portions of the memory films 50 located above the horizontal surface including the topmost surface of the alternating stack (32, 42) may be completely removed by a set of etch processes that sequentially etch the various materials of the memory films 50 from outside to inside. For example, a series of wet etch processes may be used to completely remove the memory film 50 from above the horizontal surface including the topmost surface of the alternating stack (32, 42). Subsequently, a conformal gate dielectric layer may be deposited and anisotropically etched to form the gate dielectrics 250, each of which may have a cylindrical shape. Alternatively, or additionally, physically exposed surface portions of the vertical semiconductor channels 60 may be converted into a gate dielectric material by a conversion process, which may include thermal oxidation, plasma oxidation, thermal nitridation, and/or plasma nitridation. In embodiments in which dielectric material portions (not shown) are formed on the top surfaces of the drain regions 63, such dielectric material portions may be removed in subsequent processing steps.

Alternatively, at least one of the component layers within each memory film 50 may not be completely removed, and may be incorporated into the gate dielectrics 250. For example, a tunneling dielectric layer 56 may remain after removal of physically exposed portions of the charge storage layer 54 from each memory film 50, and may become, or may be incorporated as a component of, a gate dielectric 250. In another example, portions of the charge storage layer 54 may remain after removal of the first sacrificial matrix layer 142, and may be converted into a silicon oxynitride layer or a silicon oxide layer by a thermal oxidation process or a plasma oxidation process, which is incorporated into a gate dielectric 250. Additionally, a gate dielectric layer (such as a dielectric metal oxide layer) may be deposited on any remaining portions of the memory films 50 that are incorporated into the gate dielectrics 250. Generally, the gate dielectrics 250 may be formed by deposition of a dielectric material and/or incorporation of any remaining portions or any converted portions (for example, by oxidation or nitridation) of the memory films 50 that remain above the horizontal surface including the topmost surface of the alternating stack (32, 42).

Figure 40:
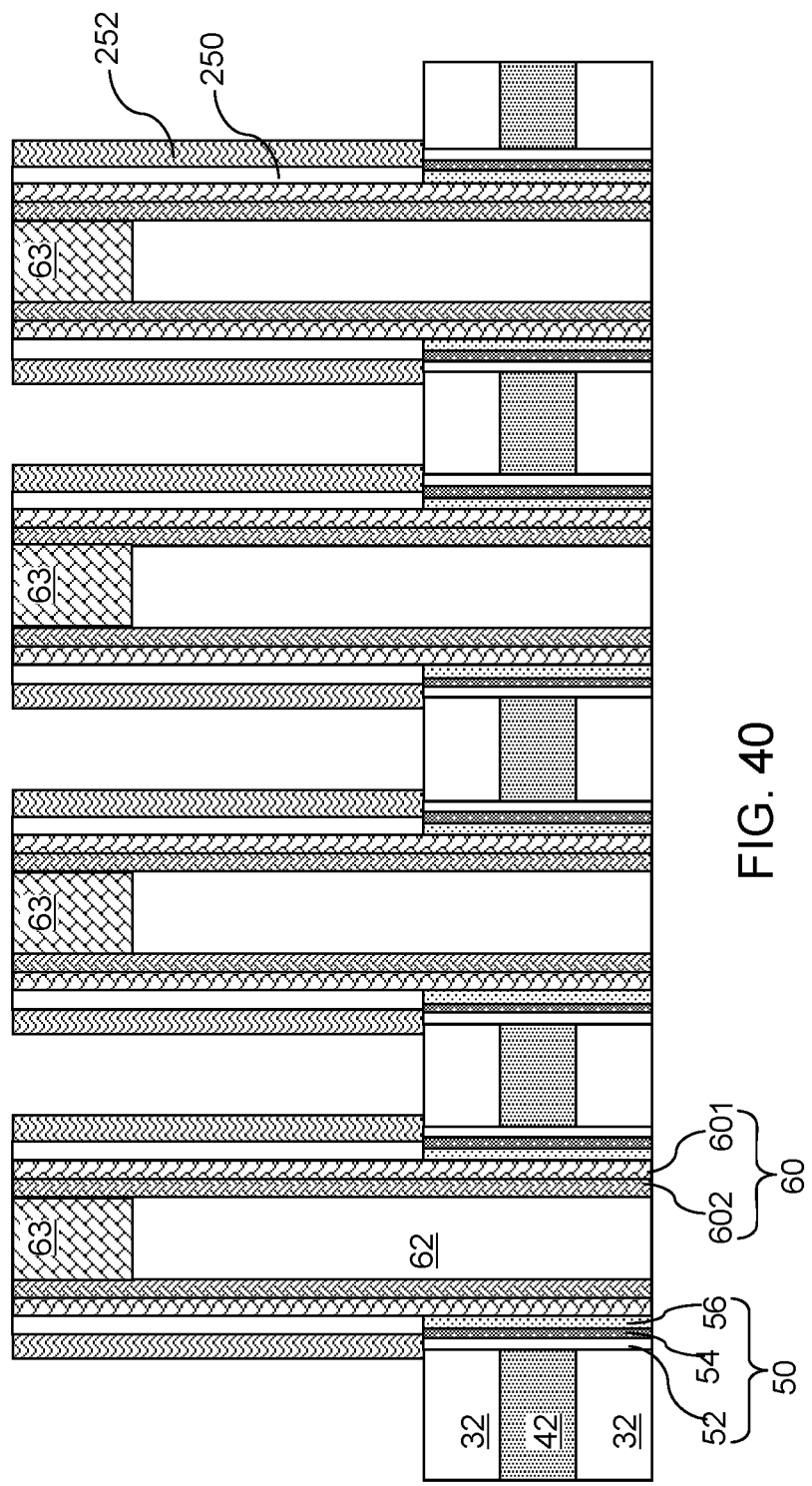
FIG. 40 is a vertical cross-sectional view of the second exemplary structure after formation of cylindrical electrode portions according to the second embodiment of the present disclosure.

Referring to FIG. 40, a conformal conductive material layer may be conformally deposited on the outer sidewalls of the gate dielectrics 250, on the top surface of the topmost insulating layer 32, and the top surfaces of the vertical semiconductor channels 60 and the drain regions 63 by a conformal deposition process. The conformal conductive material layer may include a heavily doped (conductive) semiconductor material layer, an elemental metal (such as tungsten), an intermetallic alloy, or a conductive metal nitride (such as TiN, TaN, or WN). The thickness of the conformal conductive material layer may be in a range from 3 nm to 50 nm, such as 15 nm to 30 nm although lesser and greater thicknesses may also be used.

An anisotropic etch may be performed to remove horizontal portions of the gate electrode material layer from above the drain regions 63 and from above the topmost insulating layer 32. Each remaining cylindrical portion of the conformal conductive material layer constitutes a cylindrical electrode portion 252. Each cylindrical electrode portion 252 has a tubular configuration, contacts and laterally surrounds a gate dielectric 250, and laterally encircles an upper portion of a vertical semiconductor channel 60.

Figure 41A:
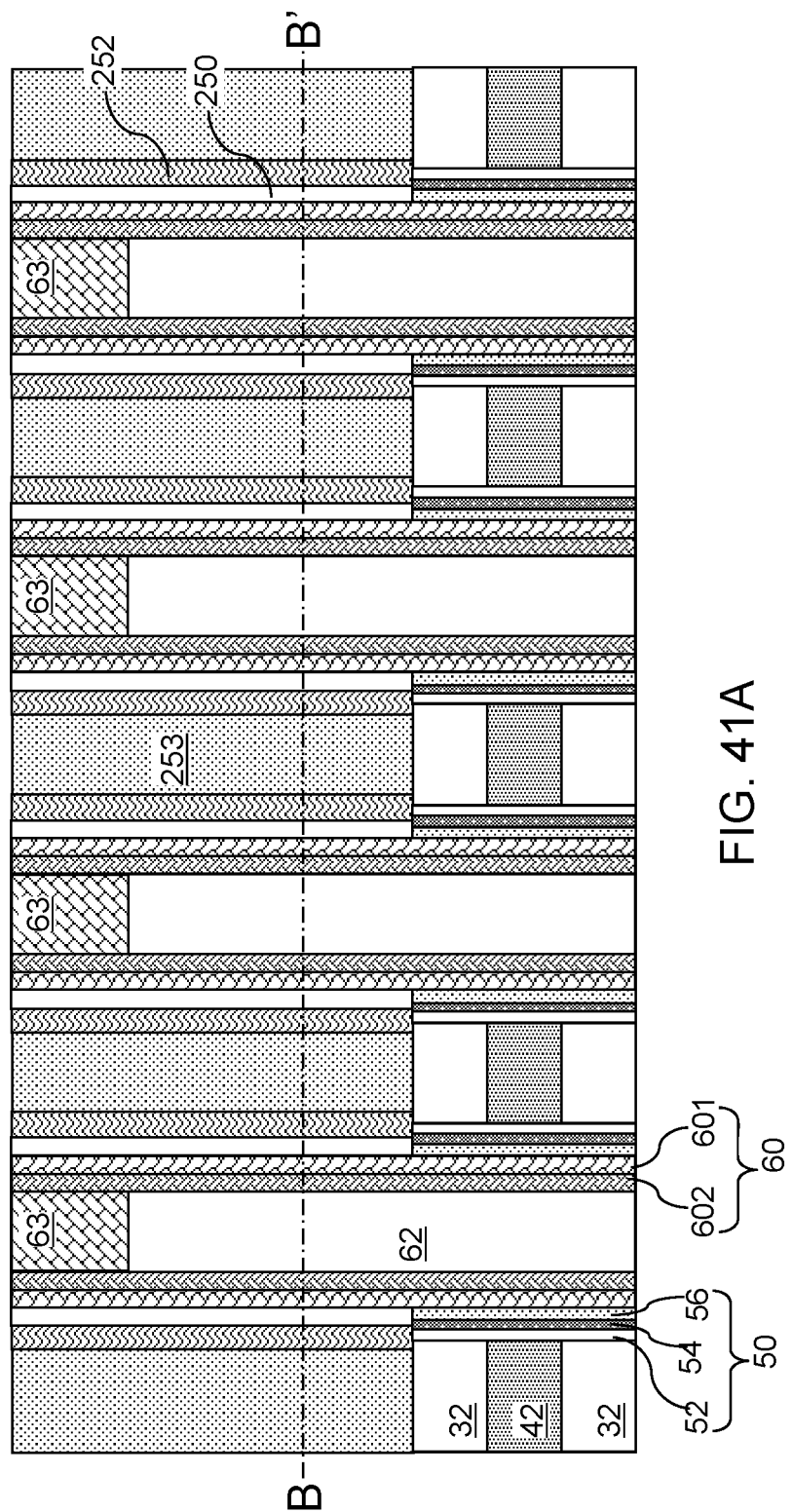
FIG. 41A is a vertical cross-sectional view of the second exemplary structure after formation of an etch mask layer according to the second embodiment of the present disclosure.
Figure 41B:
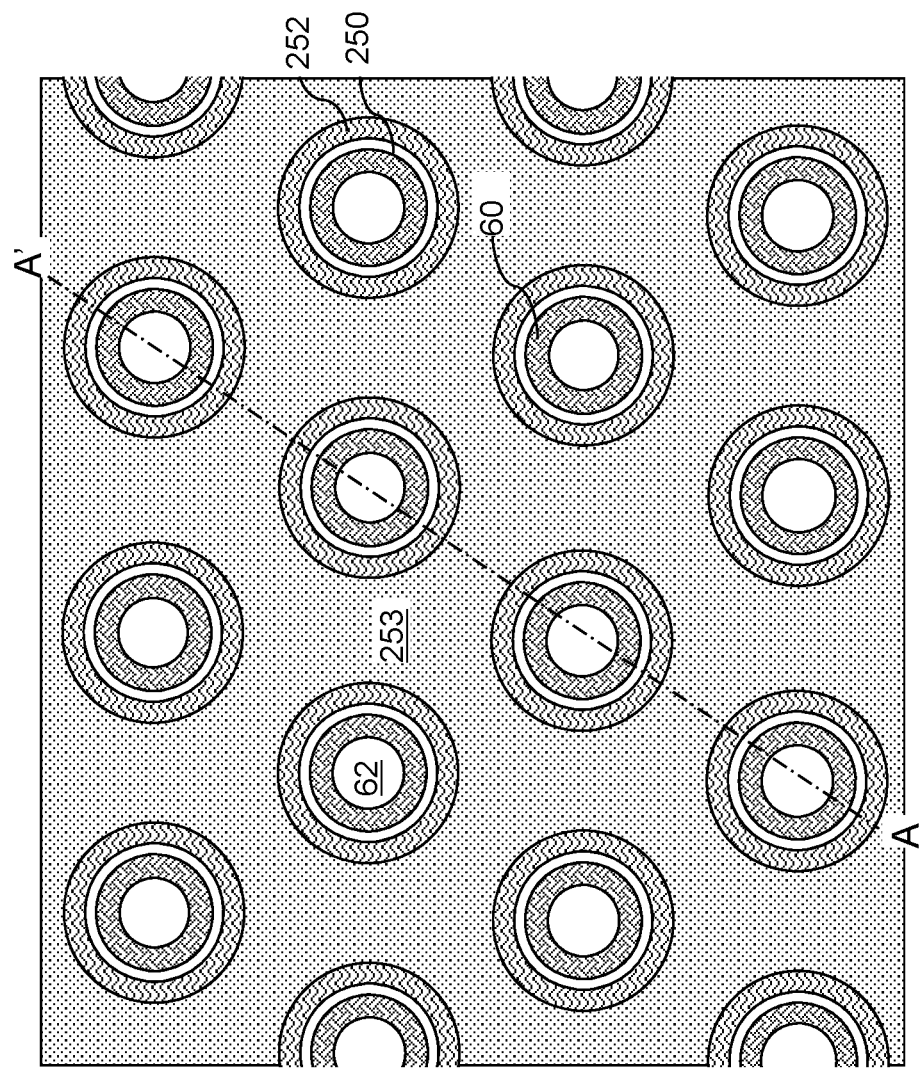
FIG. 41B is a top-down view of the second exemplary structure of FIG. 41A. The vertical plane A-A' is the plane of the cross-section for FIG. 41A.

FIG. 41A is a vertical cross-sectional view of the second exemplary structure after formation of an etch mask layer according to the second embodiment of the present disclosure. FIG. 41B is a top-down view of the second exemplary structure of FIG. 41A. The vertical plane A-A' is the plane of the cross-section for FIG. 41A. Referring to FIGS. 41A and 41B, an etch mask layer 253 can be formed by filling the gaps among the cylindrical electrode portions 252 with an etch mask material. The etch mask material includes a material that is different from the materials of the drain regions 63, the vertical semiconductor channels 60, the gate dielectrics 250, and the cylindrical electrode portions 252. For example, the etch mask layer 253 can include silicon nitride, photoresist, amorphous carbon or polycrystalline carbon. Portions of the material of the etch mask layer 253 that protrude above the horizontal plane including the top surfaces of the drain regions 63 can be removed by a planarization process such as chemical mechanical planarization or a recess etch.

Figure 42:
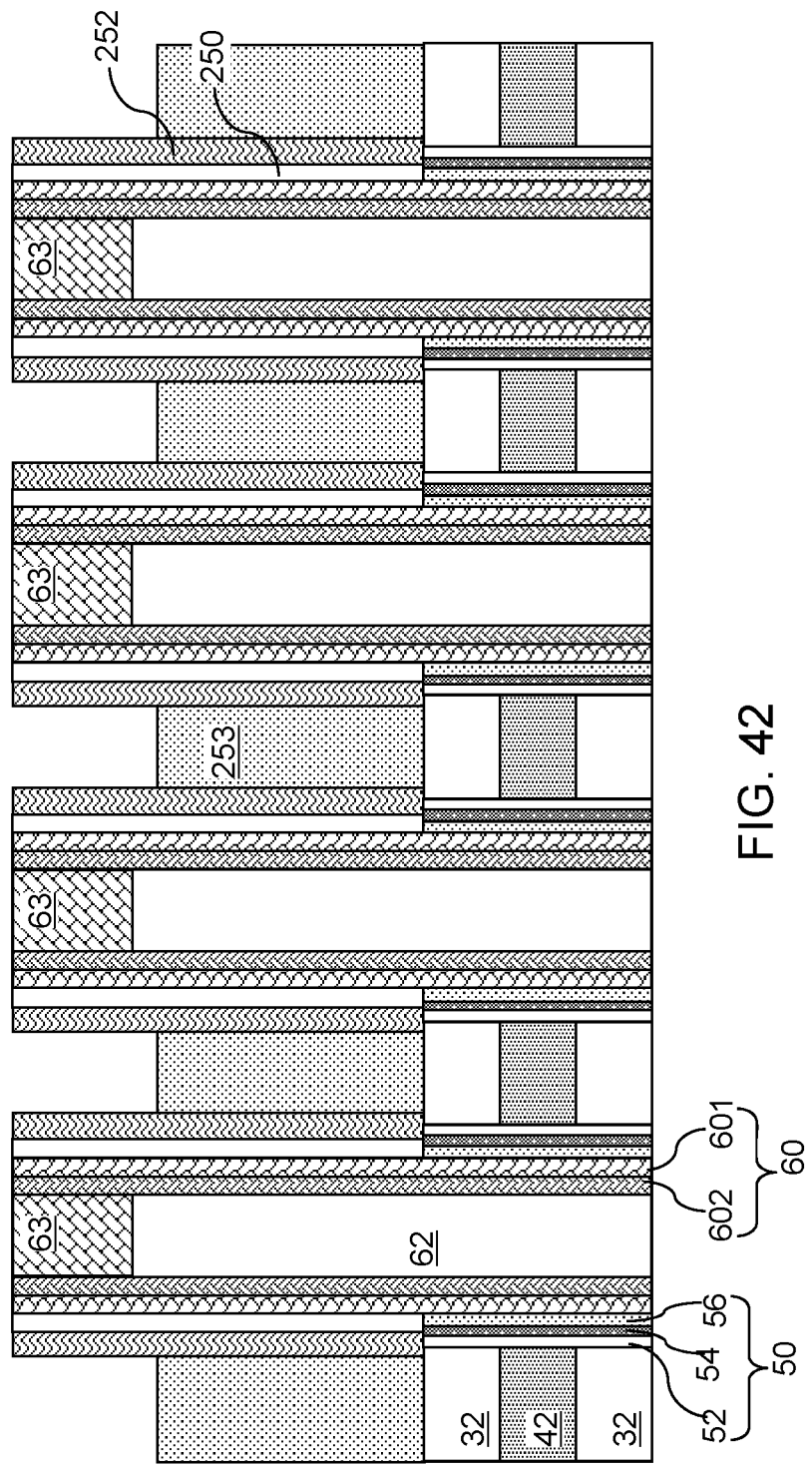
FIG. 42 is a vertical cross-sectional view of the second exemplary structure after recessing the etch mask layer according to the second embodiment of the present disclosure.

Referring to FIG. 42, the etch mask layer 253 may be vertically recessed such that the recessed top surface of the etch mask layer 253 is at the target height for the upper end of the cylindrical electrode portions 252. In other words, the thickness of the remaining portion of the etch mask layer 253 may be the same as the target height for the cylindrical electrode portions 252.

Figure 43:
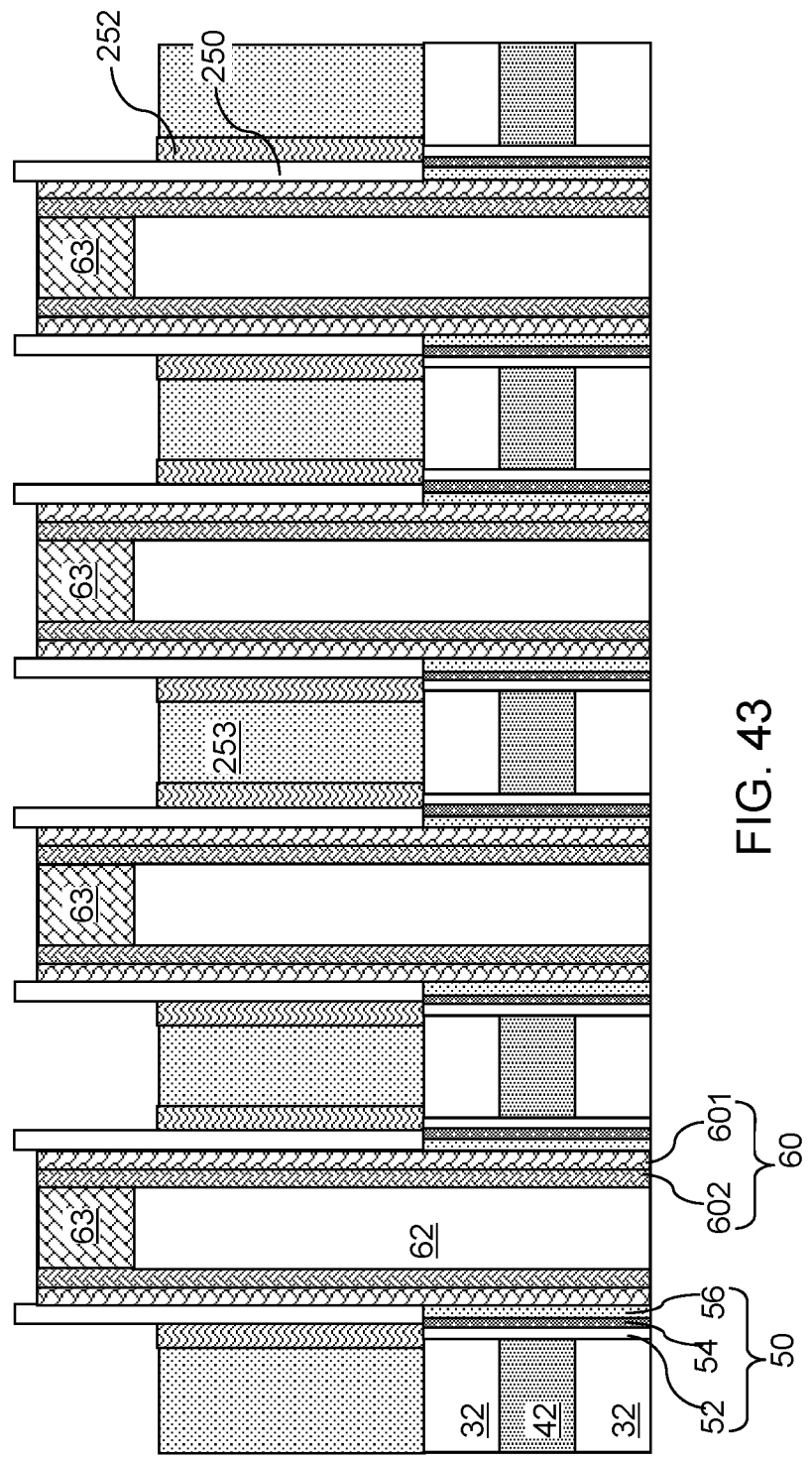
FIG. 43 is a vertical cross-sectional view of the second exemplary structure after trimming the cylindrical electrode portions according to the second embodiment of the present disclosure.

Referring to FIG. 43, the upper portions of the cylindrical electrode portions 252 (which are remaining portions of the conformal conductive material layer) may be trimmed by an isotropic etch that etches the material of the cylindrical electrode portions 252. The etch mask layer 253 protects regions of the cylindrical electrode portions 252 that are surrounded by the etch mask layer 253. In case the cylindrical electrode portions 252 includes a doped semiconductor material, top surfaces of the vertical semiconductor channels 60 and the drain regions 63 may be collaterally recessed during trimming of the cylindrical electrode portions 252.

The etch mask layer 253 may be subsequently removed selective to the cylindrical electrode portions 252, the drain regions 63, and the vertical semiconductor channels 60, for example, by selective etching (e.g., hot phosphoric acid for silicon nitride etch mask layer 253) or by ashing for a photoresist or carbon etch mask layer 253. A plurality of cylindrical electrode portions 252 may be provided around a respective one of the vertical semiconductor channels 60. The plurality of cylindrical electrode portions 252 may include two-dimensional arrays having the same periodicity as the memory stack structures 55. Each of the plurality of cylindrical electrode portions 252 laterally surrounds and encircles a respective gate dielectric 250.

Figure 44:
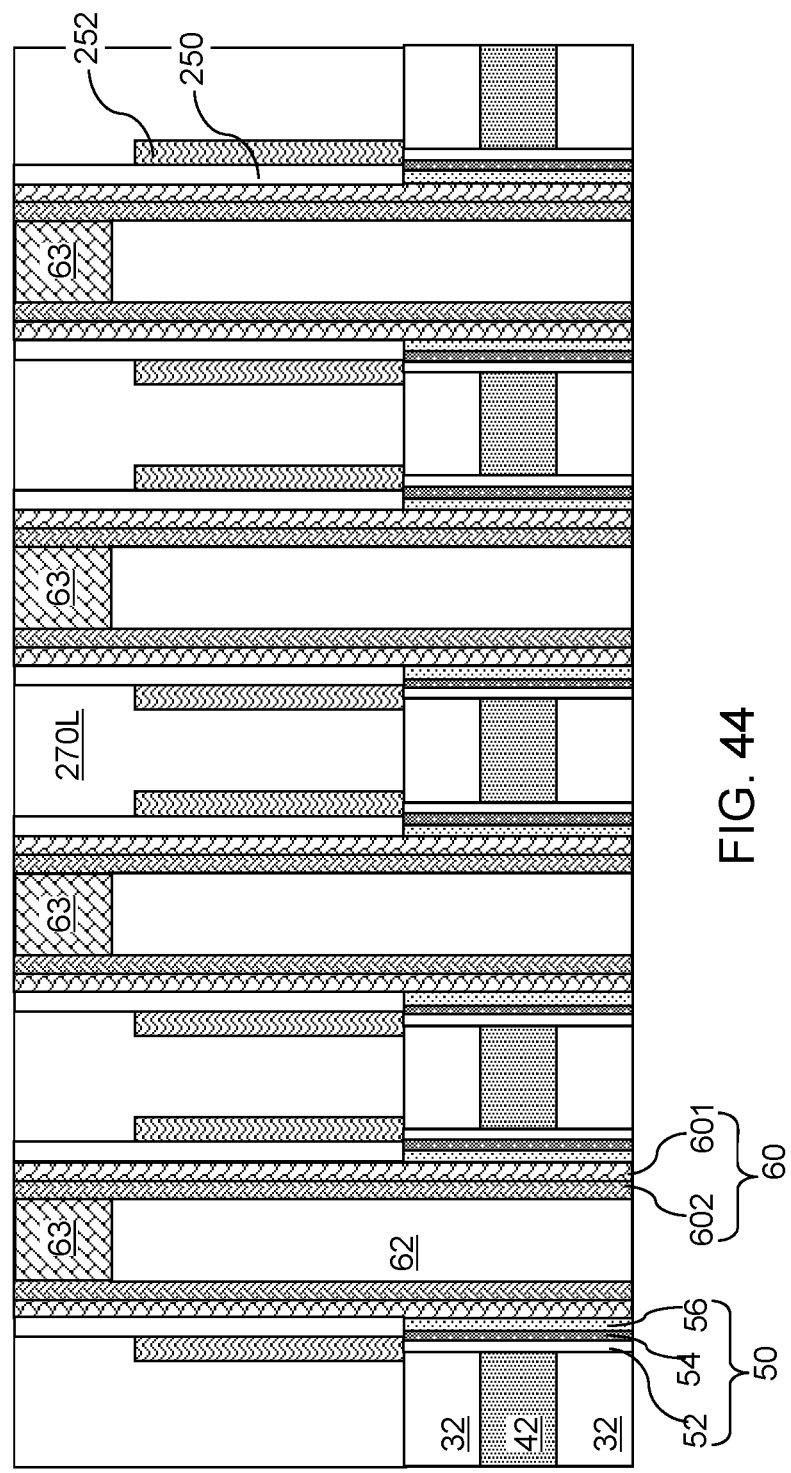
FIG. 44 is a vertical cross-sectional view of the second exemplary structure after removal of the etch mask layer and formation of a dielectric template layer according to the second embodiment of the present disclosure.

Referring to FIG. 44, a dielectric template layer 270L may be formed between the cylindrical electrode portions 252. The dielectric template layer 270L may include a planarizable dielectric material such as doped silicate glass or undoped silicate glass (e.g., silicon oxide), and may be deposited by a conformal deposition process. Optionally, a reflow process using an anneal may be performed to remove voids formed during an initial deposition process. The dielectric template layer 270L may be deposited directly on the outer sidewalls of the plurality of cylindrical electrode portions 252 and on the outer sidewalls of the gate dielectrics 250. The dielectric template layer 270 may be planarized with a planarization process such as chemical mechanical planarization. Upon planarization, the top surface of the dielectric template layer 270 may be within the horizontal plane including the top surfaces of the drain regions 63.

Figure 45:
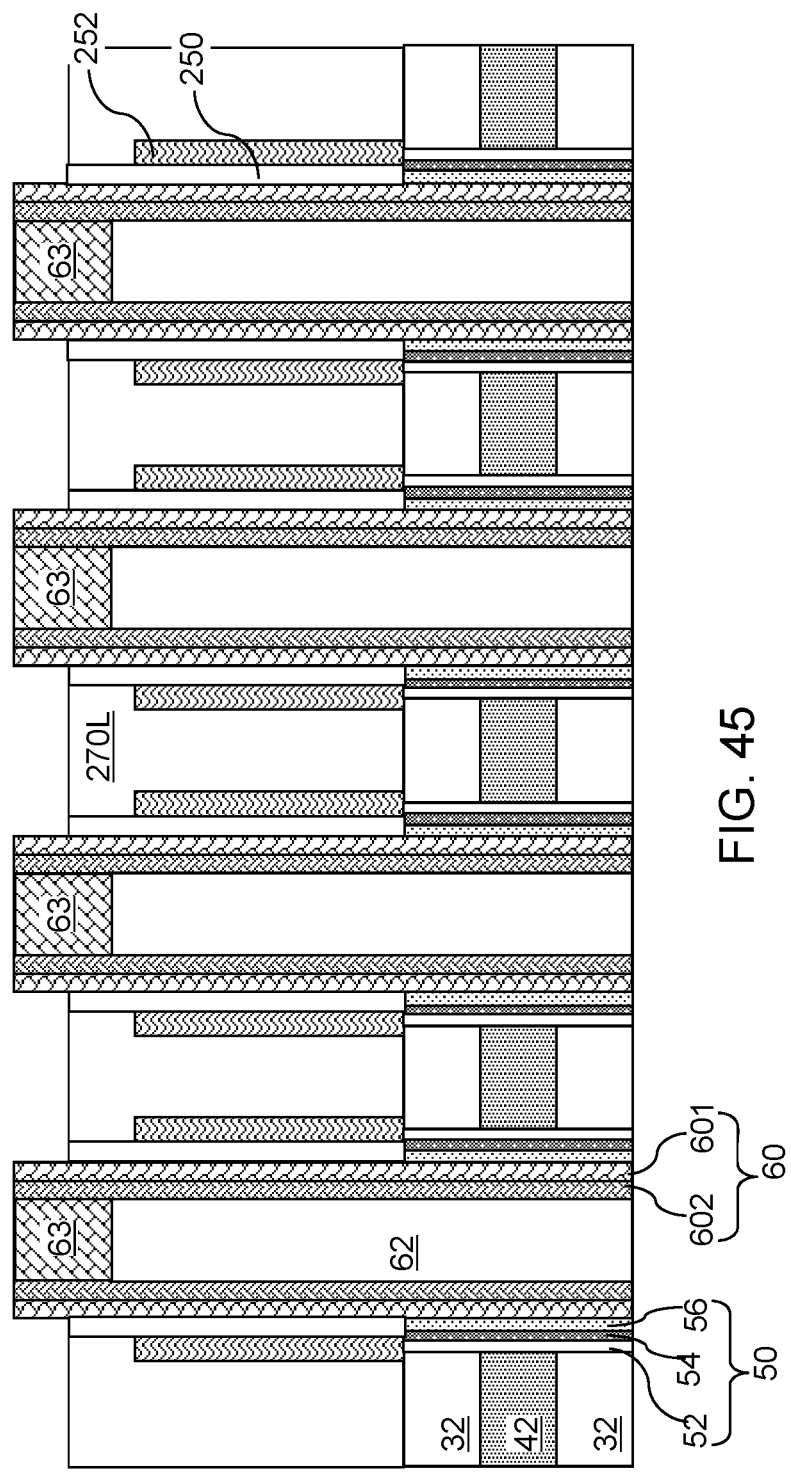
FIG. 45 is a vertical cross-sectional view of the second exemplary structure after recessing the dielectric template layer according to the second embodiment of the present disclosure.

Referring to FIG. 45, the dielectric template layer 270L and the gate dielectrics 250 may be vertically recessed below the horizontal plane including the top surfaces of the drain regions 63. For example, a wet etch using hydrofluoric acid may be used to vertically recess the dielectric template layer 270L. The recessed top surface of the dielectric template layer 270L may be above the horizontal plane including the top surfaces of the cylindrical electrode portions 252. In one embodiment, the recessed top surface of the dielectric template layer 270L may be between the horizontal plane including the top surfaces of the drain regions 63 and the horizontal plane including the bottom surfaces of the drain regions 63. In an illustrative example, the vertical distance between the recessed top surface of the dielectric template layer 270L and the horizontal plane including the top surfaces of the drain regions 63 may be in a range from 10 nm to 100 nm, such as from 25 nm to 40 nm, although lesser and greater vertical distances may also be used.

Figure 46A:
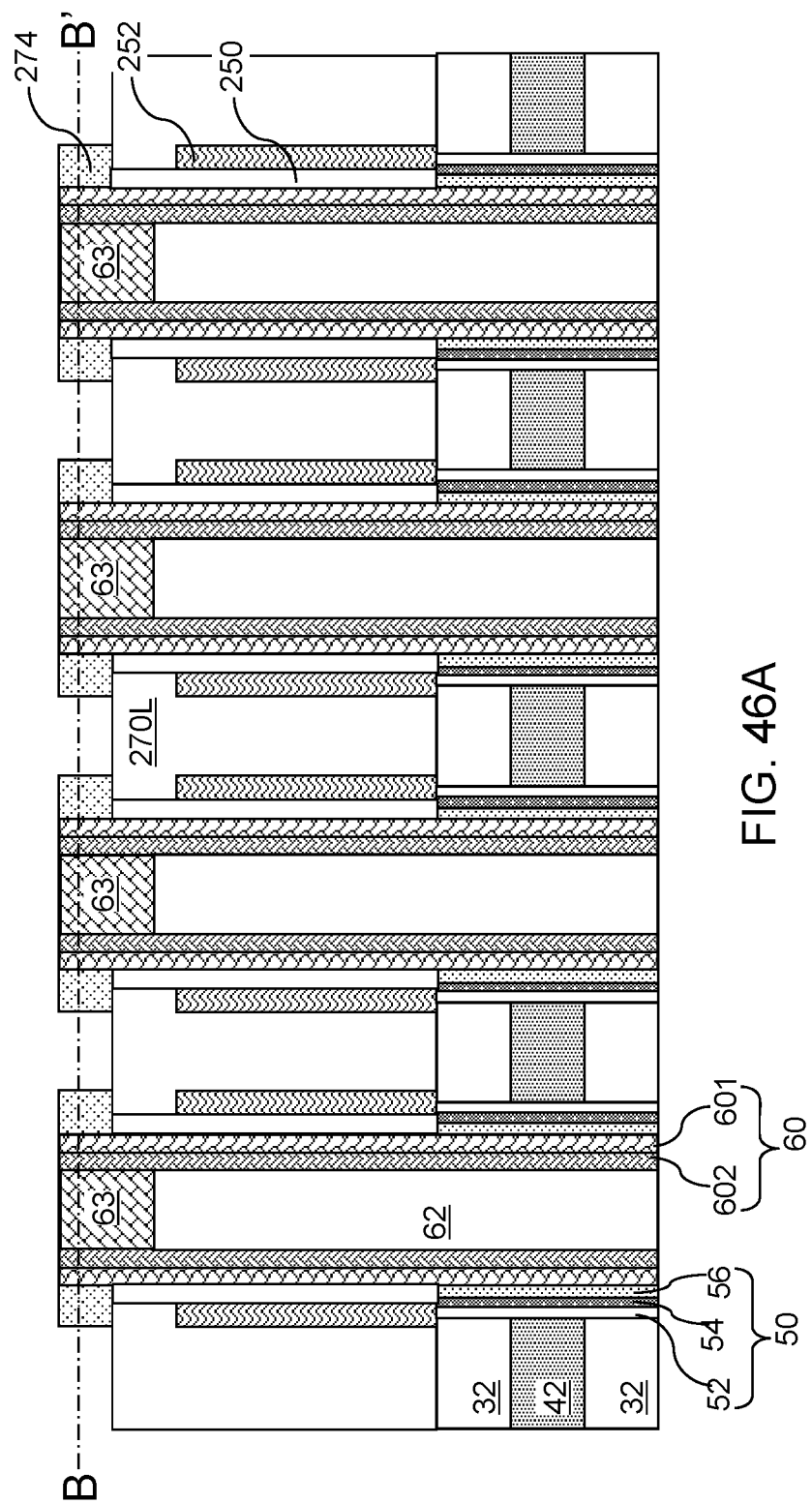
FIG. 46A is a vertical cross-sectional view of the second exemplary structure after formation of etch mask rings according to the second embodiment of the present disclosure.
Figure 46B:
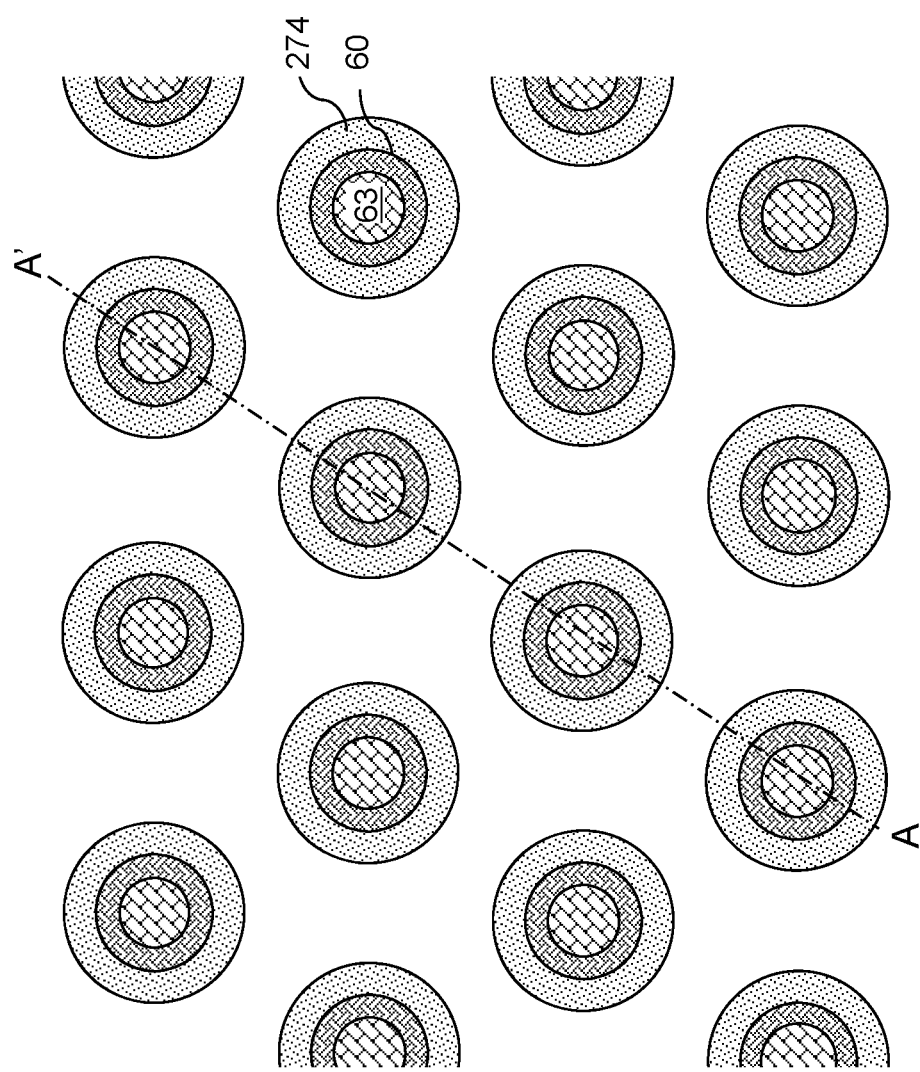
FIG. 46B is a top-down view of the second exemplary structure of FIG. 46A. The vertical plane A-A' is the plane of the cross-section for FIG. 46A.

FIG. 46A is a vertical cross-sectional view of the second exemplary structure after formation of etch mask rings according to the second embodiment of the present disclosure. FIG. 46B is a top-down view of the second exemplary structure of FIG. 46A. The vertical plane A-A' is the plane of the cross-section for FIG. 46A. Referring to FIGS. 46A and 46B, an etch mask material is conformally deposited and anisotropically etched to form etch mask rings (e.g., cylindrical sidewall spacers) 274 that are self-aligned to the drain regions 63. The etch mask material is a material that is resistant to the chemistry of the anisotropic etch process to be subsequently employed to pattern the dielectric template layer 270L. The etch mask material can be conductive material, such as metallic material, for example a metal or a conductive metal nitride, a semiconductor material (e.g., polysilicon or amorphous silicon) having a doping of the second conductivity type (i.e., the same conductivity type as the drain regions 63) or an undoped semiconductor material, or a dielectric material such as a dielectric metal oxide (e.g., amorphous aluminum oxide). The conformal deposition of the etch mask material can be performed by chemical vapor deposition or atomic layer deposition. The thickness of the deposited etch mask material may be about the same as the thickness of the cylindrical electrode portions 252, such as from 3 nm to 50 nm. The anisotropic etch process removes the horizontal portions of the deposited etch mask material to form the etch mask rings 274. An array of etch mask rings 274 laterally surrounds a respective one of the drain regions 63. In case the etch mask material includes a heavily doped semiconductor material, the etch mask rings 274 can function as an additional drain region on which a drain contact via structure can be subsequently formed to provide an additional current path, thereby reducing the on-resistance of the vertical field effect transistors including the vertical semiconductor channels 60. The etch mask rings 274 can be formed as discrete structures that do not contact one another.

Figure 47A:
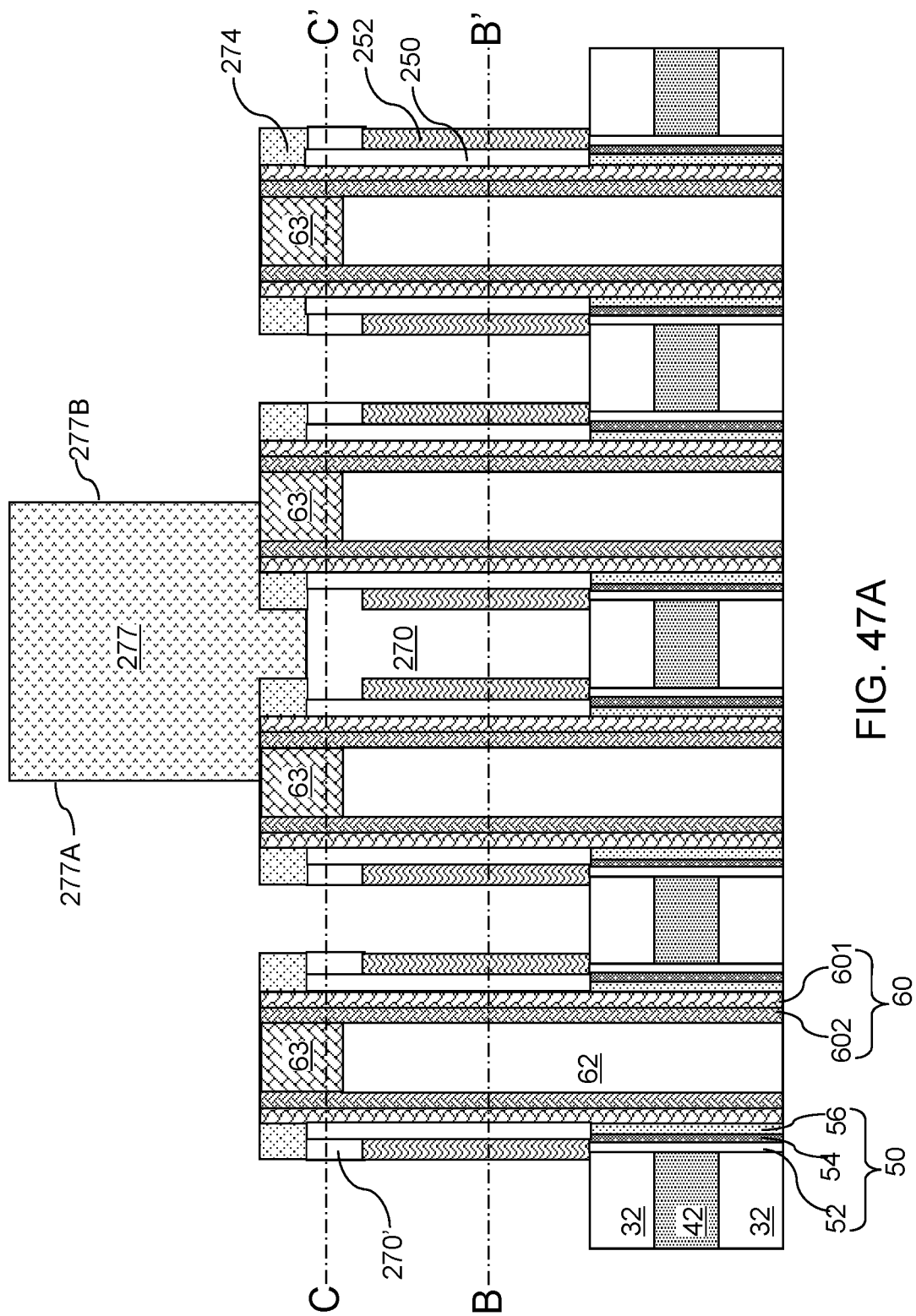
FIG. 47A is a vertical cross-sectional view of the second exemplary structure after anisotropically etching the dielectric template layer using a combination of a patterned photoresist layer and the etch mask rings as an etch mask according to the second embodiment of the present disclosure.
Figure 47B:
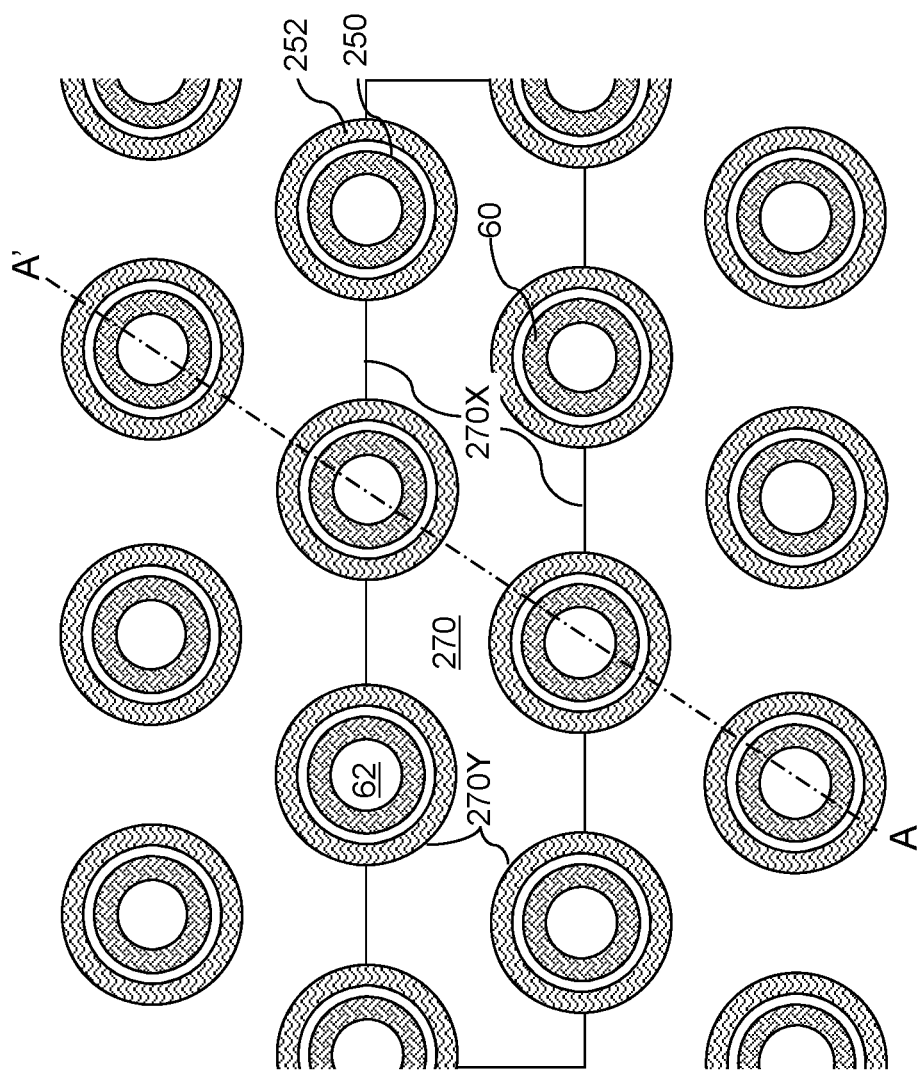
FIG. 47B is a horizontal cross-sectional view along the plane B-B' of the second exemplary structure of FIG. 47A. The vertical plane A-A' is the plane of the cross-section for FIG. 47A.
Figure 47C:
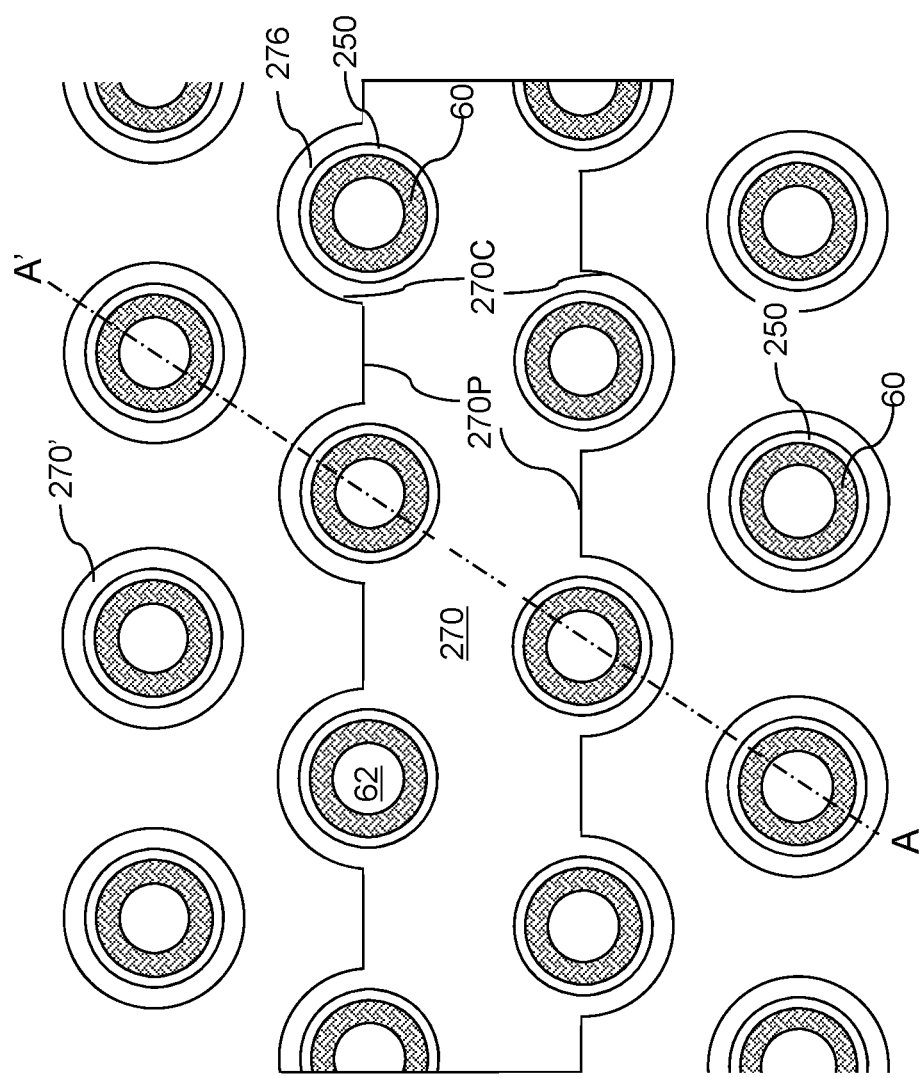
FIG. 47C is a horizontal cross-sectional view along the plane C-C' of the second exemplary structure of FIG. 47A.

FIG. 47A is a vertical cross-sectional view of the second exemplary structure after anisotropically etching the dielectric template layer employing a combination of a patterned photoresist layer and the etch mask rings as an etch mask according to the second embodiment of the present disclosure. FIG. 47B is a horizontal cross-sectional view along the plane B-B' of the second exemplary structure of FIG. 47A. The vertical plane A-A' is the plane of the cross-section for FIG. 47A. FIG. 47C is a horizontal cross-sectional view along the plane C-C' of the second exemplary structure of FIG. 47A. Referring to FIGS. 47A-47C, a photoresist layer 277 can be applied over the second exemplary structure, and can be lithographically patterned to form line patterns in areas in which electrical isolation between neighboring pairs of drain select gate electrodes is to be provided. In one embodiment, the patterned portions of the photoresist layer 277 can have a pair of lengthwise sidewalls that extend along the lengthwise direction of a pair of rows of memory opening fill structures 58. A first lengthwise sidewall 277A of each patterned portion of the photoresist layer 277 can overlie a first row of memory opening fill structures 58 within two rows of memory opening fill structures 58 that are neighboring row pairs, and a second lengthwise sidewall 277B of each patterned portion of the photoresist layer 277 can overlie a second row of memory opening fill structures 58 within the two rows of memory opening fill structures 58. The width of each patterned portion of the photoresist layer 277, as measured along a direction perpendicular to the direction of the lengthwise sidewalls, can be in a range from 0.5 times the inter-row pitch p to 1.5 times the inter-row pitch p, and may be in a range from 0.7 times the inter-row pitch p to 1.3 times the inter-row pitch p.

An anisotropic etch process that etches the dielectric template layer 270L selective to the material of the drain regions 63, the vertical semiconductor channels 60, and the etch mask rings 274 may be performed. For example, if the dielectric template layer 270L includes doped or undoped silicate glass (e.g., silicon oxide) materials, and if the drain regions 63, the vertical semiconductor channels 60, and the etch mask rings 274 include semiconductor materials (such as polysilicon), an anisotropic etch process that etches silicon oxide selective to the semiconductor materials may be used. The photoresist layer 277, the drain regions 63, the vertical semiconductor channels 60, and the etch mask rings 274 protect underlying masked portions of the dielectric template layer 270L during the anisotropic etch process. Thus, the combination of the patterned photoresist layer 277 and the etch mask rings 274 is used as an etch mask during the anisotropic etch. Specifically, the combination of the photoresist layer 277, the drain regions 63, the vertical semiconductor channels 60, and the etch mask rings 274 functions as an etch mask for anisotropically etching the dielectric template layer 270L. The anisotropic etch process may stop on, or within, the topmost insulating layer 32.

Each portion of the dielectric template layer 270L that underlies a patterned portion of the photoresist layer 277 or etch mask rings 274 contacting the patterned portion of the photoresist layer 277 may be patterned into a drain-select-level isolation strip 270. Each portion of the dielectric template layer 270L that underlies an etch mask ring 274 that does not contact any patterned portion of the photoresist layer 277 may be patterned into a tubular dielectric spacer 270'. The drain-select-level isolation strips 270 includes remaining portions of the dielectric template layer 270L.

As shown in FIG. 47C, Each drain-select-level isolation strip 270 includes an upper portion overlying the cylindrical electrode portions 252 and a lower portion contacting sidewalls of a respective subset of the cylindrical electrode portions 252. The upper portion of each drain-select-level isolation strip 270 includes two rows of perforations arranged along the first horizontal direction hd1. The two rows of perforations 276 may be cylindrical openings. Each of the cylindrical openings may laterally surround a respective one of a subset of the vertical semiconductor channels 60 that is arranged in two rows that extend along the first horizontal direction hd1. The upper portion of each drain-select-level isolation strip 270 may directly contact two rows of gate dielectrics 250.

In one embodiment, the upper portion of each drain-select-level isolation strip 270 includes two lengthwise sidewalls that generally extend along the first horizontal direction hd1. Each of the two lengthwise sidewalls of the upper portion of each drain-select-level isolation strip 270 includes a respective alternating sequence of planar sidewall segments 270P and convex sidewall segments 270C. In one embodiment, each of the two lengthwise sidewalls of the upper portion of each drain-select-level isolation strip 270 includes a respective alternating sequence of vertical planar sidewall segments 270P and vertical convex sidewall segments 270C.

As shown in FIG. 47B, the lower portion of each drain-select-level isolation strip 270 contacts sidewalls of a subset of the cylindrical electrode portions 252. In one embodiment, the lower portion of each drain-select-level isolation strip 270 may include two lengthwise sidewalls, and each of the two lengthwise sidewalls of the lower portion of each drain-select-level isolation strip 270 may include a respective alternating sequence of planar sidewall segments 270X and concave sidewall segments 270Y. In one embodiment, the planar sidewall segments 270P of the upper portion of each drain-select-level isolation strip 270 may be vertically coincident with the planar sidewall segments 270X of the lower portion of the same drain-select-level isolation strip 270. In one embodiment, each of the two lengthwise sidewalls of the lower portion of each drain-select-level isolation strip 270 may include a respective alternating sequence of vertical planar sidewall segments 270X and vertical concave sidewall segments 270Y.

In one embodiment, each cylindrical electrode portion 252 that laterally surrounds a vertical semiconductor channel 60 within a neighboring pair of rows of vertical semiconductor channels 60 contacts a respective concave sidewall segment of the lower portion of each drain-select-level isolation strip 270.

In one embodiment, additional patterned portions of the photoresist layer 277 may cover all areas in which formation of drain select gate electrodes is not desired. For example, the peripheral device region 200 and portions of the contact region 300 that overlie the stepped surfaces of the sacrificial material layers 42 may be covered by a continuous remaining portion of the photoresist layer 277 after the lithographic patterning of the photoresist layer 277. In this case, the portions of the dielectric template layer 270L that are covered by the continuous patterned portion of the photoresist layer 277 is protected from the anisotropic etch process that forms the drain-select-level isolation strips 270. The photoresist layer 277 may be removed, for example, by ashing, after formation of the drain-select-level isolation strips 270.

Figure 48A:
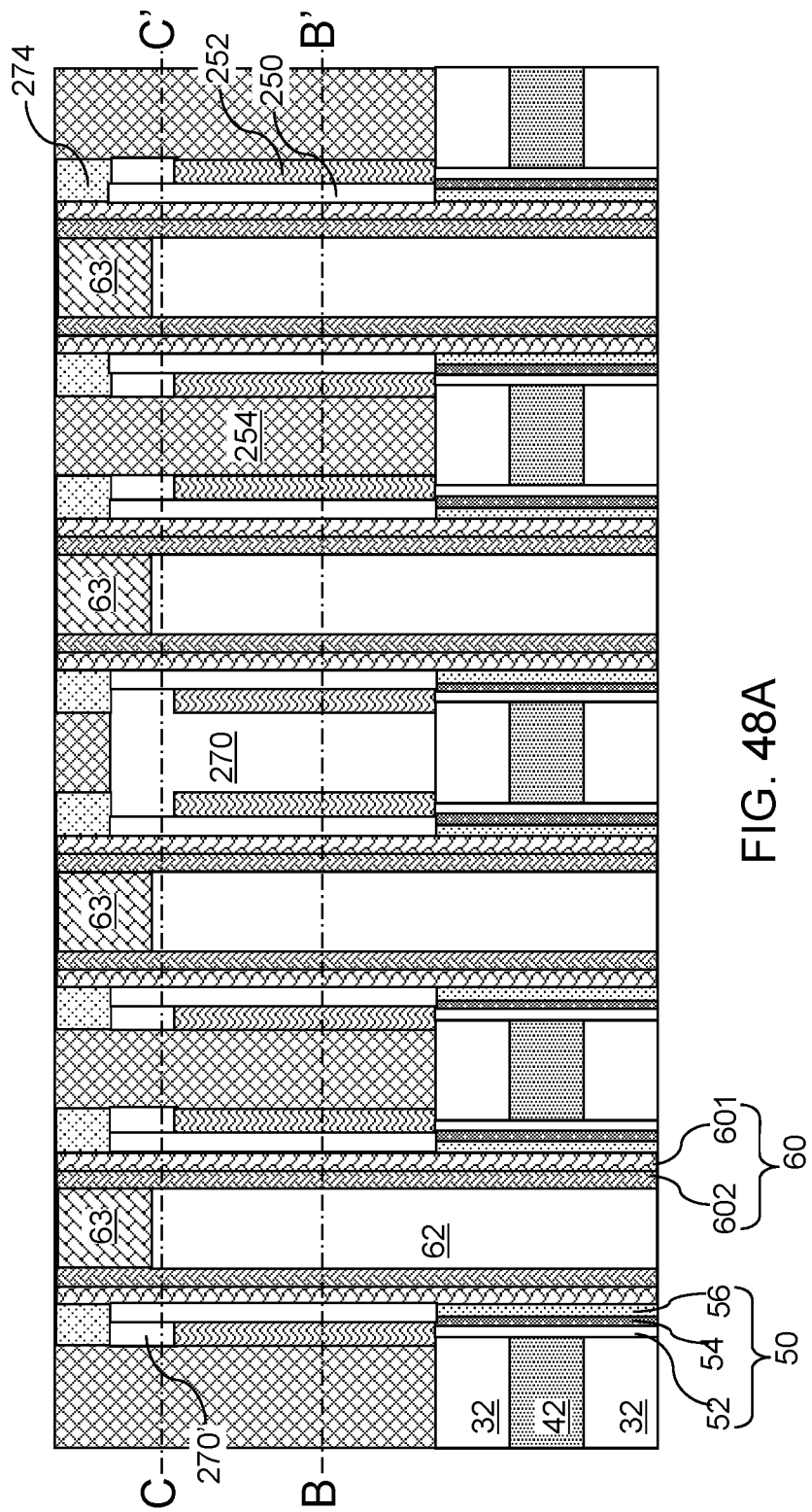
FIG. 48A is a vertical cross-sectional view of the second exemplary structure after deposition of a conductive material in recessed regions according to the second embodiment of the present disclosure.
Figure 48B:
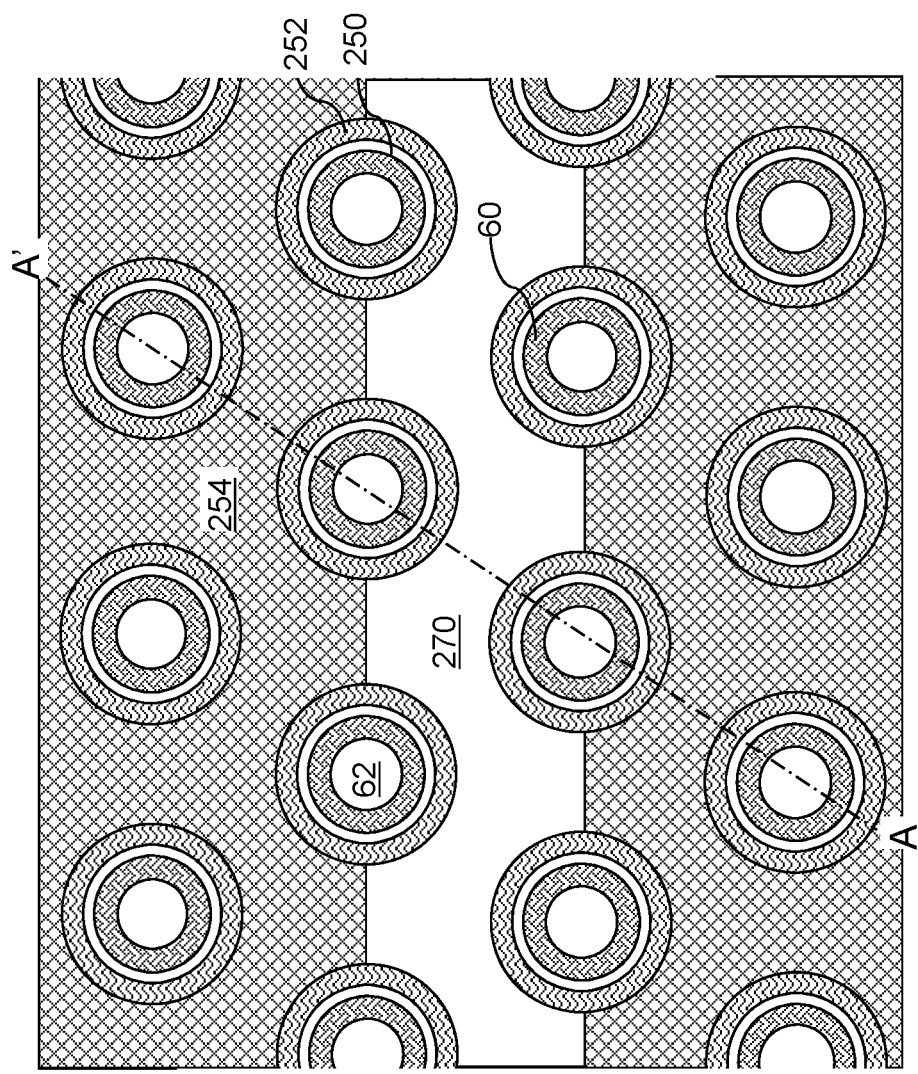
FIG. 48B is a horizontal cross-sectional view along the plane B-B' of the second exemplary structure of FIG. 48A. The vertical plane A-A' is the plane of the cross-section for FIG. 48A.
Figure 48C:
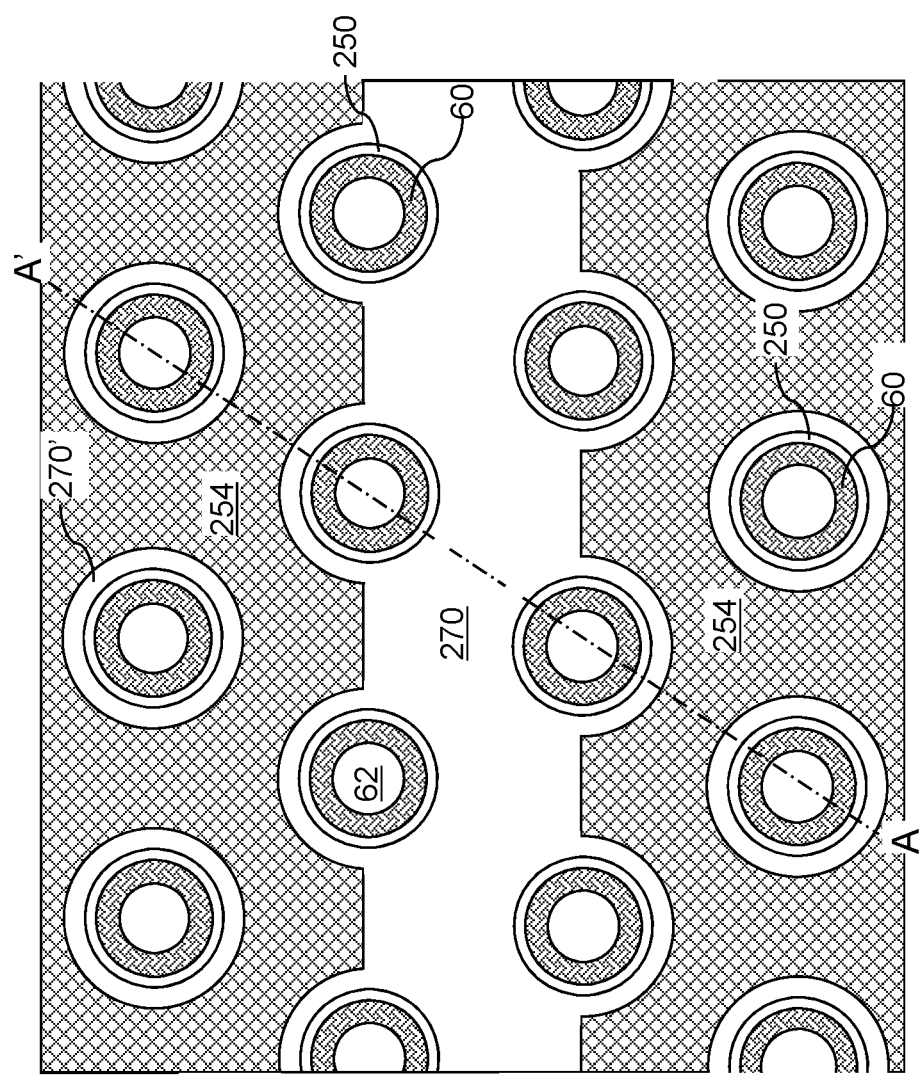
FIG. 48C is a horizontal cross-sectional view along the plane C-C' of the second exemplary structure of FIG. 48A.

FIG. 48A is a vertical cross-sectional view of the second exemplary structure after deposition of a conductive material in recessed regions according to the second embodiment of the present disclosure. FIG. 48B is a horizontal cross-sectional view along the plane B-B' of the second exemplary structure of FIG. 48A. The vertical plane A-A' is the plane of the cross-section for FIG. 48A. FIG. 48C is a horizontal cross-sectional view along the plane C-C' of the second exemplary structure of FIG. 48A. Referring to FIGS. 48A-48C, at least one conductive material is deposited in the recessed regions between neighboring pairs of drain select level isolation strips 270. The at least one conductive material can include an elemental metal (such as tungsten, aluminum, copper, or cobalt), an intermetallic alloy, a conductive metal nitride material (such as TiN, TaN, or WN), or a heavily doped semiconductor material. The at least one conductive material can fill the entire volume of the recessed regions between the top surface of the topmost insulating layer 32 and the horizontal plane including the top surfaces of the drain regions 63. Portions of the deposited at least one conductive material can be removed from above the horizontal plane including the top surfaces of the drain regions 63 by a recess etch.

Figure 49:
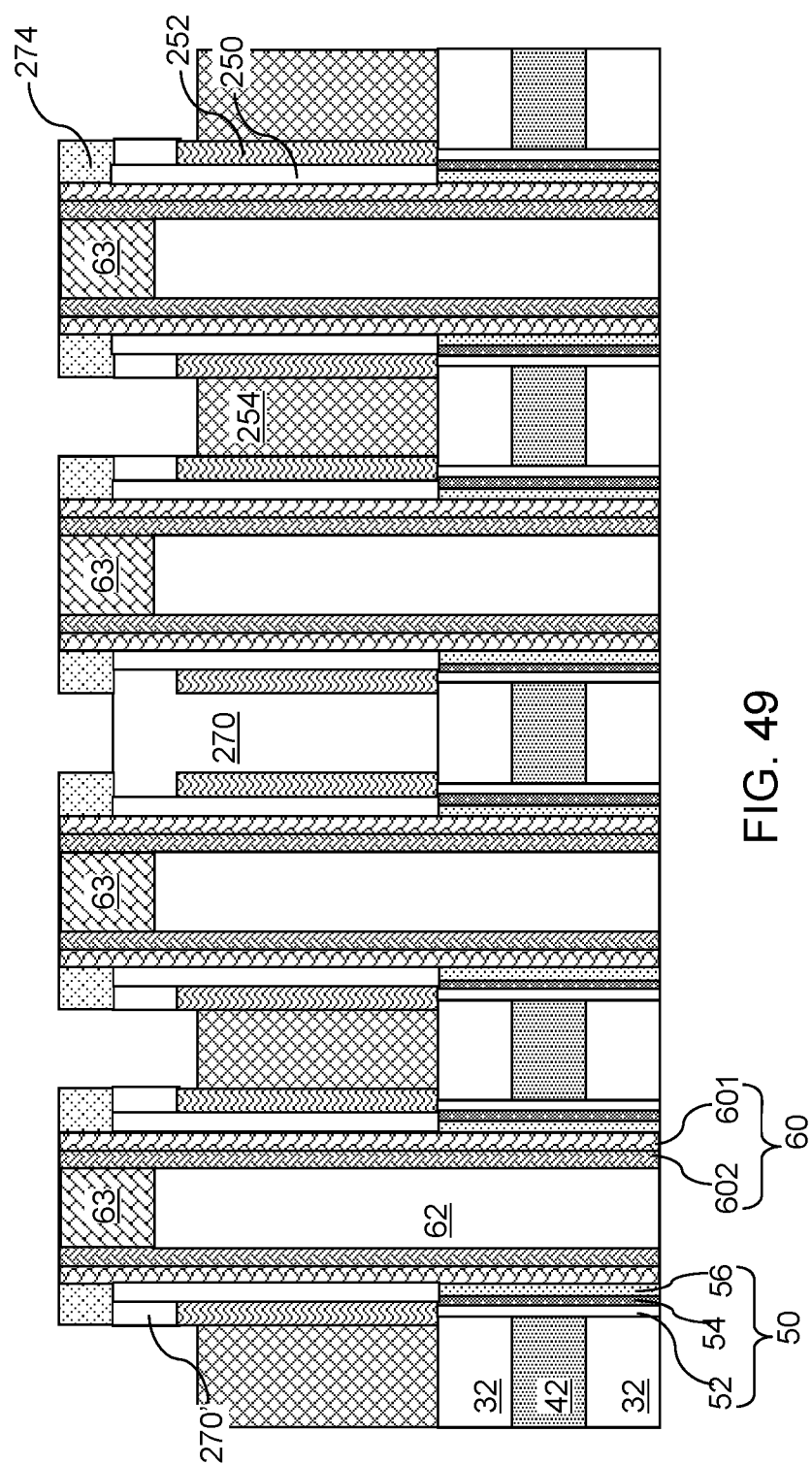
FIG. 49 is a vertical cross-sectional view of the second exemplary structure after formation of strip electrode portions by recessing the conductive material according to the second embodiment of the present disclosure.

Referring to FIG. 49, the recess etch may continue to recess the top surface of remaining portions of the deposited at least one conductive material below the topmost surfaces of the tubular dielectric spacers 270' and the drain-select-level isolation strips 270. In one embodiment, the recessed top surface of the at least one conductive material may contact outer sidewalls of the tubular dielectric spacers 270' or outer sidewalls of cylindrical electrode portions 252. Each remaining portion of the at least one conductive material constitutes a strip electrode portion 254, which laterally encircles and directly contacts each cylindrical electrode portion 252 located between a neighboring pair of drain-select-level isolation strips 270, and directly contacts only one side of each cylindrical electrode portion 252 contacting any of the neighboring pair of drain-select-level isolation strips 270.

Each strip electrode portion 254 may include a pair of lengthwise sidewalls that generally extend along the first horizontal direction hd1. Each lengthwise sidewall of a strip electrode portion 254 includes a laterally alternating sequence of planar sidewall segments and concave sidewall segments, which may be a laterally alternating sequence of vertical planar sidewall segments and vertical concave sidewall segments. Each set of adjacent strip electrode portion 254 and plurality of cylindrical electrode portions 252 (which laterally surround a respective one of the vertical semiconductor channels 60) constitutes a drain select gate electrode (252, 254). Each neighboring pair of drain select gate electrodes (252, 254) is laterally spaced from each other by a respective drain-select-level isolation strip 270.

Each strip electrode portion 254 is formed on a respective subset of the plurality of cylindrical electrode portions 252 that is arranged in rows that extend along a first horizontal direction hd1. Each drain select gate electrode (252, 254) laterally surrounds, and encircles, respective rows of vertical semiconductor channels 60, and contacts only one side of two rows of gate dielectrics 250, which are two outmost rows of gate dielectrics 250 contacting a respective drain-select-level isolation strip 270.

The drain select gate electrodes (252, 254) are formed around upper portions of the vertical semiconductor channels 60. The drain-select-level isolation strips 270 may be formed between a neighboring pair of the drain select gate electrodes (252, 254).

Figure 50A:
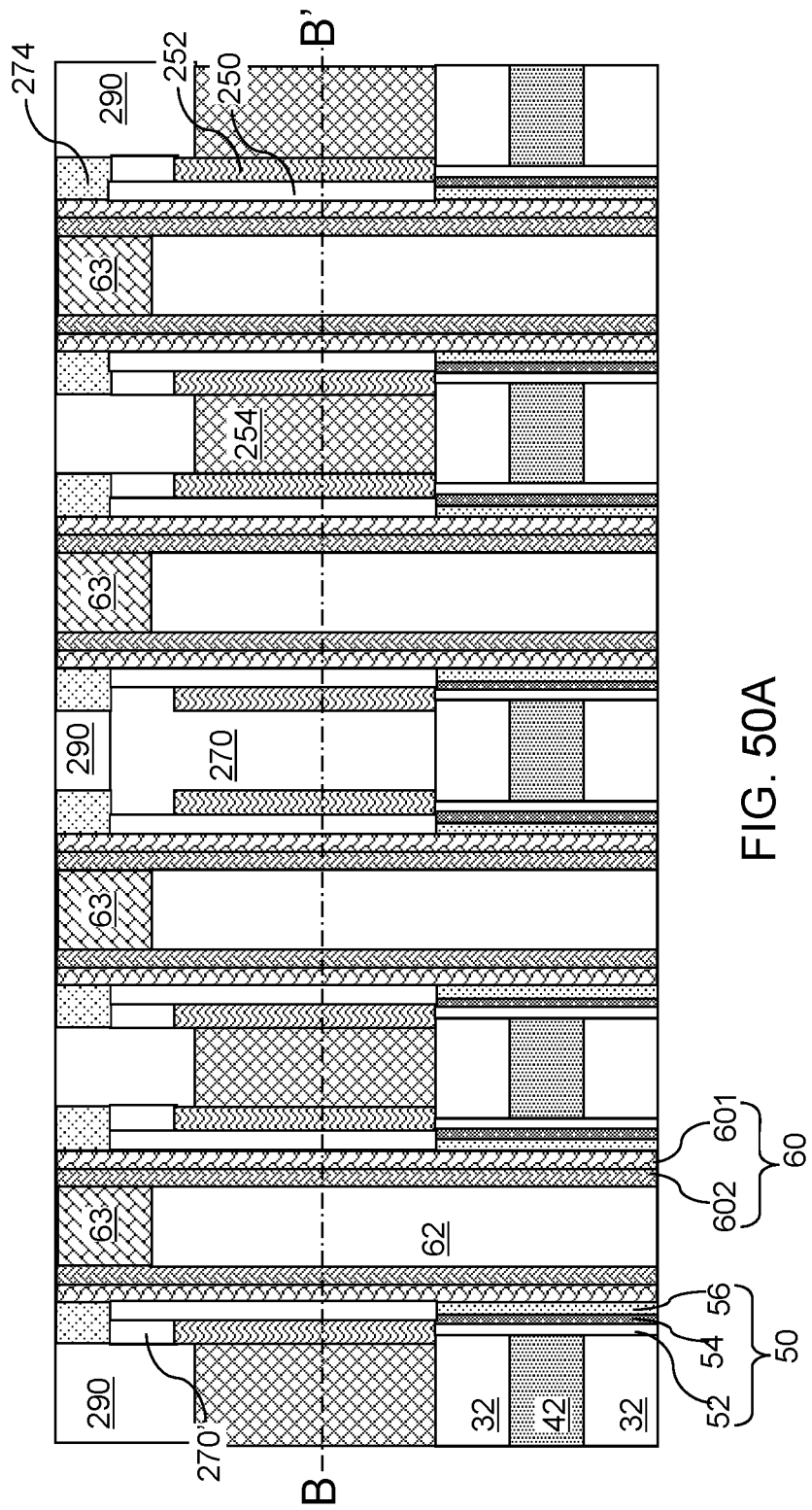
FIG. 50A is a vertical cross-sectional view of the second exemplary structure after formation of a dielectric fill material layer according to the second embodiment of the present disclosure.
Figure 50B:
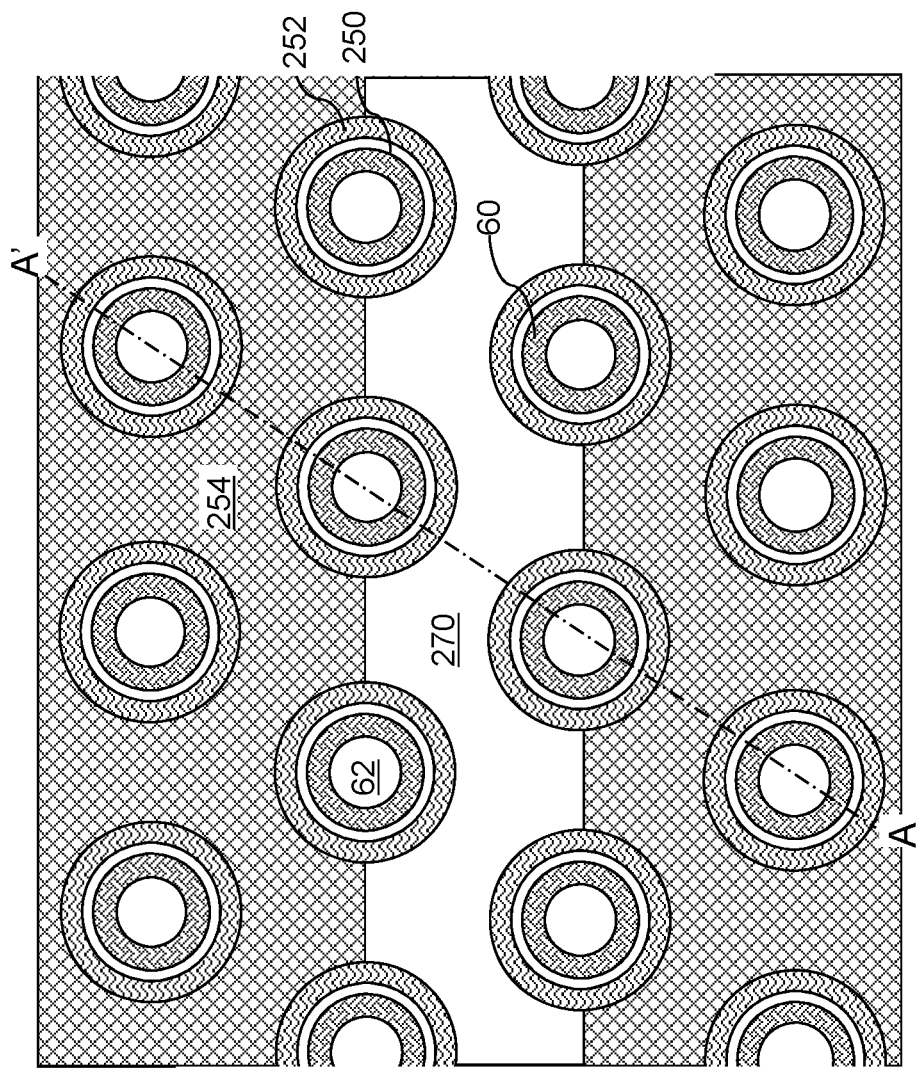
FIG. 50B is a horizontal cross-sectional view along the plane B-B' of the second exemplary structure of FIG. 50A. The vertical plane A-A' is the plane of the cross-section for FIG. 50A.

FIG. 50A is a vertical cross-sectional view of the second exemplary structure after formation of a dielectric fill material layer according to the second embodiment of the present disclosure. FIG. 50B is a horizontal cross-sectional view along the plane B-B' of the second exemplary structure of FIG. 50A. The vertical plane A-A' is the plane of the cross-section for FIG. 50A. Referring to FIGS. 50A, 50B, 51A, and 51B, a dielectric fill material layer 290 is formed on the top surface of the strip electrode portions 254 to fill the gaps between the etch mask rings 274. The dielectric fill material layer 290 can include a planarizable dielectric material such as silicon oxide. The dielectric fill material layer 290 can be planarized to remove to provide a top surface that is coplanar with the top surfaces of the drain regions 63 and the etch mask rings 274. For example, chemical mechanical planarization or a recess etch can be employed. The top surfaces of the drain select level isolation strips 270 and the dielectric fill material layer 290 can be within a same horizontal plane as the top surfaces of the drain regions 63. The combination of a respective drainselect-level assembly 55 and the respective underlying support pillar structure 320 comprises a support structure 358.

Figure 51A:
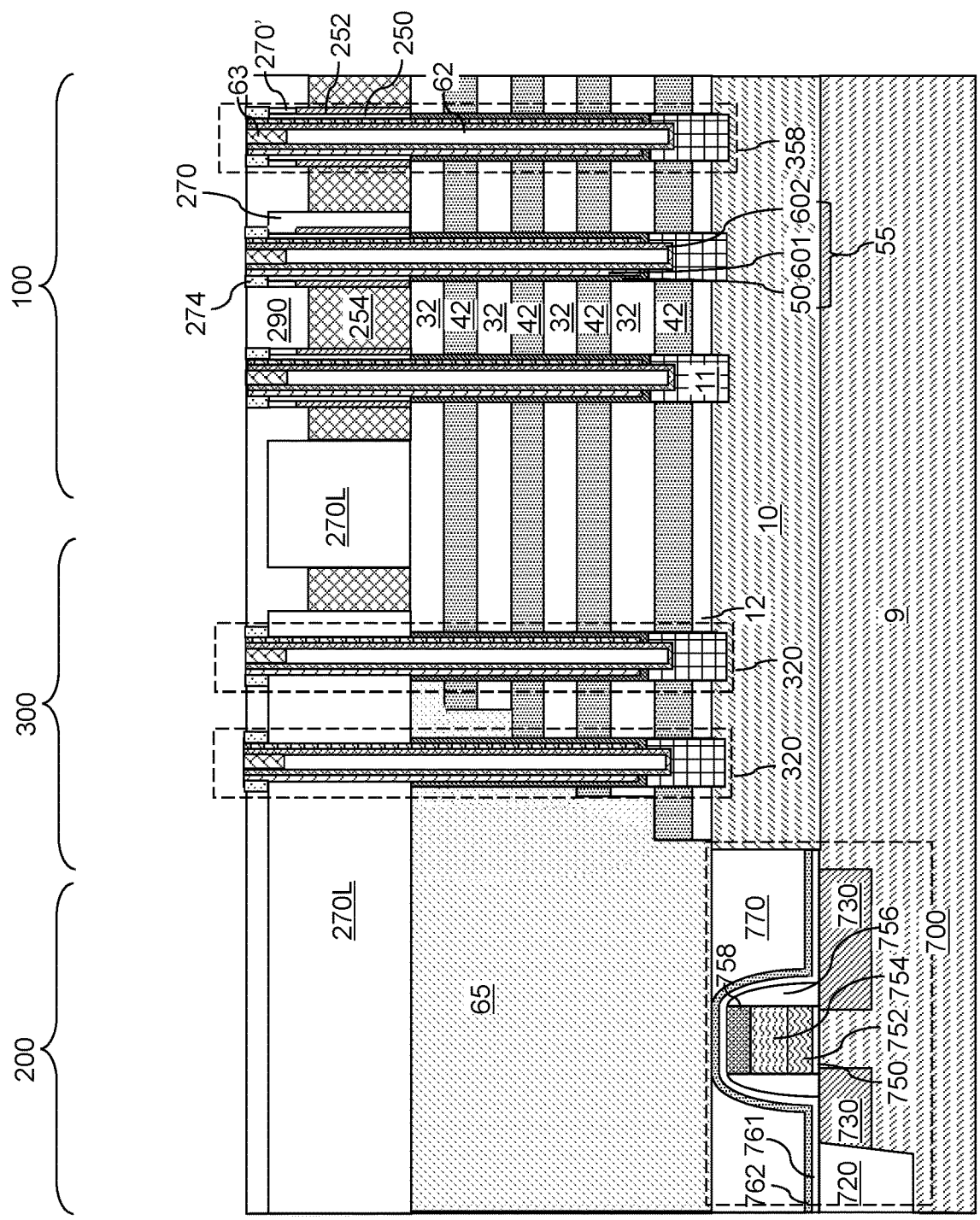
FIG. 51A is another vertical cross-sectional view of the second exemplary structure at the processing steps of FIGS. 50A and 50B.
Figure 51B:
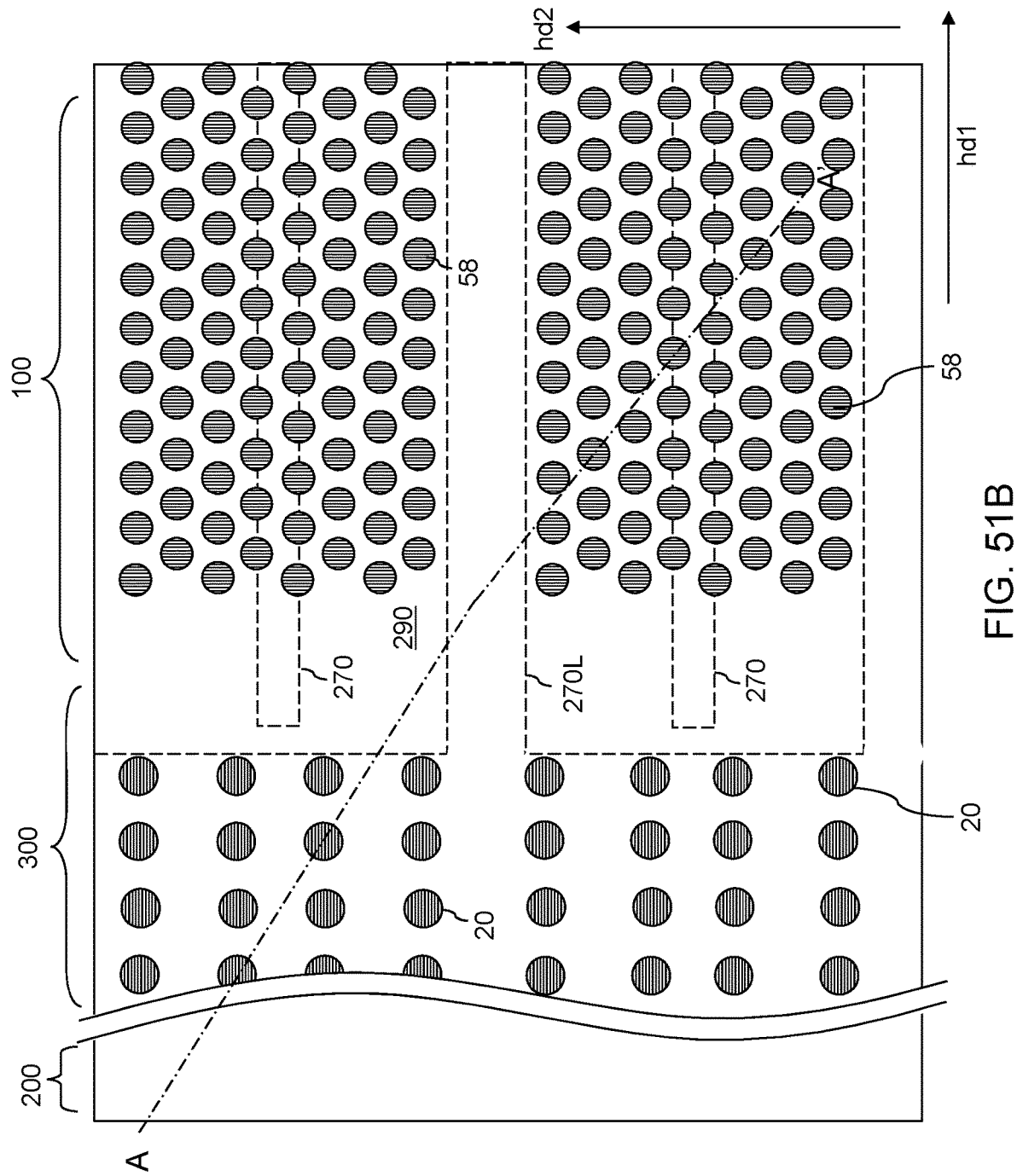
FIG. 51B is a top-down view of the second exemplary structure of FIG. 51A. The vertical plane A-A' is the plane of the cross-section of FIG. 51A.
Figure 52A:
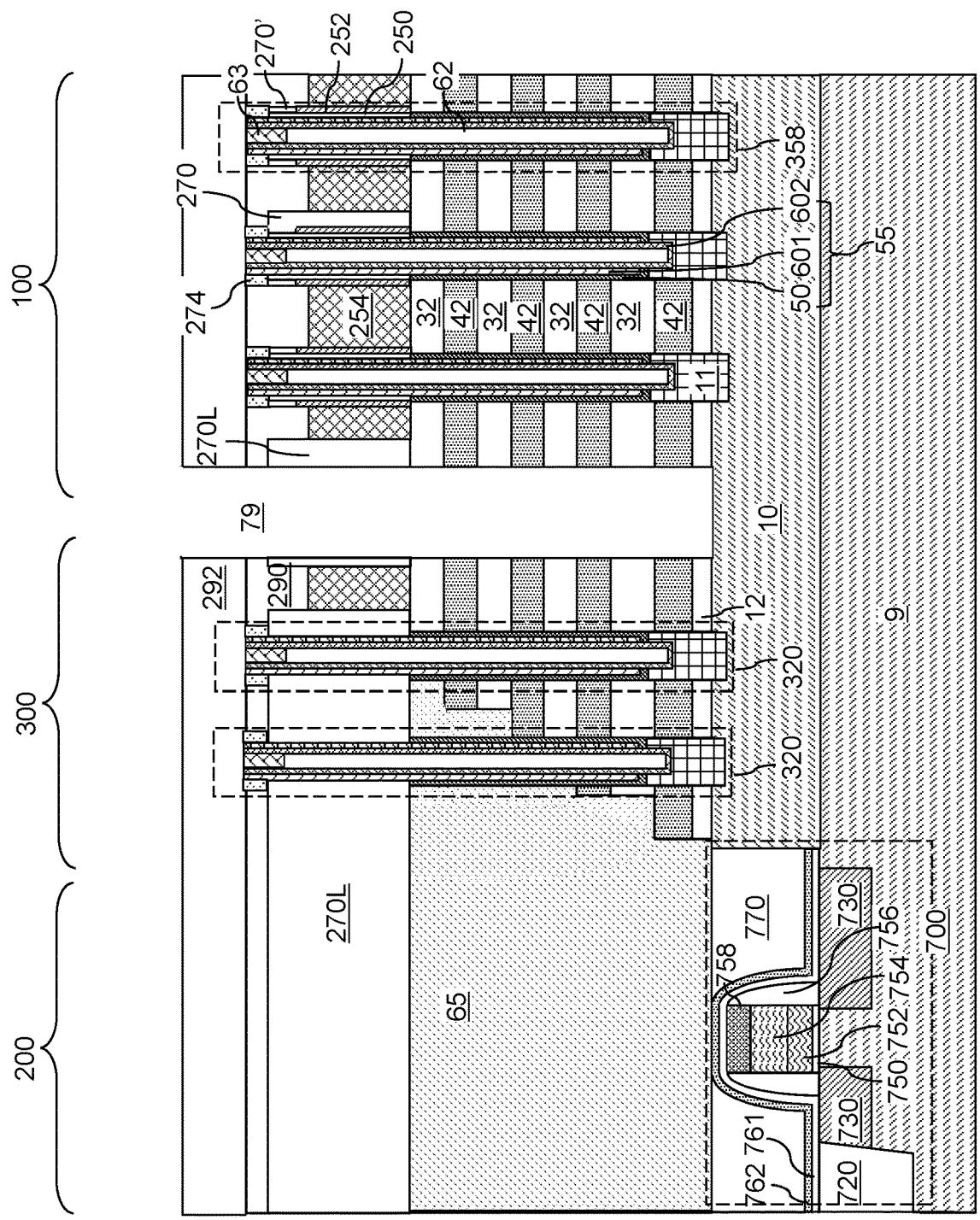
FIG. 52A is a vertical cross-sectional view of the second exemplary structure after formation of a contact level dielectric layer and backside trenches according to the second embodiment of the present disclosure.
Figure 52B:
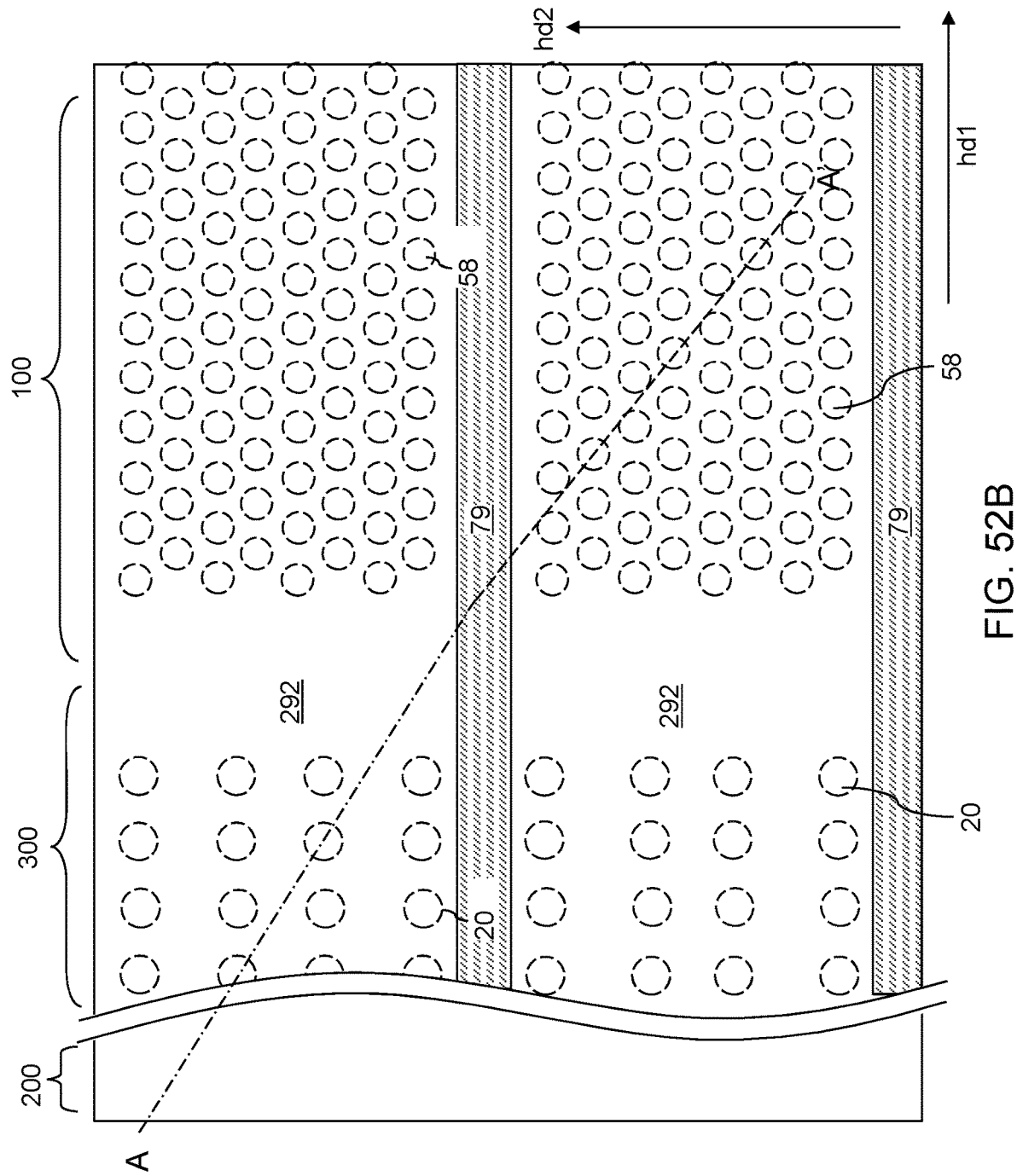
FIG. 52B is a top-down view of the second exemplary structure of FIG. 52A. The vertical plane A-A' is the plane of the cross-section of FIG. 52A.

FIGS. 52A to 55 illustrate steps for replacing the sacrificial material layers 42 with the electrically conductive layers 46. In one embodiment, these steps can be performed after the step shown in FIG. 44 in which the dielectric template layer 270L is formed. Alternatively, these steps may be performed after the step shown in FIGS. 51A and 51B. FIG. 51A is another vertical cross-sectional view of the second exemplary structure at the processing steps of FIGS. 50A and 50B. FIG. 51B is a top-down view of the second exemplary structure of FIG. 51A. The vertical plane A-A' is the plane of the cross-section of FIG. 51A. FIG. 52A is a vertical cross-sectional view of the second exemplary structure after formation of a contact level dielectric layer and backside trenches according to the second embodiment of the present disclosure. FIG. 52B is a top-down view of the second exemplary structure of FIG. 52A. The vertical plane A-A' is the plane of the cross-section of FIG. 52A. Referring to FIGS. 52A and 52B, a contact level dielectric layer 292 can be formed over the dielectric fill material layer 290. The contact level dielectric layer 292 includes a dielectric material such as silicon oxide, and can have a thickness in a range from 50 nm to 800 nm, although lesser and greater thicknesses can also be employed. A photoresist layer (not shown) can be applied over the contact level dielectric layer 292, and is lithographically patterned to form openings in areas between arrays of memory stack structures 55. The pattern in the photoresist layer can be transferred through, the dielectric template layer 270L, the alternating stack (32, 42), and/or the retro-stepped dielectric material portion 65 (and optionally through the contact level dielectric layer 292 and the dielectric fill material layer 290 if present at this step) employing an anisotropic etch to form backside trenches 79. The backside trenches 79 vertically extend at least to the top surface of the substrate (9, 10), and laterally extend through the memory array region 100 and the contact region 300. In one embodiment, the backside trenches 79 can be employed as source contact openings in which source contact via structures can be subsequently formed. In one embodiment, the backside trenches 79 can laterally extend along the first horizontal direction hd1, i.e., along the word line direction of the rows of the memory stack structures 55. The photoresist layer can be removed, for example, by ashing.

Figure 53:
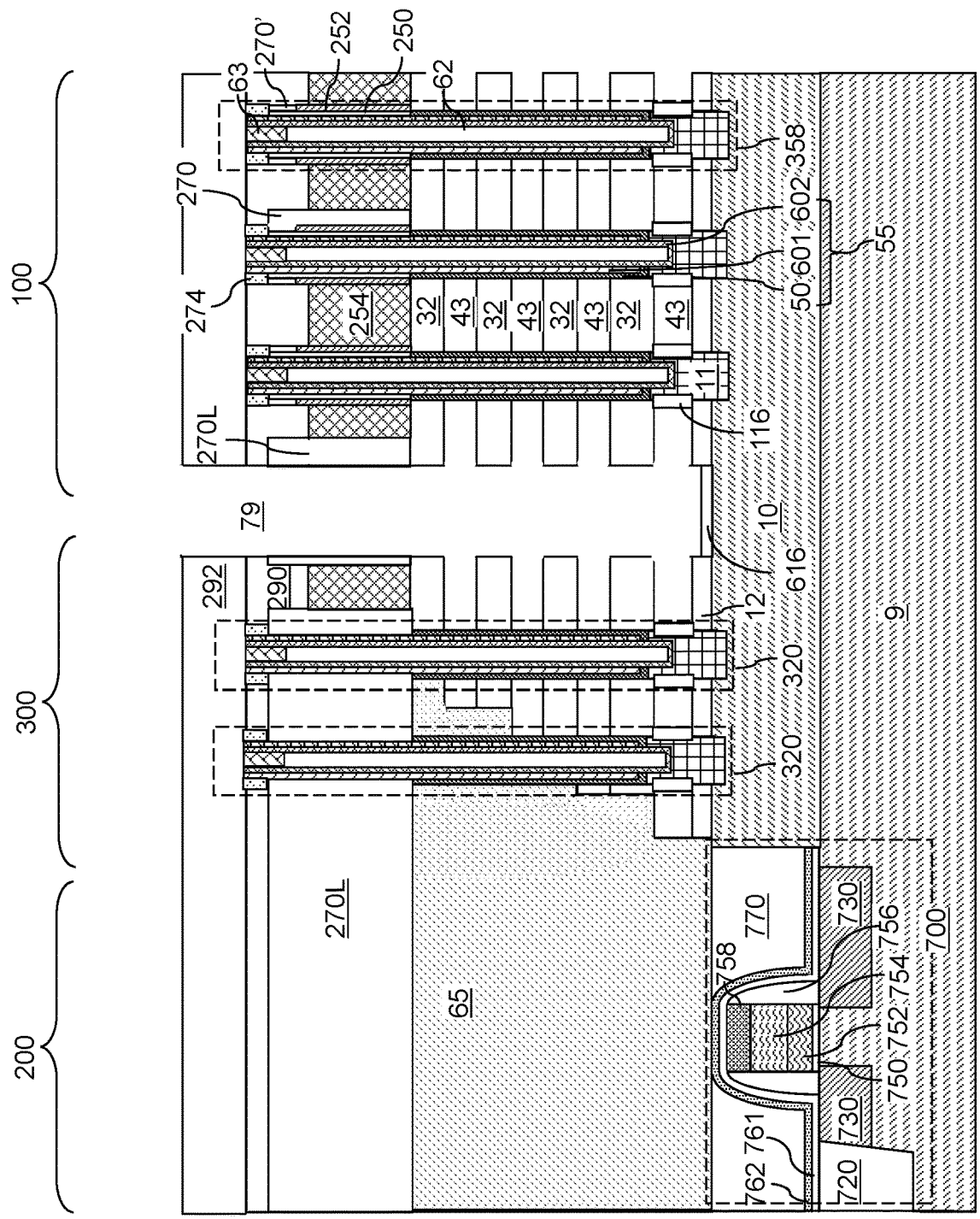
FIG. 53 is a vertical cross-sectional view of the second exemplary structure after formation of backside recesses by removal of the sacrificial material layers with respect to the insulating layers according to the second embodiment of the present disclosure.

Referring to FIG. 53 an etchant that selectively etches the second material of the sacrificial material layers 42 with respect to the first material of the insulating layers 32 may be introduced into the backside trenches 79, for example, using an etch process. Backside recesses 43 are formed in volumes from which the sacrificial material layers 42 are removed. The removal of the second material of the sacrificial material layers 42 may be selective to the first material of the insulating layers 32, the materials of the contact level dielectric layer 292, the dielectric fill material layer 290, the dielectric template layer 270L, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32, contact level dielectric layer 292, the dielectric fill material layer 290, the dielectric template layer 270, and the retro-stepped dielectric material portion 65 may be selected from silicon oxide and dielectric metal oxides. In another embodiment, the sacrificial material layers 42 may include a semiconductor material such as polysilicon, and the materials of the insulating layers 32 and the retro-stepped dielectric material portion 65 may be selected from silicon oxide, silicon nitride, and dielectric metal oxides. In this case, the depth of the backside trenches 79 may be modified so that the bottommost surface of the backside trenches 79 is located within the base insulating layer 12, i.e., to avoid physical exposure of the top surface of the semiconductor material layer 10.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 may define a space for receiving a respective word line of the array of monolithic three-dimensional NAND strings.

Each of the plurality of backside recesses 43 may extend substantially parallel to the top surface of the substrate (9, 10). A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor material layer 10 may be converted into dielectric material portions by thermal conversion and/or plasma conversion of the semiconductor materials into dielectric materials. For example, thermal conversion and/or plasma conversion may be used to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor material layer 10.

Figure 54:
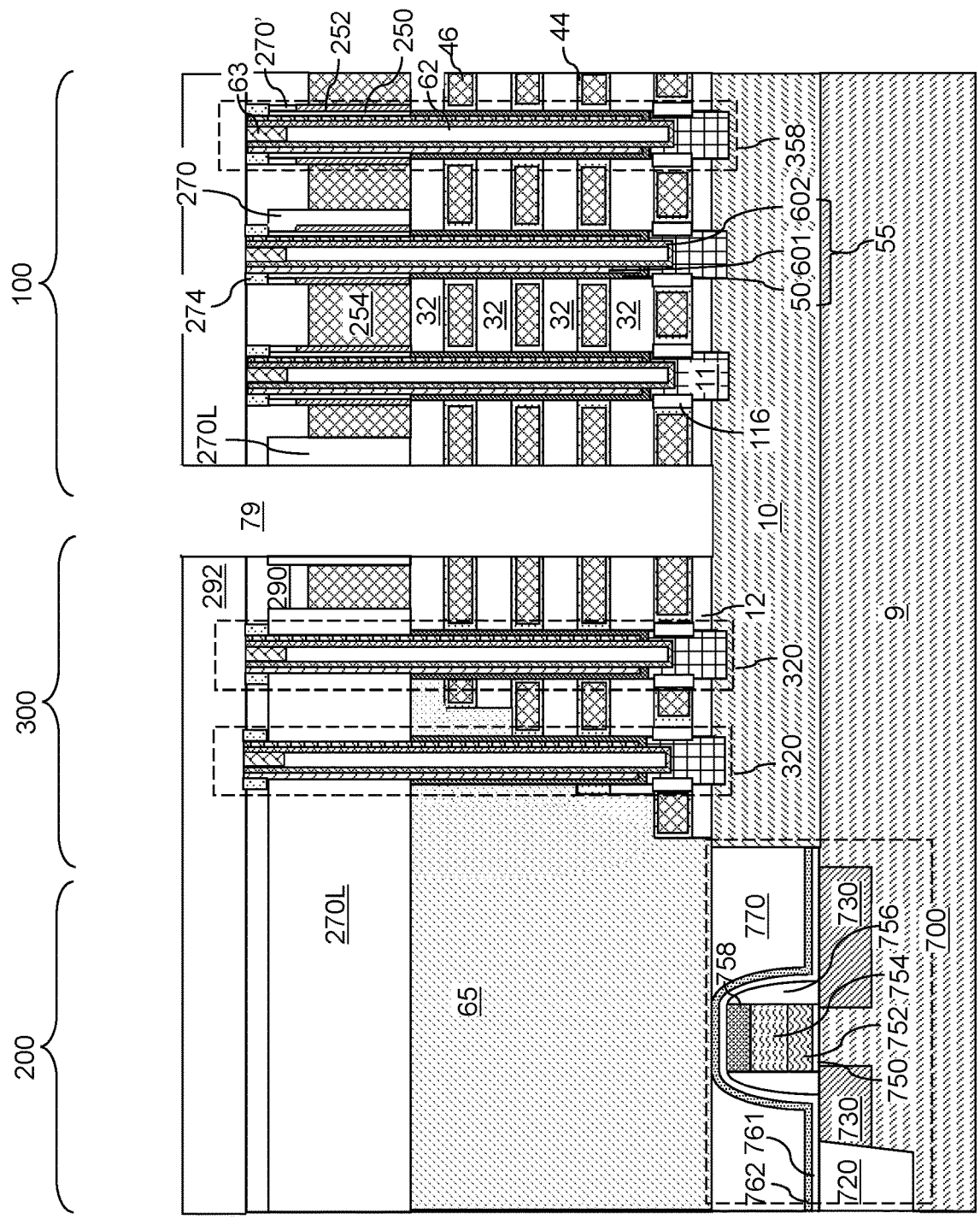
FIG. 54 is a vertical cross-sectional view of the second exemplary structure after formation of optional backside blocking dielectric layers and electrically conductive layers and after removal of excess conductive material from within the backside trenches according to the second embodiment of the present disclosure.

Referring to FIG. 54, a backside blocking dielectric layer 44 may be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 may be formed in the backside recesses 43 and on a sidewall of the backside trench 79. The backside blocking dielectric layer 44 may be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 may be formed by a conformal deposition process such as atomic layer deposition (ALD). The backside blocking dielectric layer 44 may consist essentially of aluminum oxide. The thickness of the backside blocking dielectric layer 44 may be in a range from 1 nm to 15 nm, such as 2 to 6 nm, although lesser and greater thicknesses may also be used.

The dielectric material of the backside blocking dielectric layer 44 may be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively, or additionally, the backside blocking dielectric layer may include a silicon oxide layer. The backside blocking dielectric layer may be deposited by a conformal deposition method such as chemical vapor deposition or atomic layer deposition. The thickness of the backside blocking dielectric layer may be in a range from 1 nm to 10 nm, although lesser and greater thicknesses may also be used. The backside blocking dielectric layer may be formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' may be present within the portion of each backside trench 79 that is not filled with the backside blocking dielectric layer.

At least one conductive material may be deposited in the backside recesses 43, peripheral portions of the backside trenches 79, and over the contact level dielectric layer 292 by conformal deposition. Each continuous portion of the at least one conductive material deposited in a backside recess 43 constitutes an electrically conductive layer 46. The conductive material deposited outside of the backside recesses 43 collectively constitute a continuous metallic material layer (not shown), which is a continuous layer of the conductive material that is deposited over the contact level dielectric layer 292 and at peripheral portions of the backside trenches 79.

In an illustrative example, a metallic barrier layer (not explicitly shown) may be deposited in the backside recesses. The metallic barrier layer includes an electrically conductive metallic material that may function as a diffusion barrier layer and/or adhesion promotion layer for a metallic fill material to be subsequently deposited. The metallic barrier layer may include a conductive metallic nitride material such as TiN, TaN, WN, or a stack thereof, or may include a conductive metallic carbide material such as TiC, TaC, WC, or a stack thereof. In one embodiment, the metallic barrier layer may be deposited by a conformal deposition process such as chemical vapor deposition (CVD) or atomic layer deposition (ALD). The thickness of the metallic barrier layer may be in a range from 2 nm to 8 nm, such as from 3 nm to 6 nm, although lesser and greater thicknesses may also be used. In one embodiment, the metallic barrier layer may consist essentially of a conductive metal nitride such as TiN.

A metal fill material is deposited in the plurality of backside recesses 43, on the sidewalls of the at least one the backside contact trench 79, and over the top surface of the contact level dielectric layer 292 to form a metallic fill material layer. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer may consist essentially of at least one elemental metal. The at least one elemental metal of the metallic fill material layer may be selected, for example, from tungsten, cobalt, ruthenium, titanium, and tantalum. In one embodiment, the metallic fill material layer may consist essentially of a single elemental metal. In one embodiment, the metallic fill material layer may be deposited using a fluorine-containing precursor gas such as $WF_6$. In one embodiment, the metallic fill material layer may be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 may be formed in the plurality of backside recesses 43. The continuous metallic material layer may be formed on the sidewalls of each backside contact trench 79 and over the contact level dielectric layer 292. Each electrically conductive layer 46 includes a portion of the metallic barrier layer and a portion of the metallic fill material layer that are located between a vertically neighboring pair of dielectric material layers, which may be a pair of insulating layers 32, a bottommost insulating layer and a base insulating layer 12, or a topmost insulating layer and the insulating cap layer 70. The continuous metallic material layer includes a continuous portion of the metallic barrier layer and a continuous portion of the metallic fill material layer that are located in the backside trenches 79 or above the contact level dielectric layer 292.

Each sacrificial material layer 42 may be replaced with an electrically conductive layer 46. A backside cavity is present in the portion of each backside contact trench 79 that is not filled with the backside blocking dielectric layer and the continuous metallic material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

The deposited metallic material of the continuous electrically conductive material layer is etched back from the sidewalls of each backside contact trench 79 and from above the dielectric template layer 270L (and above the contact level dielectric layer 292 if present at this step), for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each drain select gate electrode (252, 254) functions as a drain side select gate electrode (SGD) of the vertical NAND string. One or several of the bottommost electrically conductive layers functions as a source side select gate electrode (SGS) of the vertical NAND string. Each electrically conductive layer 46 located between the drain side and the source side select gate electrodes may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

In one embodiment, the removal of the continuous electrically conductive material layer may be selective to the material of the backside blocking dielectric layer 44. In this case, a horizontal portion of the backside blocking dielectric layer 44 may be present at the bottom of each backside contact trench 79. The base insulating layer 12 may be vertically spaced from the backside contact trench 79 by the horizontal portion of the backside blocking dielectric layer 44.

In another embodiment, the removal of the continuous electrically conductive material layer may not be selective to the material of the backside blocking dielectric layer 44 or, the backside blocking dielectric layer 44 may not be used. In this case, a top surface and/or sidewall surface, of the base insulating layer 12 may be physically exposed at the bottom of the backside contact trench 79 depending on whether the base insulating layer 12 is not removed or partially removed during removal of the continuous electrically conductive material layer.

Figure 55:
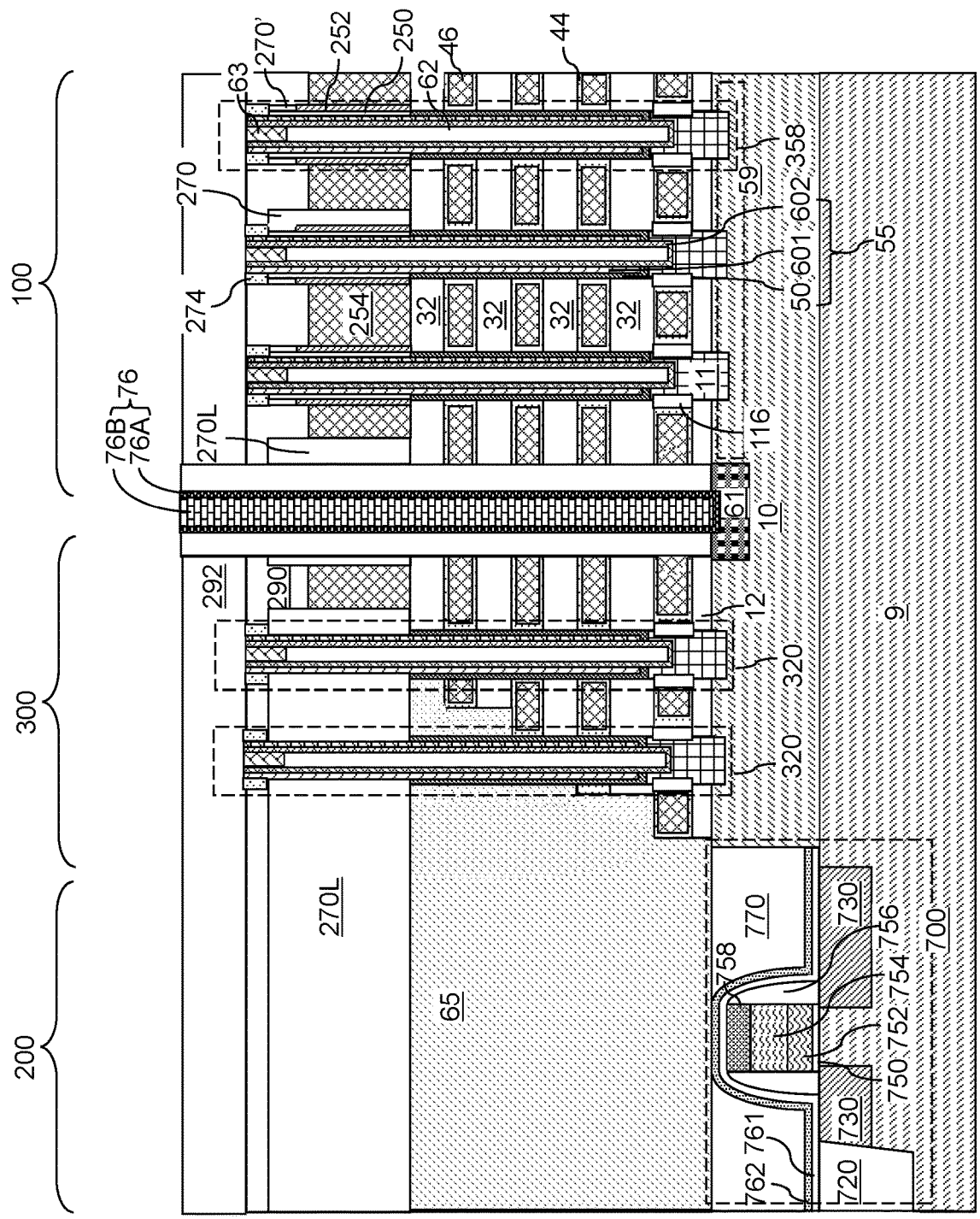
FIG. 55 is a vertical cross-sectional view of the second exemplary structure after formation of an insulating spacer, and a backside contact structure within each backside trench according to the second embodiment of the present disclosure.

Referring to FIG. 55, an insulating material layer may be formed in the at least one backside contact trench 79 and over the dielectric template layer 270L (and also over the contact level dielectric layer 292 if present at this step) by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be used.

If a backside blocking dielectric layer 44 is present, the insulating material layer may be formed directly on surfaces of the backside blocking dielectric layer 44 and directly on the sidewalls of the electrically conductive layers 46. If a backside blocking dielectric layer 44 is not used, the insulating material layer may be formed directly on sidewalls of the insulating layers 32 and directly on sidewalls of the electrically conductive layers 46.

An anisotropic etch is performed to remove horizontal portions of the insulating material layer from above the dielectric template layer 270L (and from above the contact level dielectric layer 292 if present at this step) and at the bottom of each backside contact trench 79. Each remaining portion of the insulating material layer constitutes an insulating spacer 74. A backside cavity is present within a volume surrounded by each insulating spacer 74.

The anisotropic etch process may continue with, or without, a change in the etch chemistry to remove portions of the optional backside blocking dielectric layer 44 and the planar dielectric portion 616 that underlies the opening through the insulating spacer 74. A top surface of the semiconductor material layer 10 may be physically exposed at the bottom of each backside contact trench 79.

A source region 61 may be formed at a surface portion of the semiconductor material layer 10 under each backside cavity 79' (shown in FIG. 29) by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74. Each source region 61 may have a doping of a second conductivity type, which is the opposite of the first conductivity type. For example, if the first conductivity type is p-type, the second conductivity type is n-type, and vice versa.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels (60, 160) through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Each source region 61 may be formed in an upper portion of the semiconductor substrate (9, 10).

A contact via structure 76 may be formed within each cavity in the backside trenches 79. Each contact via structure 76 may fill a respective cavity. The contact via structures 76 may be formed by depositing at least one conductive material in the remaining unfilled volume (i.e., the backside cavity) of the backside contact trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be used. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized using the contact level dielectric layer 292 overlying the alternating stack (32, 46) as a stopping layer. If chemical mechanical planarization (CMP) process is used, the contact level dielectric layer 292 may be used as a CMP stopping layer. Each remaining continuous portion of the at least one conductive material in the backside contact trenches 79 constitutes a backside contact via structure 76. The backside contact via structure 76 extends through the alternating stack (32, 46), and contacts a top surface of the source region 61. If a backside blocking dielectric layer 44 is used, the backside contact via structure 76 may contact a sidewall of the backside blocking dielectric layer 44.

Figure 56A:
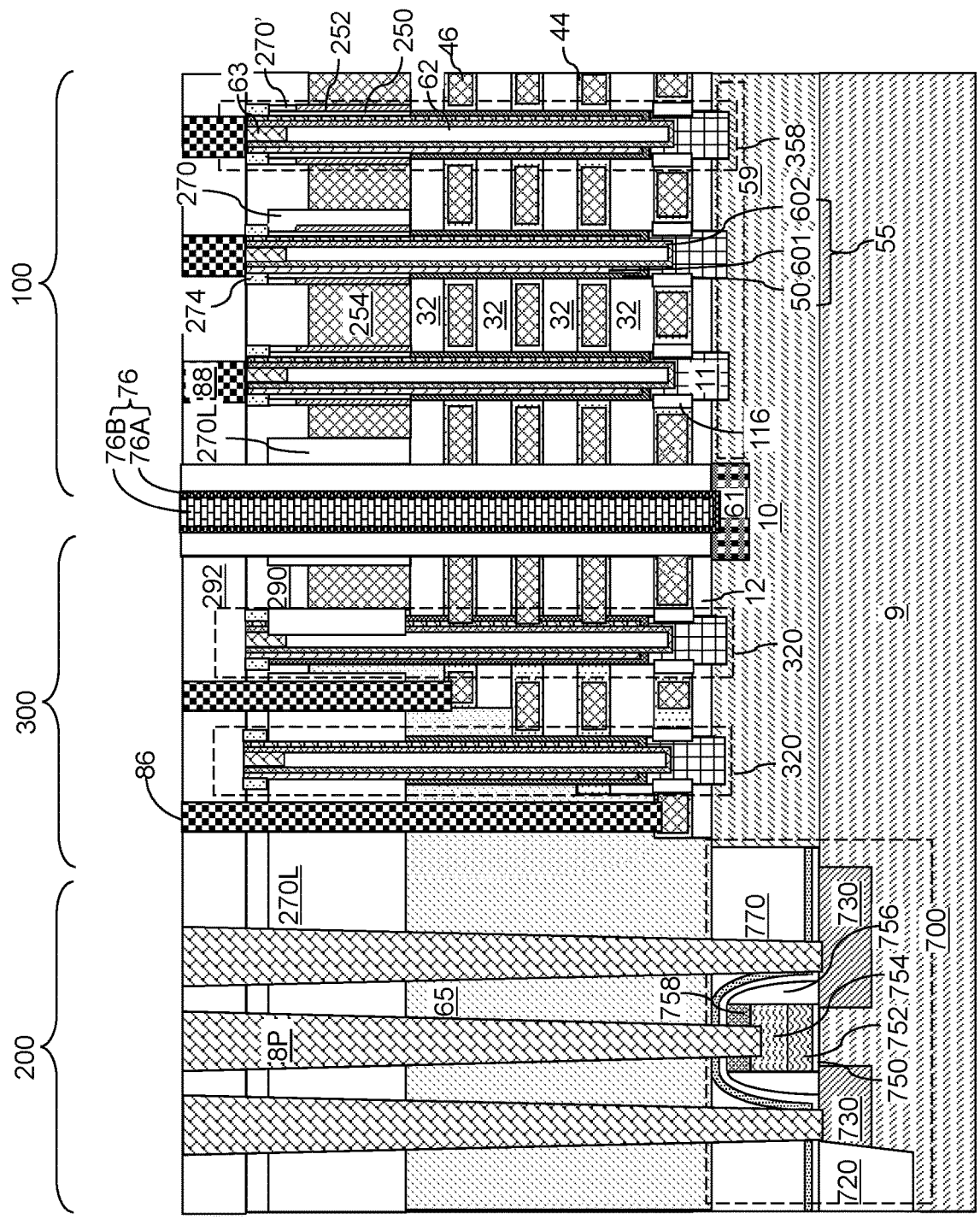
FIG. 56A is a vertical cross-sectional view of the second exemplary structure after formation of additional contact via structures according to the second embodiment of the present disclosure.
Figure 56B:
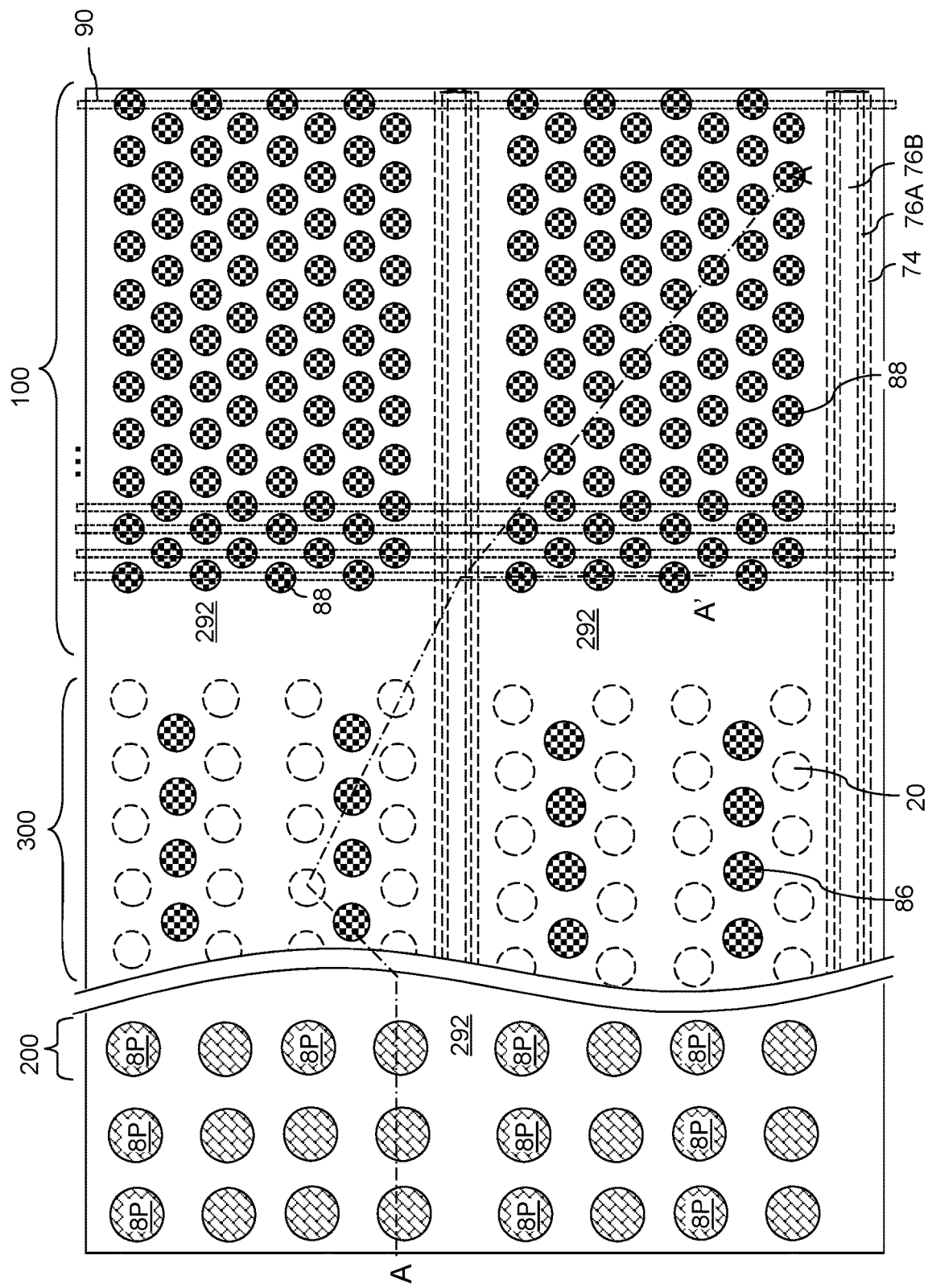
FIG. 56B is a top-down view of the exemplary structure of FIG. 56A. The vertical plane A-A' is the plane of the schematic vertical cross-sectional view of FIG. 56A.

FIG. 56A is a schematic vertical cross-sectional view of the second exemplary structure after formation of additional contact via structures according to the second embodiment of the present disclosure. FIG. 56B is a top-down view of the exemplary structure of FIG. 56A. The vertical plane A-A' is the plane of the schematic vertical cross-sectional view of FIG. 56A. Referring to FIGS. 56A and 56B, additional contact via structures (88, 86, 8P) can be formed through the contact level dielectric layer 292, the dielectric fill material layer 290, and optionally through the retro-stepped dielectric material portion 65. For example, drain contact via structures 88 can be formed through the contact level dielectric material layer 292 on each drain region 63. Word line contact via structures 86 can be formed on the electrically conductive layers 46 through the contact level dielectric layer 292, the dielectric fill material layer 290, the dielectric template layer 270L, and through the retro-stepped dielectric material portion 65. Peripheral device contact via structures 8P can be formed through the contact level dielectric layer 292, the dielectric fill material layer 290, the dielectric template layer 270L, and through the retro-stepped dielectric material portion 65 directly on respective nodes of the peripheral devices. Additional metal interconnect structures (not shown) can be subsequently formed as needed. For example, bit lines 90 (shown schematically in FIG. 31B) which extend in the second horizontal direction hd2 can be formed to provide electrical contact with the drain contact via structures 88.

Figure 57:
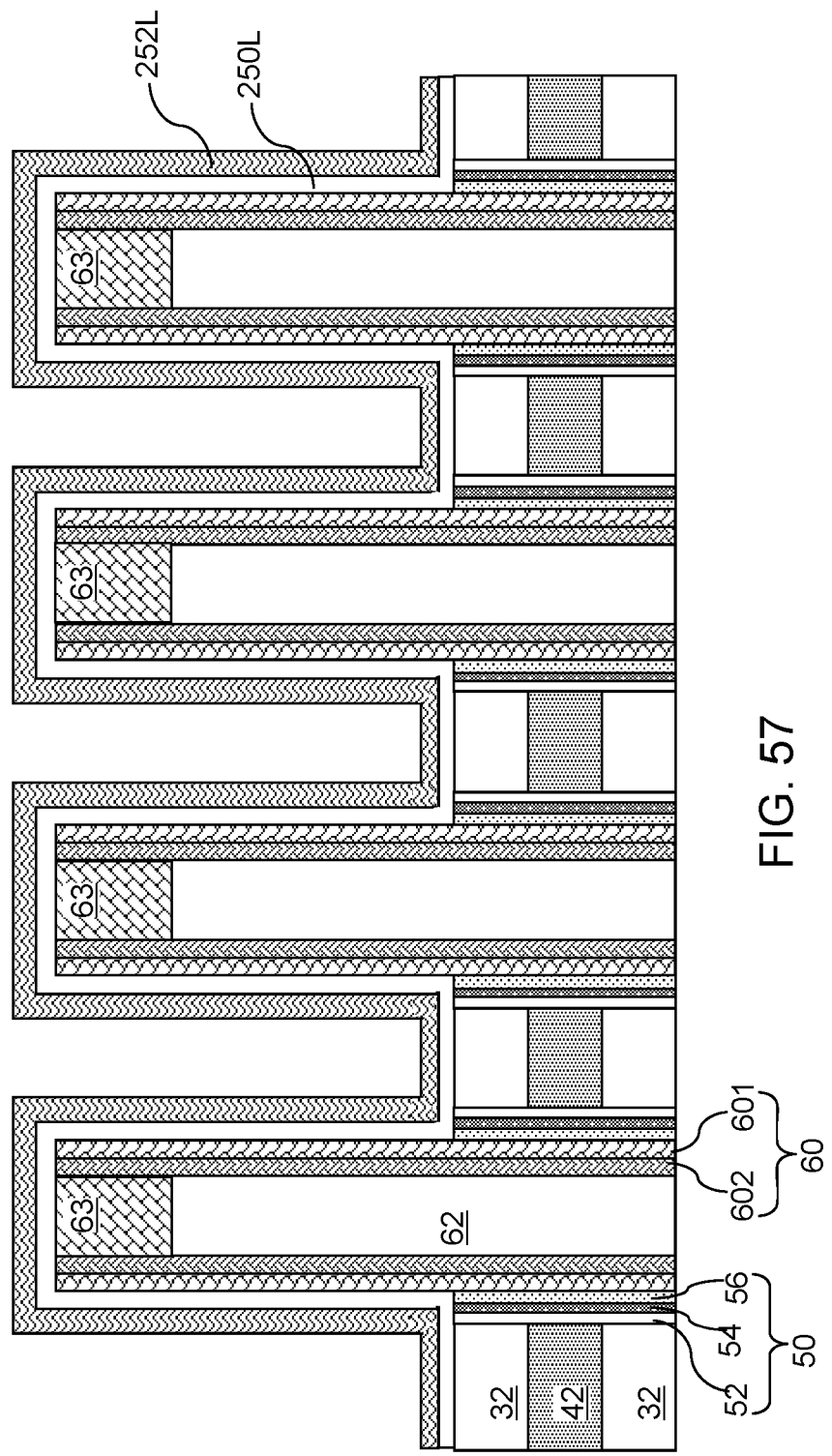
FIG. 57 is a vertical cross-sectional view of an alternative embodiment of the second exemplary structure after formation of a gate dielectric layer and a conformal gate electrode material layer according to the second embodiment of the present disclosure.
Figure 58:
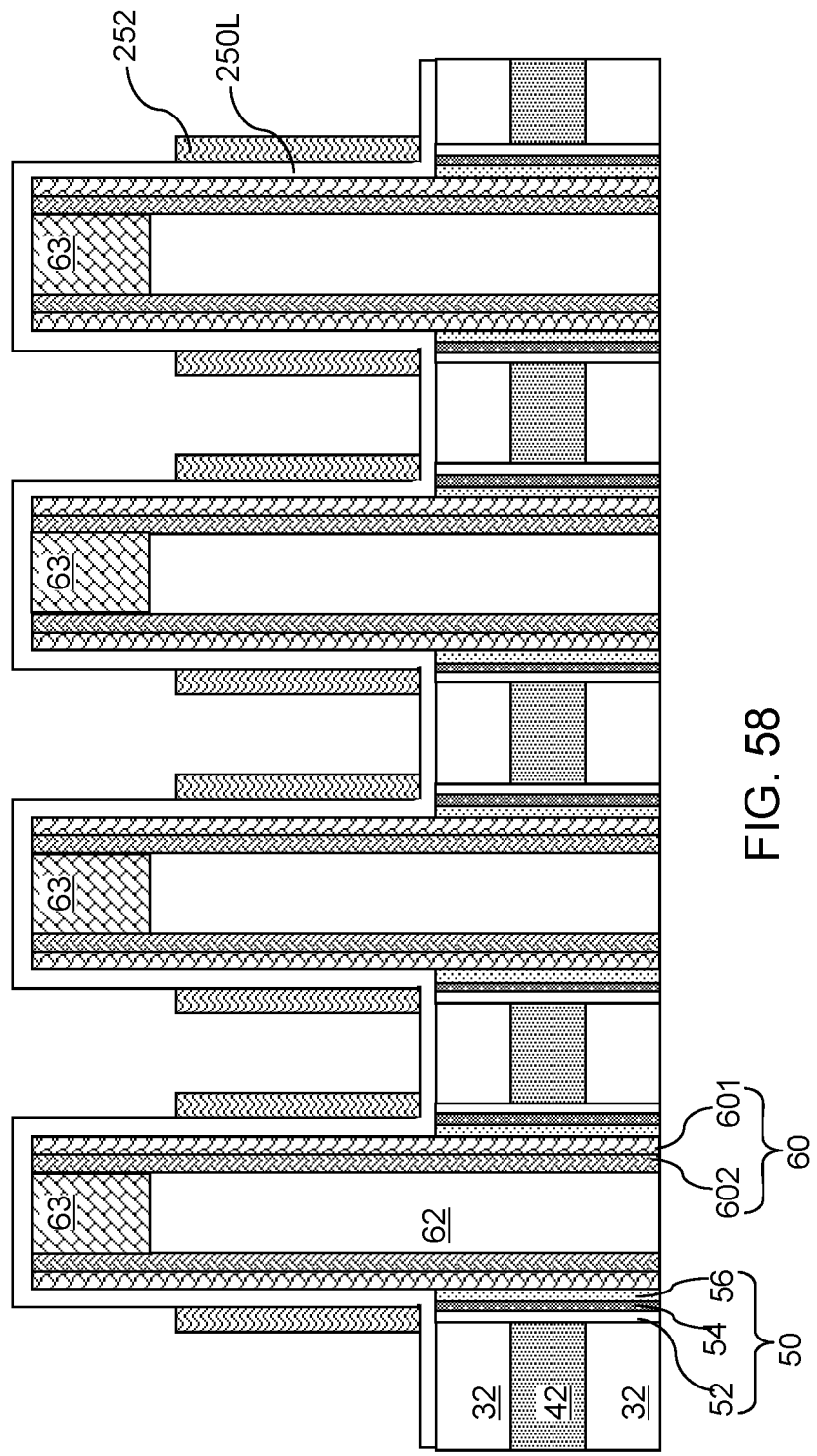
FIG. 58 is a vertical cross-sectional view of the alternative embodiment of the second exemplary structure after formation of cylindrical electrode portions according to the second embodiment of the present disclosure.
Figure 59:
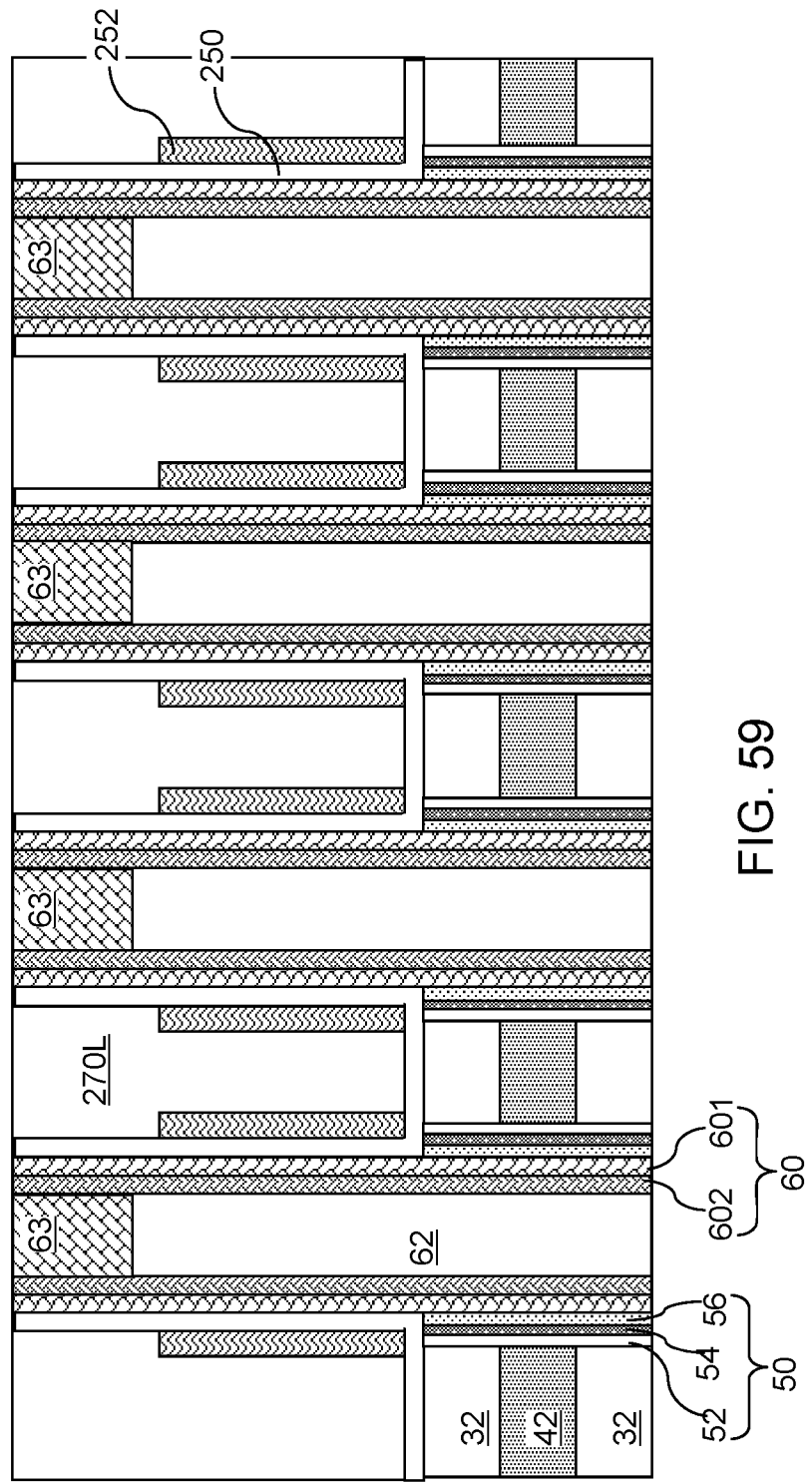
FIG. 59 is a vertical cross-sectional view of the alternative embodiment of the second exemplary structure after formation of a dielectric template layer according to the second embodiment of the present disclosure.

FIGS. 57-59 illustrate an alternative embodiment of the second embodiment, in which a trimming process that adjusts the height of the cylindrical electrode portions 252, as illustrated in FIGS. 41A, 41B, 42, and 43, is replaced with a controlled anisotropic etch process that adjusts the height of the cylindrical electrode portions 252.

Referring to FIG. 57, an alternative embodiment of the second exemplary structure may be derived from the second exemplary structure of FIG. 38 by removing any protruding remaining portions of the memory films 50 from above the top surface of the topmost insulating layer, and by sequentially depositing a conformal gate dielectric layer 250L and a conformal gate electrode material layer 252L. The conformal gate dielectric layer 250L may have the same composition and thickness as the gate dielectrics 250, and the conformal gate electrode material layer 252L may have the same composition and thickness as the cylindrical electrode portions 252 as described above.

Referring to FIG. 58, an anisotropic etch is performed to remove horizontal portions of the conformal gate electrode material layer 252L. Each remaining portion of the conformal gate electrode material layer 252L constitutes a cylindrical electrode portion 252, which has a cylindrical shape. In one embodiment, the anisotropic etch may continue to reduce the height of the cylindrical electrode portions 252 until the height of the cylindrical electrode portions 252 reaches the target height. The anisotropic etch may, or may not, be selective to the material of the conformal gate electrode material layer 252L. In one embodiment, the anisotropic etch may be selective to the material of the conformal gate electrode material layer 252L.

Referring to FIG. 59, a dielectric template layer 270L may be formed in the same manner as in the processing steps of FIG. 44. Subsequent processing steps of the second embodiment may be performed thereafter to provide the second exemplary structure of FIGS. 56A and 56B.

Referring collectively to all drawings related to the second embodiment, the second exemplary structure and alternative embodiments thereof may include a three-dimensional memory device. The three-dimensional memory device may comprise: an alternating stack of insulating layers 32 and electrically conductive layers 46 located over a substrate (9, 10); an array of memory stack structures 55 extending through the alternating stack (32, 46) and arranged as rows that extend along a first horizontal direction hd1 with a first pitch and are spaced along a second horizontal direction hd2 with a second pitch for each pair of neighboring rows, wherein each of the memory stack structures 55 comprises a vertical semiconductor channel 60 and a vertical stack of a memory film 50 and a gate dielectric 250 that contacts a top surface of the memory film 50; drain select gate electrodes (252, 254) laterally surrounding respective rows of the gate dielectrics 250; and a drain-select-level isolation strip 270 comprising a dielectric material and located between a neighboring pair of the drain select gate electrodes (252, 254).

In one embodiment, each of the drain select gate electrodes (252, 254) comprises: a strip electrode portion 254 including a pair of lengthwise sidewalls that generally extend along the first horizontal direction hd1; and a plurality of cylindrical electrode portions 252 that laterally surround a respective one of the gate dielectrics 250. In one embodiment, the memory film 50 comprises a lateral stack, from outside to inside, of a blocking dielectric 52, charge storage elements (comprising portions of the charge storage layer 54 located at levels of the electrically conductive layers 46), and a tunneling dielectric 56; and the gate dielectric 250 comprises a material different from a material of the charge storage elements.

In one embodiment, the memory film 50 and the gate dielectric 250 directly contact an outer sidewall of the vertical semiconductor channel 60; and the gate dielectric 250 contacts an inner sidewall of a respective one of the plurality of cylindrical electrode portions 252. In one embodiment, a top surface of the memory film 50 directly contacts a bottom surface of a respective one of the plurality of cylindrical electrode portions 252.

In one embodiment, the drain-select-level isolation strip 270 comprises: planar sidewall segments that contact planar sidewalls of the strip electrode portion 254 of the one of the drain select gate electrodes (252, 254); and concave sidewall segments that contact outer sidewalls of the plurality of cylindrical electrode portions 252 of the one of the drain select gate electrodes (252, 254). In one embodiment, each gate dielectric 250 that is laterally surrounded by the plurality of cylindrical electrode portions 252 contacts the drain-select-level isolation strip 270.

In one embodiment, the drain-select-level isolation strip 270 comprises two rows of cylindrical openings therethrough, wherein each of the cylindrical openings laterally surrounds a respective one of a subset of the gate dielectrics 250 that is arranged in two rows that extend along the first horizontal direction hd1. In one embodiment, a first subset of the cylindrical electrode portions 252 underlies overhanging portions of the drain-select-level isolation strip 270 and has sidewalls that are vertically coincident with sidewalls of the overhanging portions of the drain-select-level isolation strip 270; and a second subset of the cylindrical electrode portions 252 underlies tubular dielectric spacers 270' and has sidewalls that are vertically coincident with sidewalls of the tubular dielectric spacers 270'. In one embodiment, the drain-select-level isolation strip 270 and the tubular dielectric spacers 270' comprise a same dielectric material; and top surfaces of the drain-select-level isolation strip 270 and the tubular dielectric spacers 270' may be within a same horizontal plane.

In one embodiment, a first subset of the plurality of cylindrical electrode portions 252 contacts the drain-select-level isolation strip 270; and a second subset of the plurality of cylindrical electrode portions 252 has a respective cylindrical outer sidewall that is contacted by, and entirely encircled by, the strip electrode portion 254. In one embodiment, an array of drain regions 63 may contact top portions of a respective one of the vertical semiconductor channels 60. An array of etch mask rings 274 may be provided, which laterally surrounds a respective one of the drain regions 63, and is located over the drain select gate electrodes (252, 254) and the drain-select-level isolation strip 270. In one embodiment, each of the etch mask rings 274 contacts a top surface of a respective one of the gate dielectrics 250 and an outer sidewall of a respective one of the vertical semiconductor channels 60.

Each of the exemplary structures of the present disclosure may include a three-dimensional memory device. In one embodiment, the three-dimensional memory device comprises a vertical NAND memory device. The electrically conductive layers 46 may comprise, or may be electrically connected to, a respective word line of the monolithic three-dimensional NAND memory device. The substrate (9, 10) may comprise a silicon substrate. The vertical NAND memory device may comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings may be located over another memory cell (comprising another portion of the charge storage layer 54 at a level of another electrically conductive layer 46) in a second device level of the array of monolithic three-dimensional NAND strings. The silicon substrate may contain an integrated circuit comprising a driver circuit for the memory device located thereon. The electrically conductive layers 46 may comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings may comprise: a plurality of semiconductor channels {(59, 11, 60, 160) or (59, 11, 60)}, wherein at least one end portion {(60, 160) or 60} of each of the plurality of semiconductor channels {(59, 11, 60, 160) or (59, 11, 60)} extends substantially perpendicular to a top surface of the substrate (9, 10); and a plurality of charge storage elements (comprising charge trapping material portions). Each charge storage element may be located adjacent to a respective one of the plurality of semiconductor channels {(59, 11, 60, 160) or (59, 11, 60)}.

Figure 60A:
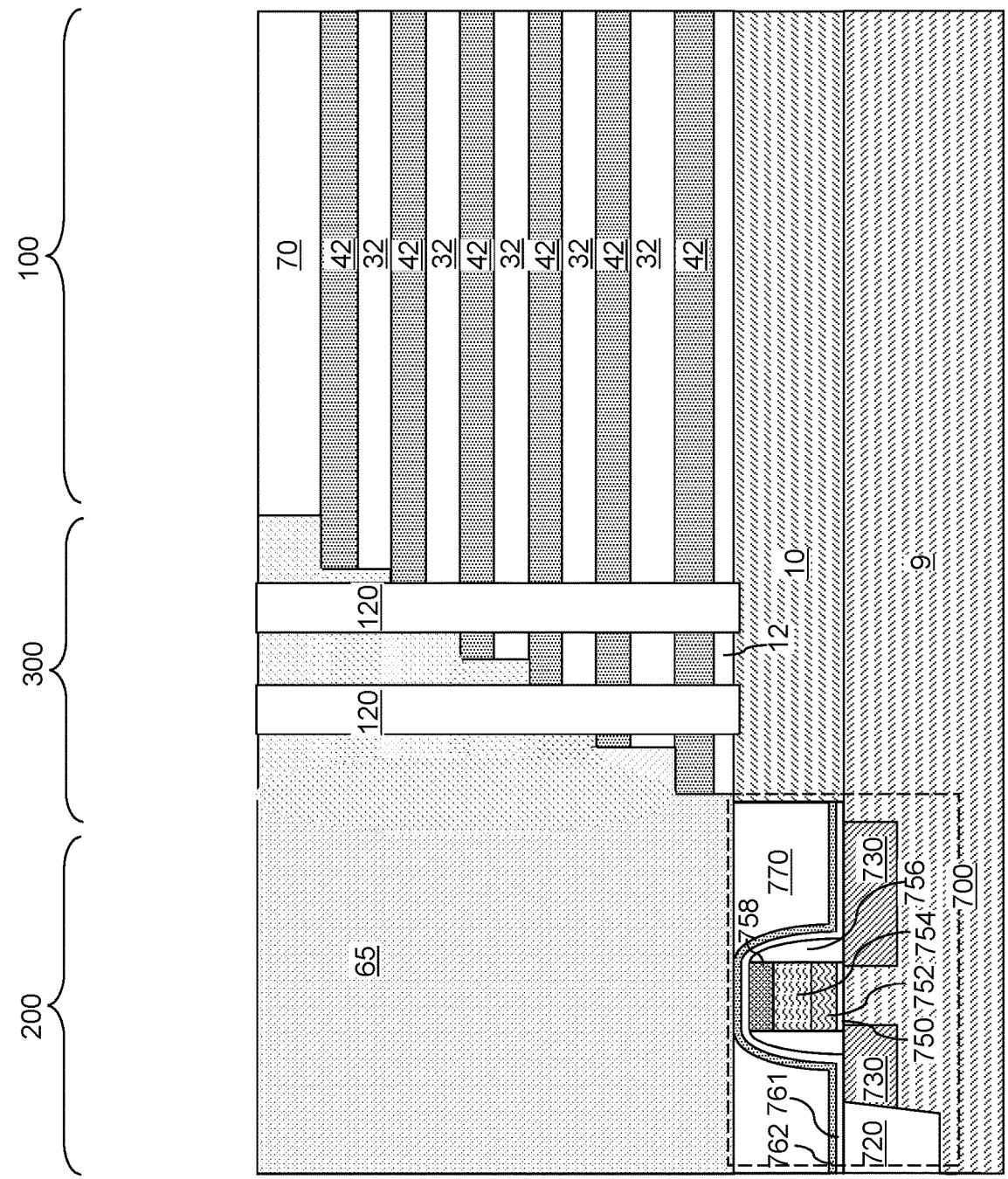
FIG. 60A is a vertical cross-sectional view of a third exemplary structure after formation of support pillar structures according to a third embodiment of the present disclosure.
Figure 60B:
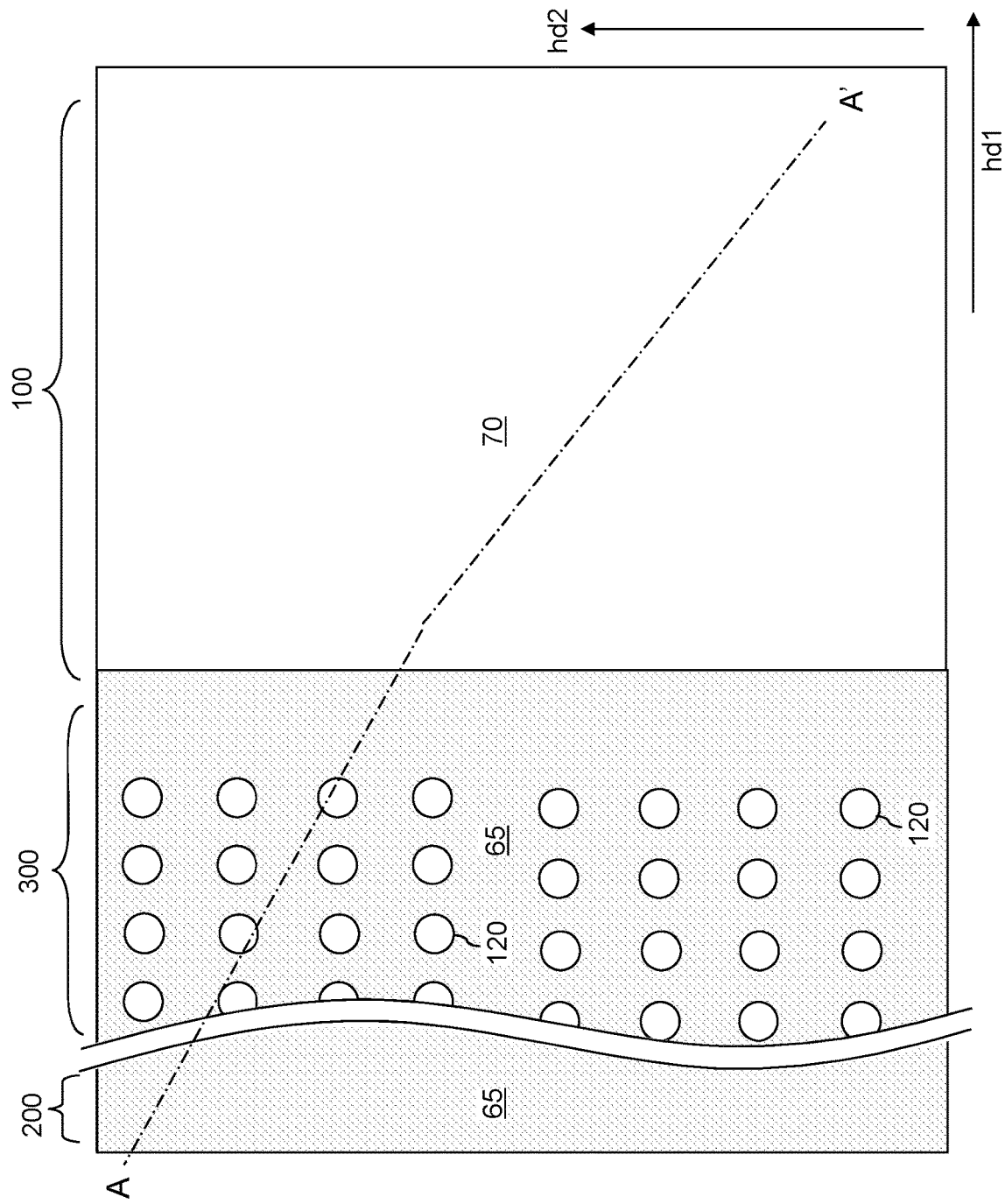
FIG. 60B is a top-down view of the third exemplary structure of FIG. 60A. The hinged vertical plane A-A' is the plane of the vertical cross-sectional view of FIG. 60A.

Referring to FIGS. 60A and 60B, a third exemplary structure according to a third embodiment of the present disclosure may be derived from the first exemplary structure of FIG. 3 by forming support openings at locations of the support openings 19 in FIGS. 4A and 4B while not forming memory openings. A dielectric material such as silicon oxide may be deposited in the support openings by a conformal deposition process. Excess portions of the dielectric material may be removed from above the horizontal plane including the top surface of the insulating cap layer 70. Each remaining portion of the dielectric material that fills a memory opening constitutes a support pillar structure 120. The support pillar structures 120 may be arranged with a same pattern as the support pillar structures 20 of the first exemplary structure.

Figure 61A:
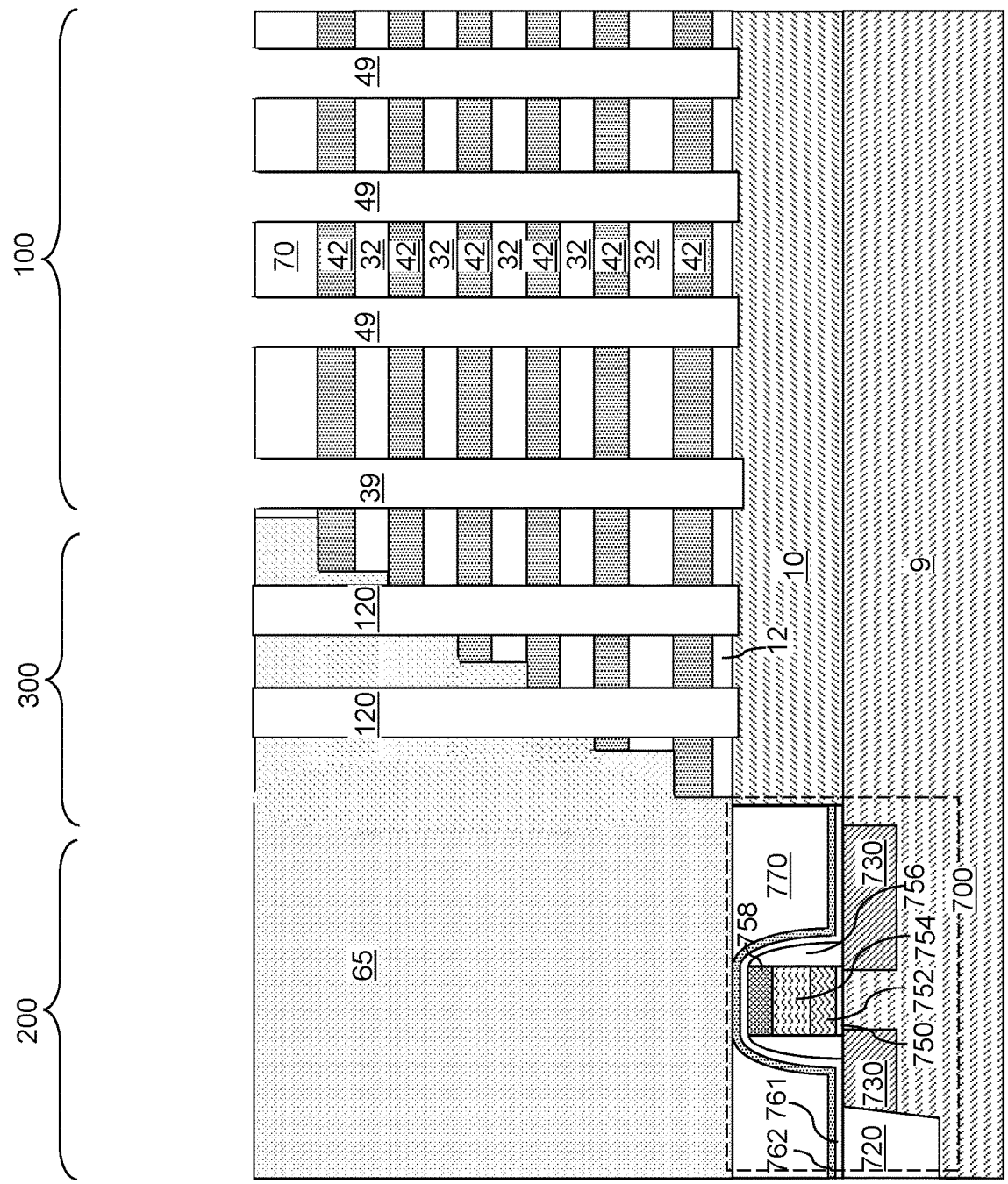
FIG. 61A is a vertical cross-sectional view of the third exemplary structure after formation of memory openings according to the third embodiment of the present disclosure.
Figure 61B:
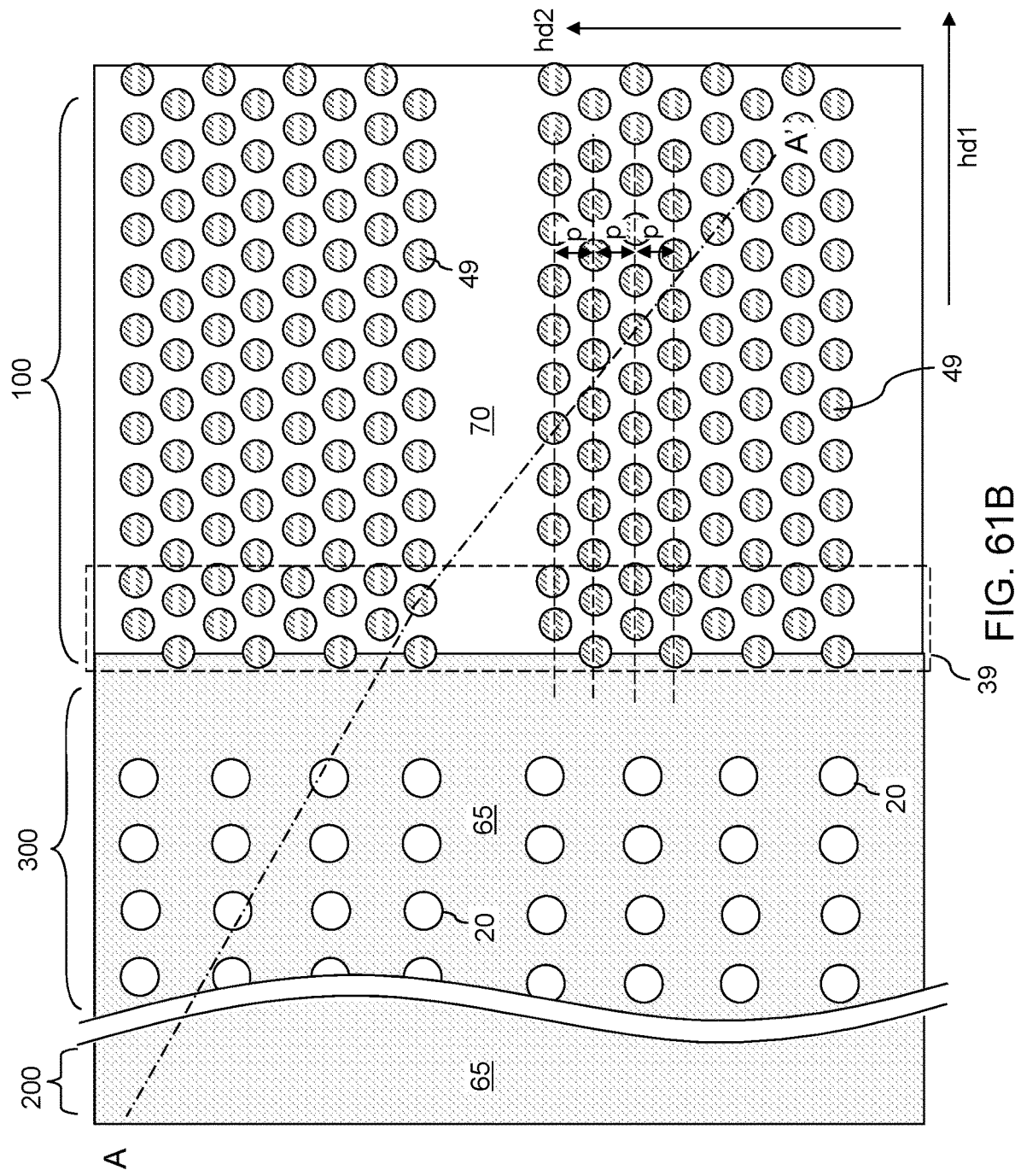
FIG. 61B is a top-down view of the third exemplary structure of FIG. 61A. The hinged vertical plane A-A' is the plane of the vertical cross-sectional view of FIG. 61A.

Referring to FIGS. 61A and 61B, memory openings (49, 39) may be formed by applying and patterning a photoresist layer (not shown) over the insulating cap layer 70 and the retro-stepped dielectric material portion 65, and by transferring the pattern of the opening in the photoresist layer through the alternating stack (32, 42) in the memory array region 100. The memory openings (49, 39) include first memory openings 49 that may be formed in a center portion of the memory array region 100 and second memory openings 39 that may be formed in a peripheral portion of the memory array region 100. The first memory openings 49 may be used to subsequently form electrically active memory opening fill structures therein, and the second memory openings 39 may be used to subsequently form dummy (electrically inactive) memory opening fill structures therein. The memory openings (39, 49) of the third exemplary structure may be formed with the same pattern as the memory openings 49 of the first exemplary structure disclosed above with reference to FIGS. 4A and 4B.

Figure 62A:
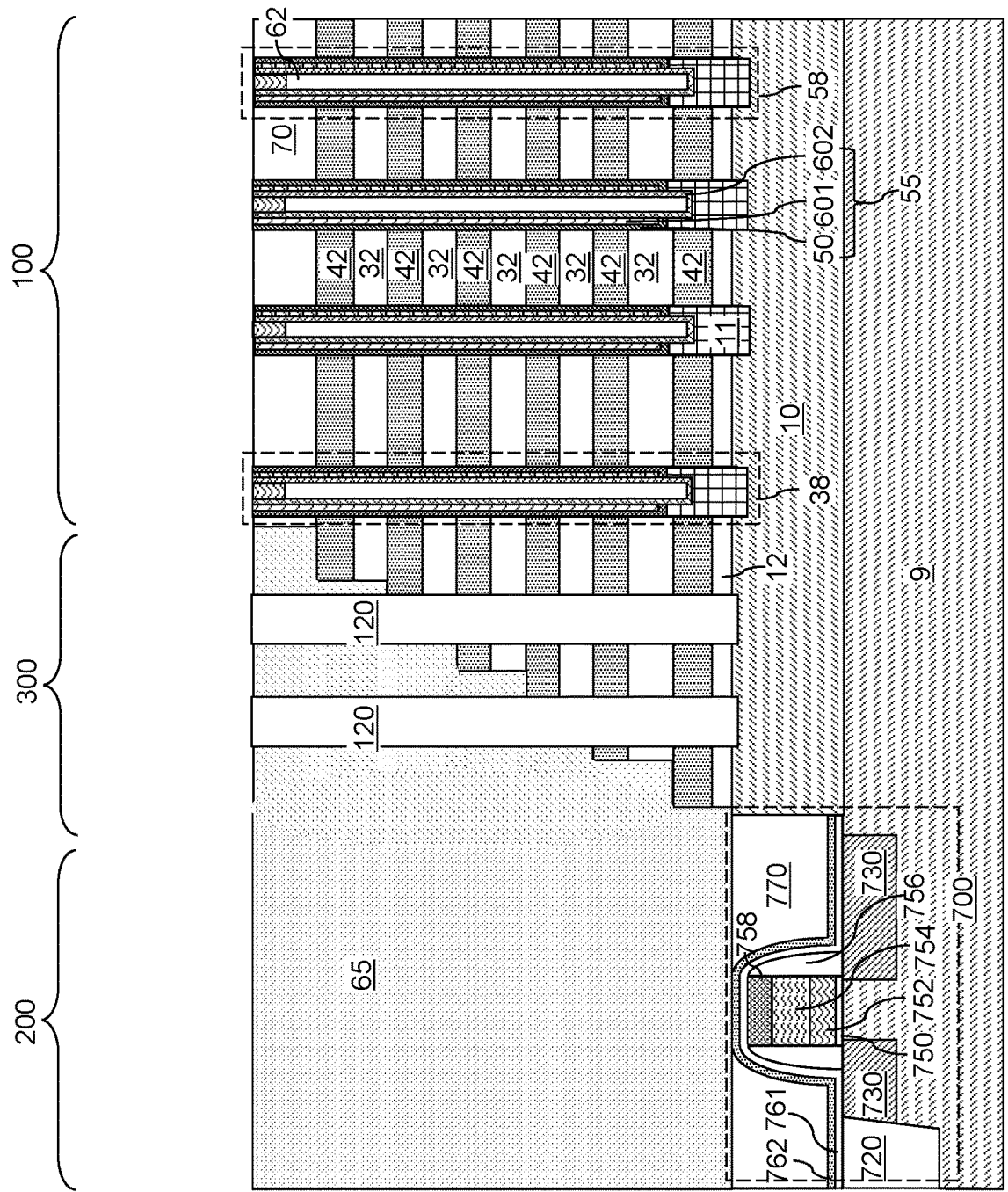
FIG. 62A is a vertical cross-sectional view of the third exemplary structure after formation of memory opening fill structures according to the third embodiment of the present disclosure.
Figure 62B:
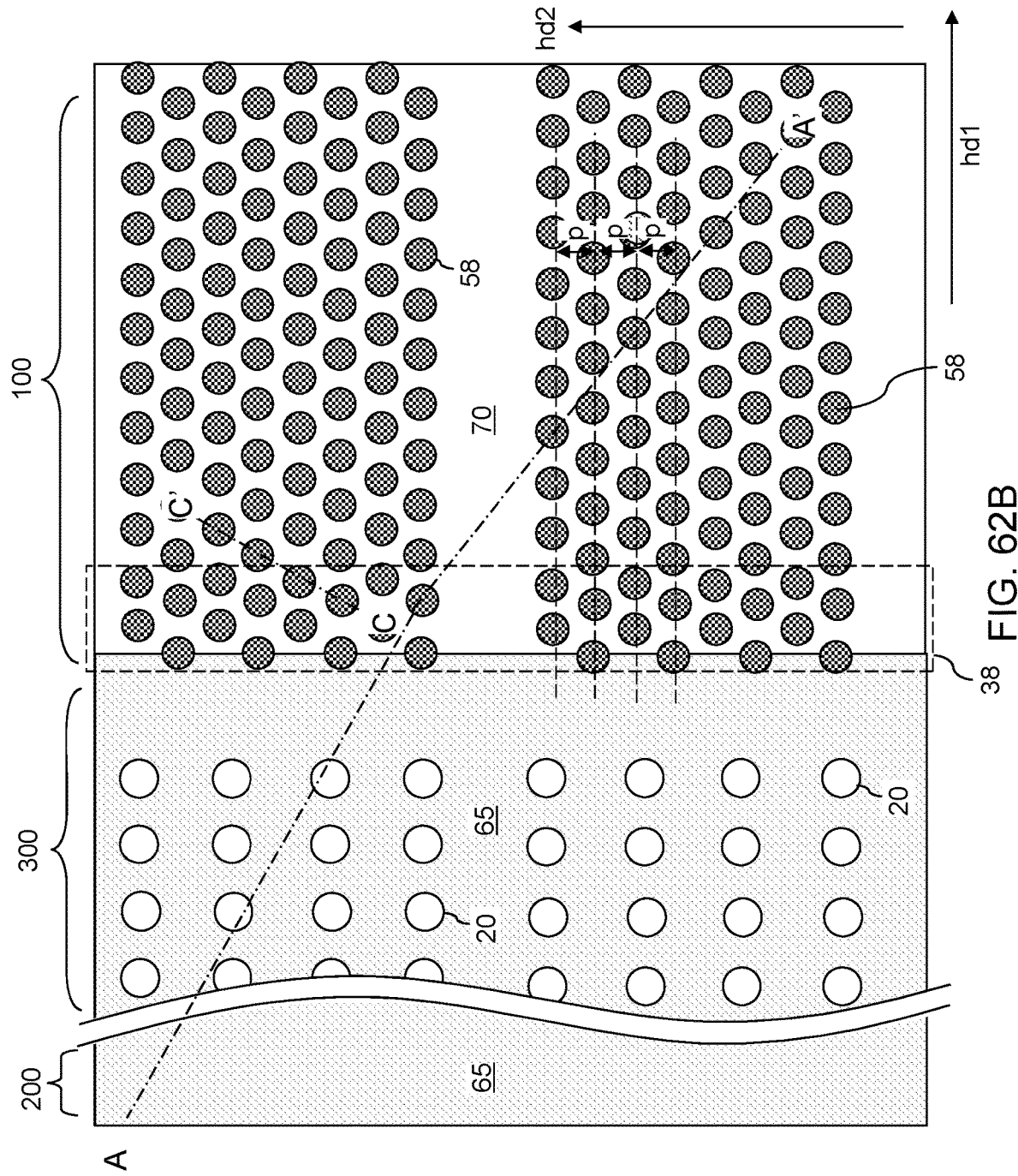
FIG. 62B is a top-down view of the third exemplary structure of FIG. 62A. The hinged vertical plane A-A' is the plane of the vertical cross-sectional view of FIG. 62A.
Figure 62C:
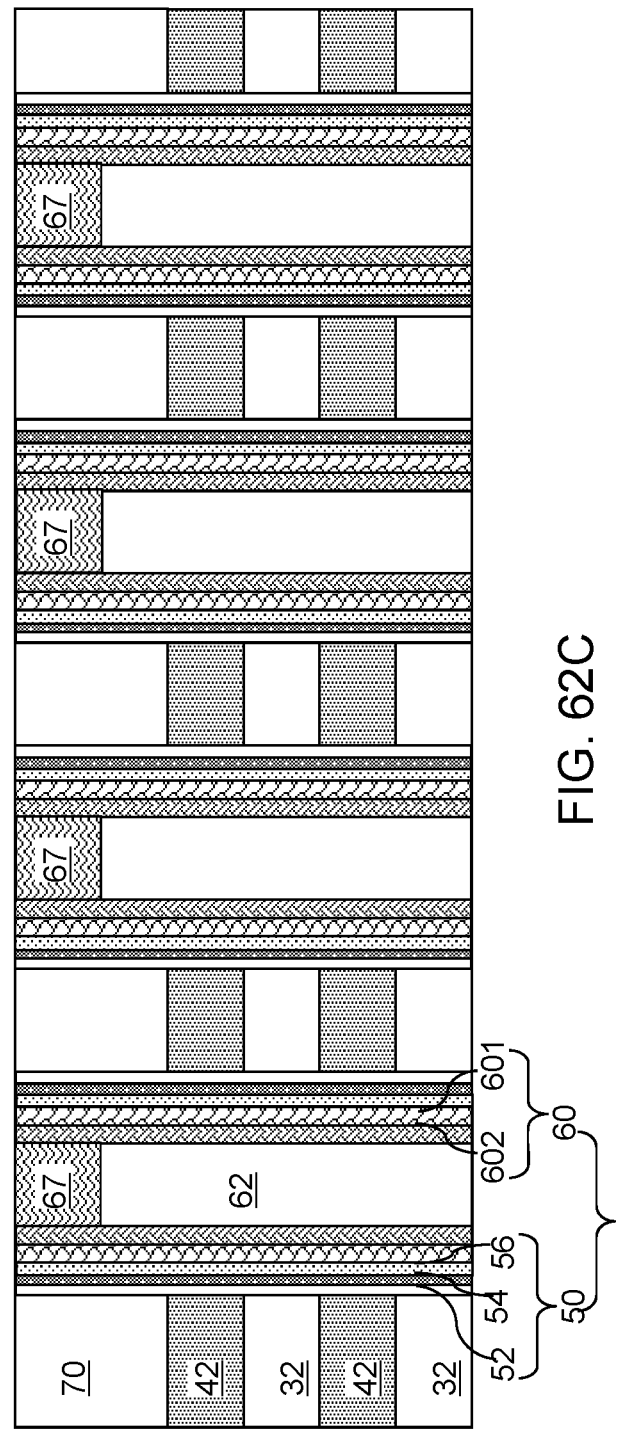
FIG. 62C is a vertical cross-sectional view along the vertical plane C-C' of FIG. 62B.

Referring to FIGS. 62A-62C, the processing steps disclosed above with reference to FIGS. 5B-5E may be sequentially performed to form an optional pedestal channel portion 11, a memory film 50, and semiconductor channel layers (601, 602). A dielectric core material layer may be formed by performing the processing steps of FIG. 5E. The dielectric core material layer may be vertically recessed to form dielectric cores 62. Each dielectric core 62 may have a top surface between a horizontal plane including the top surface of the insulating cap layer 70 and a horizontal plane including the bottom surface of the insulating cap layer 70. A doped semiconductor material having a doping of the first conductivity type may be deposited in recesses above the dielectric cores 62 to form channel connection regions 67.

Figure 63A:
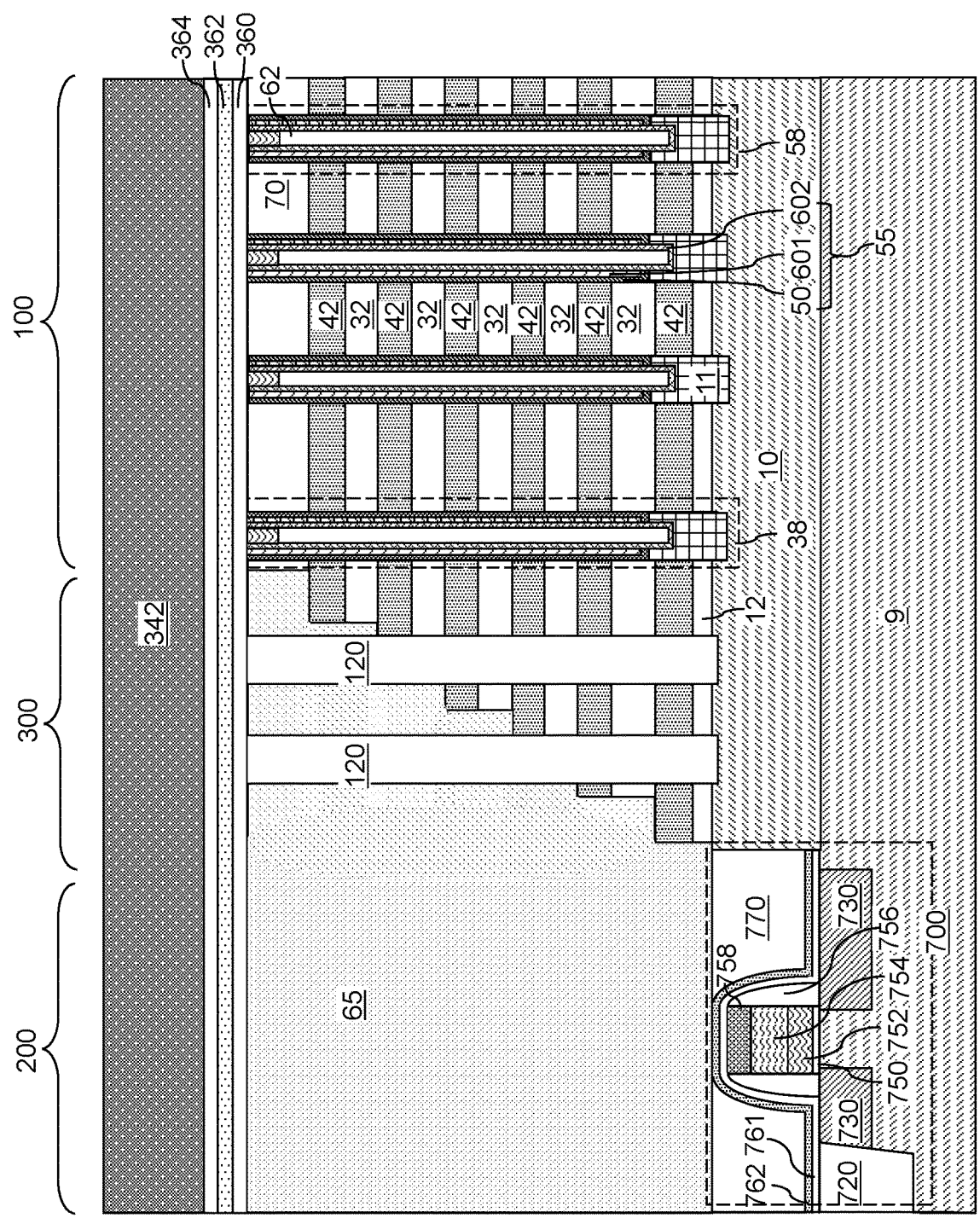
FIG. 63A is a vertical cross-sectional view of the third exemplary structure after formation of an insulating spacer layer, an etch stop dielectric layer, an optional drain-select-level insulating layer, and a drain-select-level sacrificial material layer according to the third embodiment of the present disclosure.
Figure 63B:
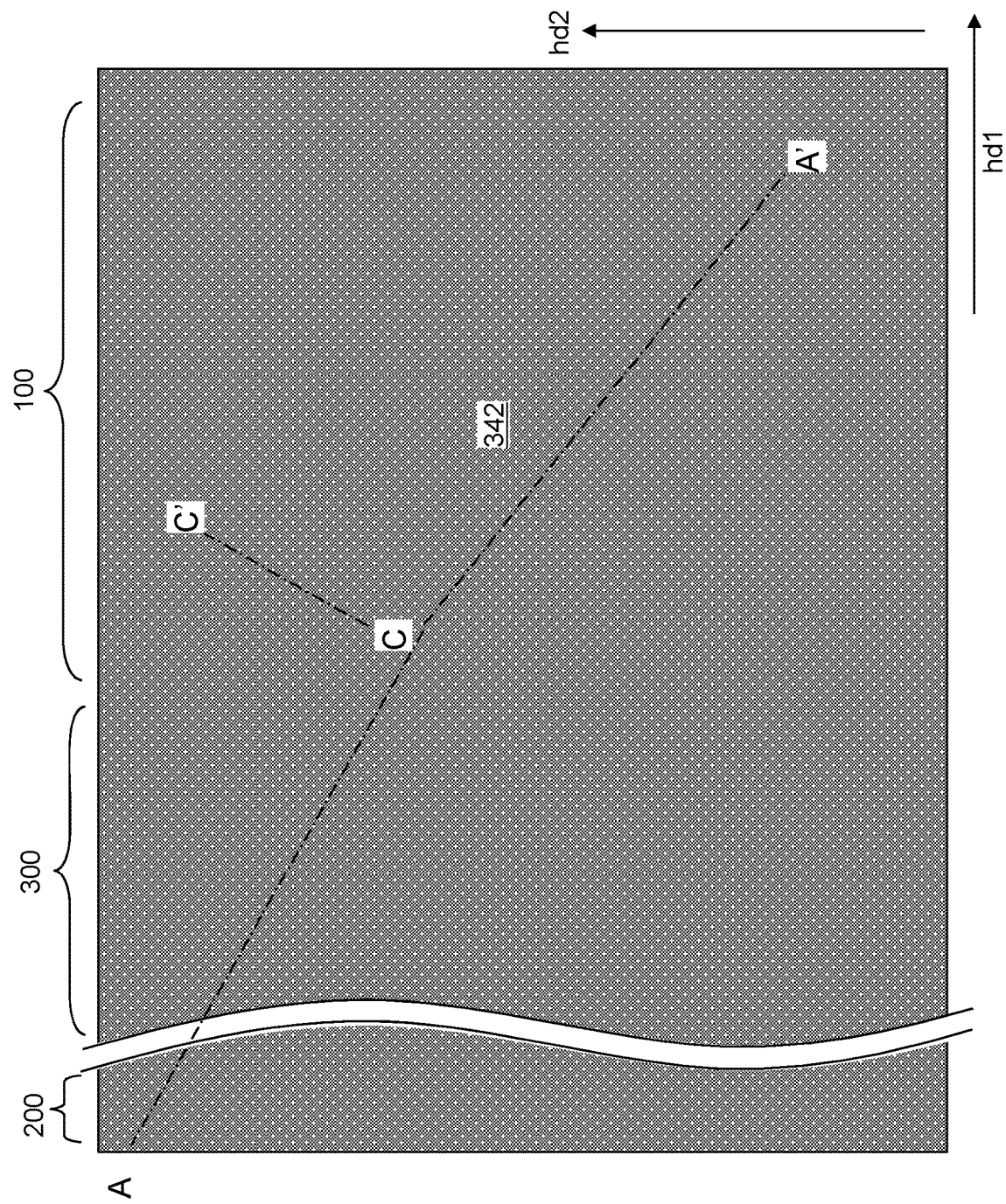
FIG. 63B is a top-down view of the third exemplary structure of FIG. 63A. The hinged vertical plane A-A' is the plane of the vertical cross-sectional view of FIG. 63A.
Figure 63C:
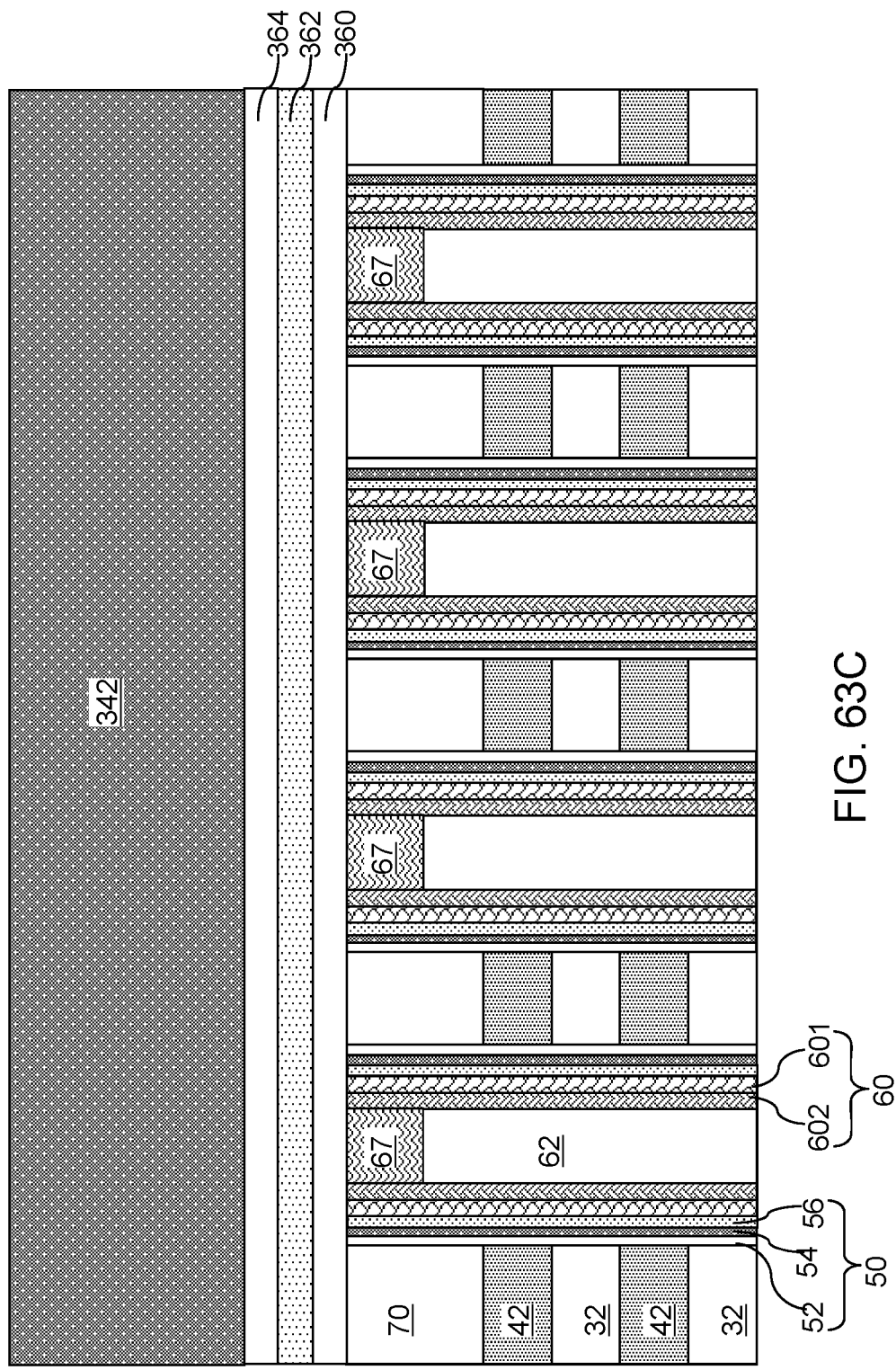
FIG. 63C is a vertical cross-sectional view along the vertical plane C-C' of FIG. 63B.

Memory opening fill structures (58, 38) may be formed in the memory openings (49, 39). The memory opening fill structures (58, 38) may include first memory opening fill structures 58 that are formed in the first memory openings 49 and second memory opening fill structures 38 that are formed in the second memory openings 39. Each of the memory openings (58, 38) may include a memory stack structure 55. An array of memory stack structures 55 extending through the alternating stack and arranged as rows that extend along a first horizontal direction and may be spaced apart along a second horizontal direction, wherein each of the memory stack structures 55 comprises a memory film 50 and a memory-level channel portion 60 contacting an inner sidewall of the memory film;

Referring to FIGS. 63A-63C, an insulating spacer layer 360, an etch stop dielectric layer 362, an optional drain-select-level insulating layer 364, and a drain-select-level sacrificial material layer 342 may be sequentially formed over the insulating cap layer 70 and the retro-stepped dielectric material portion 65. The insulating spacer layer 360 may include an insulating material that is different from the material of the sacrificial material layers 42. For example, the insulating spacer layer 360 may include silicon oxide. The thickness of the insulating spacer layer 360 may be in a range from 30 nm to 300 nm, although lesser and greater thicknesses may also be used. The etch stop dielectric layer 362 includes a dielectric material that may be used as an etch stop material. For example, the etch stop dielectric layer 362 may include a dielectric metal oxide such as aluminum oxide. The thickness of the etch stop dielectric layer 362 may be in a range from 1 nm to 20 nm, although lesser and greater thicknesses may also be used. The optional drain-select-level insulating layer 364 may include an insulating material that is different from the material of the sacrificial material layers 42. For example, the drain-select-level insulating layer 364 may include silicon oxide. The thickness of the drain-select-level insulating layer 364 may be in a range from 10 nm to 100 nm, although lesser and greater thicknesses may also be used. The drain-select-level sacrificial material layer 342 may include a sacrificial material that may be removed selective to the material of the drain-select-level insulating layer 364. The drain-select-level sacrificial material layer 342 may include silicon nitride, organosilicate glass, or a silicon-germanium alloy. The thickness of the drain-select-level sacrificial material layer 342 may be in a range from 30 nm to 300 nm, although lesser and greater thicknesses may also be used.

Figure 64A:
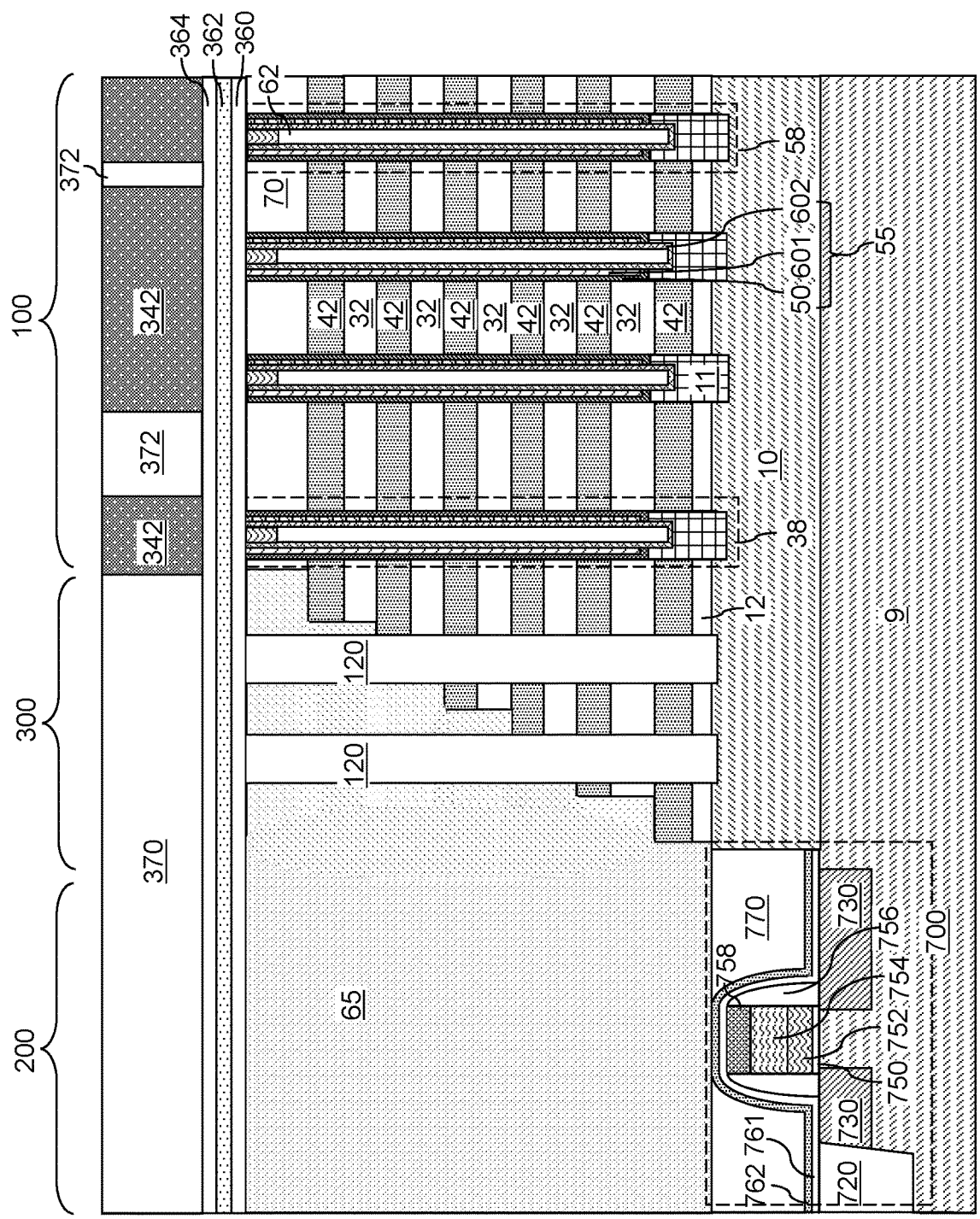
FIG. 64A is a vertical cross-sectional view of the third exemplary structure after formation of a drain-select-level isolation layer and drain-select-level isolation structures according to the third embodiment of the present disclosure.
Figure 64B:
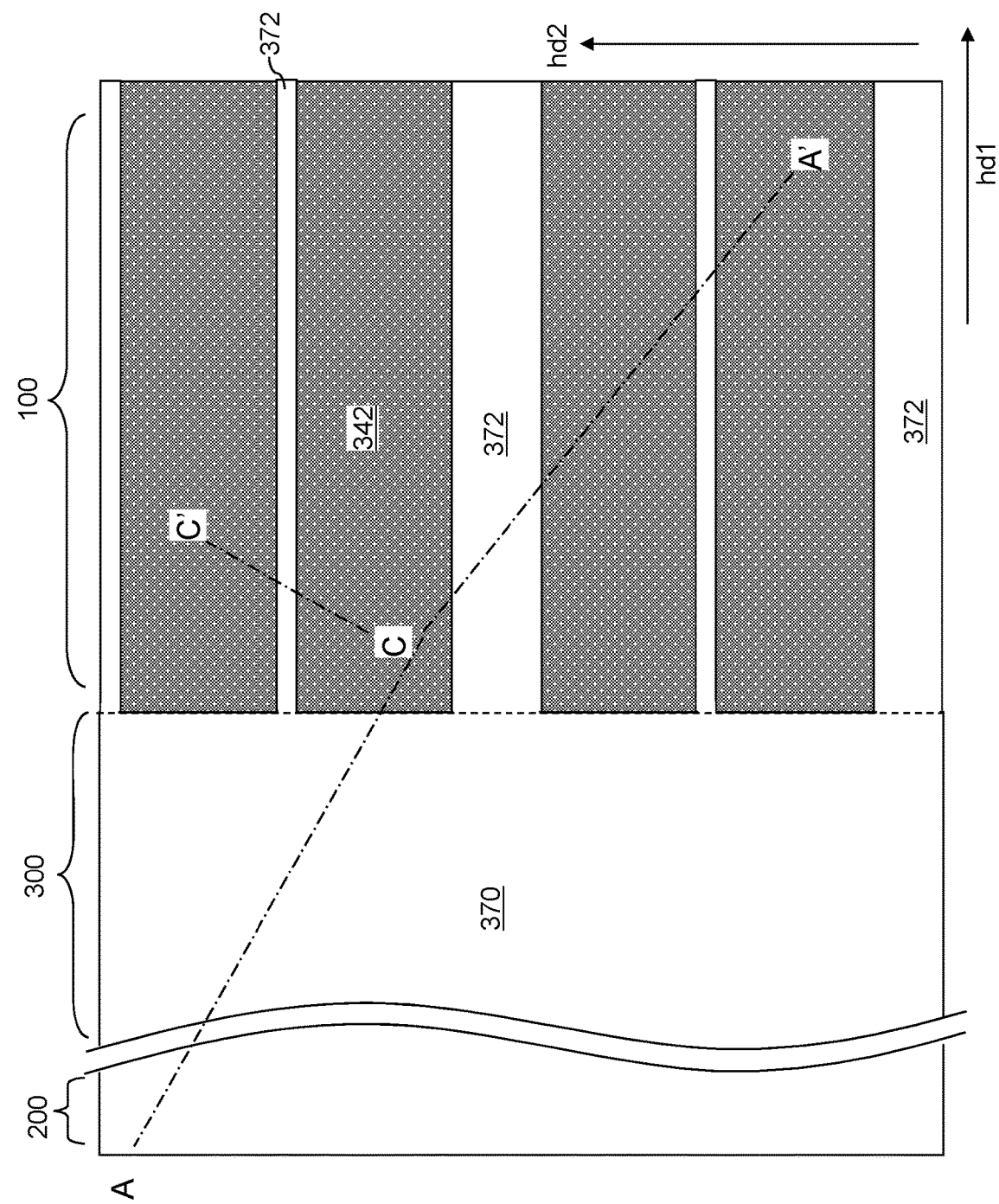
FIG. 64B is a top-down view of the third exemplary structure of FIG. 64A. The hinged vertical plane A-A' is the plane of the vertical cross-sectional view of FIG. 64A.
Figure 64C:
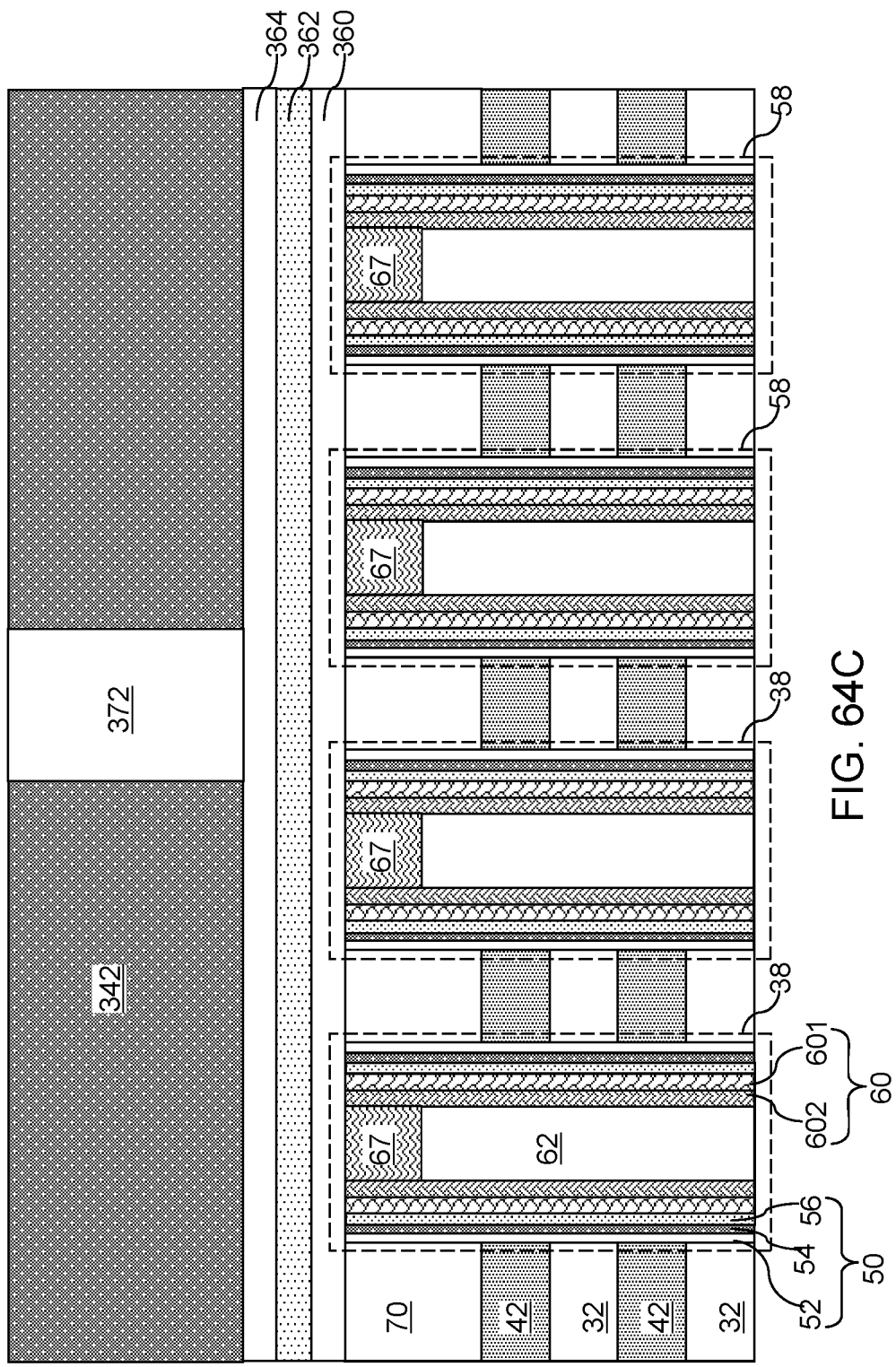
FIG. 64C is a vertical cross-sectional view along the vertical plane C-C' of FIG. 64B.

Referring to FIGS. 64A-64C, the drain-select-level sacrificial material layer 342 may be patterned into multiple strips that overlie a respective subset of the memory opening fill structures (58, 38) arranged as a respective two-dimensional array. Each patterned strip of the drain-select-level sacrificial material layer 342 may have a rectangular shape with sides that extend along the first horizontal direction hd1 and with sides that extend along the second horizontal direction hd2. Line trenches extending along the first horizontal direction hd1 may be formed between each neighboring pair of strips of the drain-select-level sacrificial material layer 342 in the memory array region 100. The drain-select-level sacrificial material layer 342 may be removed from the staircase region 300 and the peripheral region 200 to provide a continuous region that is free of the drain-select-level sacrificial material layer 342, which is herein referred as a field isolation region.

A dielectric material such as silicon oxide may be deposited in the line trenches and in the field isolation region. Portions of the dielectric material that overlie a horizontal plane including the top surfaces of remaining portions of the drain-select-level sacrificial material layer 342 may be removed by a planarization process such as a chemical mechanical polish (CMP) process. Each remaining portion of the dielectric material in the line trenches constitutes drain-select-level isolation structures 372. The remaining portion of the dielectric material in the field isolation region constitutes a drain-select-level isolation layer 370.

Figure 65A:
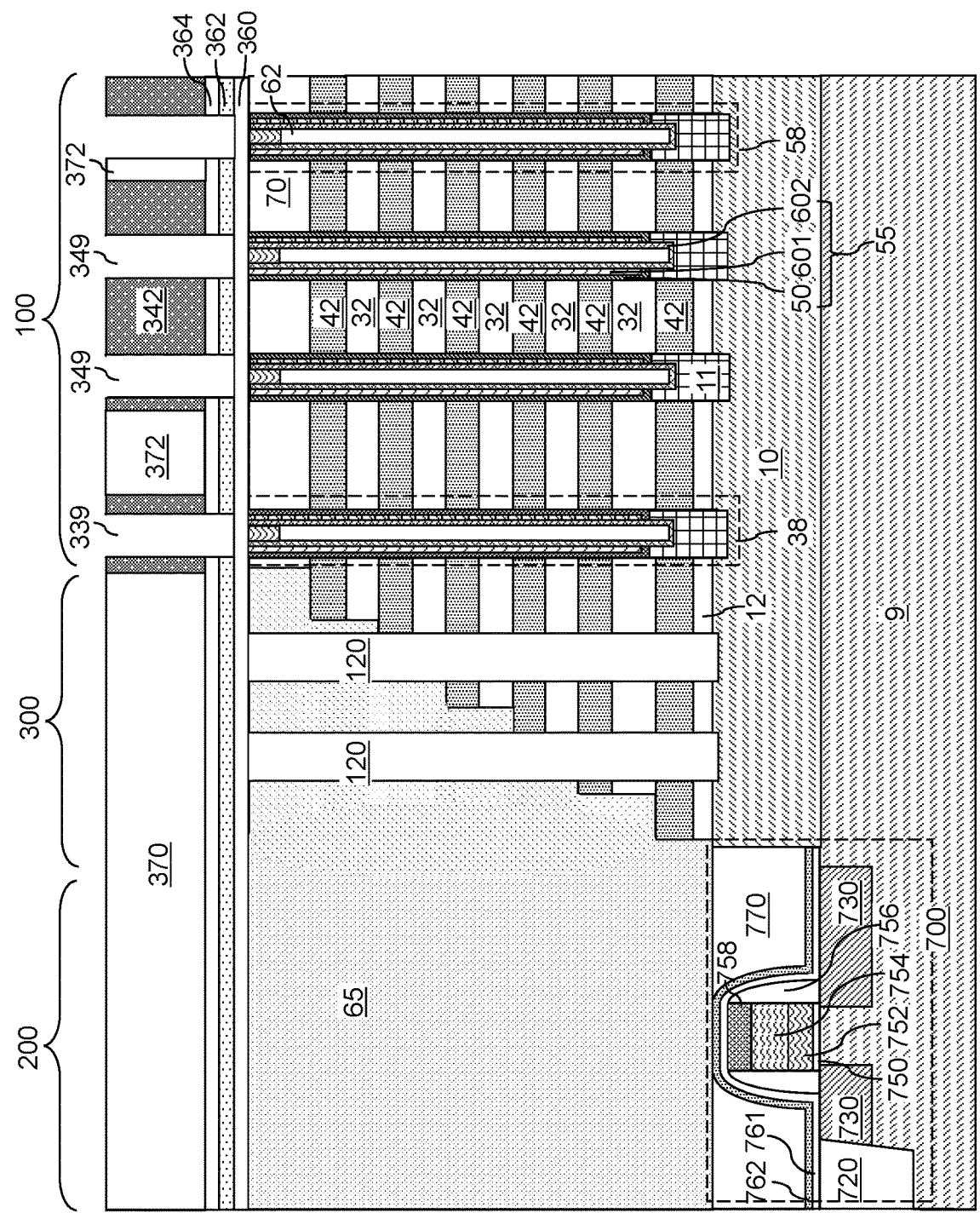
FIG. 65A is a vertical cross-sectional view of the third exemplary structure after formation of drain-select-level openings according to the third embodiment of the present disclosure.
Figure 65B:
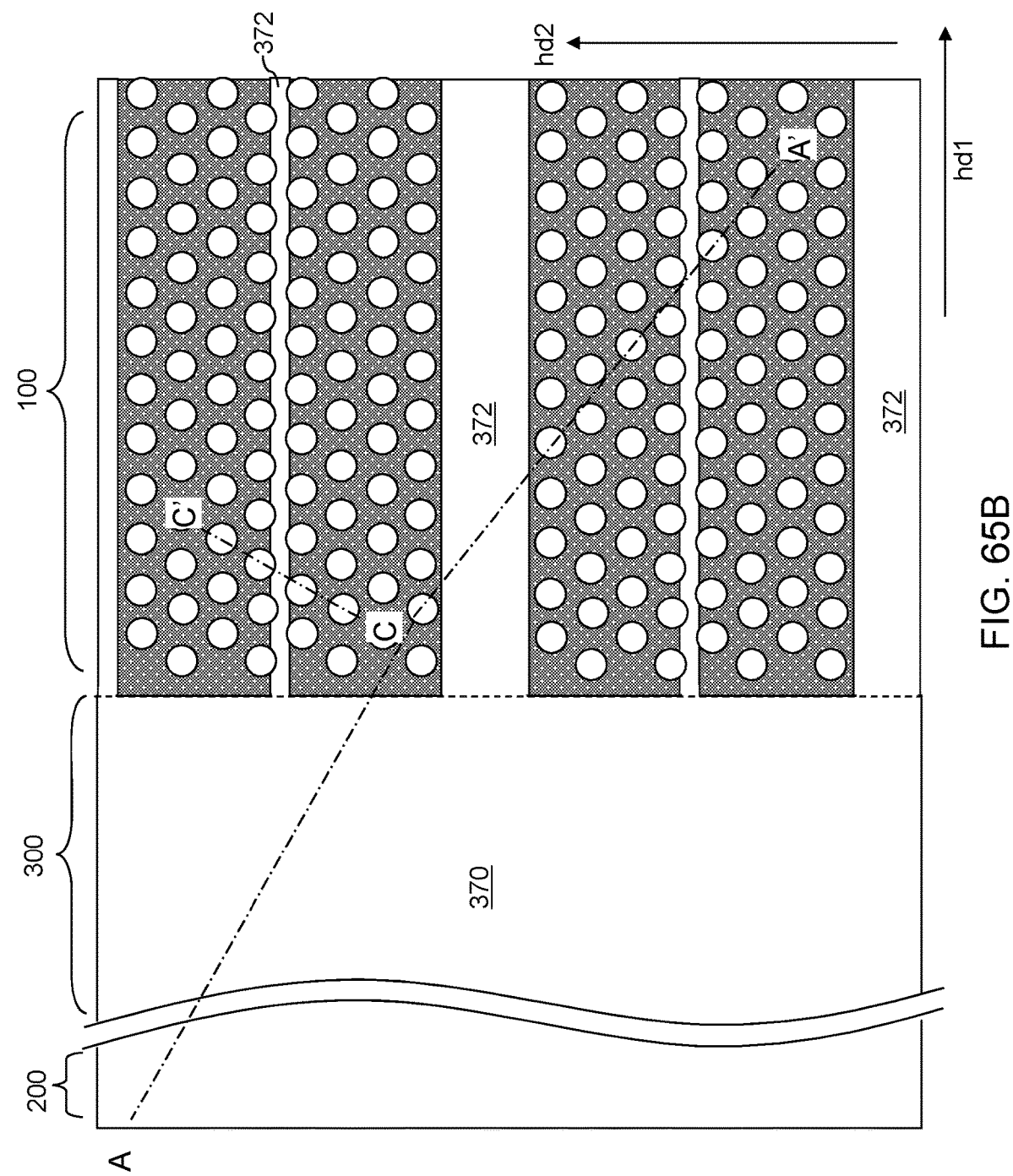
FIG. 65B is a top-down view of the third exemplary structure of FIG. 65A. The hinged vertical plane A-A' is the plane of the vertical cross-sectional view of FIG. 65A.
Figure 65C:
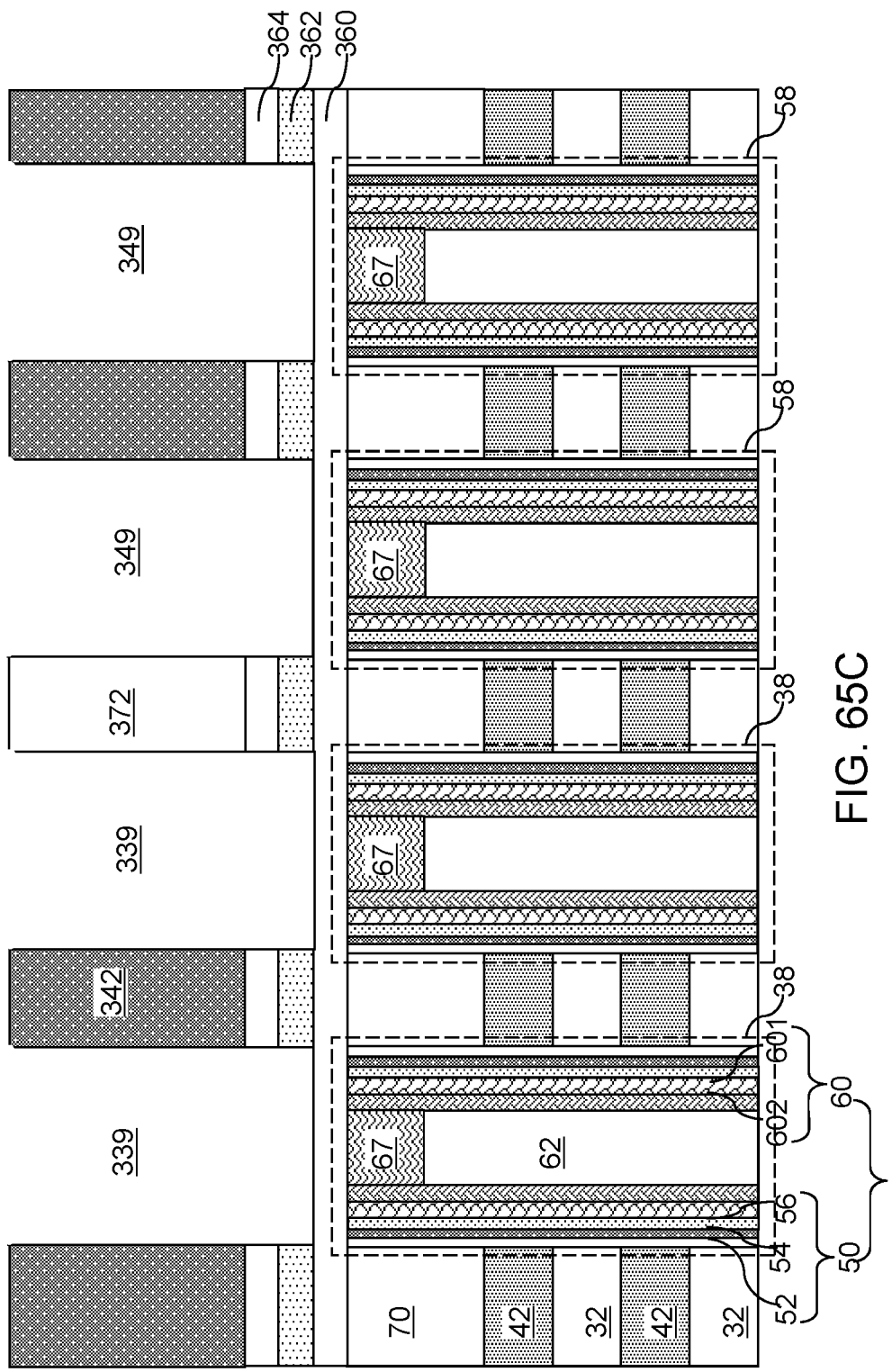
FIG. 65C is a vertical cross-sectional view along the vertical plane C-C' of FIG. 65B.

Referring to FIGS. 65A-65C, a photoresist layer (not shown) may be applied over the drain-select-level isolation layer 370, the drain-select-level isolation structures 372, and the drain-select-level sacrificial material layer 342, and may be lithographically patterned to form an array of openings therein. The pattern of the openings in the photoresist layer may replicate the pattern of the memory openings (49, 39) at the processing steps described above with reference to FIGS. 61A and 61B. In one embodiment, the lithographic mask used to pattern the memory openings (49, 39) may be reused to pattern the photoresist layer at the processing steps of FIGS. 65A-65C.

An anisotropic etch process may be performed to transfer the pattern of the openings in the photoresist layer through the drain-select-level isolation structures 372, and the drain-select-level sacrificial material layer 342, the drain-select-level insulating layer 364, and the etch stop dielectric layer 362. Drain-select-level openings (349, 339) may be formed through the drain-select-level sacrificial material layer 342, the drain-select-level insulating layer 364, and the etch stop dielectric layer 362. The drain-select-level openings (349, 339) openings may include first drain-select-level openings 349 having a respective area that overlaps with the area of an underlying first memory opening fill structure 58, and second drain-select-level openings 339 having a respective area that overlaps with the area of an underlying second memory opening fill structure 38.

In one embodiment, two rows of drain-select-level openings (349, 339) may cut through two lengthwise sidewalls of a drain-select-level isolation structure (e.g., strip) 372. In this case, such a drain-select-level isolation structure 372 may comprise a pair of laterally undulating sidewalls that generally extend along the first horizontal direction hd1 and laterally undulating in the second horizontal direction hd2. In one embodiment, each of the pair of laterally undulating sidewalls comprises a laterally alternating sequence of flat sidewall segments and concave sidewall segments.

Figure 66:
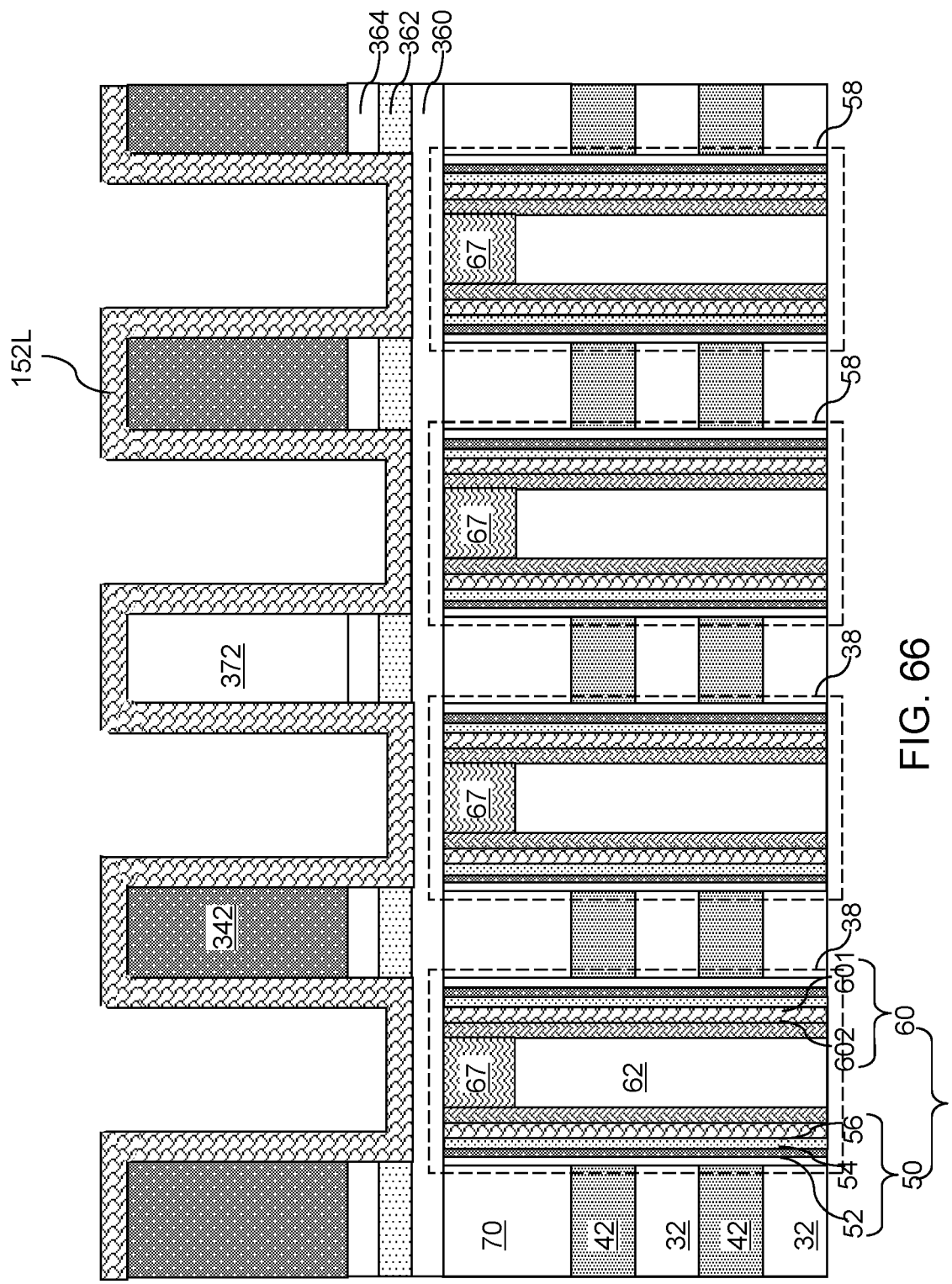
FIG. 66 is a vertical cross-sectional view of a region of the third exemplary structure after formation of a conformal gate electrode material layer according to the third embodiment of the present disclosure.

Referring to FIG. 66, a conformal gate electrode material layer 152L may be deposited on physically exposed surfaces of the drain-select-level openings (349, 339) and over the drain-select-level isolation structures 372 and the drain-select-level sacrificial material layer 342 by a conformal deposition process. The thickness of the conformal gate electrode material layer 152L may be in a range from 3 nm to 30 nm, although lesser and greater thicknesses may also be used. The conformal gate electrode material layer 152L includes a conductive material, which may be a metallic material or a heavily-doped semiconductor material (such as heavily doped polysilicon or heavily-doped amorphous silicon).

Figure 67:
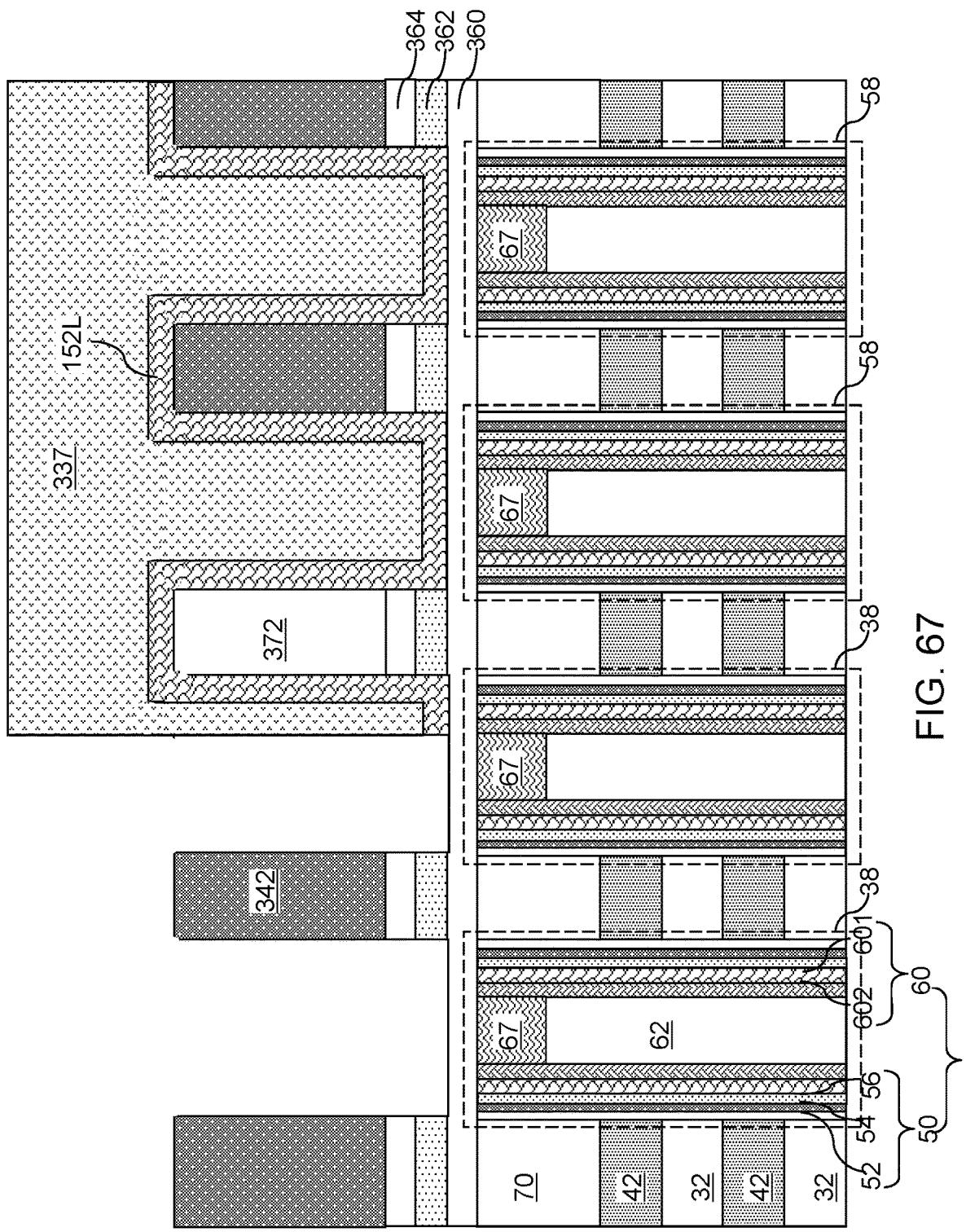
FIG. 67 is a vertical cross-sectional view of a region of the third exemplary structure after patterning the conformal gate electrode material layer according to the third embodiment of the present disclosure.

Referring to FIG. 67, a photoresist layer 337 may be applied over the third exemplary structure, and may be lithographically patterned to cover the first drain-select-level openings 349 without covering at least a portion of each second drain-select-level opening 339. In case the first drain-select-level openings 349 and the second drain-select-level openings 339 are arranged in a hexagonal array, the patterned photoresist layer 337 may have a straight edge that laterally extend along the second horizontal direction hd2, and peripheral portions of a subset of the second drain-select-level openings 339 that are proximal to the first drain-select-level openings 349 may be partially covered by the photoresist layer 337. At least one second drain-select-level opening 349 may not be covered by any portion of the photoresist layer 337.

An etch process may be performed to remove portions of the conformal gate electrode material layer 152L that are not covered by the photoresist layer 337. Portions of the conformal gate electrode material layer 152L in the second drain-select-level openings 339 may be removed while the photoresist layer 337 covers and protects portions of the conformal gate electrode material layer 152L in the first drain-select-level openings 349. The photoresist layer 337 may be subsequently removed, for example, by ashing.

Figure 68:
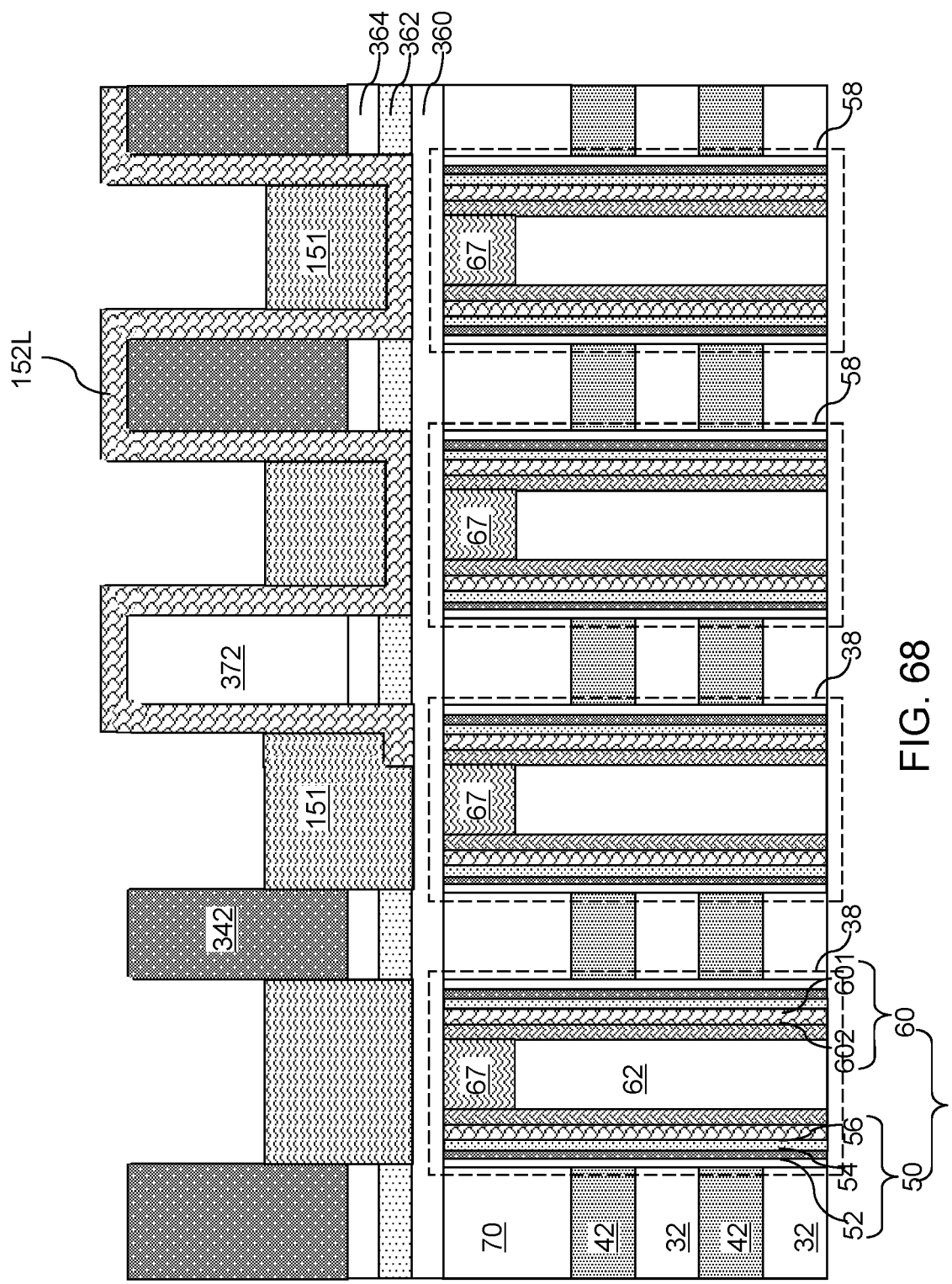
FIG. 68 is a vertical cross-sectional view of a region of the third exemplary structure after formation of sacrificial fill material portions according to the third embodiment of the present disclosure.

Referring to FIG. 68, a sacrificial fill material may be deposited in remaining volumes of the drain-select-level openings (349, 339). The sacrificial fill material layer may include a sacrificial fill material such as spin-on carbon, a spin-on glass, or a semiconductor material such as germanium or a silicon-germanium alloy. In one embodiment, the sacrificial fill material layer includes, and/or consists of, spin-on carbon. The sacrificial fill material layer may fill the entirety of voids in the drain-select-level openings (349, 339). The sacrificial fill material may be vertically recessed below the horizontal plane including the top surfaces of the drain-select-level isolation structures 372 and the drain-select-level sacrificial material layer 342. Each remaining portion of the sacrificial fill material constitutes a sacrificial fill material portion 151. The top surfaces of the sacrificial fill material portions 151 may be vertically recessed below the horizontal plane including the top surfaces of the drain-select-level isolation structures 372 and the drain-select-level sacrificial material layer 342 by a vertical recess distance. The vertical recess distance may be in a range from 10% to 70% of the thickness of the drain-select-level sacrificial material layer 342. The sacrificial fill material portions 151 may be formed in lower regions of the first drain-select-level openings 349 and the second drain-select-level openings 339.

Figure 69:
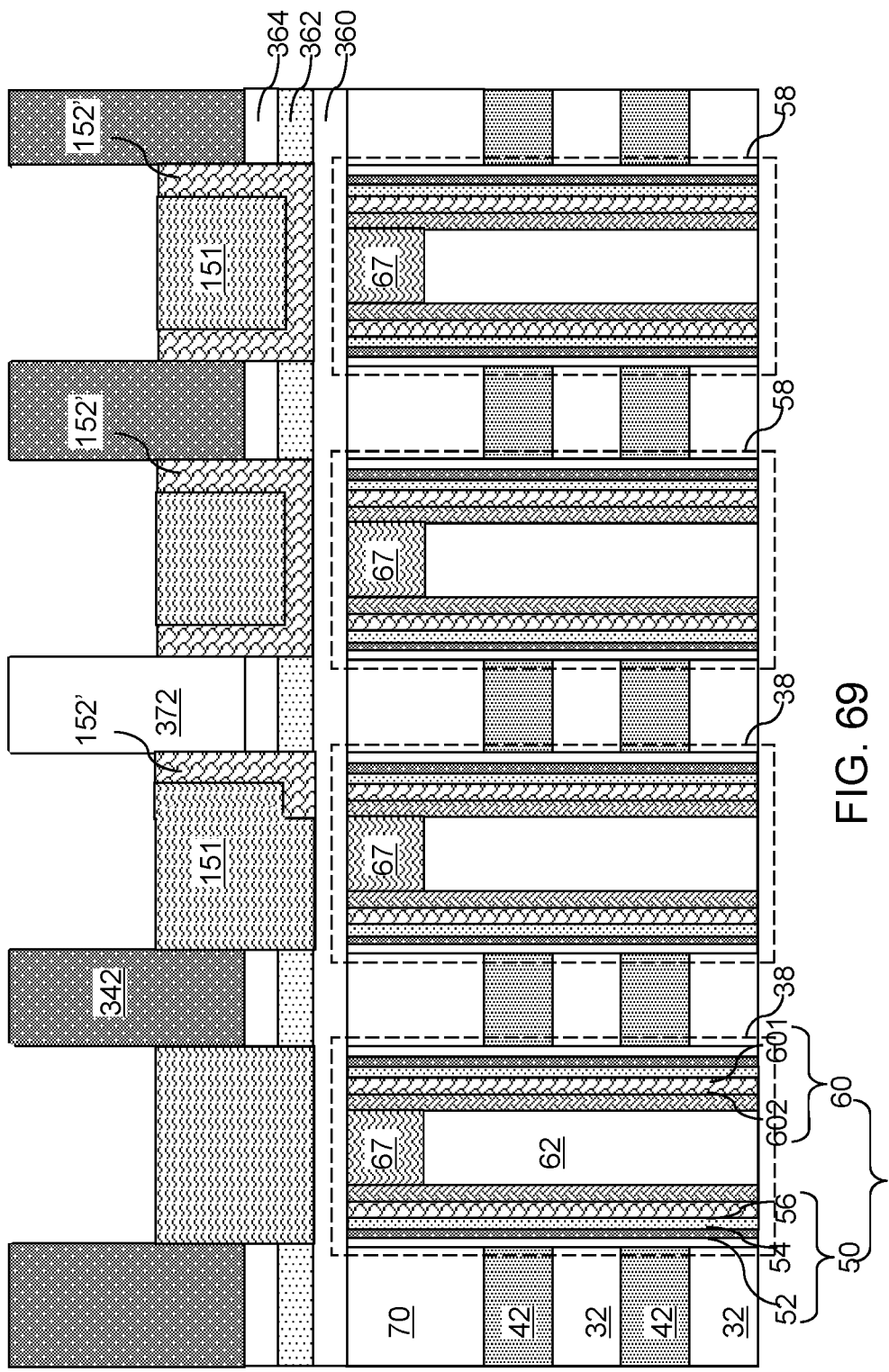
FIG. 69 is a vertical cross-sectional view of a region of the third exemplary structure after removal of upper portions of the conformal gate electrode material layer according to the third embodiment of the present disclosure.

Referring to FIG. 69, physically exposed portions of the conformal gate electrode material layer 152L may be removed by an etch process. The etch process may include an isotropic etch process such as a wet etch process. For example, if the conformal gate electrode material layer 152L includes a doped semiconductor material, a wet etch process using hot trimethyl-2 hydroxyethyl ammonium hydroxide ("hot TMY") or tetramethyl ammonium hydroxide (TMAH) may be used. Alternatively, an isotropic dry etch process such as chemical dry etch may be used to remove physically exposed portions of the conformal gate electrode material layer 152L. Remaining portions of the conformal gate electrode material layer 152L constitute gate electrode material portions (152', 152"). The gate electrode material portions (152', 152") may include first gate electrode material portions 152' located in the first drain-select-level openings 349 and second gate electrode material portions 152" located in the second drain-select-level openings 339.

Figure 70:
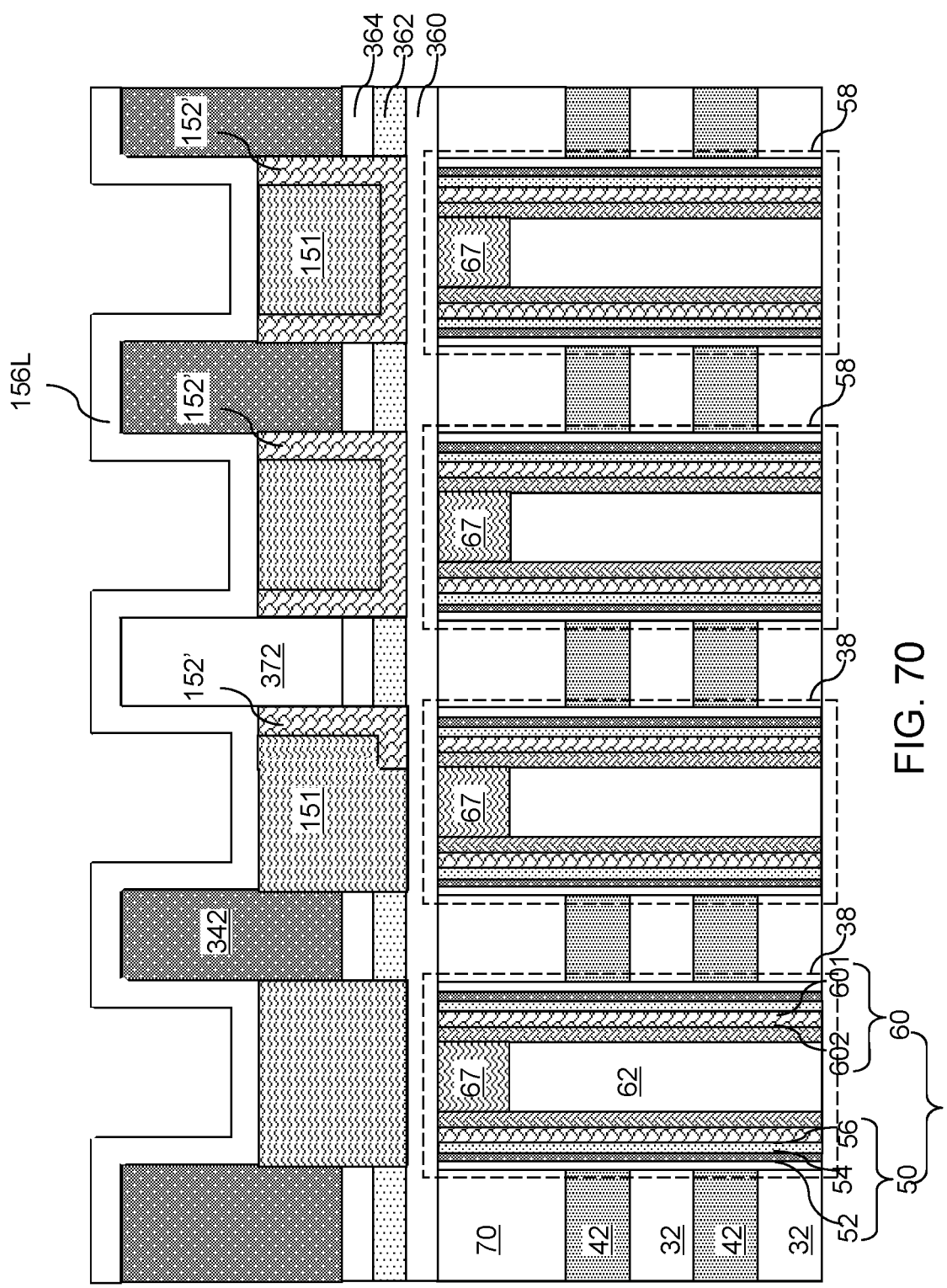
FIG. 70 is a vertical cross-sectional view of a region of the third exemplary structure after formation of a conformal dielectric spacer material layer according to the third embodiment of the present disclosure.

Referring to FIG. 70, a conformal dielectric spacer material layer 156L may be deposited in upper portions of the drain-select-level openings (349, 339) and over the drain-select-level isolation structures 372 and the drain-select-level sacrificial material layer 342 by a conformal deposition process. The conformal dielectric spacer material layer 156L includes a dielectric material such as silicon oxide. The thickness of the conformal dielectric spacer material layer 156L may be in a range from 3 nm to 30 nm, although lesser and greater thicknesses may also be used. In one embodiment, the thickness of the conformal dielectric spacer material layer 156L may be substantially the same as the thickness of vertical portions of the gate electrode material portions (152', 152").

Figure 71:
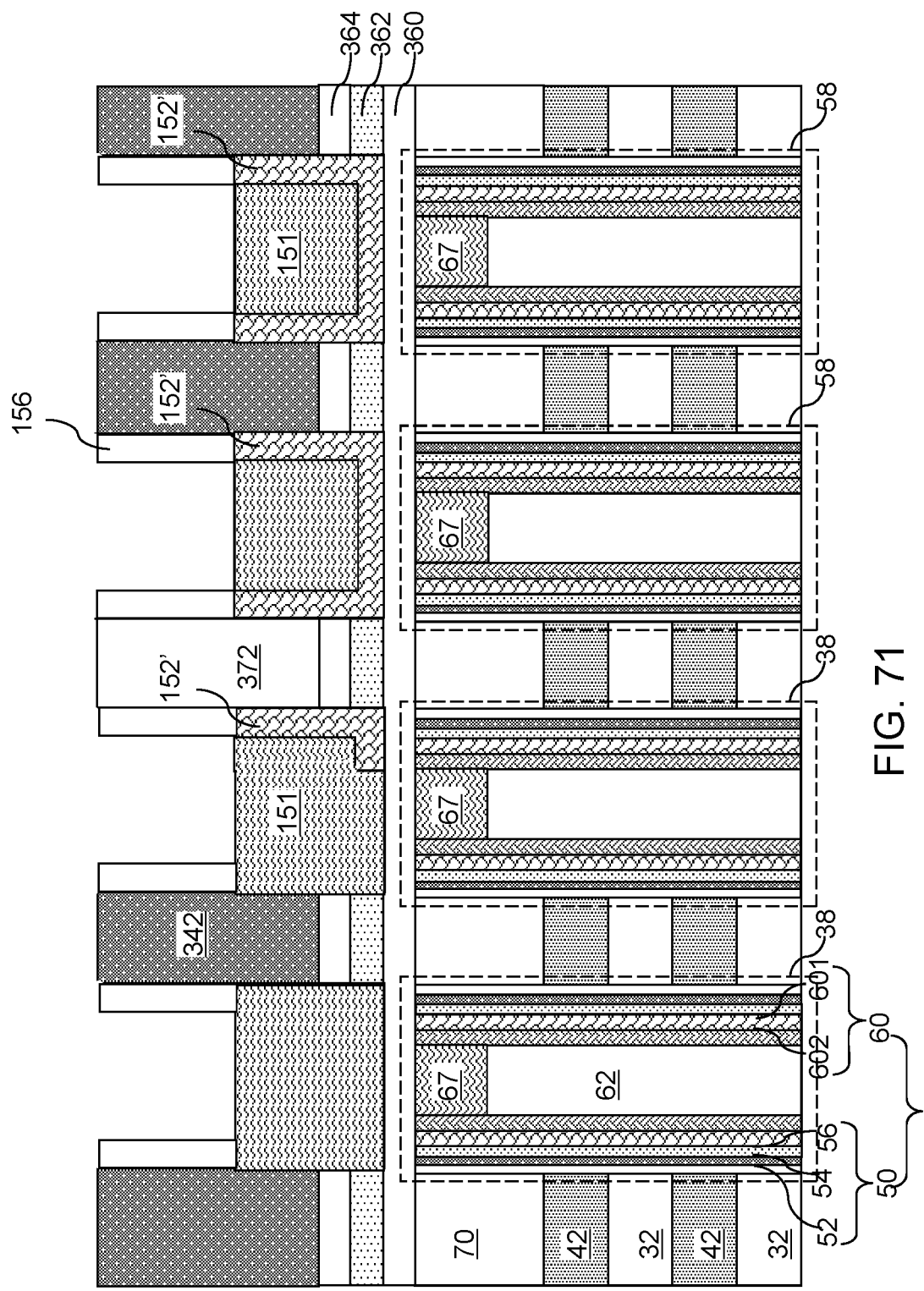
FIG. 71 is a vertical cross-sectional view of a region of the third exemplary structure after formation of cylindrical dielectric spacers according to the third embodiment of the present disclosure.

Referring to FIG. 71, an anisotropic etch process may be performed to remove horizontal portions of the conformal dielectric spacer material layer 156L. Each remaining cylindrical vertical portion of the conformal dielectric spacer material layer 156L constitutes a cylindrical dielectric spacer 156 that has a tubular configuration. The cylindrical dielectric spacers 156 may be formed over the sacrificial fill material portions 151 within upper regions of the first drain-select-level openings 349 and the second drain-select-level openings 339.

Figure 72:
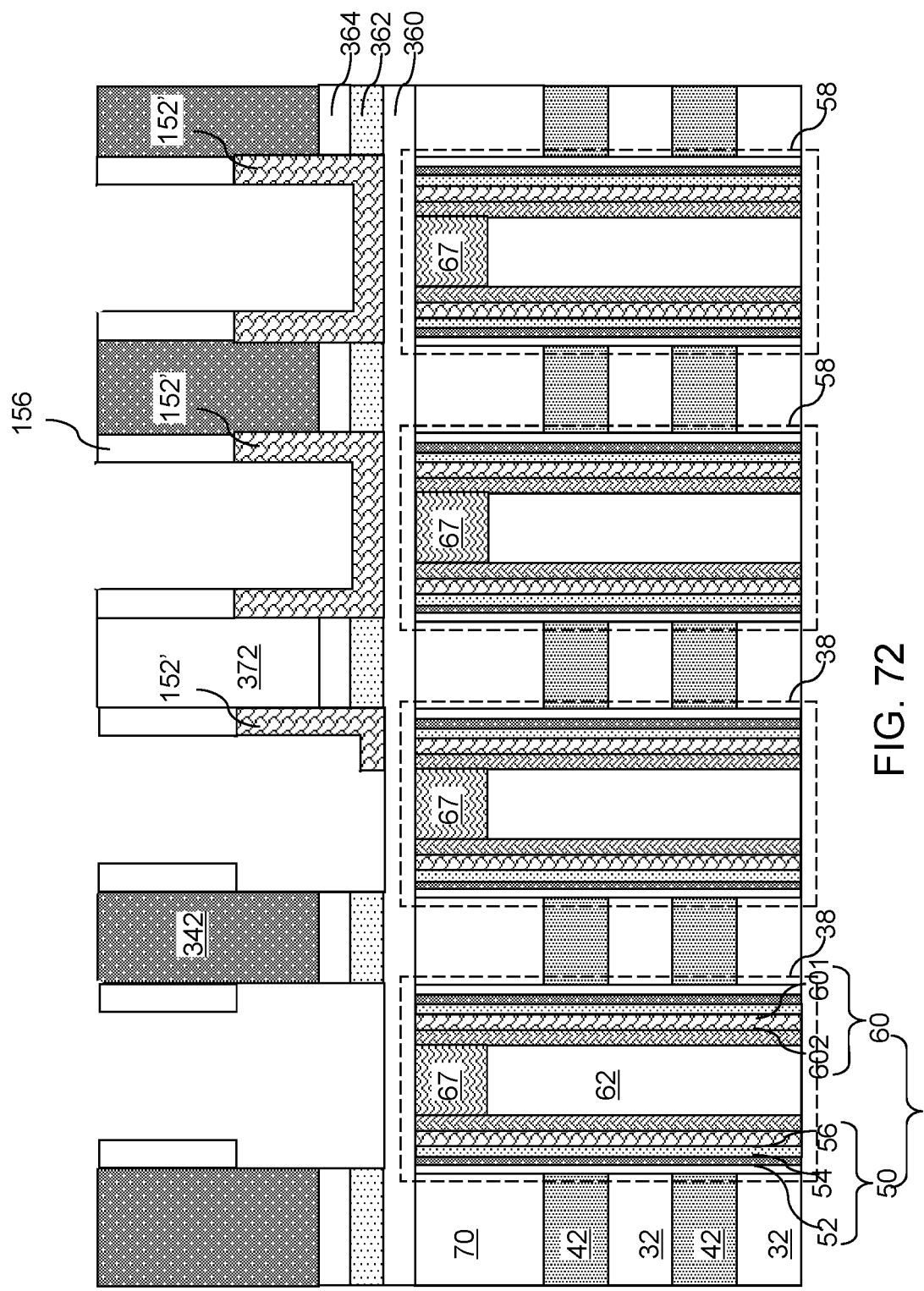
FIG. 72 is a vertical cross-sectional view of a region of the third exemplary structure after removal of sacrificial fill material portions according to the third embodiment of the present disclosure.

Referring to FIG. 72, the sacrificial fill material portions 151 may be removed selective to the cylindrical dielectric spacers 156, the gate electrode material portions (152', 152"), the drain-select-level isolation layer 370, the drain-select-level isolation structures 372, and the drain-select-level sacrificial material layer 342. For example, if the sacrificial fill material portions 151 include a spin-on carbon material, the sacrificial fill material portions 151 may be removed by ashing.

Figure 73:
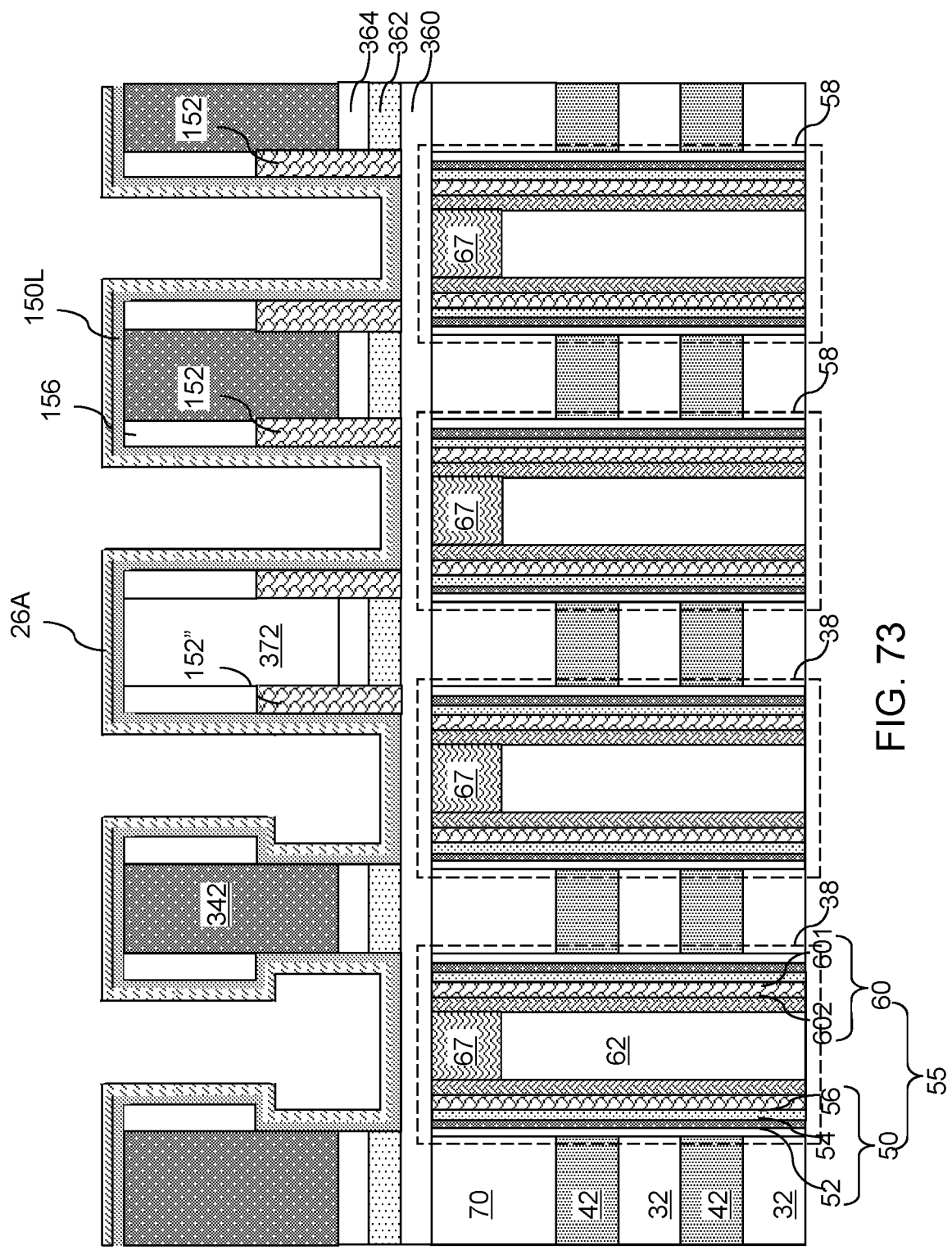
FIG. 73 is a vertical cross-sectional view of a region of the third exemplary structure after formation of cylindrical electrode portions, a gate dielectric layer, and a cover semiconductor material layer according to the third embodiment of the present disclosure.

Referring to FIG. 73, an anisotropic etch process may be performed to etch unmasked regions of the gate electrode material portions (152', 152"). Regions of the gate electrode material portions (152', 152") that are not covered by the cylindrical dielectric spacers 156 are removed by the anisotropic etch process. Each remaining portion of the first gate electrode material portions 152' in the first drain-select-level openings 349 constitutes a cylindrical electrode portion 152. Each remaining portion of the second gate electrode material portions 152" includes only a vertical portion, which may have a shape of a cylindrical arc.

A gate dielectric layer 150L may be formed by conformal deposition of at least one gate dielectric layer such as silicon oxide and/or a dielectric metal oxide. The gate dielectric layer 150L may be formed, for example, by chemical vapor deposition and/or by atomic layer deposition. The thickness of the gate dielectric layer 150L may be in a range from 1 nm to 6 nm, although lesser and greater thicknesses may also be used. The gate dielectric layer 150L may be formed on the cylindrical dielectric spacers 156 and the cylindrical electrode portions 152. The gate dielectric layer 150L may be formed directly on a sidewall of the drain-select-level sacrificial material layer 342 in each of the second drain-select-level openings 339, and is laterally spaced from sidewalls of the drain-select-level sacrificial material layer 342 by the cylindrical dielectric spacers 156 or by the cylindrical electrode portions 152 in the first drain-select-level openings 349.

A cover semiconductor material layer 26A may be conformally deposited over the gate dielectric layer 150L. The cover semiconductor material layer 26A may include a semiconductor material such as at least one elemental semiconductor material, at least one III-V compound semiconductor material, at least one II-VI compound semiconductor material, at least one organic semiconductor material, or other semiconductor materials known in the art. In one embodiment, the cover semiconductor material layer 26A includes amorphous silicon or polysilicon. The cover semiconductor material layer 26A may be formed by a conformal deposition method such as low pressure chemical vapor deposition (LPCVD). The thickness of the cover semiconductor material layer 26A may be in a range from 2 nm to 10 nm, although lesser and greater thicknesses may also be used.

Figure 74:
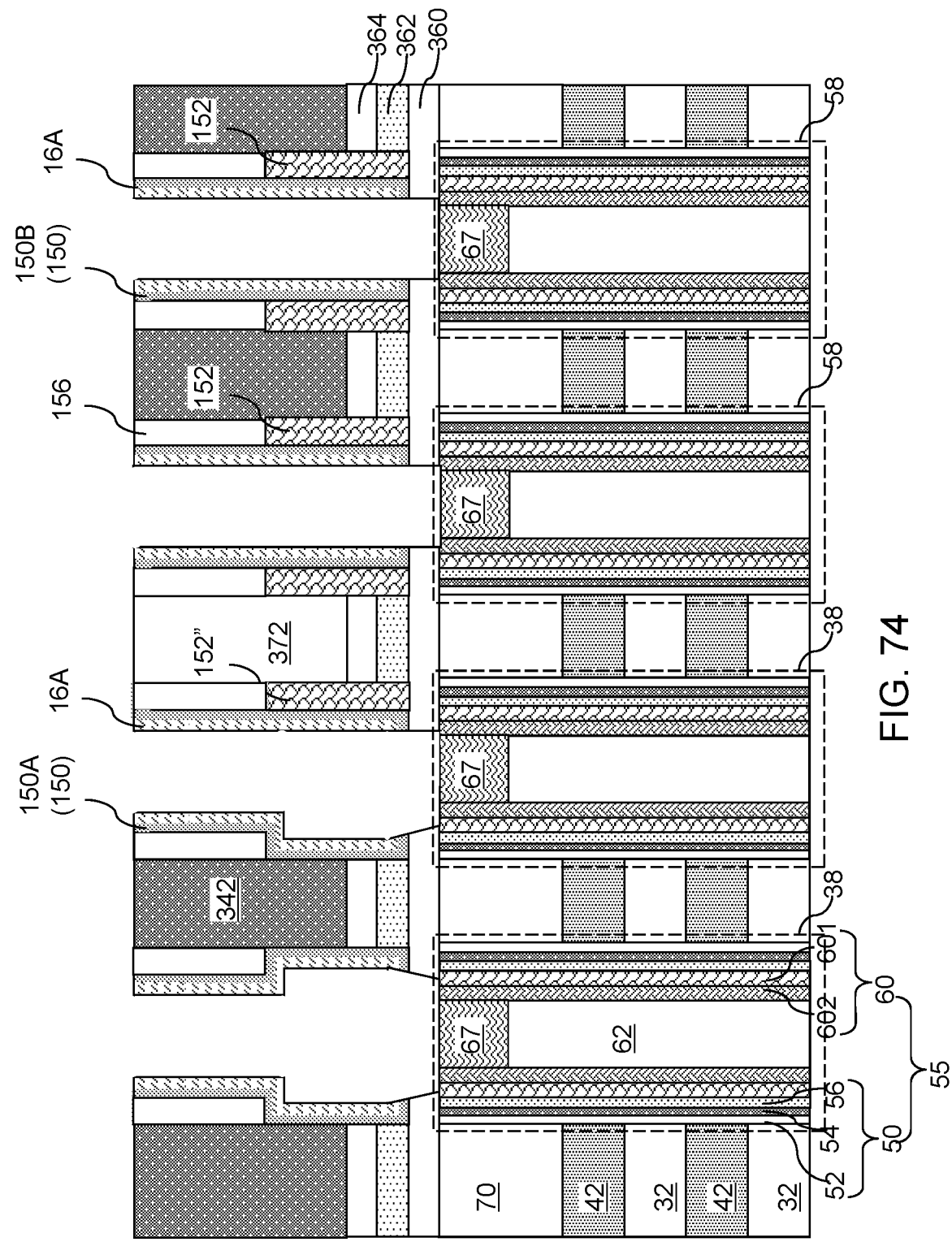
FIG. 74 is a vertical cross-sectional view of a region of the third exemplary structure after an anisotropic etch process that removes horizontal portions of the cover semiconductor material layer and the gate dielectric layer and extends drain-select-level cavities to memory opening fill structures according to the third embodiment of the present disclosure.

Referring to FIG. 74, an anisotropic etch process may be performed to etch horizontal portions of the cover semiconductor material layer 26A and the gate dielectric layer 150L, and to etch through unmasked portions of the insulating spacer layer 360 that underlie the voids within the drain-select-level openings (349, 339). The voids are herein referred to as the drain-select-level cavities, which are vertically extended by the anisotropic etch through the insulating spacer layer 360. A channel connection region 67 may be physically exposed at the bottom of each cavity that is laterally surrounded by a remaining portion of the cover semiconductor material layer 26A. Each remaining portion of the cover semiconductor material layer 26A constitutes an outer semiconductor channel portion 16A. Each remaining portion of the gate dielectric layer 150L constitutes a gate dielectric 150. The gate dielectrics 150 include first gate dielectrics 150A located in the first drain-select-level openings 349 and second gate dielectrics 150B located in the second drain-select-level openings 339. A combination of a cylindrical electrode portion 152 and a first gate dielectric 150A may be formed in each first drain-select-level opening 349 (which is included in a first subset of the drain-select-level openings (349, 339)), while forming a second gate dielectric 150B directly on a sidewall of each second drain-select-level opening 339 (which is included a second subset of the drain-select-level openings (349, 339)).

Figure 75:
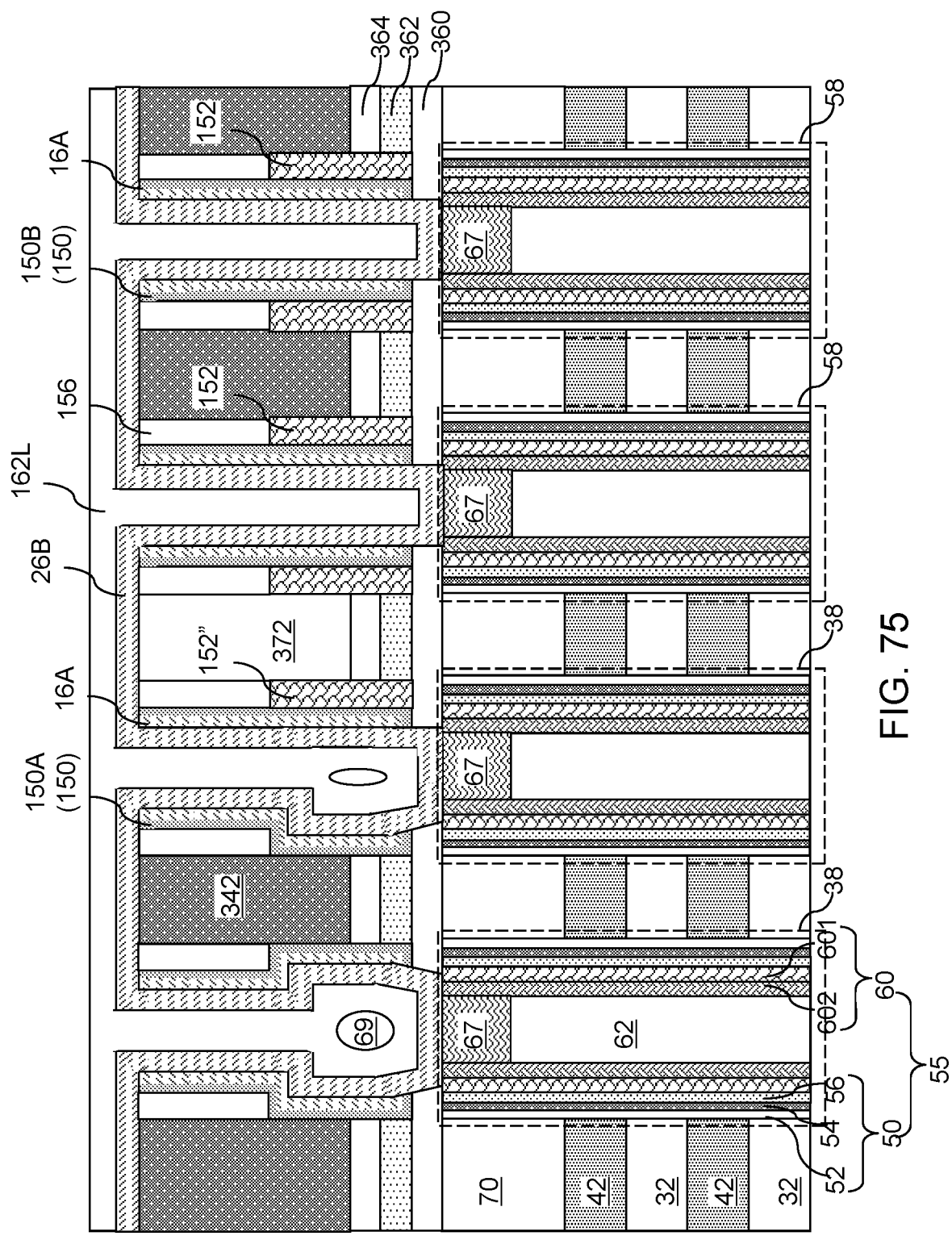
FIG. 75 is a vertical cross-sectional view of the region of the third exemplary structure after depositing a drain-select-level dielectric core material layer according to the third embodiment of the present disclosure.

Referring to FIG. 75, a body semiconductor material layer 26B may be deposited directly on the physically exposed surfaces of the channel connection regions 67, inner sidewalls of the outer semiconductor channel portions 16A, and over the top surfaces of the drain-select-level isolation structures 372 and the drain-select-level sacrificial material layer 342. The body semiconductor material layer 26B may include a semiconductor material such as at least one elemental semiconductor material, at least one III-V compound semiconductor material, at least one II-VI compound semiconductor material, at least one organic semiconductor material, or other semiconductor materials known in the art. In one embodiment, the body semiconductor material layer 26B may include amorphous silicon or polysilicon. The body semiconductor material layer 26B may be formed by a conformal deposition method such as low pressure chemical vapor deposition (LPCVD). The thickness of the body semiconductor material layer 26B may be in a range from 2 nm to 10 nm, although lesser and greater thicknesses may also be used.

A drain-select-level dielectric core material layer 162L may be deposited in the drain-select-level cavities by a conformal deposition process. The drain-select-level dielectric core material layer 162L may include a dielectric material such as silicon oxide. Encapsulated voids 69 may be formed in the second drain-select-level openings 339.

Figure 76:
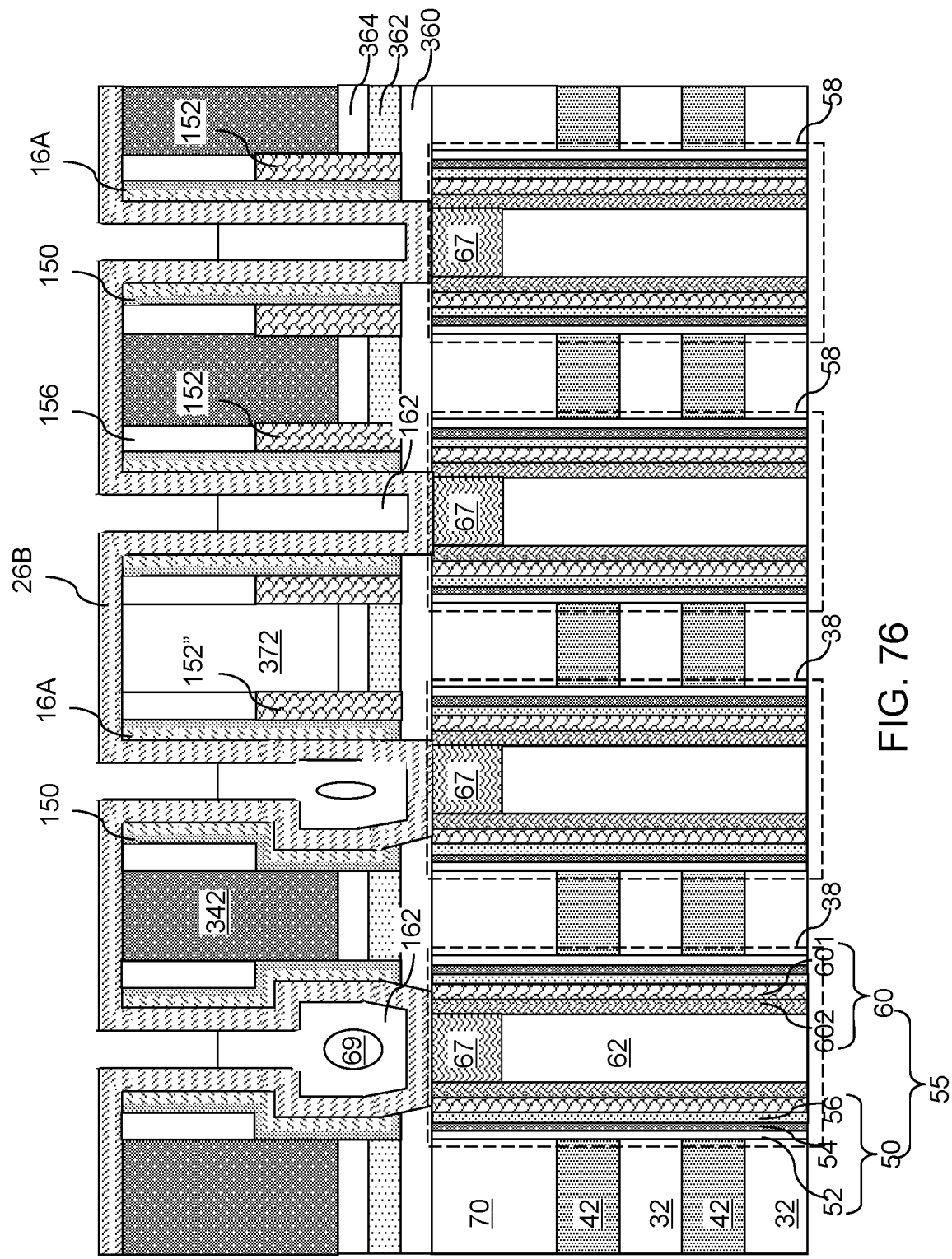
FIG. 76 is a vertical cross-sectional view of the region of the third exemplary structure after formation of drain-select-level dielectric cores according to the third embodiment of the present disclosure.

Referring to FIG. 76, the material of the drain-select-level dielectric core material layer 162L may be vertically recessed selective to the material of the body semiconductor material layer 26B. For example, a wet etch process using dilute hydrofluoric acid may be used to vertically recess the material of the drain-select-level dielectric core material layer 162L below the horizontal plane including the top surfaces of the drain-select-level isolation structures 372 and the drain-select-level sacrificial material layer 342. Each remaining portion of the drain-select-level dielectric core material layer 162L constitutes a drain-select-level dielectric core 162.

Figure 77:
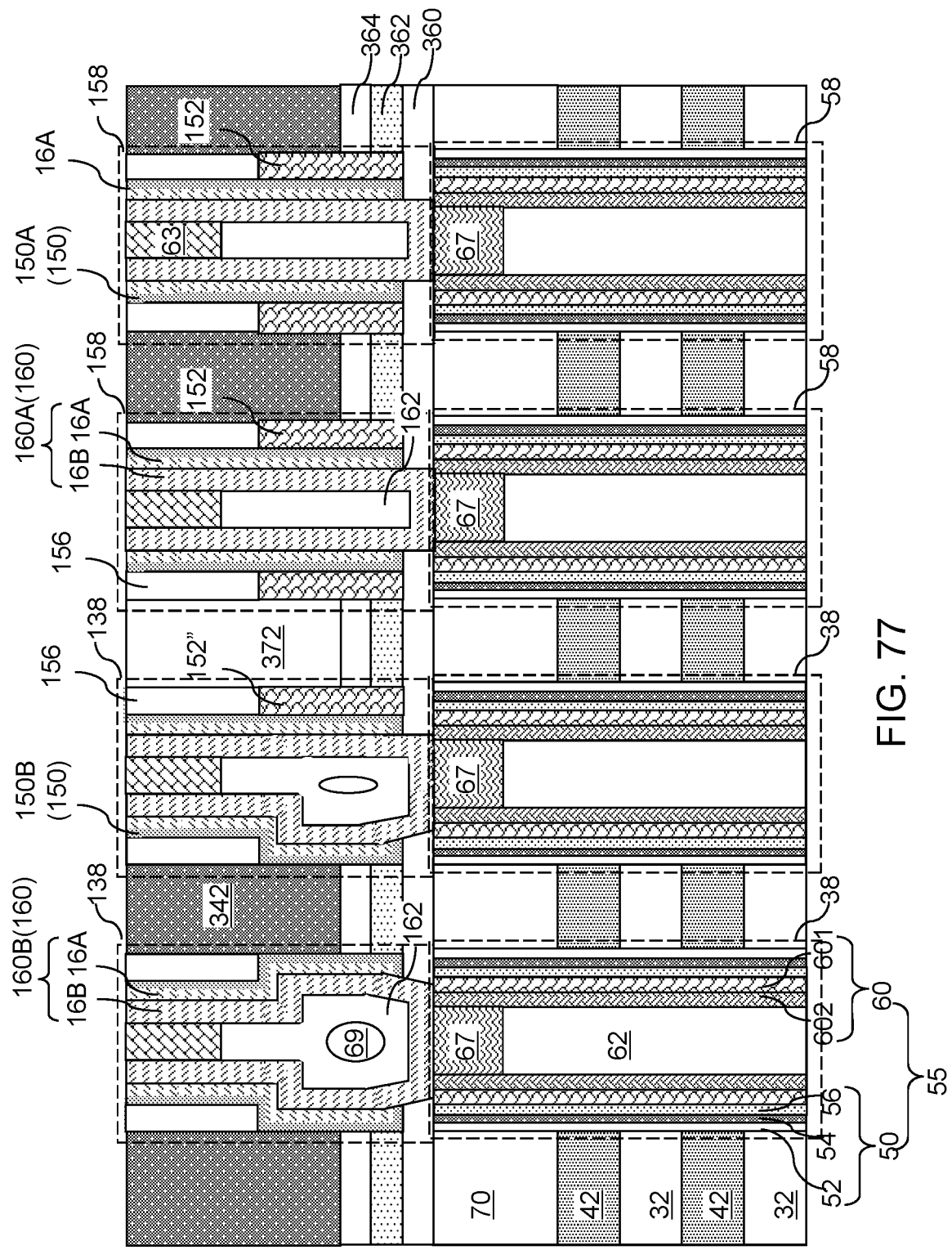
FIG. 77 is a vertical cross-sectional view of the region of the third exemplary structure after formation of drain regions according to the third embodiment of the present disclosure.
Figure 78:
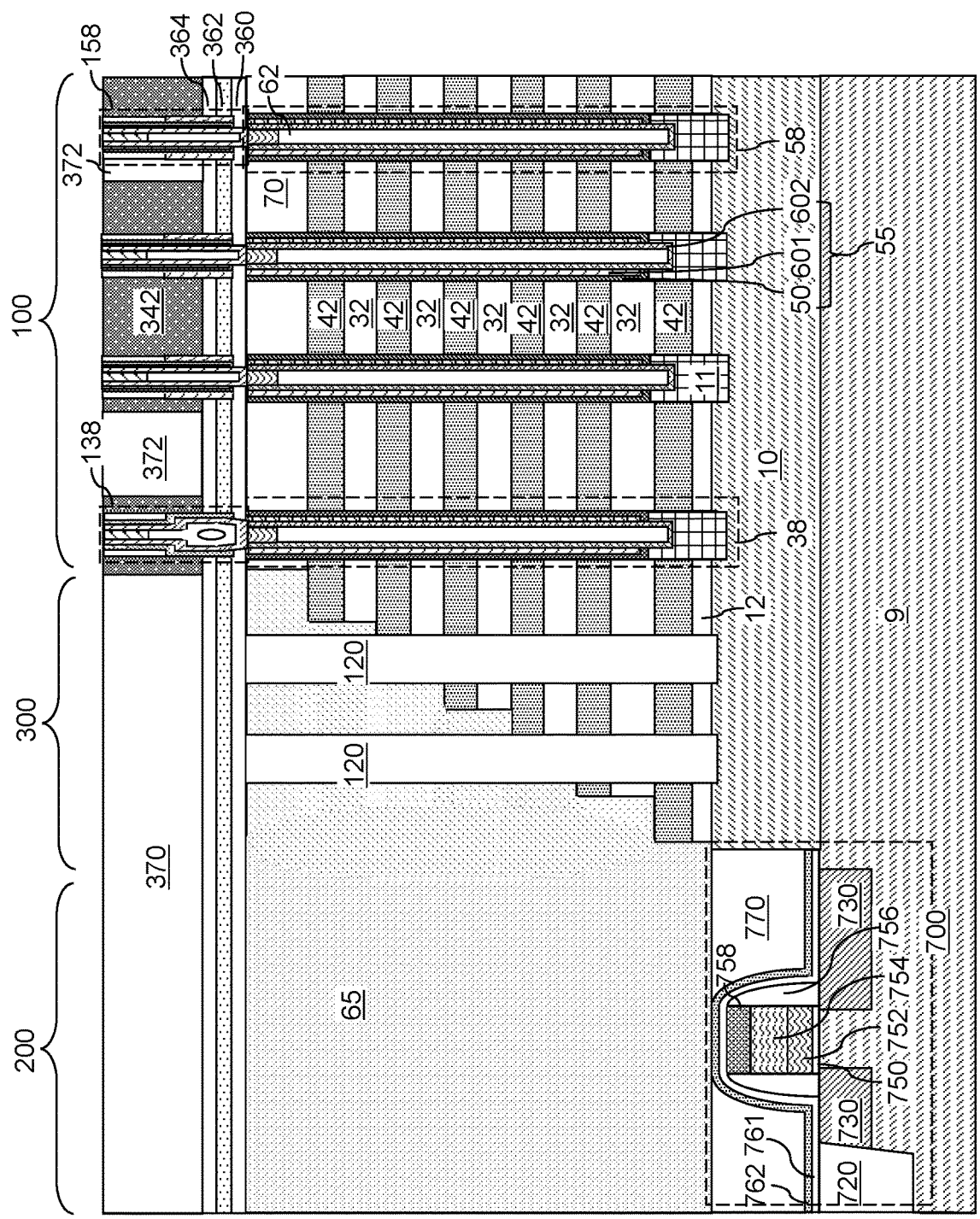
FIG. 78 is a vertical cross-sectional view of the third exemplary structure at the processing steps of FIG. 77.

Referring to FIGS. 77 and 78, a heavily-doped semiconductor material having a doping of the second conductivity type may be deposited in the recesses that overlie the drain-select-level dielectric cores 162. Excess portions of the heavily-doped semiconductor material may be removed from above the horizontal plane including the top surfaces of the drain-select-level isolation structures 372 and the drain-select-level sacrificial material layer 342 by a planarization process. Each remaining portion of the heavily-doped semiconductor material of the second conductivity type constitutes a drain region 63. Portions of the body semiconductor material layer 26B overlying the top surfaces of the drain-select-level isolation structures 372 and the drain-select-level sacrificial material layer 342 may be collaterally removed during the planarization process. The planarization process may use a recess etch and/or chemical mechanical planarization (CMP). Each remaining portion of the body semiconductor material layer 26B constitutes an inner semiconductor channel portion 16B. Each set of an outer semiconductor channel portion 16A and an inner semiconductor channel portion 16B constitutes a drain-select-level channel portion 160.

Each combination of a cylindrical electrode portion 152, a cylindrical dielectric spacer 156, a first gate dielectric 150A, a drain-select-level channel portion 160, a drain-select-level dielectric core 162, and a drain region 63 that fills a first drain-select-level opening 349 constitutes a first drain-select-level assembly 158. Each combination of a cylindrical dielectric spacer 156, a second gate electrode material portion 152", if present, a second gate dielectric 150B, a drain-select-level channel portion 160, a drain-select-level dielectric core 162, and a drain region 63 that fills a second drain-select-level opening 339 constitutes a second drain-select-level assembly 138.

A first drain-select-level channel portion 160A may be formed in each first drain-select-level opening 349 while a second drain-select-level channel portion 160B is formed in each second drain-select-level opening 339. The first drain-select-level assemblies 158 are formed in the first drain-select-level openings 349, and the second drain-select-level assemblies 138 are formed in the second drain-select-level openings 339. Each of the drain-select-level channel portions 160 extends through, and contacts a sidewall of, an insulating spacer layer 360 that overlies the array of memory stack structures 55.

Each of the first drain-select-level assemblies 158 comprises a respective first gate dielectric 150A that vertically extends straight from a horizontal plane including top surface of the drain-select-level assemblies (158, 138) to a top surface of the insulating spacer layer 360. Each of the second drain-select-level assemblies 138 comprises a respective second gate dielectric 150B having a greater lateral extent at a lower bulging portion thereof than at an upper portion thereof.

In one embodiment, the first drain-select-level assemblies 158 and the second drain-select-level assemblies 138 collectively constitute a periodic array of drain-select-level assemblies (158, 138) having a same periodicity as the array of memory stack structures 55 along the first horizontal direction hd1 and the second horizontal direction hd2 and overlies the alternating stack (32, 42). Each of the first drain-select-level channel portions 160A and the second drain-select-level channel portions 160B contacts a respective memory-level channel portion 60.

The array of memory stack structures 55 and the array of drain-select-level assemblies (158, 138) may be formed in the memory array region 100 in which each layer within the alternating stack (32, 42) is present. The alternating stack (32, 42) comprises a staircase region in which the sacrificial material layers 42 have variable lateral extents that decrease with a vertical distance from the substrate (9, 10). The second drain-select-level assemblies 138 may be located at a periphery of the memory array region 100 adjacent to the staircase region 300. The first drain-select-level assemblies 158 may be laterally spaced apart from the staircase region 300 by a greater lateral distance than the second drain-select-level assemblies 138 are from the staircase region 300.

Figure 79A:
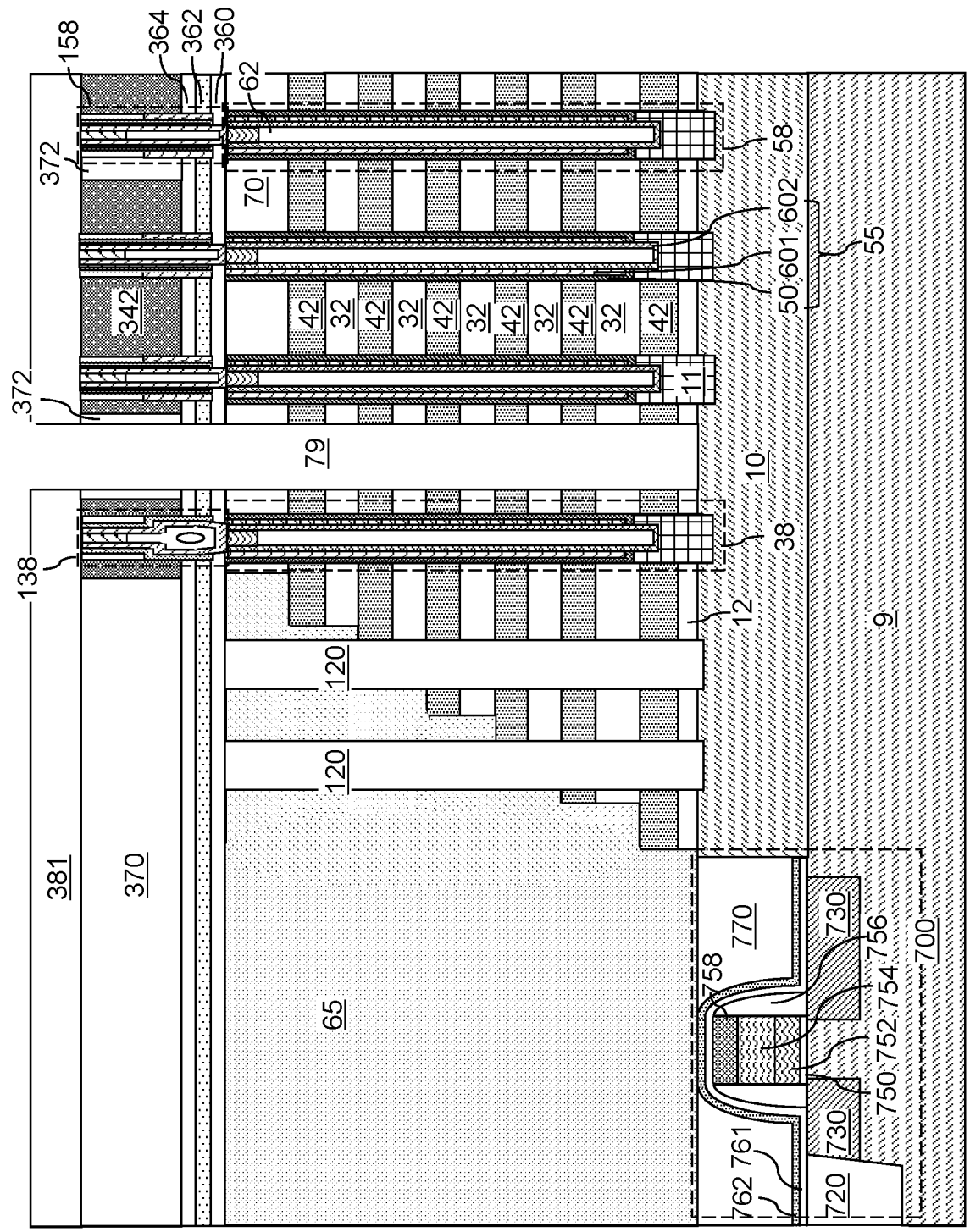
FIG. 79A is a vertical cross-sectional view of the third exemplary structure after formation of backside trenches according to the third embodiment of the present disclosure.
Figure 79B:
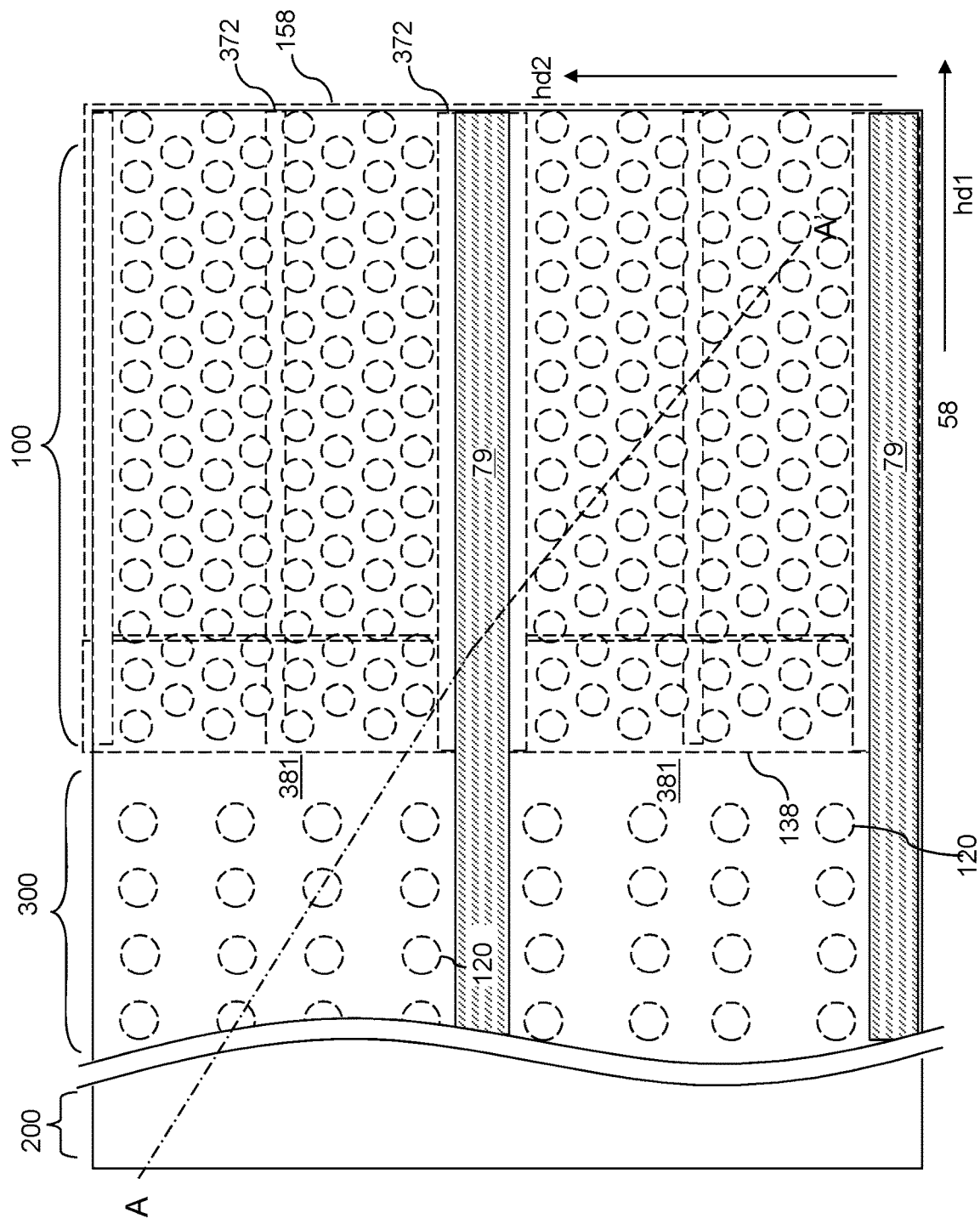

Referring to FIGS. 79A and 79B, a sacrificial dielectric cover layer 381 may be formed over the drain-select-level isolation structures 372 and the drain-select-level sacrificial material layer 342. The sacrificial dielectric cover layer 381 includes a dielectric material such as silicon oxide, and may have a thickness in a range from 10 nm to 200 nm, although lesser and greater thicknesses may also be used. A photoresist layer (not shown) may be applied over the sacrificial dielectric cover layer 381, and may be lithographically patterned to form openings in areas between arrays of memory stack structures 55. The pattern in the photoresist layer may be transferred through the sacrificial dielectric cover layer 381, the drain-select-level isolation structures 372, the drain-select-level sacrificial material layer 342, the drain-select-level isolation layer 370, the drain-select-level insulating layer 364, the etch stop dielectric layer 362, the insulating spacer layer 360, the alternating stack (32, 42), and/or the retro-stepped dielectric material portion 65 using an anisotropic etch to form backside trenches 79. The backside trenches 79 may vertically extend at least to the top surface of the substrate (9, 10), and laterally extend through the memory array region 100 and the contact region 300. In one embodiment, the backside trenches 79 may be used as source contact openings in which source contact via structures may be subsequently formed. The photoresist layer may be removed, for example, by ashing. Each backside trench 79 is laterally spaced from portions of the drain-select-level sacrificial material layer 342 by a respective remaining portion of the drain-select-level isolation structures 372.

Figure 80:
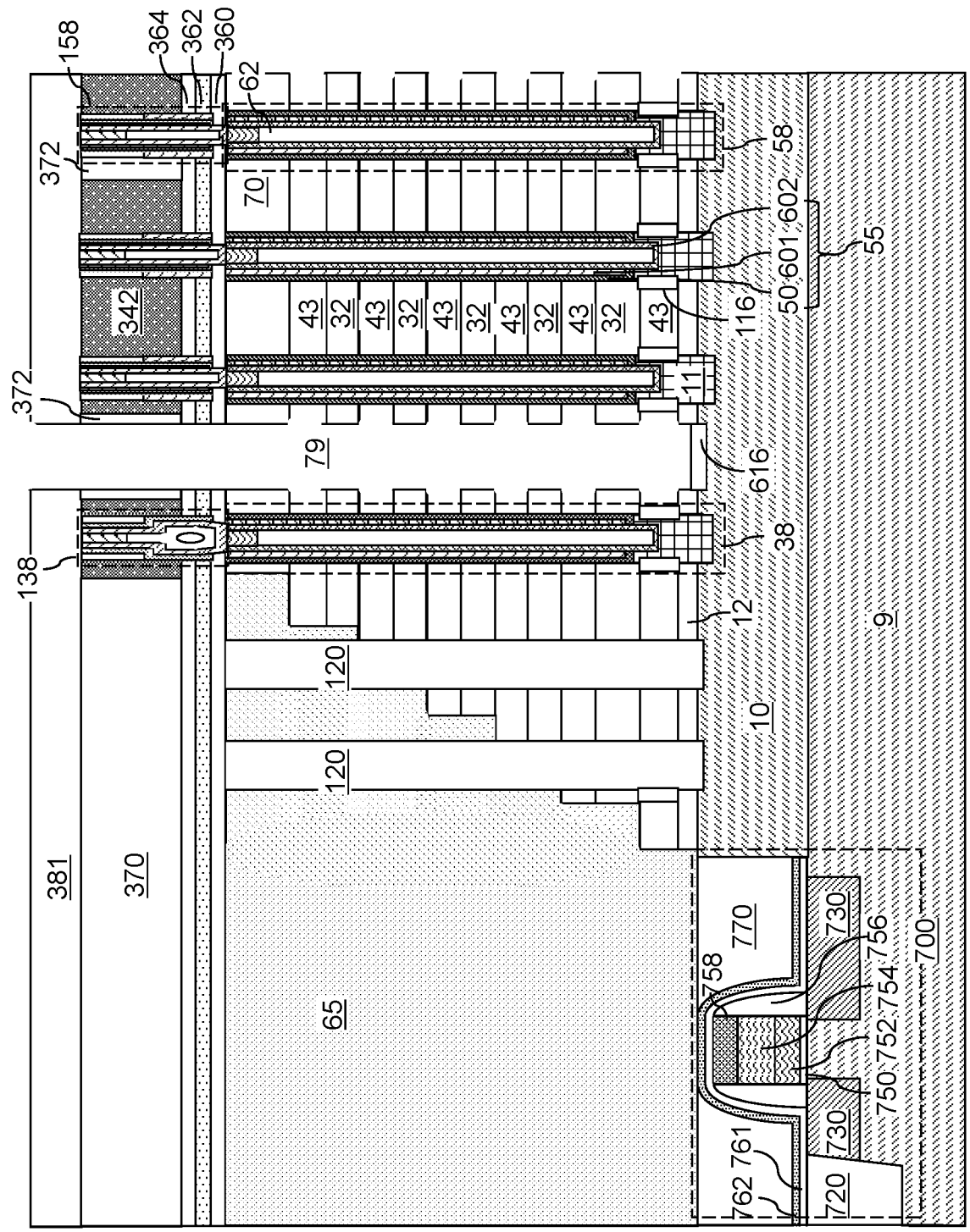

Referring to FIG. 80, the processing steps discussed above with reference to FIG. 27 may be performed. An etchant that selectively etches the second material of the sacrificial material layers 42 with respect to the first material of the insulating layers 32 may be introduced into the backside trenches 79, for example, using an etch process. Backside recesses 43 may be formed in volumes from which the sacrificial material layers 42 are removed. The removal of the second material of the sacrificial material layers 42 may be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 may include silicon nitride, and the materials of the insulating layers 32, the insulating spacer layer 360, and the retro-stepped dielectric material portion 65 may be selected from silicon oxide and dielectric metal oxides.

The etch process that removes the second material selective to the first material and the outermost layer of the memory films 50 may be a wet etch process using a wet etch solution, or may be a gas phase (dry) etch process in which the etchant is introduced in a vapor phase into the backside trenches 79. For example, if the sacrificial material layers 42 include silicon nitride, the etch process may be a wet etch process in which the first exemplary structure is immersed within a wet etch tank including phosphoric acid, which etches silicon nitride selective to silicon oxide, silicon, and various other materials used in the art. The support pillar structure 120, the retro-stepped dielectric material portion 65, and the memory stack structures 55 provide structural support while the backside recesses 43 are present within volumes previously occupied by the sacrificial material layers 42.

Figure 81:
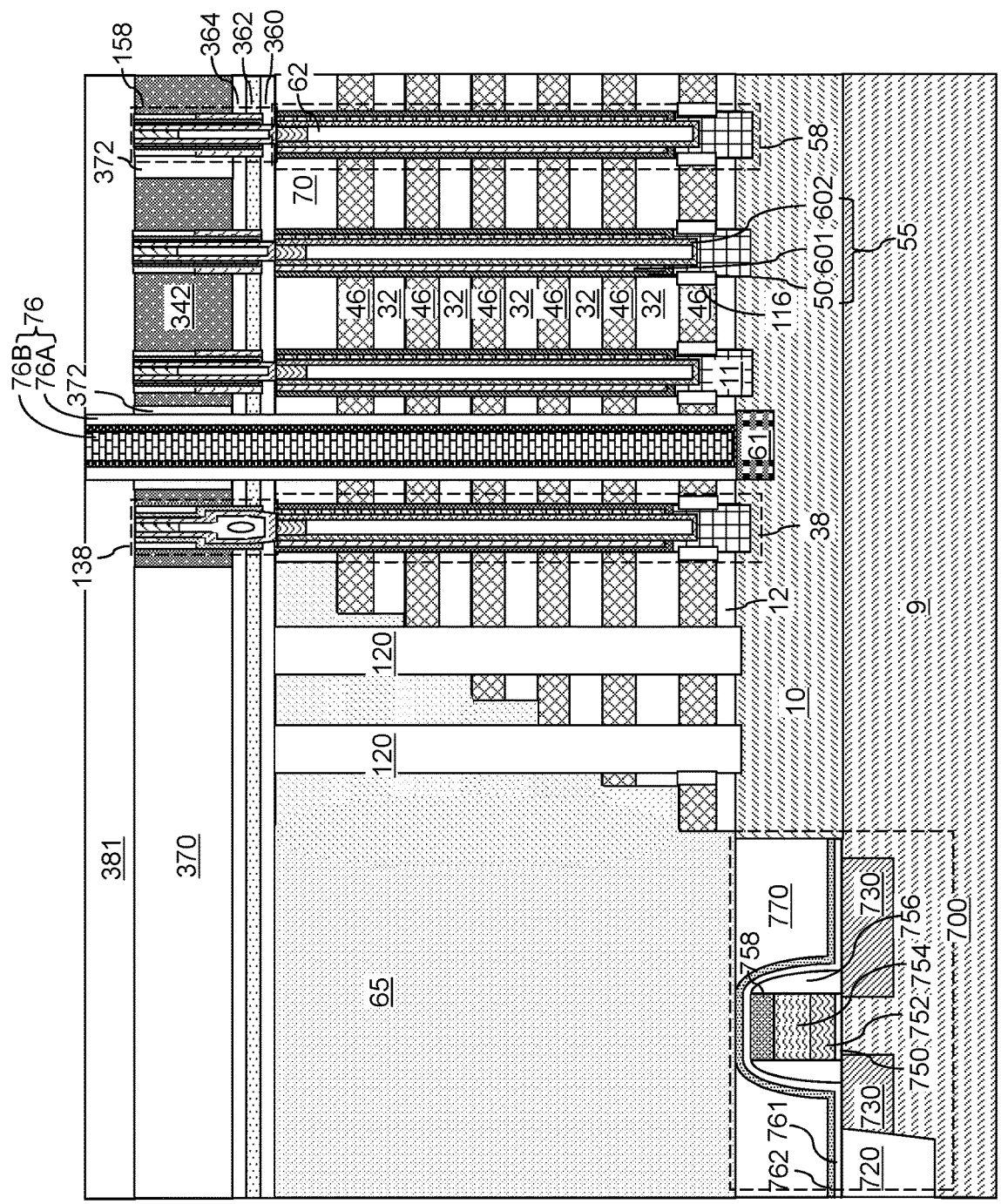

Referring to FIG. 81, the processing steps of FIGS. 28, 29, and 30 may be subsequently performed to form electrically conductive layers 46 in the backside recesses 43. Source regions 61, insulating spacers 74, and backside contact via structures 76 may be subsequently formed.

Figure 82:
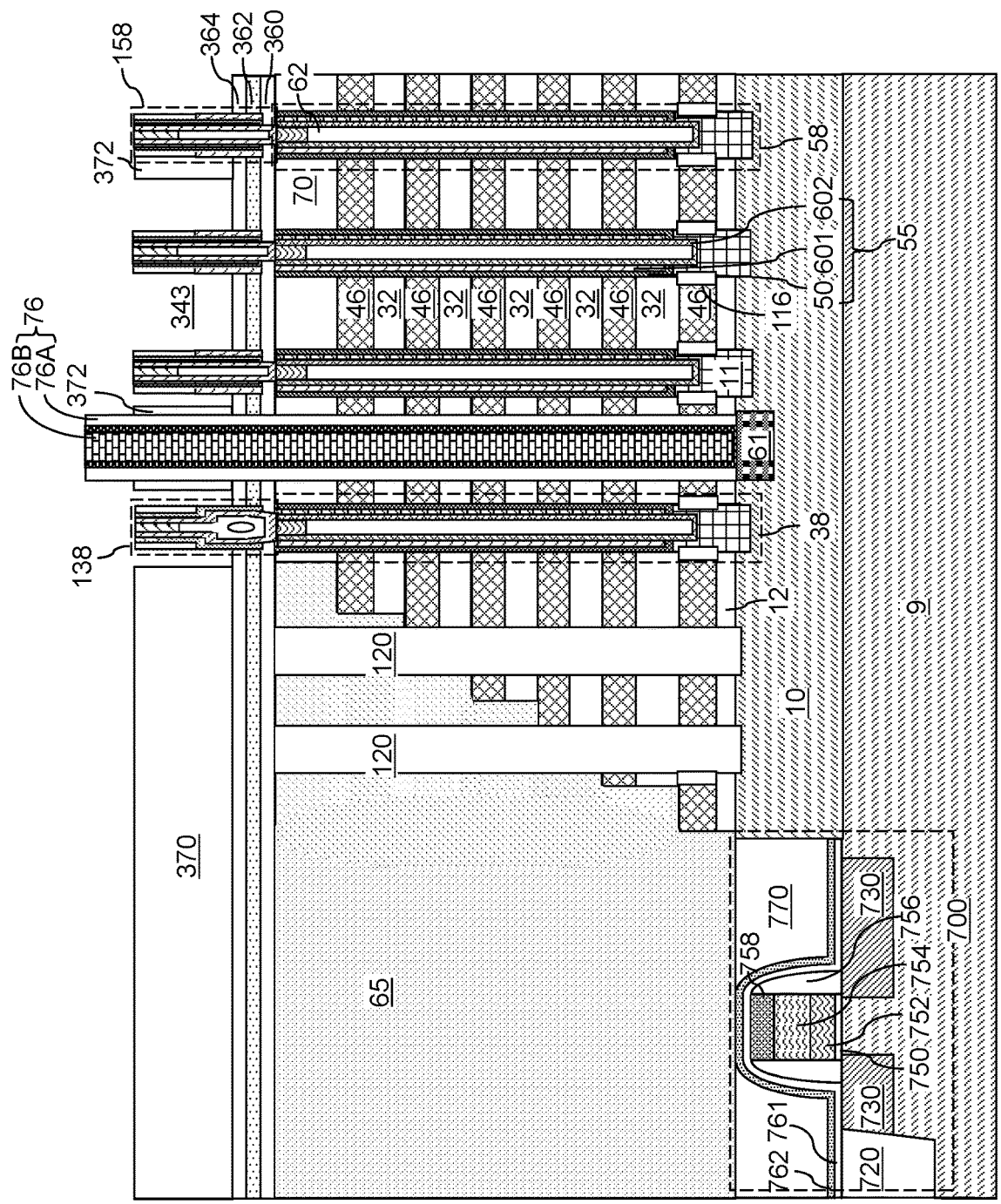

Referring to FIG. 82, the sacrificial dielectric cover layer 381 may be removed by an etch process, which may include an isotropic etch process or an anisotropic etch process. For example, if the sacrificial dielectric cover layer 381 includes a doped silicate glass such as borosilicate glass, the sacrificial dielectric cover layer 381 may be removed by a wet etch process using dilute hydrofluoric acid.

Subsequently, the drain-select-level sacrificial material layer 342 may be removed selective to the drain-select-level isolation structures 372, the drain-select-level isolation layer 370, the optional drain-select-level insulating layer 364, and the drain-select-level assemblies (158, 138). A drain-select-level cavity 343 may be formed in each volume from which a portion of the drain-select-level sacrificial material layer 342 is removed. Outer sidewalls of the cylindrical electrode portions 152 are physically exposed.

Figure 83:
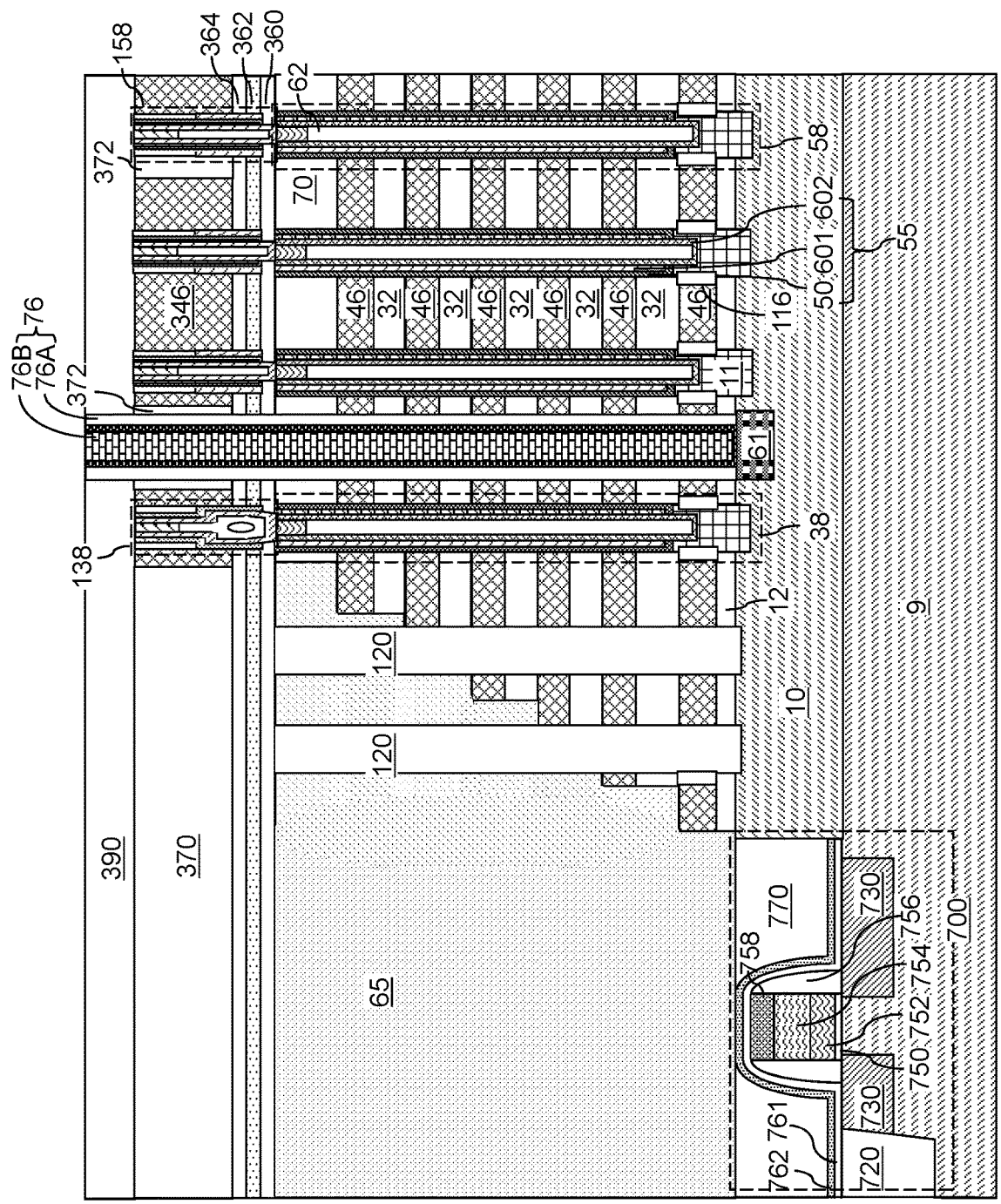

Referring to FIG. 83, strip electrode portions 346 may be formed by depositing at least one conductive material in each drain-select-level cavity 343. Specifically, at least one conductive material may be deposited in the drain-select-level cavity 343 and on each of the cylindrical electrode portions 152. The at least one conductive material may include an elemental metal (such as tungsten, aluminum, copper, or cobalt), an intermetallic alloy, a conductive metal nitride material (such as TiN, TaN, or WN), or a heavily doped semiconductor material. The at least one conductive material may fill the entire volume of each drain-select-level cavity 343. Portions of the deposited at least one conductive material may be removed from above the horizontal plane including the top surfaces of the drain-select-level isolation structures 372 and the drain-select-level isolation layer 370 by a recess etch. Each remaining portion of the at least one conductive material constitutes a strip electrode portion 346, which contacts a respective subset of the cylindrical electrode portions 152.

Each strip electrode portion 346 may include a pair of lengthwise sidewalls that generally extend along the first horizontal direction hd1. Each lengthwise sidewall of a strip electrode portion 346 includes a laterally alternating sequence of planar sidewall segments and concave sidewall segments, which may be a laterally alternating sequence of vertical planar sidewall segments and vertical concave sidewall segments. Each strip electrode portion 346 may be formed directly on sidewalls of a respective set of cylindrical electrode portions 152. Each set of a strip electrode portion 346 and plurality of cylindrical electrode portions 152 constitutes a drain select gate electrode (152, 346). A neighboring pair of drain select gate electrodes (152, 346) may be laterally spaced from each other by a respective drain-select-level isolation structure 372.

Each strip electrode portion 346 may be formed on a respective subset of the plurality of cylindrical electrode portions 152 that is arranged in rows that extend along a first horizontal direction hd1. Each drain select gate electrode (152, 346) laterally surrounds, and encircles, respective rows of drain-select-level assemblies (158, 138).

A contact level dielectric layer 390 may be formed over the drain select gate electrodes (152, 346), the drain-select-level isolation structures 372, and the drain-select-level isolation layer 370. The contact level dielectric layer 390 may include a dielectric material such as silicon oxide. The contact level dielectric layer 390 may have a top surface that is coplanar with, or is located above, the horizontal plane including the top surfaces of the backside contact via structures 76.

Figure 84A:
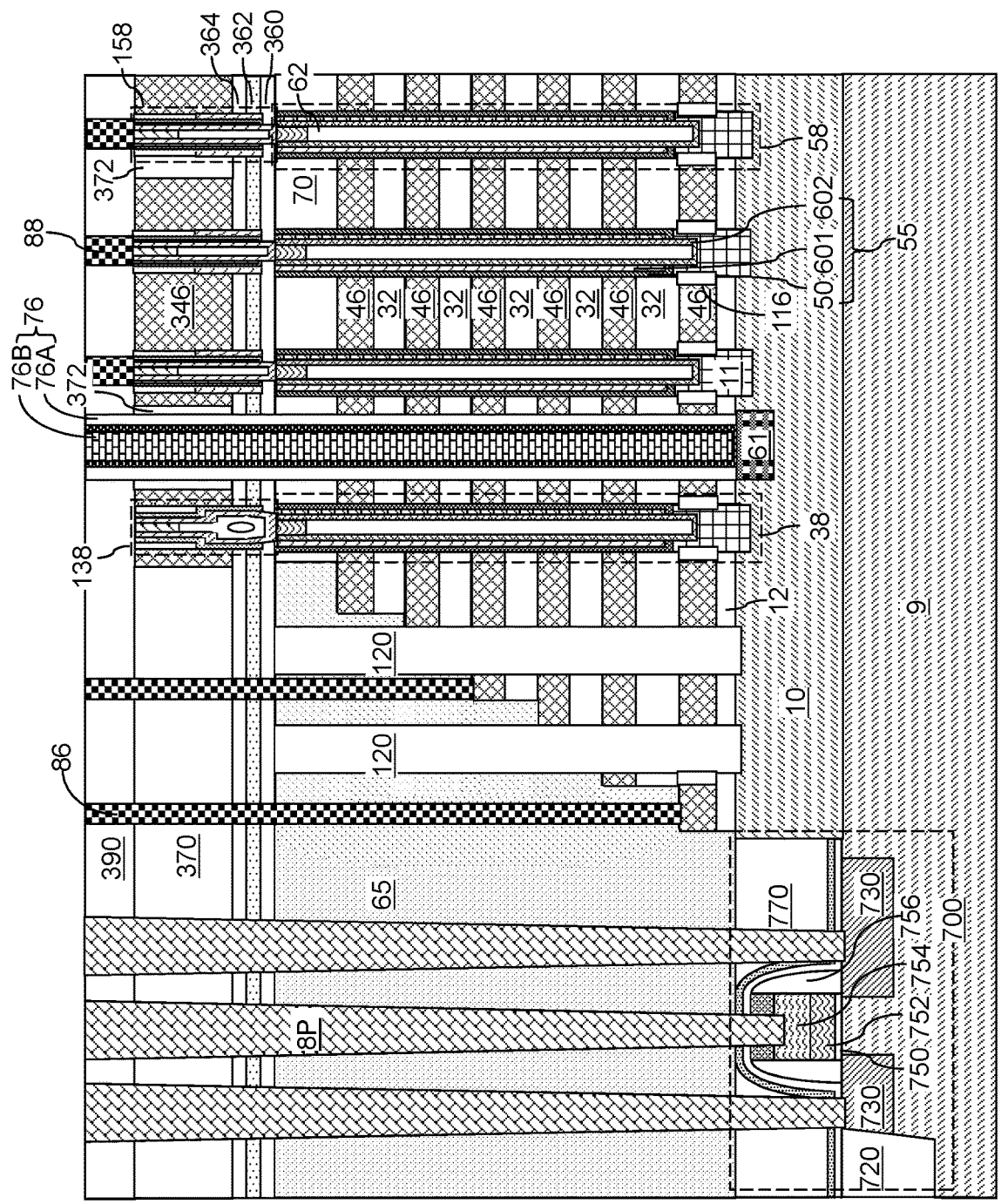
Figure 84C:
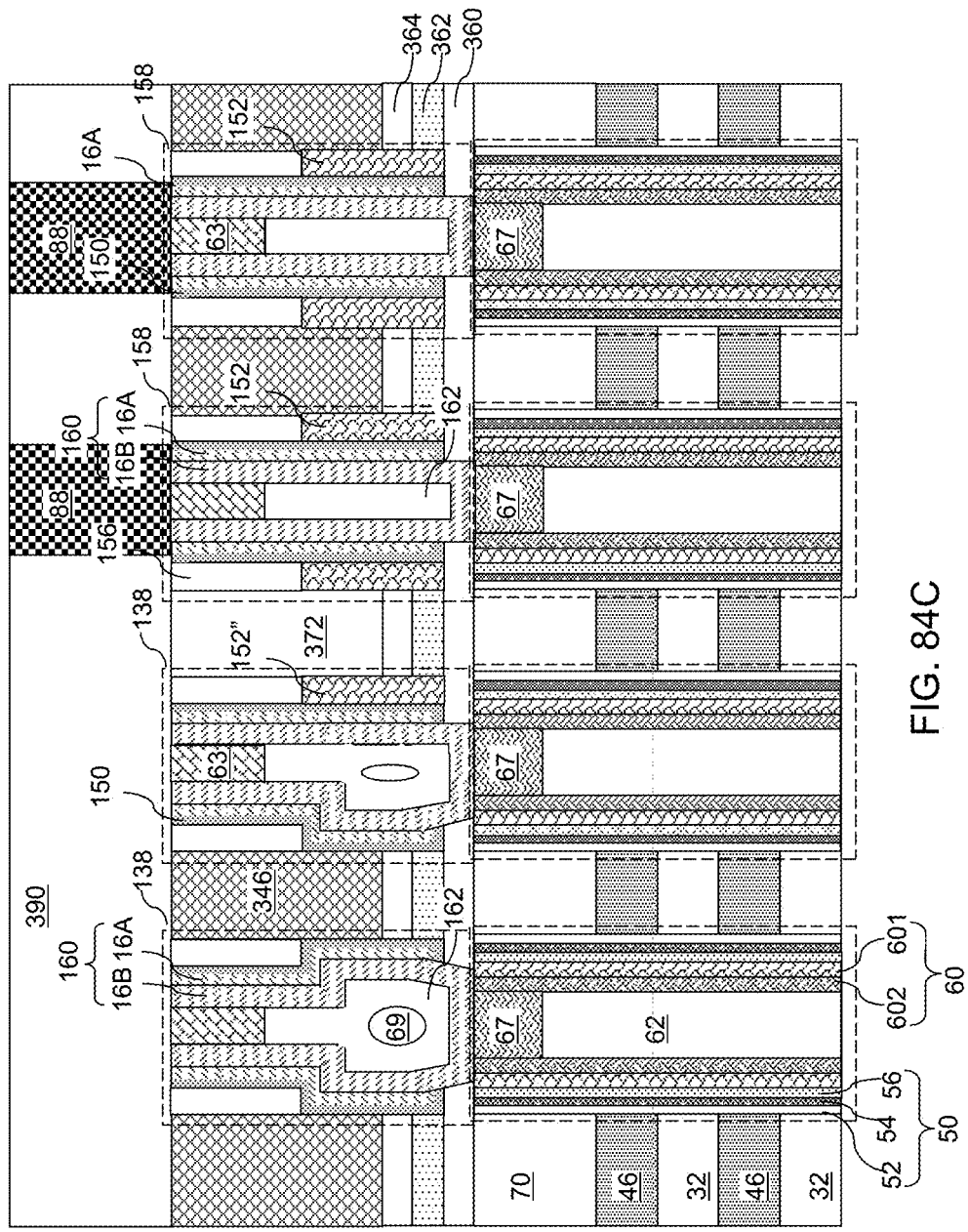

Referring to FIGS. 84A-84C, the processing steps of FIGS. 31A and 31B may be performed to form additional contact via structures (88, 86, 8P). For example, drain contact via structures 88 may be formed through the contact level dielectric material layer 390 on each drain region 63. Word line contact via structures 86 may be formed on the electrically conductive layers 46 through the contact level dielectric layer 390, the drain-select-level isolation layer 370, the insulating spacer layer 360, and through the retro-stepped dielectric material portion 65. Peripheral device contact via structures 8P may be formed through the contact level dielectric layer 390, the drain-select-level isolation layer 370, the insulating spacer layer 360, and through the retro-stepped dielectric material portion 65 directly on respective nodes of the peripheral devices. Additional metal interconnect structures (not shown) may be subsequently formed as needed. For example, bit lines 90 (shown schematically in FIG. 31B) which extend in the second horizontal direction hd2 may be formed to provide electrical contact with the drain contact via structures 88.

Referring to all drawings and according to various embodiments of the present disclosure, a three-dimensional memory device is provided, which comprises an alternating stack of insulating layers 32 and electrically conductive layers 46 located over a substrate (9, 10); an array of memory stack structures 55 extending through the alternating stack (32, 46) and arranged as rows that extend along a first horizontal direction hd1 and are spaced apart along a second horizontal direction hd2, wherein each of the memory stack structures 55 comprises a memory film 50 and a memory-level channel portion 60 contacting an inner sidewall of the memory film 50; an array of drain-select-level assemblies (158, 138) overlying the alternating stack (32, 46) and having a same periodicity as the array of memory stack structures 55 along the first horizontal direction hd1 and the second horizontal direction hd2, wherein each of the drain-select-level assemblies (158, 138) comprises a drain-select-level channel portion 160 contacting a respective memory-level channel portion 60 and a drain region 63 contacting an upper end of the drain-select-level channel portion 160; a strip electrode portion 346 laterally surrounding respective rows of drain-select-level assemblies (158, 138); a drain-select-level isolation structure (e.g., strip) 372 comprising at least one dielectric material and contacting the strip electrode portion 346 and sidewalls of a row of drain-select-level assemblies (158, 138).

In one embodiment, the drain-select-level assemblies (158, 138) comprise: first drain-select-level assemblies 158 including a respective first drain region 63 that is contacted by a respective drain contact via structure 88; and second drain-select-level assemblies 138 including a respective second drain region 63, wherein an entirety of top surfaces of the second drain regions 63 contacts a dielectric bottom surface of a contact level dielectric layer 390.

In one embodiment, the array of memory stack structures 55 and the array of drain-select-level assemblies (158, 138) are located in a memory array region 100 in which each layer within the alternating stack (32, 46) is present. In one embodiment, the alternating stack (32, 46) comprises a staircase region in which the electrically conductive layers 46 have variable lateral extents that decrease with a vertical distance from the substrate (9, 10); the second drain-select-level assemblies 138 are located at a periphery of the memory array region 100 adjacent to the staircase region 300; and the first drain-select-level assemblies 158 are laterally spaced apart from the staircase region 300 by a greater lateral distance than the second drain-select-level assemblies 138 are from the staircase region 300.

In one embodiment, each of the first drain-select-level assemblies 158 comprises a cylindrical electrode portion 152 that contacts the strip electrode portion 346. In one embodiment, each of the first drain-select-level assemblies 158 comprises a first gate dielectric 150A that is laterally spaced from the strip electrode portion 346 by a cylindrical electrode portion 152 selected from the cylindrical electrode portions 152.

In one embodiment, each of the second drain-select-level assemblies 138 comprises a second gate dielectric 150B that contacts the strip electrode portion 346. In one embodiment, each of the first drain-select-level assemblies 158 comprises a first cylindrical dielectric spacer 156 that contacts an annular top surface of a respective one of the cylindrical electrode portions 152. In one embodiment, one of the second drain-select-level assemblies 138 comprises a second cylindrical dielectric spacer 156 having an annular bottom surface that contacts an annular horizontal surface of one of the second gate dielectrics 150B. In one embodiment, another of the second drain-select-level assemblies 138 comprises another second cylindrical dielectric spacer 156 having an annular bottom surface that contacts a horizontal surface of another of the second gate dielectrics 150B and a top surface of a conductive material portion (such as a second gate electrode material portions 152") having a same material portion as the cylindrical electrode portions 152.

In one embodiment, each of the drain-select-level channel portions 160 extends through, and contacts a sidewall of, an insulating spacer layer 360 that overlies the array of memory stack structures 55. In one embodiment, each of the first drain-select-level assemblies 158 comprises a respective first gate dielectric 150A that vertically extends straight from a horizontal plane including top surface of the drain-select-level assemblies (158, 138) to a top surface of the insulating spacer layer 360; and each of the second drain-select-level assemblies 138 comprises a respective second gate dielectric 150B having a greater lateral extent at a lower bulging portion thereof than at an upper portion thereof.

In one embodiment, the drain-select-level isolation structure (e.g., strip) 372 comprises a pair of laterally undulating sidewalls; and each of the pair of laterally undulating sidewalls comprises a laterally alternating sequence of flat sidewall segments and concave sidewall segments. In one embodiment, flat sidewall segments of one of the pair of laterally undulating sidewalls contact the strip electrode portion 346; and concave sidewall segments of the one of the pair of laterally undulating sidewalls contacts cylindrical electrode portions 152 that are located within a first subset of the drain-select-level assemblies (158. 138) (i.e., the first drain-select-level assemblies 158) and contact a respective concave sidewall of the strip electrode portion 346.

The various embodiments of the present disclosure provide drain-select-level isolation structures (e.g., strips) 372 without altering the periodicity of the array of memory openings (39, 49) or of any structure formed thereupon. Thus, the drain-select-level isolation strips 372 may be formed without using any additional footprint in the design layout of the three-dimensional memory device, thereby providing a higher density for three-dimensional memory devices without alteration of an inter-row pitch used to form prior art drain-select-level isolation strips. The first drain-select-level assemblies 158 may be active components that include portions of active vertical semiconductor channels. The second drain-select-level assemblies 138 are dummy structures, i.e., electrically inactive structures. The second drain-select-level assemblies 138 are used at peripheral portions of the two-dimensional array of drain-select-level assemblies (158, 138). Absence of the cylindrical electrode portions 152 in the second drain-select-level assemblies 138 reduces the leakage current through the second drain-select-level assemblies 138.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    an alternating stack of insulating layers and electrically conductive layers located over a substrate;
    an array of memory stack structures extending through the alternating stack and arranged as rows that extend along a first horizontal direction and are spaced apart along a second horizontal direction, wherein each of the memory stack structures comprises a memory film and a memory-level channel portion contacting an inner sidewall of the memory film;
    an array of drain-select-level assemblies overlying the alternating stack and having a same periodicity as the array of memory stack structures along the first horizontal direction and the second horizontal direction, wherein each of the drain-select-level assemblies comprises a drain-select-level channel portion contacting a respective memory-level channel portion and a drain region contacting an upper end of the drain-select-level channel portion;
    a strip electrode portion laterally surrounding respective rows of drain-select-level assemblies; and
    a drain-select-level isolation strip comprising at least one dielectric material and contacting the strip electrode portion and sidewalls of a row of drain-select-level assemblies;
    wherein the drain-select-level assemblies comprise:
        first drain-select-level assemblies including a respective first drain region that is contacted by a respective drain contact via structure; and
        second drain-select-level assemblies including a respective second drain region, wherein an entirety of top surfaces of the second drain regions contacts a dielectric bottom surface of a contact level dielectric layer;
    wherein each of the drain-select-level channel portions extends through, and contacts a sidewall of, an insulating spacer layer that overlies the array of memory stack structures;
    wherein each of the first drain-select-level assemblies comprises a respective first gate dielectric that vertically extends straight from a horizontal plane including top surface of the drain-select-level assemblies to a top surface of the insulating spacer layer; and
    wherein each of the second drain-select-level assemblies comprises a respective second gate dielectric having a greater lateral extent at a lower bulging portion thereof than at an upper portion thereof.

2. The three-dimensional memory device of claim 1, wherein the array of memory stack structures and the array of drain-select-level assemblies are located in a memory array region in which each layer within the alternating stack is present.

3. The three-dimensional memory device of claim 2, wherein:
    the alternating stack comprises a staircase region in which the electrically conductive layers have variable lateral extents that decrease with a vertical distance from the substrate;
    the second drain-select-level assemblies are located at a periphery of the memory array region adjacent to the staircase region; and
    the first drain-select-level assemblies are laterally spaced apart from the staircase region by a greater lateral distance than the second drain-select-level assemblies are from the staircase region.

* * * * *